US009680103B2

(12) United States Patent
Sugiura et al.

(10) Patent No.: US 9,680,103 B2

(45) Date of Patent: Jun. 13, 2017

(54) ORGANIC PHOTOELECTRIC CONVERSION ELEMENT COMPOSITION, THIN FILM AND PHOTOVOLTAIC CELL EACH CONTAINING THE SAME, ORGANIC SEMICONDUCTOR POLYMER AND COMPOUND EACH FOR USE IN THESE, AND METHOD OF PRODUCING THE POLYMER

(71) Applicant: FUJIFILM Corporation, Minato-ku, Tokyo (JP)

(72) Inventors: Hiroki Sugiura, Ashigarakami-gun (JP); Hiroshi Yamada, Ashigarakami-gun (JP); Naoyuki Hanaki, Ashigarakami-gun (JP); Yoshihiro Nakai, Ashigarakami-gun (JP); Kiyoshi Takeuchi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 114 days.

(21) Appl. No.: 14/461,985

(22) Filed: Aug. 18, 2014

(65) Prior Publication Data

US 2014/0360585 A1 Dec. 11, 2014

Related U.S. Application Data

(63) Continuation of application No. PCT/JP2013/053294, filed on Feb. 12, 2013.

(30) Foreign Application Priority Data

Feb. 17, 2012 (JP) ................................ 2012-033425

(51) Int. Cl.

*H01L 51/00* (2006.01)
*C08G 61/12* (2006.01)

(Continued)

(52) U.S. Cl.

CPC .......... *H01L 51/0043* (2013.01); *B82Y 10/00* (2013.01); *C08G 61/02* (2013.01);

(Continued)

(58) Field of Classification Search

None

See application file for complete search history.

(56) References Cited

U.S. PATENT DOCUMENTS

2005/0029610 A1 2/2005 Nishikitani et al.
2010/0283047 A1 11/2010 Facchetti et al.

(Continued)

FOREIGN PATENT DOCUMENTS

JP 2010-254587 A 11/2010
JP 2011-035243 A 2/2011

(Continued)

OTHER PUBLICATIONS

Zhen Fang, et al., "Low-Bandgap Donor-Acceptor Conjugated Polymer Sensitizers for Dye-Sensitized Solar Cells", Journal of the American Chemical Society, Mar. 9, 2011, ,pp. 3063-3069, vol. 133, issue 9.

(Continued)

*Primary Examiner* — Harold Pyon
*Assistant Examiner* — Katie L Hammer
(74) *Attorney, Agent, or Firm* — Sughrue Mion, PLLC

(57) ABSTRACT

An organic photoelectric conversion element composition including a p-type-and-n-type linked organic semiconductor polymer represented by any one of formulas (1) to (5), a thin film and a photovoltaic cell each containing the same, an organic semiconductor polymer and a compound each for use in these, and a method of producing the polymer:

(Continued)

(1)

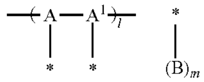

(2)

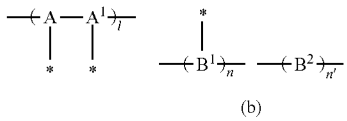

(3)

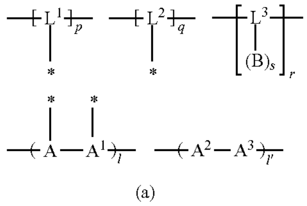

(4)

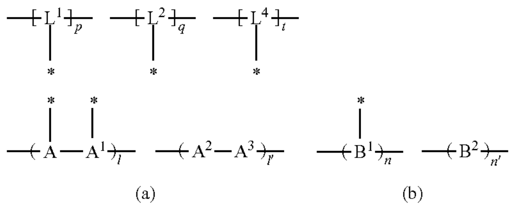

(5)

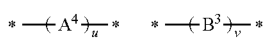

wherein, in formulas, A to $A^4$ represent a group of a p-type organic semiconductor unit, and B to $B^3$ represent a group of an n-type organic semiconductor unit; $L^1$ to $L^4$ represent a divalent or trivalent linking group; herein, in the formulas, at least one bonding hand represented by -* in the structures shown upperward and downward, and in the case of formula (4), $L^4$ and (b), and $L^1$ or $L^2$ and (a), bond directly or through a divalent linking group; l, n, r, t, u and v represent an integer of 1 to 1,000; m and s represent an integer of 1 to 10; and p, q, l' and n' represent an integer of 0 to 1,000; in which p and q do not simultaneously represent 0.

14 Claims, 1 Drawing Sheet

(51) Int. Cl.

| | |
|---|---|
| ***C08G 65/22*** | (2006.01) |
| ***C08L 65/00*** | (2006.01) |
| ***H01L 51/42*** | (2006.01) |
| ***C08G 61/02*** | (2006.01) |
| ***C09D 165/00*** | (2006.01) |
| ***B82Y 10/00*** | (2011.01) |

(52) U.S. Cl.

CPC .......... *C08G 61/12* (2013.01); *C08G 61/123* (2013.01); *C08G 61/124* (2013.01); *C08G 61/126* (2013.01); *C08G 65/22* (2013.01); *C08L 65/00* (2013.01); *C09D 165/00* (2013.01); *H01L 51/0036* (2013.01); *H01L 51/0047* (2013.01); *H01L 51/0094* (2013.01); *H01L 51/42* (2013.01); *C08G 2261/124* (2013.01); *C08G 2261/1412* (2013.01); *C08G 2261/1424* (2013.01); *C08G 2261/1452* (2013.01); *C08G 2261/314* (2013.01); *C08G 2261/3223* (2013.01); *C08G 2261/3243* (2013.01); *C08G 2261/3246* (2013.01); *C08G 2261/344* (2013.01); *C08G 2261/91* (2013.01); *H01L 51/4253* (2013.01); *Y02E 10/549* (2013.01); *Y02P 70/521* (2015.11)

(56) References Cited

U.S. PATENT DOCUMENTS

| | | | | |
|---|---|---|---|---|
| 2011/0028644 | A1 | 2/2011 | Brown et al. | |
| 2012/0227812 | A1* | 9/2012 | Quinn ................ | H01L 51/0036 136/263 |

FOREIGN PATENT DOCUMENTS

| | | | |
|---|---|---|---|
| JP | 2012-233072 | A | 11/2012 |
| JP | 2013-57007 | A | 3/2013 |
| WO | 03/075364 | A1 | 9/2003 |
| WO | 2009/098250 | A1 | 8/2009 |
| WO | 2011/069554 | A1 | 6/2011 |
| WO | 2011/153694 | A1 | 12/2011 |
| WO | 2012/031403 | A1 | 3/2012 |
| WO | 2012/099000 | A1 | 7/2012 |
| WO | 2013/094456 | A1 | 6/2013 |
| WO | 2013/116643 | A1 | 8/2013 |

OTHER PUBLICATIONS

Johannes Frisch, et al., "Full electronic structure across a polymer heterojunction solar cell", Journal of Materials Chemistry, Jan. 3, 2012, pp. 4418-4424, vol. 22, issue 10.

Michael Sommer, et al., "Donor-acceptor block copolymers for photovoltaic applications", Journal of Materials Chemistry, Sep. 2, 2010, pp. 10788-10797, vol. 20, issue 48.

International Search Report for PCT/JP2013/053294 dated May 21, 2013 [PCT/ISA/210].

Communication dated May 12, 2015 from the Japanese Patent Office in counterpart application No. 2012-033425.

"Preparation and Properties of Polythiophene with Phenylacetylene Substituent", The Society of Polymer Science, May 2001, vol. 58, No. 5, pp. 221-226.

* cited by examiner

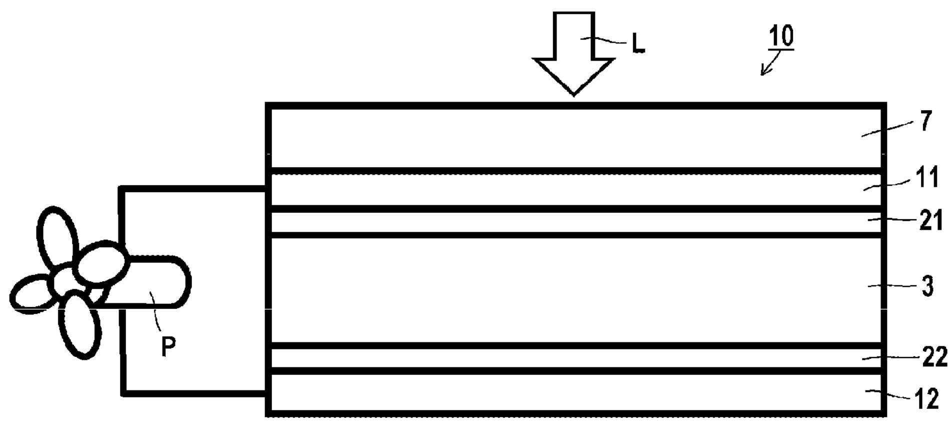
L
10
7
11
21
3
22
12
P

ORGANIC PHOTOELECTRIC CONVERSION ELEMENT COMPOSITION, THIN FILM AND PHOTOVOLTAIC CELL EACH CONTAINING THE SAME, ORGANIC SEMICONDUCTOR POLYMER AND COMPOUND EACH FOR USE IN THESE, AND METHOD OF PRODUCING THE POLYMER

CROSS-REFERENCE TO RELATED APPLICATIONS

This application is a Continuation of PCT International Application No. PCT/JP2013/053294 filed on Feb. 12, 2013, which claims priority under 35 U.S.C §119(a) to Japanese Patent Application No. 2012-033425 filed on Feb. 17, 2012. Each of the above applications is hereby expressly incorporated by reference, in its entirety, into the present application.

TECHNICAL FIELD

The present invention relates to an organic photoelectric conversion element composition, a thin film and a photovoltaic cell each containing the same, an organic semiconductor polymer and a compound each for use in these, and a method of producing the polymer.

BACKGROUND ART

Organic semiconductor polymers have been a subject of active research in the field of organic electronics in recent years. For example, the polymers are used in organic electroluminescent elements that emit light when electricity is applied to, organic photoelectric conversion elements that generate power when irradiated with light, organic thin film transistor elements that control the amount of current or the amount of voltage. In such an element, as is the case with inorganic semiconductor material, use is made of an organic semiconductor material obtained by combining a p-type conductive semiconductor material, which is an electron donating material, and an n-type conductive semiconductor material, which is an electron accepting material.

In recent years, since fossil energy of petroleum and the like emit carbon dioxide to the atmosphere, there is an increasing demand of solar cells for the purpose of global environment preservation with the suppression of global warming. Known examples of organic solar cells that use organic photoelectric conversion elements include a wet type dye-sensitized solar cell (Grätzel cell) and a total solid type organic photovoltaic cell. Since the latter does not use any electrolyte liquid, there is no need to take into account evaporation of this electrolyte liquid or liquid leakage, the solar cell can be made flexible, and the structure of the solar cell or production thereof is more convenient than that of the former.

However, photoelectric conversion efficiency and durability of the organic photovoltaic cell are still insufficient. The photoelectric conversion efficiency is calculated according to an expression: short circuit current density (Jsc)×open circuit voltage (Voc)×fill factor (FF). The short circuit current density is improved by using an organic semiconductor material (for example, a donor-acceptor type thiophene derivative copolymer), which has absorption in a wide range from visible light to near-infrared light and which has high carrier mobility. The open circuit voltage is reputedly related to a difference between a HOMO level of the p-type conductive semiconductor material and a LUMO level of the n-type conductive semiconductor material, and if the difference is increased, the open circuit voltage is improved. More specifically, development of a p-type polymer having a deep HOMO and a narrow band gap has been desired, in order to achieve high photoelectric conversion efficiency.

Moreover, controlling of phase separation structure between a p-type organic semiconductor and an n-type organic semiconductor is also important, in order to enhance the photoelectric conversion efficiency. The current mainstream is bulk-heterostructure formed by applying a mixed solution of a p-type organic semiconductor and a n-type organic semiconductor, to allow to cause microphase separation comprising an electron donating phase and an electron accepting phase, due to self-organization. In this structure, the contact area of the interface between the p-type organic semiconductor and the n-type organic semiconductor becomes large, to give efficient charge separation. However, the p-type organic semiconductor and the n-type organic semiconductor are not linked by a chemical bond, and therefore there is a problem of stability of phase separation structure, or durability (thermal durability). In order to stabilize the phase separation structure, proposals have been made on a method of crosslinking a p-type organic semiconductor polymer having a polymerizable group, by light or heat (see Patent Literature 1), or formation of a block polymer of a p-type organic semiconductor and an n-type organic semiconductor (see Patent Literature 2). However, these examples employed a homopolymer, such as poly(alkylthiophene) (PAT) and poly(phenylenevinylene) (PPV), as the p-type organic semiconductor, and therefore absorption is in a shorter wavelength range and the photoelectric conversion efficiency is low. More specifically, there are demands for development of an organic semiconductor which has absorption in a longer wavelength range and which has high durability.

CITATION LIST

Patent Literatures

Patent Literature 1: JP-A-2011-35243 ("JP-A" means unexamined published Japanese patent application)
Patent Literature 2: WO 03/075364A1

SUMMARY OF THE INVENTION

Technical Problem

Under the above-described situation, the present inventors found that, when satisfaction of both photoelectric conversion efficiency and thermal durability is taken into consideration, in a microphaseseparation structure, a linking form and a linking method of a polymer unit including a molecular structure that has electron donating property and a (polymer) unit including a molecular structure that has electron accepting property are important.

More specifically, by linking a group of a p-type organic semiconductor and a group of an n-type organic semiconductor via a chemical bond, it becomes possible to efficiently arrange both units closer, to achieve a large contact area of the interface between the p-type semiconductor and the n-type semiconductor, and to achieve efficient charge separation. Further, the present inventors found that, by employing a donor/acceptor type copolymer as a p-type organic semiconductor, it becomes possible to realize absorption in a longer wavelength and to achieve high cell characteristics, such as excellent photoelectric conversion efficiency.

Moreover, a group of the p-type organic semiconductor is linked to a group of the n-type organic semiconductor by a chemical bond, and therefore the phase separation structure between the p-type organic semiconductor and the n-type organic semiconductor is stable, to enable achievement of high durability, thus realizing both high photoelectric conversion efficiency and high thermal durability.

Accordingly, the present invention is contemplated for providing an organic photoelectric conversion element composition, which is prepared by using a p-type organic semiconductor polymer having absorption in a longer wavelength, and which is to link a group of the p-type organic semiconductor to a group of the n-type organic semiconductor, thereby to remarkably improve stability of the resultant phase separation structure and to suppress change in the resultant phase separation state, and which is more excellent in photoelectric conversion efficiency and thermal durability than ever before. The present invention is also contemplated for providing a thin film and a photovoltaic cell each containing the organic photoelectric conversion element composition, an organic semiconductor polymer and a compound for use in these, and a method of producing the polymer.

Solution to Problem

The above-mentioned tasks can be achieved by the following means:

(1) An organic photoelectric conversion element composition, comprising at least one p-type-and-n-type linked organic semiconductor polymer represented by any one of formulas (1) to (5):

(1)

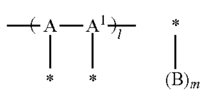

(2)

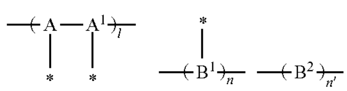

(b)

(3)

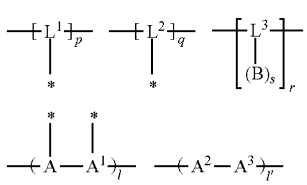

(a)

(4)

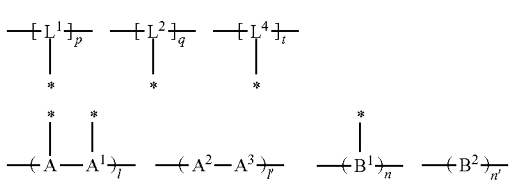

(a) (b)

(5)

wherein, in formulas (1) to (5), A, $A^1$, $A^2$, $A^3$ and $A^4$ each independently represents a group of a p-type organic semiconductor unit, and B, $B^1$, $B^2$ and $B^3$ each independently represents a group of an n-type organic semiconductor unit, in which A and $A^1$ in formulas (1) to (4) each independently represents a group of a p-type organic semiconductor different in structure from the other, and in which $A^4$'s in formula (5) each independently represents a group of two or more different p-type organic semiconductors;

$L^1$ to $L^4$ each independently represents a divalent or trivalent linking group containing no p-type organic semiconductor unit or no n-type semiconductor unit;

at least one bonding hand represented by symbols -* in A and $A^1$ in formulas (1) and (2) bonds, directly or through a divalent linking group, with a bonding hand represented by a symbol -* in B in formula (1), or with at least one bonding hand represented by symbols -* in $B^1$ in formula (2), and the remaining non-bonded bonding hands -* each bonds with a hydrogen atom or a monovalent substituent; at least one bonding hand represented by symbols -* in $L^1$ and $L^2$ in formulas (3) and (4) bonds, in each formula, directly or through a divalent linking group, with at least one bonding hand represented by symbols -* in A or $A^1$ in (a), and the remaining non-bonded bonding hand -* bonds with a hydrogen atom or a monovalent substituent; in formula (4), at least one bonding hand represented by symbols -* in $L^4$ bonds, directly or through a divalent linking group, with at least one bonding hand represented by symbols -* in $B^1$ in (b), and the remaining non-bonded bonding hand -* bonds with a hydrogen atom or a monovalent substituent; at least one bonding hand represented by symbols -* in $A^4$ in formula (5) bonds, directly or through a divalent linking group, with at least one bonding hand represented by symbols -* in $B^3$, and the remaining non-bonded bonding hand -* bonds with a hydrogen atom or a monovalent substituent;

l, n, r, t, u and v each independently represents an integer of 1 to 1,000; m and s each independently represents an integer of 1 to 10; and p, q, l' and n' each independently represents an integer of 0 to 1,000; in which p and q do not simultaneously represent 0;

in formulas (1) to (5), the bonding terminals represented by bonding hands—are each independently bonded with a hydrogen atom or a monovalent substituent.

(2) The organic photoelectric conversion element composition according to (1), wherein the p-type-and-n-type linked organic semiconductor polymer represented by any one of formulas (1) to (5) is synthesized from a corresponding combination of compounds selected from among [A] to [E]:

[A]

(1a)

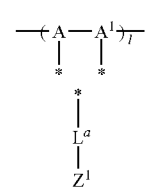

(1b)

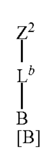

[B]

-continued (1a)

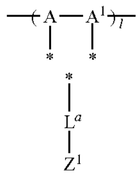

(2b)

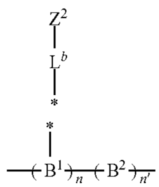

[C]

(ab)

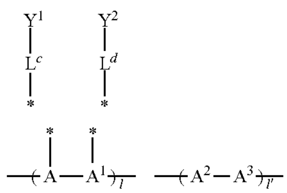

(bb)

[D]

(ab)

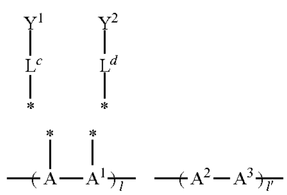

(4b)

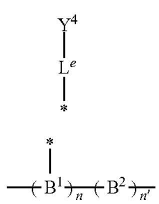

[E]

(5a)

$$Z^{1a}—L^{f}—(A^{4})_{u}—L^{g}—Z^{1b}$$

(5b)

$$Z^{2a}—L^{h}—(B^{3})_{v}—L^{i}—Z^{2b}$$

wherein, [A] is a combination of a compound represented by formula (1a) and a compound represented by formula (1b), [B] is a combination of a compound represented by formula (1a) and a compound represented by formula (2b), [C] is a combination of a compound represented by formula (ab) and a compound represented by formula (bb), [D] is a combination of a compound represented by formula (ab) and a compound represented by formula (4b), and [E] is a combination of a compound represented by formula (5a) and a compound represented by formula (5b);

in the compound represented by formula (1a) in [A] and [B], at least one bonding hand -* in A and $A^1$ bonds with a * part in *-$L^a$-$Z^1$, and when non-bonded therewith, bonds with a hydrogen atom or a monovalent substituent; in the compound represented by formula (2b) in [B], any one of bonding hands -* in n pieces of $B^1$ bonds with a * part in *-$L^b$-$Z^2$, and when non-bonded therewith, bonds with a hydrogen atom or a monovalent substituent; in the compound represented by formula (ab) in [C] and [D], at least one bonding hand -* in A and $A^1$ bonds with a * part in *-$L^c$-$Y^1$ or a * part in *-$L^d$-$Y^2$, and when non-bonded therewith, bonds with a hydrogen atom or a monovalent substituent; in the compound represented by formula (4b) in [D], any one of bonding hands -* in n pieces of $B^1$ bonds with a * part in *-$L^e$-$Y^4$, and when non-bonded therewith, bonds with a hydrogen atom or a monovalent substituent;

in formulas, A, $A^1$ to $A^4$, B, $B^1$ to $B^3$, l, l', n, n', s, u and v have the same meanings as A, $A^1$ to $A^4$, B, $B^1$ to $B^3$, l, l', n, n', s, u and v in formulas (1) to (5); $L^a$ to $L^1$ each independently represents a single bond or a divalent linking group;

$Z^1$ and $Z^2$ each independently represents a reactive functional group; $Z^{1a}$, $Z^{1b}$, $Z^{2a}$ and $Z^{2b}$ each independently represent a hydrogen atom or a substituent, and at least one of $Z^{1a}$ and $Z^{1b}$, and at least one of $Z^{2a}$ and $Z^{2b}$ each are a substituent that is a reactive functional group; $Y^1$ to $Y^4$ each independently represents a polymerizable group;

$Z^1$ and $Z^2$ each represents a reactive functional group necessary for $Z^1$ and $Z^2$ to react to form a linkage between these, and a partial structure of $Y^1$ forms $L^1$, a partial structure of $Y^2$ forms $L^2$, a partial structure of $Y^3$ forms $L^3$, and a partial structure of $Y^4$ forms $L^4$; $Z^{1a}$ or $Z^{1b}$ is a reactive functional group necessary for $Z^{1a}$ or $Z^{1b}$ to react with $Z^{2a}$ or $Z^{2b}$ to form a linkage between these;

in formulas (1a), (2b), (ab) and (4b), bonding terminals on each side are each independently bonded with a hydrogen atom or a monovalent substituent.

(3) An organic photoelectric conversion element composition, comprising compounds in any one of combinations [A] to [E]:

[A]

(1a)

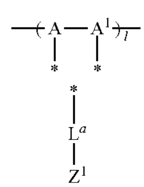

(1b)

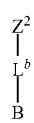

[B]

(1a)

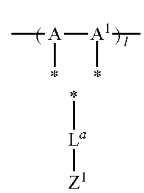

-continued (2b)

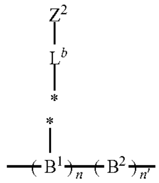

[C]

(ab)

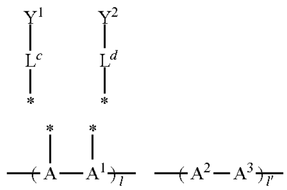

(bb)

[D]

(ab)

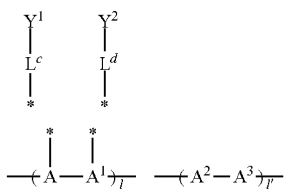

(4b)

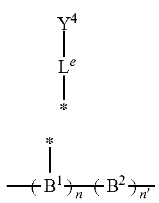

[E]

(5a)

$$Z^{1a}-L^{f}\text{-}(A^{4})_{u}\text{-}L^{g}-Z^{1b}$$

(5b)

$$Z^{2a}-L^{h}\text{-}(B^{3})_{v}\text{-}L^{i}-Z^{2b}$$

wherein, [A] is a combination of a compound represented by formula (1a) and a compound represented by formula (1b), [B] is a combination of a compound represented by formula (1a) and a compound represented by formula (2b), [C] is a combination of a compound represented by formula (ab) and a compound represented by formula (bb), [D] is a combination of a compound represented by formula (ab) and a compound represented by formula (4b), and [E] is a combination of a compound represented by formula (5a) and a compound represented by formula (5b);

in the compound represented by formula (1a) in [A] and [B], at least one bonding hand -* in A and $A^1$ bonds with a * part in *-$L^a$-$Z^1$, and when non-bonded therewith, bonds with a hydrogen atom or a monovalent substituent; in the compound represented by formula (2b) in [B], any one of bonding hands -* in n pieces of $B^1$ bonds with a * part in *-$L^b$-$Z^2$, and when non-bonded therewith, bonds with a hydrogen atom or a monovalent substituent; in the compound represented by formula (ab) in [C] and [D], at least one bonding hand -* in A and $A^1$ bonds with a * part in *-$L^c$-$Y^1$ or a * part in *-$L^d$-$Y^2$, and when non-bonded therewith, bonds with a hydrogen atom or a monovalent substituent; in the compound represented by formula (4b) in [D], any one of bonding hands -* in n pieces of $B^1$ bonds with a * part in *-$L^e$-$Y^4$, and when non-bonded therewith, bonds with a hydrogen atom or a monovalent substituent;

in formulas, A, $A^1$ to $A^4$, B, $B^1$ to $B^3$, l, l', n, n', s, u and v have the same meanings as A, $A^1$ to $A^4$, B, $B^1$ to $B^3$, l, l', n, n', s, u and v in formulas (1) to (5); $L^a$ to $L^i$ each independently represents a single bond or a divalent linking group;

$Z^1$ and $Z^2$ each independently represents a reactive functional group; $Z^{1a}$, $Z^{1b}$, $Z^{2a}$ and $Z^{2b}$ each independently represent a hydrogen atom or a substituent, and at least one of $Z^{1a}$ and $Z^{1b}$, and at least one of $Z^{2a}$ and $Z^{2b}$ each are a substituent that is a reactive functional group; $Y^1$ to $Y^4$ each independently represents a polymerizable group;

$Z^1$ and $Z^2$ each represents a reactive functional group necessary for $Z^1$ and $Z^2$ to react to form a linkage between these, and a partial structure of $Y^1$ forms $L^1$, a partial structure of $Y^2$ forms $L^2$, a partial structure of $Y^3$ forms $L^3$, and a partial structure of $Y^4$ forms $L^4$; $Z^{1a}$ or $Z^{1b}$ is a reactive functional group necessary for $Z^{1a}$ or $Z^{1b}$ to react with $Z^{2a}$ or $Z^{2b}$ to form a linkage between these;

in formulas (1a), (2b), (ab) and (4b), bonding terminals on each side are each independently bonded with a hydrogen atom or a monovalent substituent.

(4) An organic photoelectric conversion element composition, comprising at least one compound represented by any one of formulas (1a), (ab) and (5a):

(1a)

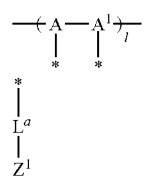

(ab)

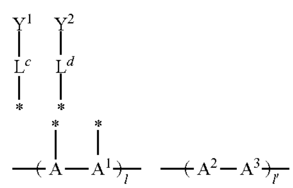

(5a)

$$Z^{1a}-L^{f}\text{-}(A^{4})_{u}\text{-}L^{g}-Z^{1b}$$

wherein, in formulas (1a), (ab) and (5a), A, $A^1$ to $A^4$, l, l' and u have the same meanings as A, $A^1$ to $A^4$, l, l' and u in formulas (1) to (5);

$L^a$, $L^c$, $L^d$, $L^f$ and $L^g$ each independently represents a single bond or a divalent linking group; $Z^1$ represents a reactive functional group; $Z^{1a}$ and $Z^{1b}$ each independently represents a hydrogen atom or a substituent, and at least one of $Z^{1a}$ and $Z^{1b}$ is a substituent that is a reactive functional group; $Y^1$ and $Y^2$ each independently represents a polymerizable group;

in the compound represented by formula (1a), at least one bonding hand -* in A and $A^1$ bonds with a * part in *-$L^a$-$Z^1$, and when non-bonded therewith, bonds with a hydrogen atom or a monovalent substituent; in the compound represented by formula (ab), at least one bonding hand -* in A and $A^1$ bonds with a * part in *-$L^c$-$Y^1$ or a * part in *-$L^d$-$Y^2$, and when non-bonded therewith, bonds with a hydrogen atom or a monovalent substituent;

in formulas (1a) and (ab), bonding terminals on each side are each independently bonded with a hydrogen atom or a monovalent substituent.

(5) The organic photoelectric conversion element composition according to (4), comprising either formula (ab) or (5a).

(6) The organic photoelectric conversion element composition according to any one of (1) to (3), wherein the group of the n-type organic semiconductor unit is a group having fullerene structure, a nitrogen-containing heterocyclic group, or an aromatic group having at least one electron-withdrawing group.

(7) The organic photoelectric conversion element composition according to any one of (1) to (6), wherein the group of the p-type organic semiconductor unit is a heterocyclic group having at least one atom among sulfur, nitrogen, oxygen, silicon, boron, selenium, tellurium, and phosphorus as a ring-constituting atom.

(8) The organic photoelectric conversion element composition according to any one of (1) to (7), wherein the group of the p-type organic semiconductor unit is selected from among the following heterocyclic groups:

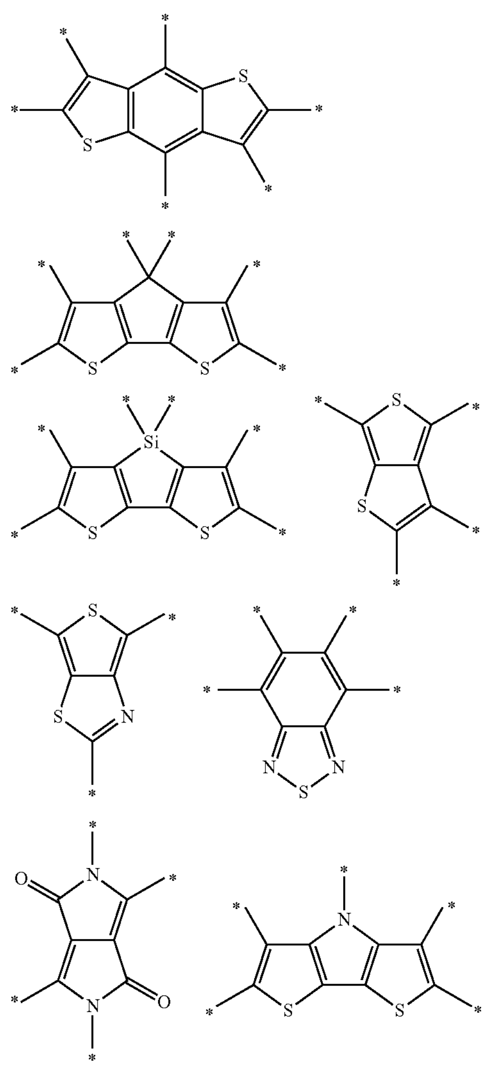

-continued

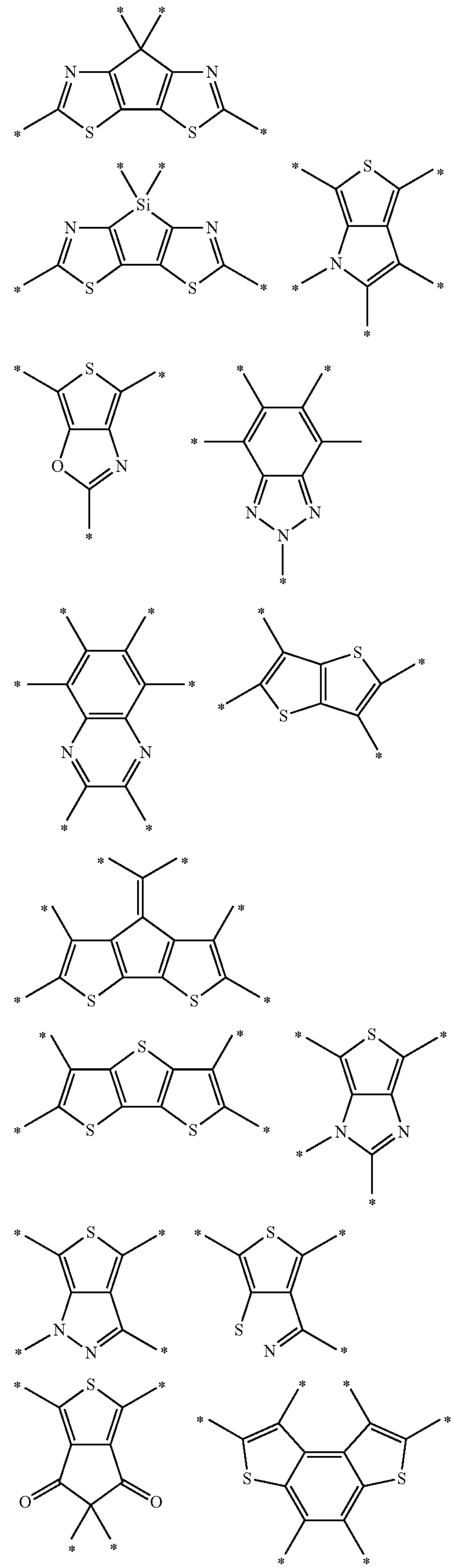

-continued
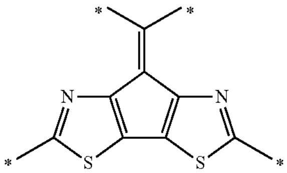
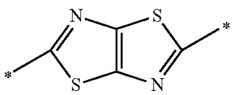
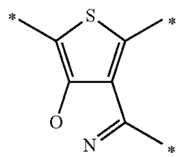
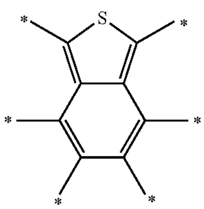
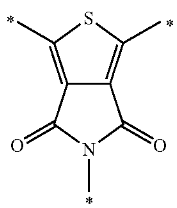
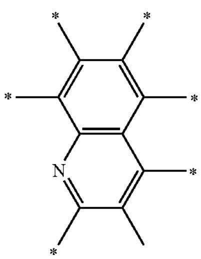
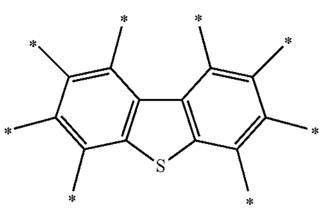
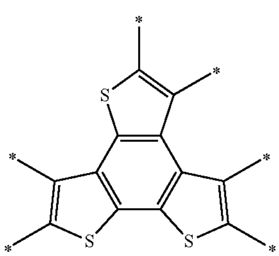
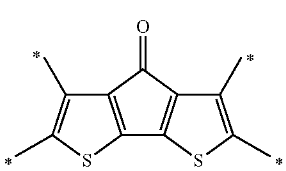
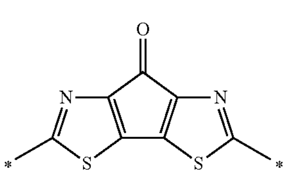
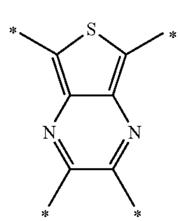
-continued
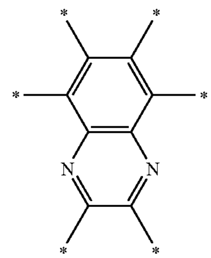
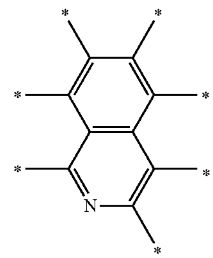
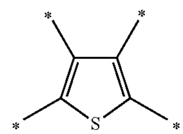
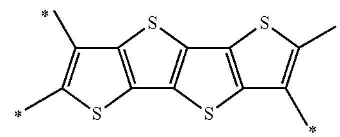
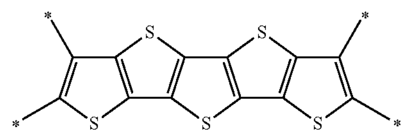
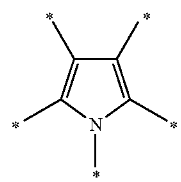
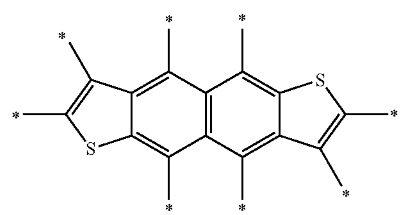
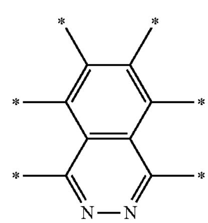
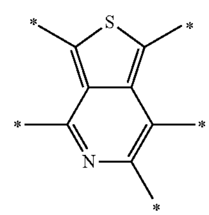
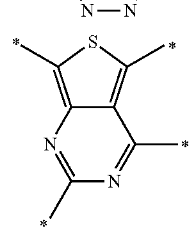
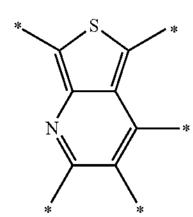
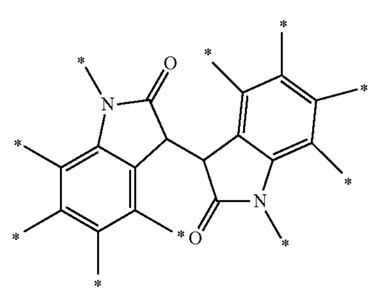

-continued

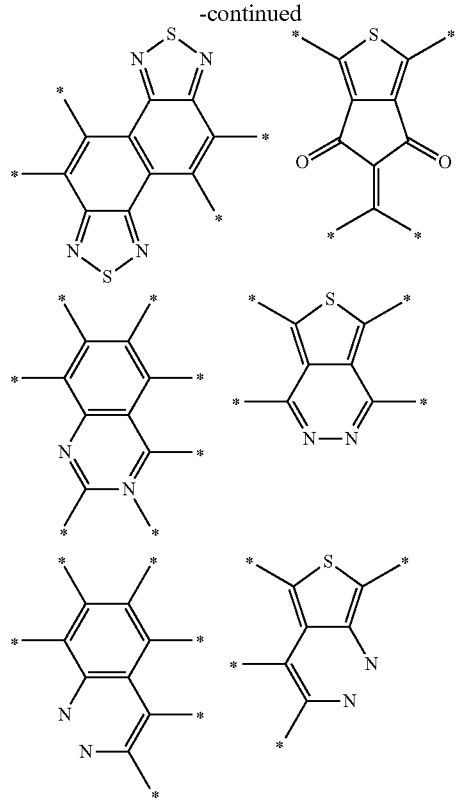

wherein, in the formulas, a bonding hand represented by a symbol * represents a linking site with a polymer main chain, a polymer side chain, a single bond or a divalent linking group; when the group forms the polymer main chain, at least two bonding hands thereof are used for forming the polymer main chain, and the remaining bonding hand(s) is bonded with a divalent linking group, a hydrogen atom, or a substituent; and when the bonding hands are used for forming the polymer main chain, each of the bonding hands is at a position where the polymer main chain conjugates.

(9) A thin film, comprising the organic photoelectric conversion element composition according to any one of (1) to (8).

(10) A photovoltaic cell, comprising a layer composed of the organic photoelectric conversion element composition according to any one of (1) to (8), between a first electrode and a second electrode.

(11) A p-type-and-n-type linked organic semiconductor polymer, which is represented by any one of formulas (1) to (5):

(1)

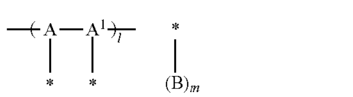

(2)

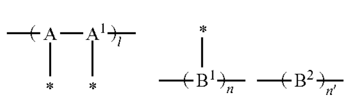

(b)

-continued (3)

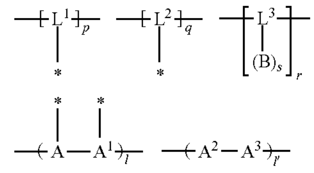

(a)

(4)

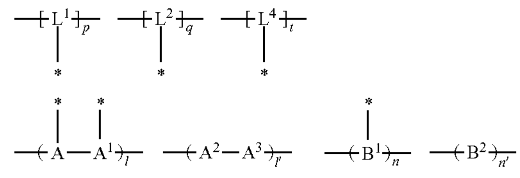

(a) (b)

(5)

wherein, in formulas (1) to (5), A, $A^1$, $A^2$, $A^3$ and $A^4$ each independently represents a group of a p-type organic semiconductor unit, and B, $B^1$, $B^2$ and $B^3$ each independently represents a group of an n-type organic semiconductor unit, in which A and $A^1$ in formulas (1) to (4) each independently represents a group of a p-type organic semiconductor different in structure from the other, and in which $A^4$'s in formula (5) each independently represents a group of two or more different p-type organic semiconductors;

$L^1$ to $L^4$ each independently represents a divalent or trivalent linking group containing no p-type organic semiconductor unit or no n-type semiconductor unit;

at least one bonding hand represented by symbols -* in A and $A^1$ in formulas (1) and (2) bonds, directly or through a divalent linking group, with a bonding hand represented by a symbol -* in B in formula (1), or with at least one bonding hand represented by symbols -* in $B^1$ in formula (2), and the remaining non-bonded bonding hands -* each bonds with a hydrogen atom or a monovalent substituent; at least one bonding hand represented by symbols -* in $L^1$ and $L^2$ in formulas (3) and (4) bonds, in each formula, directly or through a divalent linking group, with at least one bonding hand represented by symbols -* in A or $A^1$ in (a), and the remaining non-bonded bonding hand -* bonds with a hydrogen atom or a monovalent substituent; in formula (4), at least one bonding hand represented by symbols -* in $L^4$ bonds, directly or through a divalent linking group, with at least one bonding hand represented by symbols -* in $B^1$ in (b), and the remaining non-bonded bonding hand -* bonds with a hydrogen atom or a monovalent substituent; at least one bonding hand represented by symbols -* in $A^4$ in formula (5) bonds, directly or through a divalent linking group, with at least one bonding hand represented by symbols -* in $B^3$, and the remaining non-bonded bonding hand -* bonds with a hydrogen atom or a monovalent substituent;

l, n, r, t, u and v each independently represents an integer of 1 to 1,000; m and s each independently represents an integer of 1 to 10; and p, q, l' and n' each independently represents an integer of 0 to 1,000; in which p and q do not simultaneously represent 0;

in formulas (1) to (5), the bonding terminals represented by bonding hands—are each independently bonded with a hydrogen atom or a monovalent substituent.

(12) The p-type-and-n-type linked organic semiconductor polymer according to (11), wherein the p-type-and-n-type linked organic semiconductor polymer represented by any one of formulas (1) to (5) is synthesized from a corresponding combination of compounds selected from among [A] to [E]:

[A]

(1a)

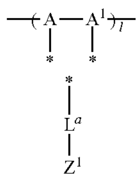

(1b)

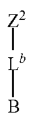

[B]

(1a)

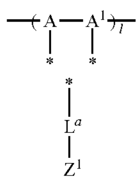

(2b)

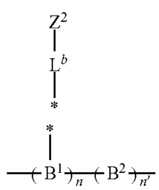

[C]

(ab)

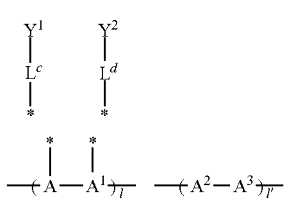

(bb)

[D]

(ab)

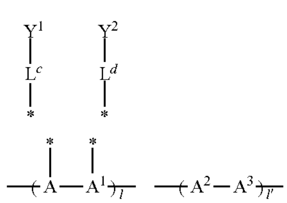

-continued (4b)

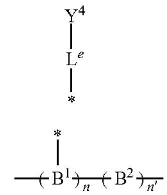

[E]

(5a)

$$Z^{1a}—L^f—(A^4)_u—L^g—Z^{1b}$$

(5b)

$$Z^{2a}—L^h—(B^3)_v—L^i—Z^{2b}$$

wherein, [A] is a combination of a compound represented by formula (1a) and a compound represented by formula (1b), [B] is a combination of a compound represented by formula (1a) and a compound represented by formula (2b), [C] is a combination of a compound represented by formula (ab) and a compound represented by formula (bb), [D] is a combination of a compound represented by formula (ab) and a compound represented by formula (4b), and [E] is a combination of a compound represented by formula (5a) and a compound represented by formula (5b);

in the compound represented by formula (1a) in [A] and [B], at least one bonding hand -* in A and $A^1$ bonds with a * part in *-$L^a$-$Z^1$, and when non-bonded therewith, bonds with a hydrogen atom or a monovalent substituent; in the compound represented by formula (2b) in [B], any one of bonding hands -* in n pieces of $B^1$ bonds with a * part in *-$L^b$-$Z^2$, and when non-bonded therewith, bonds with a hydrogen atom or a monovalent substituent; in the compound represented by formula (ab) in [C] and [D], at least one bonding hand -* in A and $A^1$ bonds with a * part in *-$L^c$-$Y^1$ or a * part in *-$L^d$-$Y^2$, and when non-bonded therewith, bonds with a hydrogen atom or a monovalent substituent; in the compound represented by formula (4b) in [D], any one of bonding hands -* in n pieces of $B^1$ bonds with a * part in *-$L^e$-$Y^4$, and when non-bonded therewith, bonds with a hydrogen atom or a monovalent substituent;

in formulas, A, $A^1$ to $A^4$, B, $B^1$ to $B^3$, l, l', n, n', s, u and v have the same meanings as A, $A^1$ to $A^4$, B, $B^1$ to $B^3$, l, l', n, n', s, u and v in formulas (1) to (5); $L^a$ to $L^i$ each independently represents a single bond or a divalent linking group;

$Z^1$ and $Z^2$ each independently represents a reactive functional group; $Z^{1a}$, $Z^{1b}$, $Z^{2a}$ and $Z^{2b}$ each independently represent a hydrogen atom or a substituent, and at least one of $Z^{1a}$ and $Z^{1b}$, and at least one of $Z^{2a}$ and $Z^{2b}$ each are a substituent that is a reactive functional group; $Y^1$ to $Y^4$ each independently represents a polymerizable group;

$Z^1$ and $Z^2$ each represents a reactive functional group necessary for $Z^1$ and $Z^2$ to react to form a linkage between these, and a partial structure of $Y^1$ forms $L^1$, a partial structure of $Y^2$ forms $L^2$, a partial structure of $Y^3$ forms $L^3$, and a partial structure of $Y^4$ forms $L^4$; $Z^{1a}$ or $Z^{1b}$ is a reactive functional group necessary for $Z^{1a}$ or $Z^{1b}$ to react with $Z^{2a}$ or $Z^{2b}$ to form a linkage between these;

in formulas (1a), (2b), (ab) and (4b), bonding terminals on each side are each independently bonded with a hydrogen atom or a monovalent substituent.

(13) The p-type-and-n-type linked organic semiconductor polymer according to (11) or (12), wherein the group of the n-type organic semiconductor unit is a group having fullerene structure, a nitrogen-containing heterocyclic group, or an aromatic group having at least one electron-withdrawing group.

(14) The p-type-and-n-type linked organic semiconductor polymer according to any one of (11) to (13), wherein the group of the p-type organic semiconductor unit is a heterocyclic group having at least one atom among sulfur, nitrogen, oxygen, silicon, boron, selenium, tellurium, and phosphorus as a ring-constituting atom.

(15) The p-type-and-n-type linked organic semiconductor polymer according to any one of (11) to (14), wherein the group of the p-type organic semiconductor unit is selected from among the following heterocyclic groups:

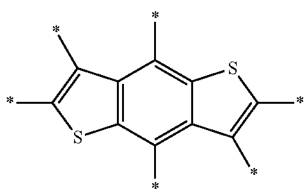

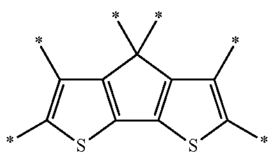

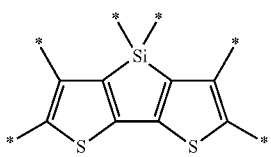

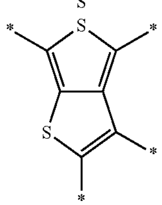

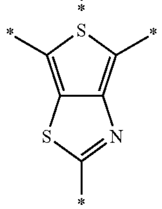

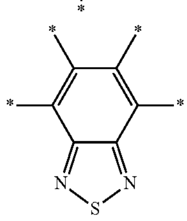

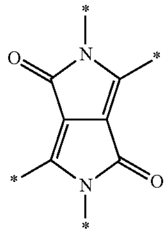

-continued

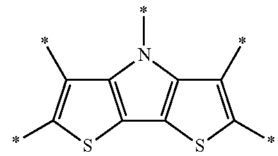

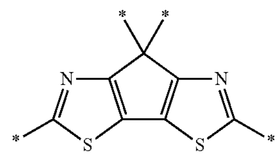

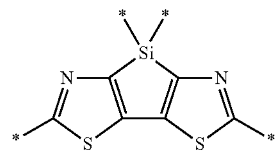

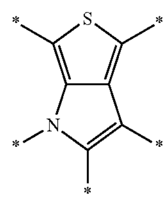

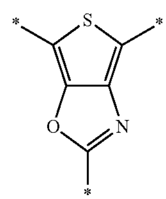

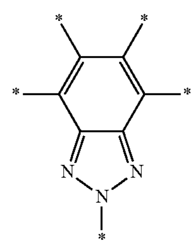

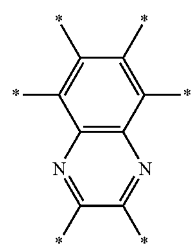

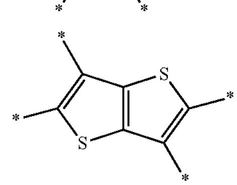

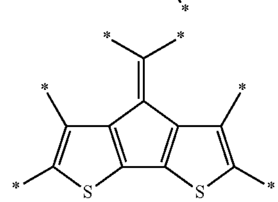

-continued
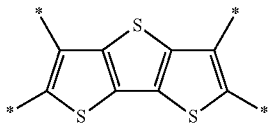
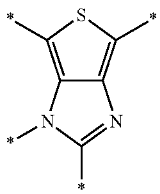
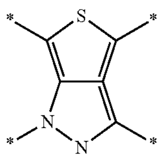
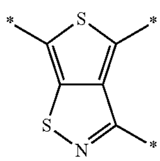
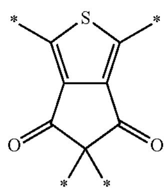
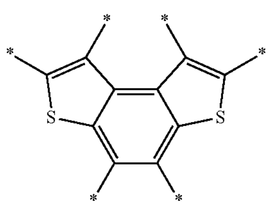
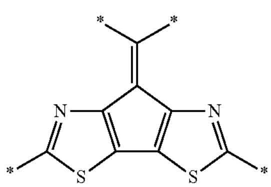
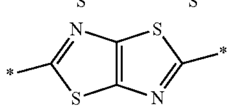
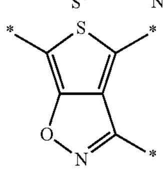
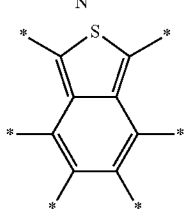
-continued
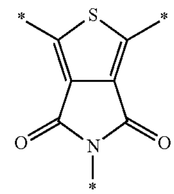
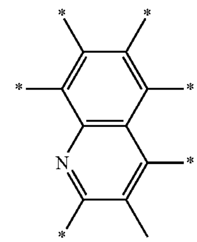
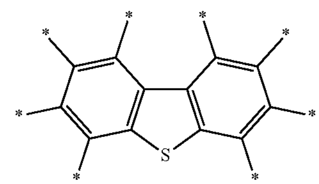
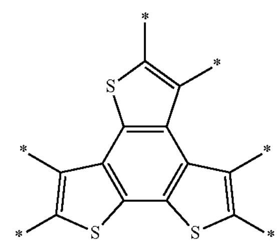
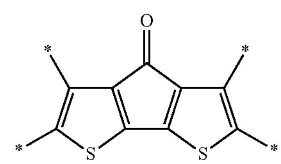
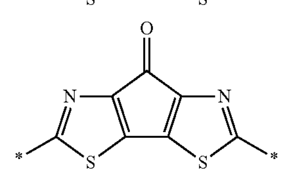
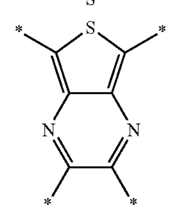
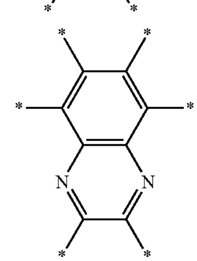

-continued

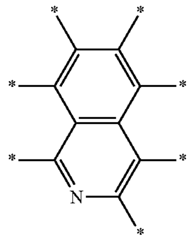

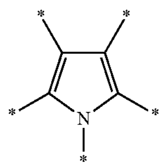

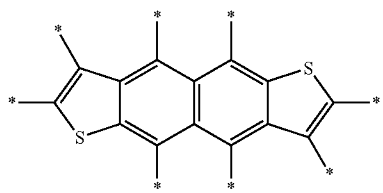

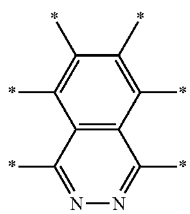

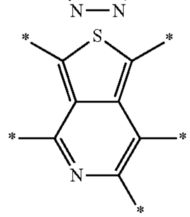

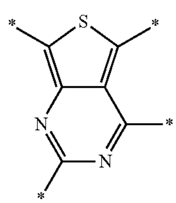

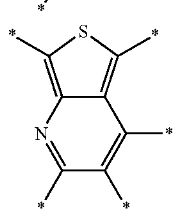

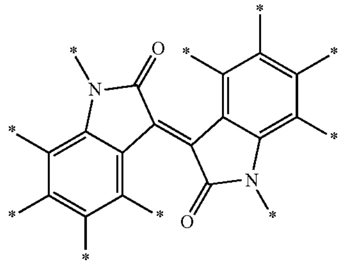

-continued

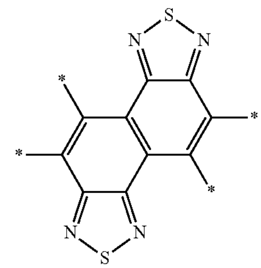

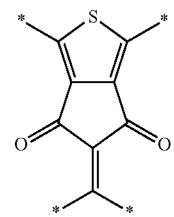

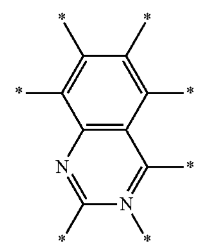

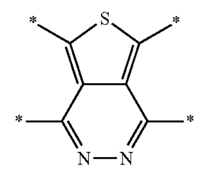

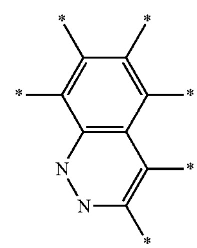

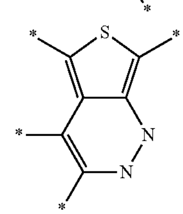

wherein, in the formulas, a bonding hand represented by a symbol * represents a linking site with a polymer main chain, a polymer side chain, a single bond or a divalent linking group; when the group forms the polymer main chain, at least two bonding hands thereof are used for forming the polymer main chain, and the remaining bonding hand(s) is bonded with a divalent linking group, a hydrogen atom, or a substituent; and when the bonding hands are used for forming the polymer main chain, each of the bonding hands is at a position where the polymer main chain conjugates.

(16) A compound, which is represented by formula (1a), (ab), or (5a):

(1a)

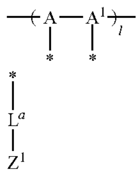

(ab)

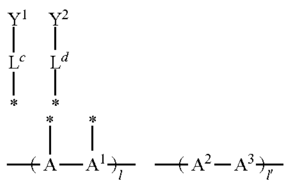

(5a)

$$Z^{1a}-L^{f}-(A^{4})_{u}-L^{g}-Z^{1b}$$

wherein, in formulas (1a), (ab) and (5a), A, $A^1$ to $A^4$, l, l' and u have the same meanings as A, $A^1$ to $A^4$, l, l' and u in formulas (1) to (5);

$L^a$, $L^c$, $L^d$, $L^f$ and $L^g$ each independently represents a single bond or a divalent linking group; $Z^1$ represents a reactive functional group; $Z^{1a}$ and $Z^{1b}$ each independently represents a hydrogen atom or a substituent, and at least one of $Z^{1a}$ and $Z^{1b}$ is a substituent that is a reactive functional group; $Y^1$ and $Y^2$ each independently represents a polymerizable group;

in the compound represented by formula (1a), at least one bonding hand -* in A and $A^1$ bonds with a * part in *-$L^a$-$Z^1$, and when non-bonded therewith, bonds with a hydrogen atom or a monovalent substituent; in the compound represented by formula (ab), at least one bonding hand -* in A and $A^1$ bonds with a * part in *-$L^c$-$Y^1$ or a * part in *-$L^d$-$Y^2$, and when non-bonded therewith, bonds with a hydrogen atom or a monovalent substituent;

in formulas (1a) and (ab), bonding terminals on each side are each independently bonded with a hydrogen atom or a monovalent substituent.

(17) The compound according to (16), wherein the group of the p-type organic semiconductor unit is a heterocyclic group having at least one atom among sulfur, nitrogen, oxygen, silicon, boron, selenium, tellurium, and phosphorus as ring-constituting atom.

(18) The compound according to (16) or (17), wherein the group of the p-type organic semiconductor unit is selected from among the following heterocyclic groups:

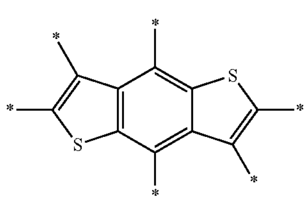

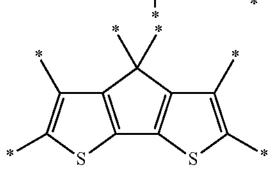

-continued

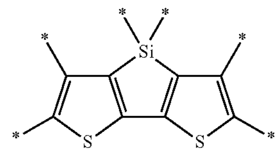

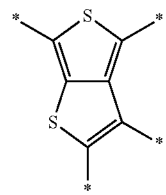

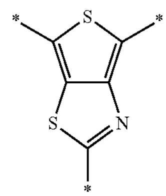

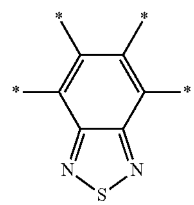

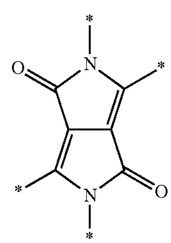

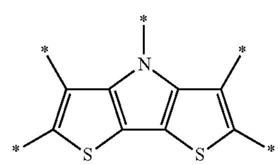

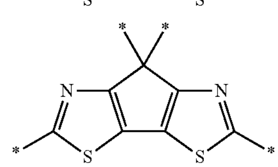

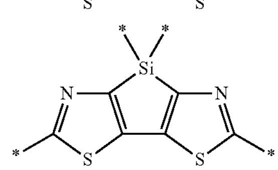

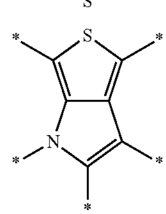

-continued
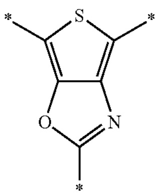
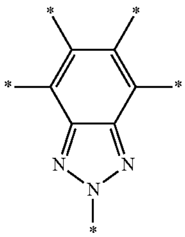
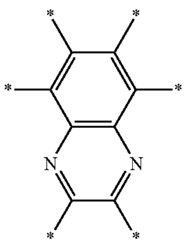
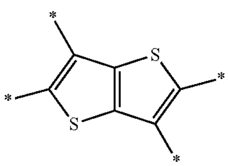
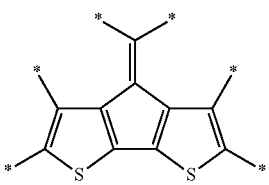
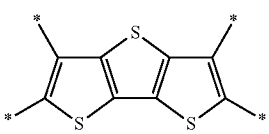
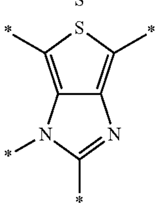
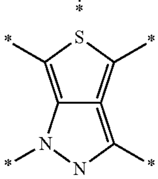
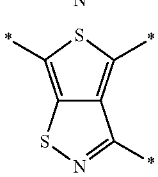
-continued
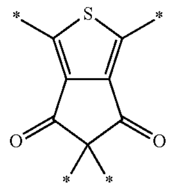
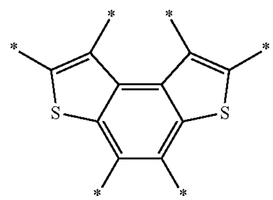
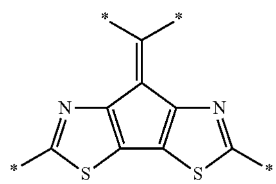
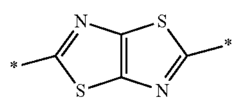
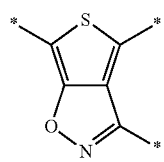
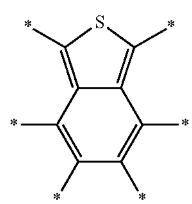
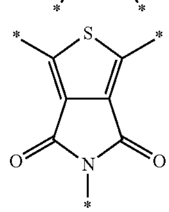
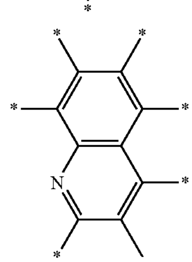
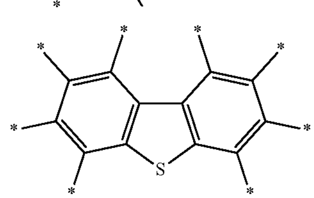

-continued
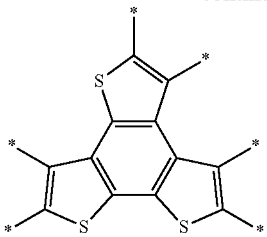
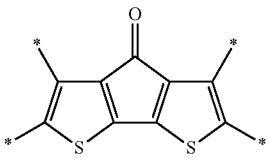
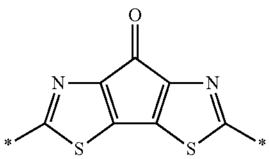
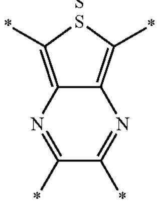
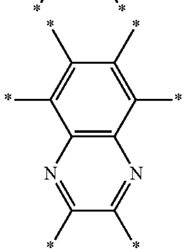
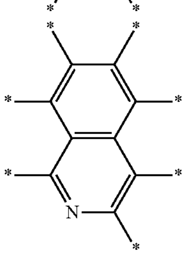
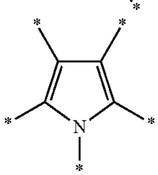
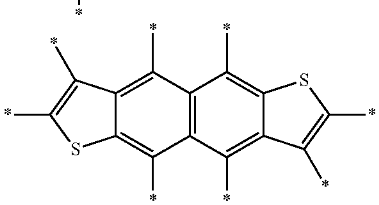
-continued
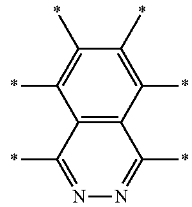
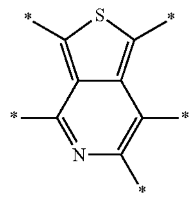
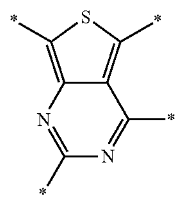
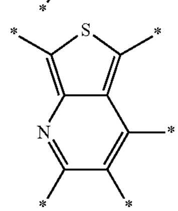
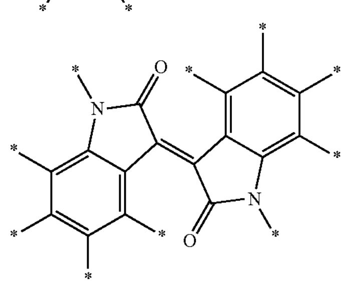
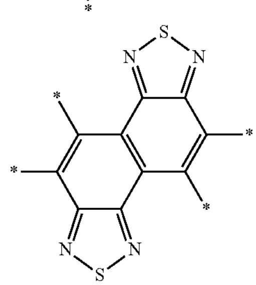
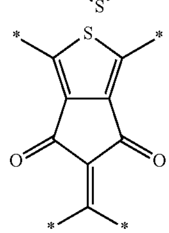

-continued

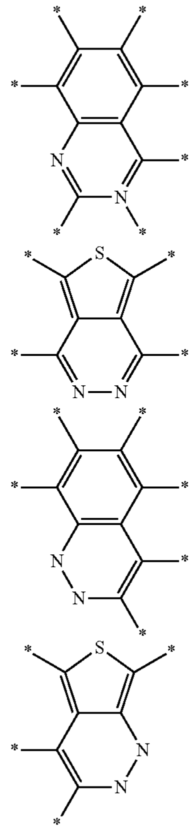

wherein, in the formulas, a bonding hand represented by a symbol * represents a linking site with a polymer main chain, a polymer side chain, a single bond or a divalent linking group; when the group forms the polymer main chain, at least two bonding hands thereof are used for forming the polymer main chain, and the remaining bonding hand(s) is bonded with a divalent linking group, a hydrogen atom, or a substituent; and when the bonding hands are used for forming the polymer main chain, each of the bonding hands is at a position where the polymer main chain conjugates.

(19) A method of preparing a polymer, comprising the step of:

conducting a reaction between a combination of compounds or polymers selected from among [A] to [E], to obtain a corresponding polymer represented by any one of formulas (1) to (5):

(1)

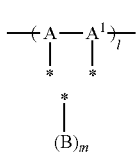

(2)

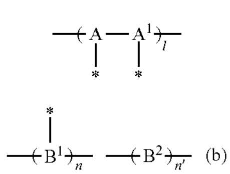

-continued (3)

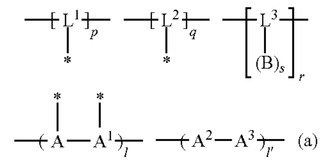

(4)

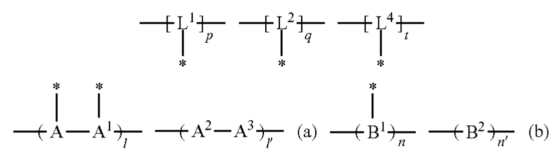

(5)

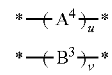

wherein, in formulas (1) to (5), A, $A^1$, $A^2$, $A^3$ and $A^4$ each independently represents a group of a p-type organic semiconductor unit, and B, $B^1$, $B^2$ and $B^3$ each independently represents a group of an n-type organic semiconductor unit, in which A and $A^1$ in formulas (1) to (4) each independently represents a group of a p-type organic semiconductor different in structure from the other, and in which $A^4$'s in formula (5) each independently represents a group of two or more different p-type organic semiconductors;

$L^1$ to $L^4$ each independently represents a divalent or trivalent linking group containing no p-type organic semiconductor unit or no n-type semiconductor unit;

at least one bonding hand represented by symbols -* in A and $A^1$ in formulas (1) and (2) bonds, directly or through a divalent linking group, with a bonding hand represented by a symbol -* in B in formula (1), or with at least one bonding hand represented by symbols -* in $B^1$ in formula (2), and the remaining non-bonded bonding hands -* each bonds with a hydrogen atom or a monovalent substituent; at least one bonding hand represented by symbols -* in $L^1$ and $L^2$ in formulas (3) and (4) bonds, in each formula, directly or through a divalent linking group, with at least one bonding hand represented by symbols -* in A or $A^1$ in (a), and the remaining non-bonded bonding hand -* bonds with a hydrogen atom or a monovalent substituent; in formula (4), at least one bonding hand represented by symbols -* in $L^4$ bonds, directly or through a divalent linking group, with at least one bonding hand represented by symbols -* in $B^1$ in (b), and the remaining non-bonded bonding hand -* bonds with a hydrogen atom or a monovalent substituent; at least one bonding hand represented by symbols -* in $A^4$ in formula (5) bonds, directly or through a divalent linking group, with at least one bonding hand represented by symbols -* in $B^3$, and the remaining non-bonded bonding hand -* bonds with a hydrogen atom or a monovalent substituent;

l, n, r, t, u and v each independently represents an integer of 1 to 1,000; m and s each independently represents an integer of 1 to 10; and p, q, l' and n' each independently represents an integer of 0 to 1,000; in which p and q do not simultaneously represent 0;

in formulas (1) to (5), the bonding terminals represented by bonding hands—are each independently bonded with a hydrogen atom or a monovalent substituent;

[A]

(1a)

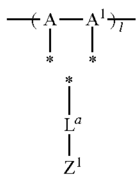

(1b)

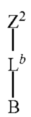

[B]

(1a)

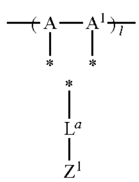

(2b)

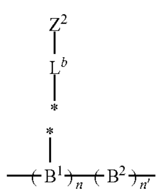

[C]

(ab)

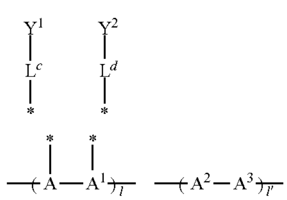

(bb)

[D]

(ab)

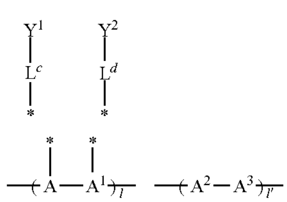

(4b)

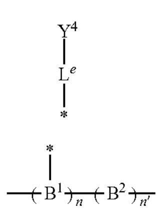

-continued

[E]

$$Z^{1a}-L^{f}-(A^{4})_{u}-L^{g}-Z^{1b} \quad (5a)$$

$$Z^{2a}-L^{h}-(B^{3})_{v}-L^{i}-Z^{2b} \quad (5b)$$

wherein, [A] is a combination of a compound represented by formula (1a) and a compound represented by formula (1b), [B] is a combination of a compound represented by formula (1a) and a compound represented by formula (2b), [C] is a combination of a compound represented by formula (ab) and a compound represented by formula (bb), [D] is a combination of a compound represented by formula (ab) and a compound represented by formula (4b), and [E] is a combination of a compound represented by formula (5a) and a compound represented by formula (5b);

in the compound represented by formula (1a) in [A] and [B], at least one bonding hand -* in A and $A^1$ bonds with a * part in *-$L^a$-$Z^1$, and when non-bonded therewith, bonds with a hydrogen atom or a monovalent substituent; in the compound represented by formula (2b) in [B], any one of bonding hands -* in n pieces of $B^1$ bonds with a * part in *-$L^b$-$Z^2$, and when non-bonded therewith, bonds with a hydrogen atom or a monovalent substituent; in the compound represented by formula (ab) in [C] and [D], at least one bonding hand -* in A and $A^1$ bonds with a * part in *-$L^c$-$Y^1$ or a * part in *-$L^d$-$Y^2$, and when non-bonded therewith, bonds with a hydrogen atom or a monovalent substituent; in the compound represented by formula (4b) in [D], any one of bonding hands -* in n pieces of $B^1$ bonds with a * part in *-$L^e$-$Y^4$, and when non-bonded therewith, bonds with a hydrogen atom or a monovalent substituent;

in formulas, A, $A^1$ to $A^4$, B, $B^1$ to $B^3$, l, l', n, n', s, u and v have the same meanings as A, $A^1$ to $A^4$, B, $B^1$ to $B^3$, l, l', n, n', s, u and v in formulas (1) to (5); $L^a$ to $L^i$ each independently represents a single bond or a divalent linking group;

$Z^1$ and $Z^2$ each independently represents a reactive functional group; $Z^{1a}$, $Z^{1b}$, $Z^{2a}$ and $Z^{2b}$ each independently represent a hydrogen atom or a substituent, and at least one of $Z^{1a}$ and $Z^{1b}$, and at least one of $Z^{2a}$ and $Z^{2b}$ each are a substituent that is a reactive functional group; $Y^1$ to $Y^4$ each independently represents a polymerizable group;

$Z^1$ and $Z^2$ each represents a reactive functional group necessary for $Z^1$ and $Z^2$ to react to form a linkage between these, and a partial structure of $Y^1$ forms $L^1$, a partial structure of $Y^2$ forms $L^2$, a partial structure of $Y^3$ forms $L^3$, and a partial structure of $Y^4$ forms $L^4$; $Z^{1a}$ or $Z^{1b}$ is a reactive functional group necessary for $Z^{1a}$ or $Z^{1b}$ to react with $Z^{2a}$ or $Z^{2b}$ to form a linkage between these;

in formulas (1a), (2b), (ab) and (4b), bonding terminals on each side are each independently bonded with a hydrogen atom or a monovalent substituent.

Advantageous Effects of Invention

The present invention provides an organic photoelectric conversion element composition that is more excellent in photoelectric conversion efficiency and thermal durability than ever before, a thin film and a photovoltaic cell each containing the same, an organic semiconductor polymer and a compound used therefor, and a method of producing the polymer.

Other and further features and advantages of the invention will appear more fully from the following description, appropriately referring to the accompanying drawing.

BRIEF DESCRIPTION OF THE DRAWING

FIG. 1 is a side view schematically showing a constitution of an organic photovoltaic cell in a preferred embodiment of a photovoltaic cell according to the present invention.

MODE FOR CARRYING OUT THE INVENTION

With respect to an organic semiconductor compound in a photoelectric conversion element, especially in organic photovoltaic cells among photovoltaic cells, there is a strong need for improvement in photoelectric conversion efficiency and durability. Therefore, in order to satisfy the need for both photoelectric conversion efficiency and thermal durability, the present inventors focused on linking a p-type organic semiconductor unit having absorption in a longer wavelength range and an n-type organic semiconductor unit, by a chemical bond. The present inventors carried out various studies on linking systems when incorporating these units into a polymer molecule. As a result, the present inventors found that the p-type organic semiconductor unit and the n-type organic semiconductor unit, when linked by a specific linking system, self-organize during formation of a thin film, to form microphase separation structure formed of an n-type semiconductor phase and a p-type semiconductor phase, whose structural stability is significantly enhanced. Moreover, the present inventors found that, by virtue of linking these units, the interface between a p-type semiconductor and an n-type semiconductor becomes large, and that this is advantageous also in charge separation, and that, by virtue of employing the p-type organic semiconductor unit having absorption in a longer wavelength range, high photoelectric conversion efficiency is obtained, thus enabling improvement in both photoelectric conversion efficiency and thermal durability. In the course of their research, the present inventors carried out various studies based on these findings and ideas, and, as a result, completed the present invention.

In addition, a thin film formed of a p-type-and-n-type linked organic semiconductor polymer according to the present invention has a microphase separation structure formed of the p-type organic semiconductor phase (electron donating phase) and the n-type organic semiconductor phase (electron accepting phase), formed by the self-organization. The microphase separation structure herein means one having a phase separation structure in which a domain size of each phase formed of the p-type organic semiconductor phase or the n-type organic semiconductor phase is about several nanometers to about several hundreds of nanometers (ordinarily 1 to 500 nm).

The present invention will be explained in detail below.

First, the p-type-and-n-type linked semiconductor polymer according to the present invention will be explained.

<p-Type-and-n-Type Linked Semiconductor Polymer>

The organic semiconductor polymer according to the present invention is a p-type-and-n-type linked organic semiconductor polymer represented by any one of formulas (1) to (5).

(1)

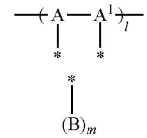

(2)

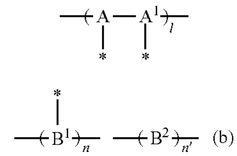

(3)

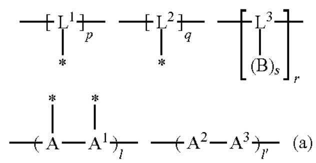

(4)

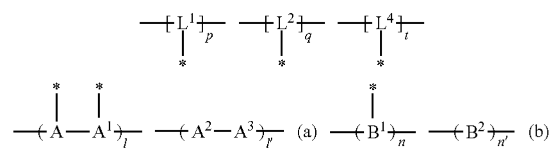

(5)

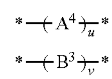

In formulas (1) to (5), A, $A^1$, $A^2$, $A^3$ and $A^4$ each independently represents a group of a p-type organic semiconductor unit, and B, $B^1$, $B^2$ and $B^3$ each independently represents a group of an n-type organic semiconductor unit, in which A and $A^1$ in formulas (1) to (4) each independently represents a group of a p-type organic semiconductor different in structure from the other, and in which $A^4$'s in formula (5) each independently represents a group of two or more different p-type organic semiconductors. It suffices for A and $A^1$ to be different from each other either in a ring structure that forms a polymer main chain or in a substituent; the ring structure preferably being different; and still more preferably both the ring structure and the substituent being different. Moreover, also, as to the groups of two or more different kinds of p-type organic semiconductors in $A^4$, in a similar manner, it suffices for these plural A4's to be different either in a ring structure that forms a polymer main chain or in a substituent; preferably the ring structure being different, and still more preferably both the ring structure and the substituent being different. Moreover, polymer main chain parts of the p-type organic semiconductors in formulas (1) to (5), $-(A-A^1)l-$, $-(A^2-A^3)l'-$, and $-(A^4)u-$ are preferably π conjugated.

$L^1$ to $L^4$ each independently represents a divalent or trivalent linking group containing no p-type organic semiconductor unit or no n-type semiconductor unit.

Herein, at least one bonding hand represented by symbols -* in A and $A^1$ in formulas (1) and (2) bonds, directly or through a divalent linking group, with a bonding hand represented by a symbol -* in B in formula (1), or with at least one bonding hand represented by symbols -* in $B^1$ in formula (2), and the remaining non-bonded bonding hands -* each bonds with a hydrogen atom or a monovalent substituent. At least one bonding hand represented by symbols -* in $L^1$ and $L^2$ in formulas (3) and (4) bonds, in each formula, directly or through a divalent linking group, with at least one bonding hand represented by symbols -* in A or $A^1$ in (a), and the remaining non-bonded bonding hand -* bonds with a hydrogen atom or a monovalent substituent. In formula (4), at least one bonding hand represented by symbols -* in $L^4$ bonds, directly or through a divalent linking group, with at least one bonding hand represented by symbols -* in $B^1$ in (b), and the remaining non-bonded bonding hand -* bonds with a hydrogen atom or a monovalent substituent. At least one bonding hand represented by symbols -* in $A^4$ in formula (5) bonds, directly or through a divalent linking group, with at least one bonding hand represented by symbols -* in $B^3$, and the remaining non-bonded bonding hand -* bonds with a hydrogen atom or a monovalent substituent.

l, n, r, t, u and v each independently represents an integer of 1 to 1,000; m and s each independently represents an integer of 1 to 10; and p, q, l' and n' each independently represents an integer of 0 to 1,000; in which p and q do not simultaneously represent 0.

Moreover, in formulas (1) to (5), the bonding terminals represented by bonding hands—are each independently bonded with a hydrogen atom or a monovalent substituent.

In addition, examples of the substituent or the monovalent substituent in the above include the substituent T described later.

Here, in formula (1), m is preferably 1, and in formula (3), s is preferably 1.

(Group of p-Type Organic Semiconductor Unit)

As the group of the p-type organic semiconductor unit, use can be made of a divalent or trivalent group of a conventionally-known p-type organic semiconductor compound, or a divalent or trivalent group derived from the compound (a group having two or three bonding hands, and further specifically, a group formed by eliminating two or three hydrogen atoms of the compound), and which compound is generally a π-electron conjugated compound in which the highest occupied molecular orbital (HOMO) level is 4.5 to 6.0 eV.

Examples thereof include a divalent or trivalent group of an aromatic ring, a heteroaromatic ring, an alicycle capable of π conjugation, a heterocyclic ring capable of π conjugation, and a condensed ring or condensed polycycle thereof; and in addition thereto, one in which these rings are linked by a single bond or a conjugated chain (e.g. a double bond or a triple bond, or a double bond or triple bond and a single bond are alternately mutually repeated), and these structural units are mutually linked to form a π-electron conjugated system. In this case, two aromatic rings and/or heteroaromatic rings may be bonded, to form a condensed ring, by a single bond or a conjugated bond, and also a bond allowing no conjugation of linking rings with each other on a position different therefrom [in which examples of the bonds include —O—, —C(═O)—, —S—, —$SO_2$—, —SO—, alkylene (e.g. —$CH_2$—, —$C(R^a)_2$—), —C[═$R^a$ ($R^{a'}$)]— and —N($R^a$)—, wherein $R^a$ and $R^{a'}$ each independently represents a hydrogen atom or a substituent, and examples of the substituents include the substituent T described later].

Here, in the present invention, when l or l' is two or more, a link part of or a main chain of a p-type organic semiconductor unit part is preferably one in which a conjugated system extends in a whole polymer molecule, and any structural unit may be applied as long as this kind of material is applied.

Examples of the aromatic ring or the ring containing the same include a benzene ring, a naphthalene ring, an anthracene ring, a phenanthrene ring, a tetracene ring, a pentacene ring, a hexacene ring, a heptacene ring, a chrysene ring, a picene ring, a fulminene ring, a pyrene ring, a peropyrene ring, a perylene ring, a terylene ring, a quoterylene ring, a coronene ring, an ovalene ring, a circumanthracene ring, a bisanthene ring, a zethrene ring, a heptazethrene ring, a pyanthrene ring, a violanthene ring, an isoviolanthene ring, a circobiphenyl ring, and an anthradithiophene ring; and a benzene ring, a naphthalene ring, an anthracene ring and a phenanthrene ring are further preferred.

Examples of the aliphatic ring capable of π conjugation include cycloalkene in which a single bond or a conjugated chain is bonded on a 1-, and 2-positions (e.g. cyclopentene, cyclohexene, cycloheptene and cyclooctene) and cycloalkadiene (e.g. cyclopentadiene, cyclopentadienone, 1,3-cyclohexadiene, 1,3-cycloheptadiene and 1,3-cyclooctadiene).

Examples of the heteroaromatic ring or the heteroring capable of π conjugation include a thiophene ring, an oligo(thiophene) ring (e.g. a dithiophene ring and a trithiophene ring), a silacyclopentadithiophene ring, a cyclopentadithiazole ring, a benzothiadiazole ring, a thiadiazoloquinoxaline ring, a cyclopentadithiophene ring, an oxidized cyclopentadithiophene ring, a benzoisothiazole ring, a benzothiazole ring, an oxidized thiophene ring, a thienothiophene ring, an oxidized thienothiophene ring, a dithienothiophene ring, an oxidized dithienothiophene ring, a tetrahydroisoindole ring, a fluorene ring, a fluorenon ring, a thiazole ring, a dithiazole ring, a thienothiazole ring, a selenophene ring, a silole ring, a thiazorothiazole ring, a naphthothiadiazole ring, a pyrazine ring, a thienopyrazine ring, an oxazole ring, a thienooxazole ring, a benzooxazole ring, a pyrrole ring, a thienopyrrole ring, a thienopyrroledione ring, a benzodithiophene ring, a naphthodithiophene ring, a pyridazine ring, a thienopyridazine ring, a pyrroledione ring, a pyrrolemonoone ring, a thienooxazole ring, an imidazole ring, a thienoimidazole ring, a pyrimidine ring, a thienopyrimidine ring, a benzooxazol ring, a thienooxazole ring, a benzimidazole ring, a diketopyrrolopyrrole ring, and a cyclopentadipyridine ring, a thiadiazole ring, a benzothiadiazole ring, a triazole ring, a benzotriazole ring, an oxadiazole ring, and a benzoxadiazole ring. Moreover, examples also include a (metal)porphyrin ring and a (metal)phthalocyanine ring.

The above-described, aromatic ring or ring containing the same, aliphatic ring capable of π conjugation, heteroaromatic ring, or heteroring capable of π conjugation, may have a substituent, and examples of the substituent include the substituent T described below.

In the present invention, among the rings described above, one having at least one heteroring structure is preferred. As the hetero atom, sulfur, nitrogen, oxygen, silicon, boron, selenium, tellurium, and phosphorus atoms are preferred, and sulfur, nitrogen, oxygen, and silicon are further preferred.

Specific preferred examples of the heterocyclic group of the group of the p-type semiconductor unit include the following groups, but the present invention is not limited thereby.

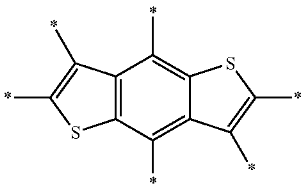
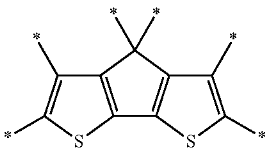
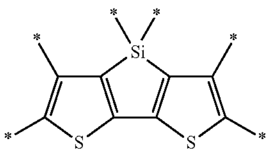
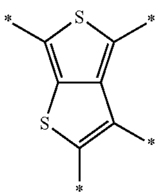
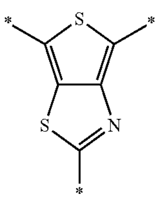
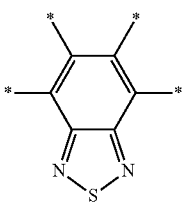
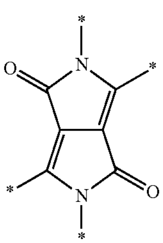
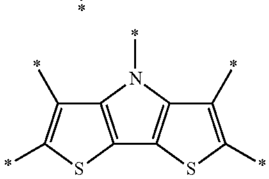
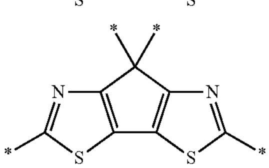
-continued
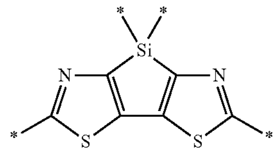
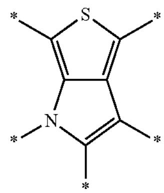
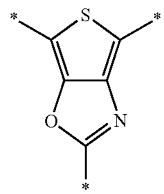
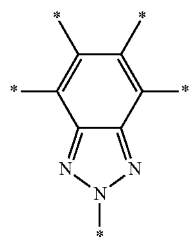
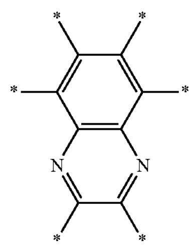
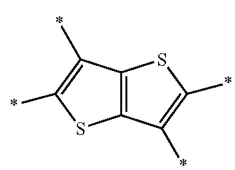
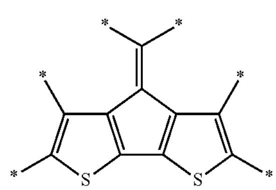
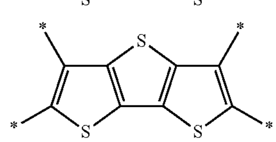
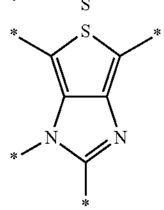

-continued
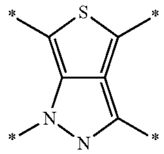
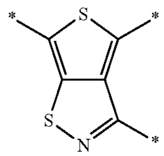
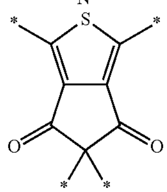
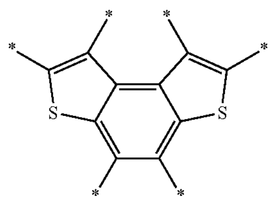
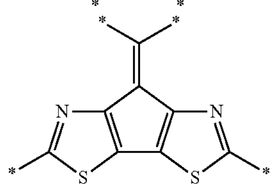
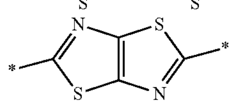
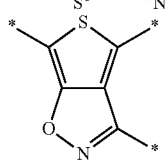
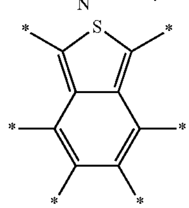
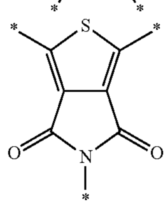
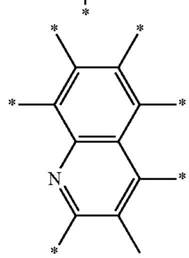
-continued
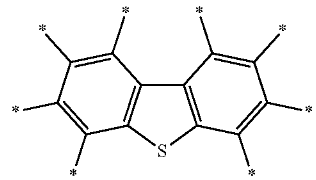
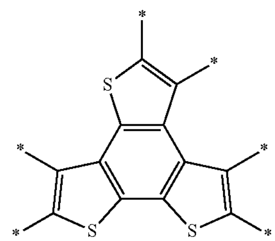
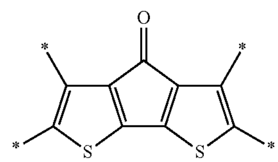
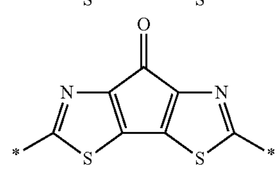
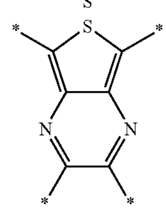
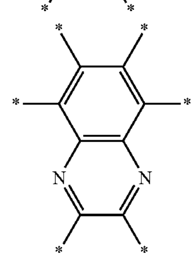
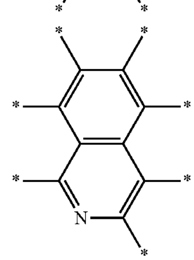
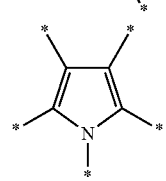

-continued

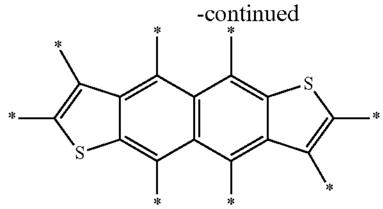

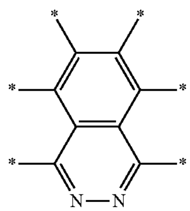

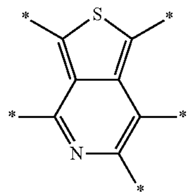

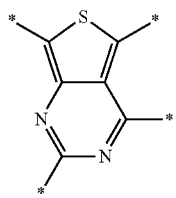

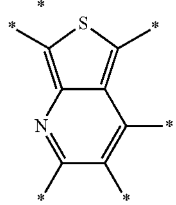

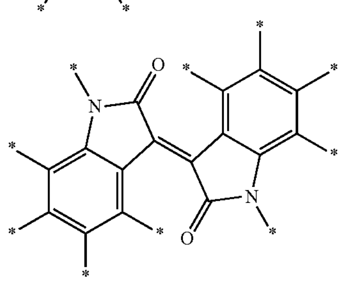

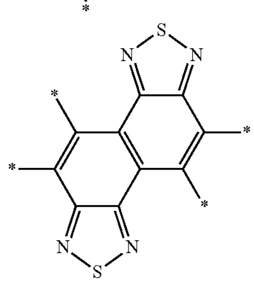

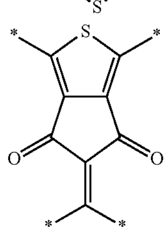

-continued

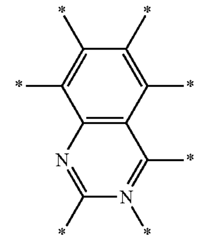

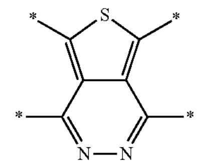

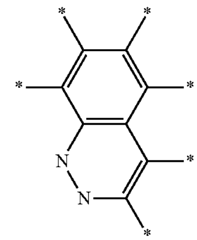

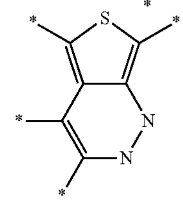

In the formulas, a bonding hand represented by a symbol * represents a linking site with a polymer main chain, a polymer side chain, a single bond or a divalent linking group. However, when the group forms the polymer main chain, at least two bonding hands thereof are used for forming the polymer main chain. Moreover, when the bonding hands are used for forming the polymer main chain, each of the bonding hands is at a position where the polymer main chain conjugates. The remaining bonding hand(s) is bonded, directly or through a linking group, with B, $B^1$, $B^2$ or $B^3$, or bonded, directly or through a linking group, with a linking group $L^1$ or $L^2$, or bonded with a hydrogen atom or a substituent. Examples of the substituent include the substituent T described later.

Two or more heteroring moieties may form a condensed ring or may be bonded through a single bond or a conjugated bond.

Specific examples of A-$A^1$ in formulas (1) to (4) and $A^4$ in formula (5) include the following groups, but the present invention is not limited thereby.

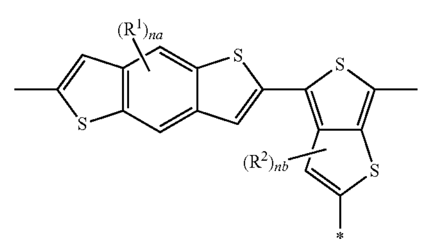

-continued

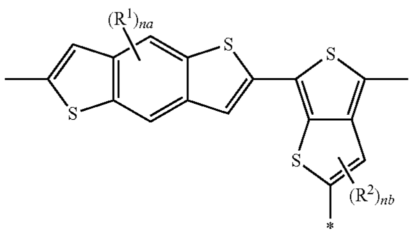

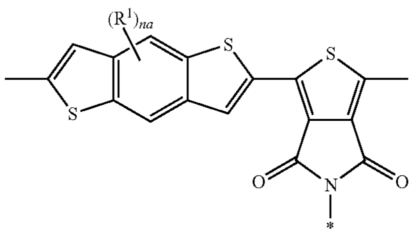

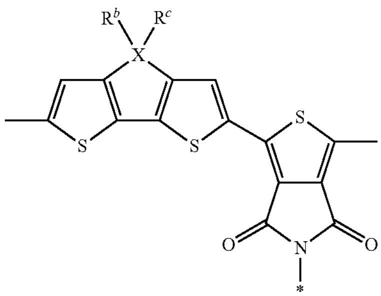

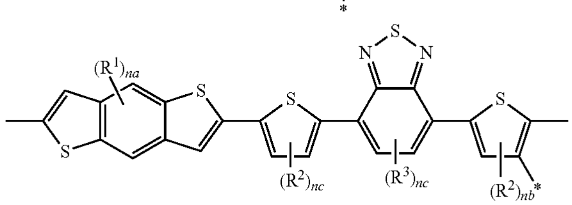

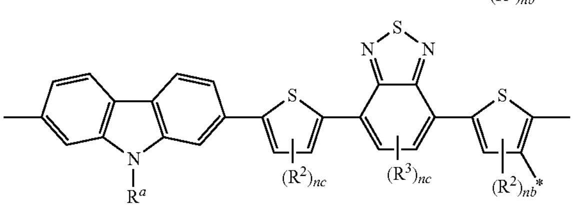

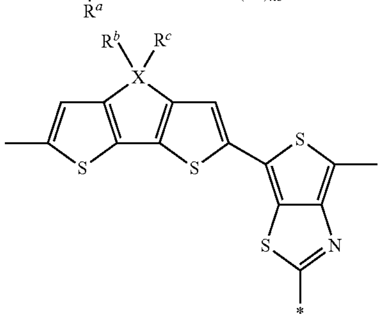

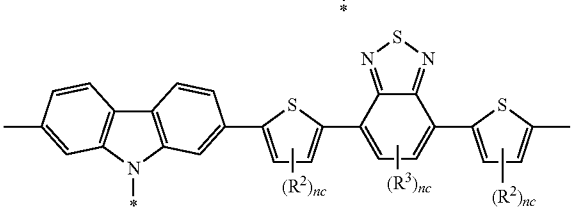

-continued

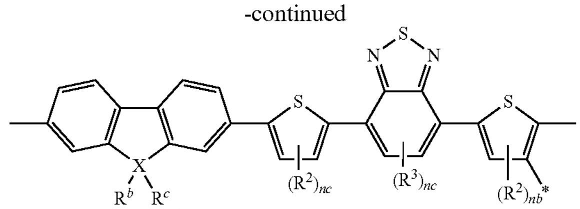

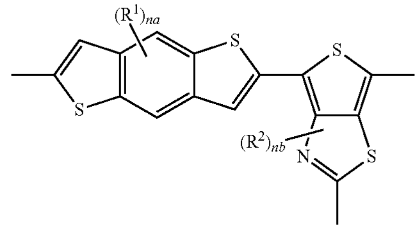

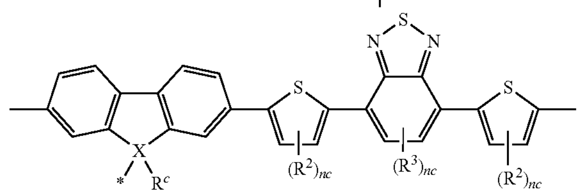

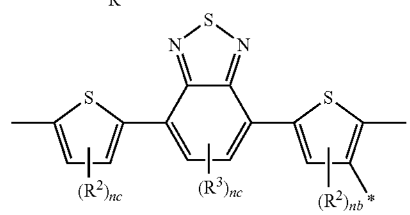

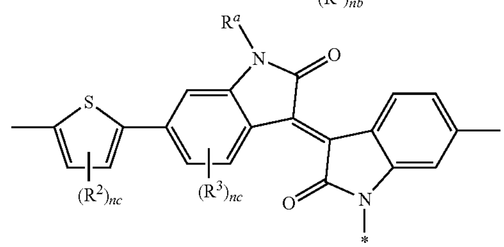

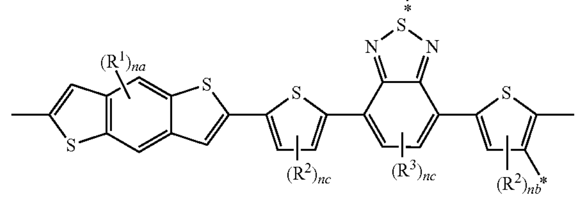

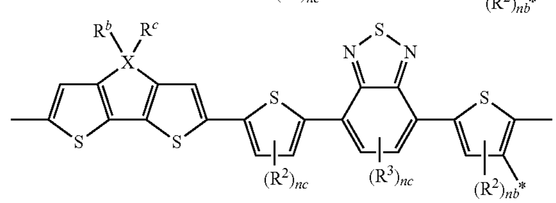

Here, $R^1$ to $R^3$, $R^b$ and $R^c$ each independently represents a hydrogen atom or a substituent, and examples of the substituent include the substituent T described later. As $R^1$ to $R^3$, an alkyl group, an alkoxy group, an alkoxycarbonyl group, an acyloxy group, an acyl group, an alkylsulfonyl group, a cyano group or a halogen atom is preferred, and as $R^b$ and $R^c$, an alkyl group is preferred. $R^1$ to $R^3$ and $R^b$ and $R^c$ may be a -* moiety, and in this case, the -* moiety is bonded with a hydrogen atom or a substituent, and examples of the substituent include the substituent T described later.

Examples of $R^a$ include the groups listed as the substituent T described later as a corresponding group, but a hydrogen atom or an alkyl group is preferred. X represents a carbon atom or a silicon atom. Then, na represents 0 to 4, nb represents 0 or 1, and nc represents 0 to 2.

In addition, a -* part is bonded, directly or through a divalent linking group, with B or $B^1$ in formulas (1) and (2), or directly or through a divalent linking group, with $L^1$ or $L^2$ in formulas (3) and (4). Moreover, in formula (5), the -* part is bonded with a hydrogen atom or a substituent. Examples of the substituent include the substituent T described later.

However, in A to $A^1$ in formulas (1) to (4), the -* moiety, when non-bonded with the n-type organic semiconductor, is bonded with a hydrogen atom or a substituent, and examples of the substituent include the substituent T described later. Among the substituents, a hydrogen atom, an alkyl group, an alkoxy group, an alkoxycarbonyl group, an acyloxy group, an acyl group, an alkylsulfonyl group, a cyano group, or a halogen atom is preferred.

Moreover, in addition to the above-described groups, as the group of the p-type organic semiconductor unit in formulas (1) to (5), a group in which the above-described -* part is a hydrogen atom, or partial structure of a substituent T, or a group of a unit having the following structure, may be incorporated into a π-conjugated main chain.

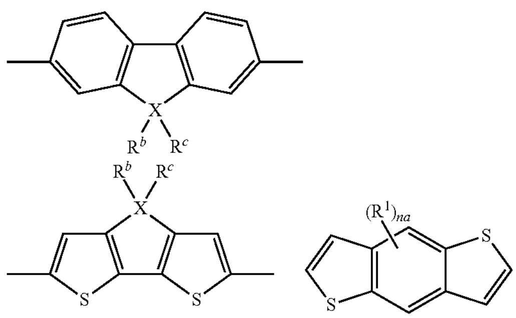

Here, $R^1$, $R^b$, $R^c$ and na have the same definitions as the definitions described above, and a preferred range thereof is also the same.

A group of the unit having the above-described structure and being non-linked with the group of the n-type organic semiconductor unit corresponds to $A^2$, $A^3$ or $A^2$-$A^3$ in formula (3) or (4), and to $A^4$ in formula (5). In the above case, a -* moiety in the above-described structures is bonded with a hydrogen atom or a substituent, and examples of the substituent include the substituent T described later. Among the groups, a hydrogen atom, an alkyl group, an alkoxy group, an alkoxycarbonyl group, an acyloxy group, an acyl group, an alkylsulfonyl group, a cyano group or a halogen atom is preferred.

Here, as to the bond between A and $A^1$ or the bond between $A^2$ and $A^3$ in A-$A^1$ or $A^2$-$A^3$, it is preferred that, through this bond, A and $A^1$ or $A^2$ and $A^3$ are π conjugated; and each of the repeating units of A-$A^1$, the repeating units of $A^2$-$A^3$, and a part with which these repeating units are linked, namely, a main chain constituted of a group of a p-type organic semiconductor unit, are preferably π conjugated.

In a similar manner, repeating units in $A^4$ and a main chain constituted by bonding of the repeating units are preferably π conjugated.

(Group of n-Type Organic Semiconductor Unit)

The group of the n-type organic semiconductor unit includes a compound conventionally-known as an n-type organic semiconductor compound or a group derived from the compound, and includes a monovalent group for B or a divalent or trivalent group (a group having two or three bonding hands, and further specifically, a group formed by eliminating two or three hydrogen atoms of the compound) for $B^1$ to $B^3$; and the compound includes a π-electron conjugated compound in which the lowest unoccupied molecular orbital (LUMO) level is 3.5 to 4.5 eV. Examples thereof include fullerene or a derivative thereof, a nitrogen-containing heterocyclic ring (e.g. octaazaporphyrin, a perfluoro component in which a hydrogen atom in a p-type organic semiconductor compound is replaced by a fluorine atom (e.g. perfluoropentacene and perfluoro-phthalocyanine), an aromatic compound having at least one electron-withdrawing substituent (e.g. aromatic carboxylic anhydride or an imidized product thereof, such as naphthalenetetracarboxylic anhydride, naphthalenetetracarboxylic diimide, perylenetetracarboxylic anhydride, and perylenetetracarboxylic diimide), and a polymer compound including these as a skeleton. Here, as the electron-withdrawing group, use can be made of a group of which a Hammett substituent constant σp is 0 or more.

Among these n-type organic semiconductor compounds, fullerene or a derivative thereof is preferred.

Examples of the fullerene or the derivative thereof include fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerenes, fullerene nanotubes, and a fullerene derivative thereof a part of which is substituted with a hydrogen atom, a halogen atom, a substituted or unsubstituted alkyl group, alkenyl group, alkynyl group, aryl group, heteroaryl group, cycloalkyl group, silyl group, alkoxy group, aryloxy group, alkylthio, group, arylthio group, amino group, alkylamino group, or dialkylamino group.

As the fullerene derivative, a phenyl-$C_{61}$-butyric acid ester, a diphenyl-$C_{62}$-bis(butyric acid ester), a phenyl-$C_{71}$-butyric acid ester, a phenyl-$C_{85}$-butyric acid ester, or a thienyl-$C_{61}$-butyric acid ester is preferred, and the number of carbon atoms of the alcohol moiety of the butyric acid esters is preferably 1 to 30, more preferably 1 to 8, even more preferably 1 to 4, and most preferably 1.

Preferred examples of the fullerene derivative include phenyl-$C_{61}$-butyric acid methyl ester ([60]PCBM), phenyl-$C_{61}$-butyric acid n-butyl ester ([60]PCBnB), phenyl-$C_{61}$-butyric acid isobutyl ester ([60]PCBiB), phenyl-$C_{61}$-butyric acid n-hexyl ester ([60]PCBH), phenyl-$C_{61}$-butyric acid n-octyl ester ([60]PCBO), diphenyl-$C_{62}$-bis(butyric acid methyl ester) (bis[60]PCBM), phenyl-$C_{71}$-butyric acid methyl ester ([70]PCBM), phenyl-$C_{85}$-butyric acid methyl ester ([84]PCBM), thienyl-$C_{61}$-butyric acid methyl ester ([60]ThCBM), $C_{60}$ pyrrolidine tris-acid, $C_{60}$ pyrrolidine tris-acid ethyl ester, N-methylfulleropyrrolidine (MP-$C_{60}$), (1,2-methanofullerene $C_{60}$)-61-carboxylic acid, (1,2-methanofullerene $C_{60}$)-61-carboxylic acid t-butyl ester; metallocene-containing fullerenes, as described, for example, in JP-A-2008-130889; and fullerenes having a cyclic ether group, as described, for example, in U.S. Pat. No. 7,329,709.

Among these, as the group of the n-type organic semiconductor unit, a group having fullerene structure, or a group having benzobisimidazo-benzophenanthroline or 3,4,9,10-perylenetetracarboxylic diimide structure is preferred.

Here, as the group having 3,4,9,10-perylenetetracarboxylic imide structure, the following group is preferred.

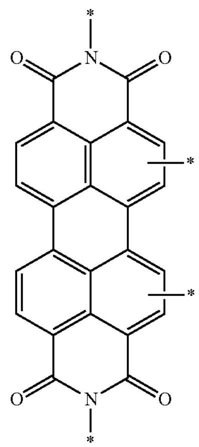

A bonding hand represented by a symbol * represents a linking site with a polymer main chain, a polymer side chain, a single bond or a divalent linking group. The remaining bonding hand non-bonded with these is bonded with a hydrogen atom or a substituent, and examples of the substituent include the substituent T described later.

In the p-type-and-n-type linked organic semiconductor polymer according to the present invention, a content ratio of the group of the p-type organic semiconductor unit to the n-type organic semiconductor unit in the polymer is adjusted to maximize photoelectric conversion efficiency, and a ratio is selected from the range of generally 10:90 to 90:10, preferably 20:80 to 80:20, and more preferably 30:70 to 70:30, in terms of mass ratio.

(Linking Group)

$L^1$, $L^2$, $L^3$, $L^4$, a linking group for bonding A or $A^1$ with B or $B^1$, a linking group for bonding $L^1$ or $L^2$ with A or $A^1$, a linking group for bonding $L^4$ with $B^1$, and a linking group for bonding $A^4$ with $B^3$ will be described below.

$L^1$, $L^2$, $L^3$ and $L^4$ each independently represents a divalent or trivalent linking group containing neither the p-type organic semiconductor unit nor the n-type semiconductor unit; a divalent or trivalent aliphatic group being preferred and the aliphatic group may have —O—, —S—, —SO—, —$SO_2$—, —C(=O)—, —$NR^a$— or a group formed by combining these (for example, —C(=O)—O—, —$NR^a$C(=O)—, —$NR^aSO_2$—), inserted into the aliphatic moiety of the aliphatic group. Here, $R^a$ represents a hydrogen atom, an alkyl group, an aryl group or a heterocyclic group.

Examples of the divalent or trivalent aliphatic group include a linear, branched or cyclic aliphatic group; and as a linking chain constituting the main chain, preferred is one having neither a double bond nor a triple bond as a carbon-carbon bond. If the group should nevertheless have these unsaturated bonds, one without conjugation thereof is preferred. In addition, the aliphatic group may be substituted by a substituent.

$L^1$, $L^2$, $L^3$ and $L^4$ each independently are preferably a linking group A as shown below.

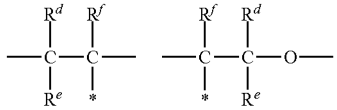

-continued

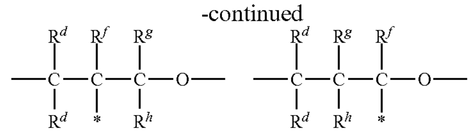

In the formulas, $R^d$ to $R^h$ each independently represents a hydrogen atom or a substituent. Examples of the substituent include the substituent T described later, and a hydrogen atom, an alkyl group, a halogen atom or a perfluoroalkyl group is preferred, and a hydrogen atom or an alkyl group is particularly preferred. $R^f$ represents a hydrogen atom or a substituent. Examples of the substituent include the substituent T described later, and a hydrogen atom, an alkyl group, a halogen atom or a perfluoroalkyl group is preferred, a hydrogen atom or a methyl group is further preferred, and a hydrogen atom is particularly preferred. These groups are preferably derived from (meth)acrylic acid, ester or amide thereof, an epoxy ring compound, or an oxetane ring compound.

$L^3$ is further preferably one in which a divalent linking group LL is bonded with the above-described * part. The linking group LL has the same definitions as the linking group for bonding A or $A^1$ with B or $B^1$, the linking group for bonding $L^1$ or $L^2$ with A or $A^1$, and the divalent linking group for bonding $L^4$ with $B^1$.

The linking group for bonding A or $A^1$ with B or $B^1$, the linking group for bonding $L^1$ or $L^2$ with A or $A^1$, and the linking group for bonding $L^4$ with $B^1$ each are bonded through a single bond or a divalent linking group, but preferably through a divalent linking group. The divalent linking group is preferably an alkylene group, an arylene group, —O—, —S—, —SO—, —$SO_2$—, —C(=O)—, —$NR^a$— or a group formed by combining these (for example, —C(=O)—O—, —$NR^a$C(=O)—, —$NR^a$C(=O)—, —$NR^aSO_2$—); and an alkylene group, —O—, —C(=O)—, —$NR^a$— or a group formed by combining these is further preferred. Here, $R^a$ represents a hydrogen atom, an alkyl group, an aryl group, or a heterocyclic group. The divalent linking group may have a substituent. Examples of the substituent include the substituent T described later, and an alkyl group, an aryl group, a hetero aromatic group, a heterocyclic group, or a hydroxyl group is preferred, and an alkyl group or an aryl group is further preferred.

Among the groups, as the divalent linking group for bonging A or $A^1$ with B or $B^1$ or the divalent linking group for bonging $L^1$ or $L^2$ with A or $A^1$, the following groups are preferred. Here, a * part indicates the bonding part with A or $A^1$.

*—C(=O)O($CH_2$)ma-OC(=O)—($CH_2$)mb-C($R^x$)<
*—($CH_2$)mc-OC(=O)—($CH_2$)mb-C($R^x$)<
*—S(=O)$_2$($CH_2$)ma-OC(=O)—($CH_2$)mb-C($R^x$)<
*—$SO_2NR^b$($CH_2$)ma-OC(=O)—($CH_2$)mb-C($R^x$)<
*—C(=O)$NR^b$($CH_2$)ma-OC(=O)—($CH_2$)mb-C($R^x$)<
*—C(=O)O($CH_2CH_2O$)ma-OC(=O)—($CH_2$)mb-C($R^x$)<
*—O($CH_2$)ma-OC(=O)—($CH_2$)mb-C($R^x$)<
*—O($CH_2CH_2O$)ma-$CH_2CH_2O$C(=O)—($CH_2$)mb-C($R^x$)<
*—C(=O)O($CH_2$)ma-
*—$SO_2$($CH_2$)ma-
*—C(=O)$NR^b$($CH_2$)ma-
*—($CH_2$)ma-
*—O($CH_2$)ma-
—C(=O)O($CH_2$)ma-OC(=O)—$R^x$—
*—C(=O)O($CH_2$)ma-OC(=O)—($CH_2$)mc-CH=CHC<

*—C(=O)O(CH$_2$)ma-OC(=O)—R$^x$—
*—C(=O)O(CH$_2$)ma-OC(=O)—(CH$_2$)mc-CH=CHC<
*—C(=O)O(CH$_2$)ma-OC(=O)—(CH$_2$)md-
*—SO$_2$(CH$_2$)ma-OC(=O)—(CH$_2$)md-
*—(CH$_2$)mc-N(R$^a$)—CH$_2$CH(OH)—CH$_2$O—(CH$_2$)md-
*—(CH$_2$)mc-N(R$^a$)—CH$_2$C(R$^b$)(R$^{b'}$)—CH(OH)—CH$_2$O—(CH$_2$)md-
*—(CH$_2$)mc-OC(=O)—(CH$_2$)mb-
*—(CH$_2$)mc-N(R$^a$)—CH$_2$C(R$^b$)(R$^{b'}$)—CH(OH)—CH$_2$O—(CH$_2$)md-
*—(CH$_2$)mc-OC(=O)—(CH$_2$)mb-
*—C(=O)O(CH$_2$)ma-OC(=O)—
*—(CH$_2$)mc-OC(=O)—
*—(CH$_2$)mc-C(=O)O—
*—C(=O)O(CH$_2$)ma-OCH$_2$—
*—SO$_2$(CH$_2$)ma-OCH$_2$—
*—C(=O)NR$^b$(CH$_2$)ma-OCH$_2$—
*—C(=O)O(CH$_2$)ma-OC(=O)—
*—SO$_2$(CH$_2$)ma-OC(=O)—
*—C(=O)NR$^b$(CH$_2$)ma-OC(=O)—

Herein, R$^a$ represents a hydrogen atom, an alkyl group, an aryl group or a heterocyclic group, R$^x$ represents a phenyl group or a thienyl group, and R$^b$ and R$^{b'}$ each independently represent a hydrogen atom or a substituent. ma to and represent an integer of 1 to 20. In the above, a "CH$_2$" moiety or a "CH" moiety as in CH$_2$CH(OH)—CH$_2$ may have a substituent; examples of the substituent include a substituent T described later, and the substituent is preferably an alkyl group.

As a divalent linking group for bonding L$^4$ with B$^1$, and as a divalent linking group LL bonding with the * part of the above-described group A of linking groups in L$^3$, the following groups are preferred. The following * part indicates the bonding part with L$^4$ or the * part of the above-described group A of linking groups.

*—C(=O)O(CH$_2$)ma-OC(=O)—(CH$_2$)mb-C(R$^x$)<
*—C(=O)NR$^a$(CH$_2$)ma-OC(=O)—(CH$_2$)mb-C(R$^x$)<
*—C(=O)O(CH$_2$)ma-OC(=O)—(CH$_2$)mc-CH=CHC<
*—CH$_2$O—(CH$_2$)ma-OC(=O)—(CH$_2$)mb-C(R$^x$)<
*—C(=O)O(CH$_2$)ma-O—(CH$_2$)mc-
*—OC(=O)—(CH$_2$)mb-C(R$^x$)<
*—C(=O)O(CH$_2$)ma-
*—C(=O)NR$^a$(CH$_2$)ma-
*—C(=O)O(CH$_2$)ma-R$^x$—
*—C(=O)NR$^a$(CH$_2$)ma-R$^x$—

Herein, R$^a$ represents a hydrogen atom, an alkyl group, an aryl group or a heterocyclic group, R$^x$ represents a phenyl group or a thienyl group, and ma to mc represent an integer of 1 to 20. In the above, a "CH$_2$" moiety or a "CH=" moiety as in CH=CH may have a substituent; examples of the substituent include a substituent T described later, and the substituent is preferably an alkyl group.

A$^4$ and B$^3$ are bonded through a single bond or a divalent linking group. As the divalent linking group, an alkylene group, an alkenylene group, an arylene group, —O—, —S—, —SO—, —SO$_2$—, —C(=O)—, —NR$^a$— or a group formed by combining these (for example, —C(=O)—O—, —NR$^a$C(=O)—, —NR$^a$C(=O)—, —NR$^a$SO$_2$—) is preferred, and an alkylene group, an alkenylene group, an arylene group, —O—, —C(=O)—, —NR$^a$— or a group formed by combining these is further preferred. Herein, R$^a$ represents a hydrogen atom, an alkyl group, an aryl group or a heterocyclic group. The divalent linking group may have a substituent. As the substituent, the substituent T described later can be mentioned; and an alkyl group, an aryl group, an alkoxy group, a cycloalkoxy group, an aryloxy group, an acyl group, an alkoxycarbonyl group, an aryloxycarbonyl group or a halogen atom is preferred.

More preferred examples of the divalent linking group are the following groups.

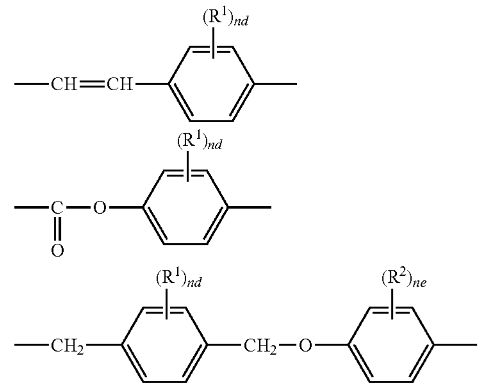

Herein, R$^1$ and R$^2$ each independently represent a substituent, and examples of the substituent include the substituent T described later. nd and ne each independently represent an integer of 0 to 4.

As a p-type-and-n-type linked organic semiconductor polymer represented by formula (5), a block copolymer as described below is further preferred.

$$\left[ (A^4)_u L^{ab} (B^3)_v L^{ab} \right]_x$$

Here, A$^4$, B$^3$, u and v have the same definitions as those in formula (5). L$^{ab}$ represents a single bond or a divalent linking group. x represents an integer of 1 to 1,000.

The molecular weight of the p-type-and-n-type linked organic semiconductor polymer of the present invention is not particularly limited, but preferably from 5,000 to 500,000, and more preferably from 10,000 to 100,000, in terms of weight average molecular weight.

Unless specified otherwise, the molecular weight and the degree of dispersion are defined as the values obtained by measurement in accordance with a GPC (Gel Permeation Chromatography) method, and the molecular weight is defined as polystyrene-converted weight-average molecular weight. The gel charged into the column for use in the GPC method is preferably a gel having at least one aromatic compound as a repeating unit, and examples thereof include a gel made of styrene-divinylbenzene copolymer. The column is preferably used in the form where 2 to 6 columns are connected. Examples of a solvent to be used include ether-based solvents, such as tetrahydrofuran, halogen-based solvents, such as chloroform, and aromatic-based solvents, such as chlorobenzene and 1,2-dichlorobenzene. The measurement is preferably carried out at a flow rate of the solvent in the range of from 0.1 to 2 mL/min, and most preferably in the range of from 0.5 to 1.5 mL/min. By carrying out the measurement within these ranges, there is no occurrence of putting a load on an apparatus, and thus, the measurement can be carried out further efficiently. Measurement temperature is appropriately changed depending on the solvent to be used, and therefore cannot be limited, but measurement is preferably carried out at a temperature from 10° C. to 200° C. A column and a solvent to be used can be properly selected, according to the property of a polymer compound to be measured.
Specific examples of the p-type-and-n-type linked organic semiconductor polymer according to the present invention are shown below, but the present invention is not limited thereto.
p-type-and-n-type linked organic semiconductor polymer represented by formula (1)
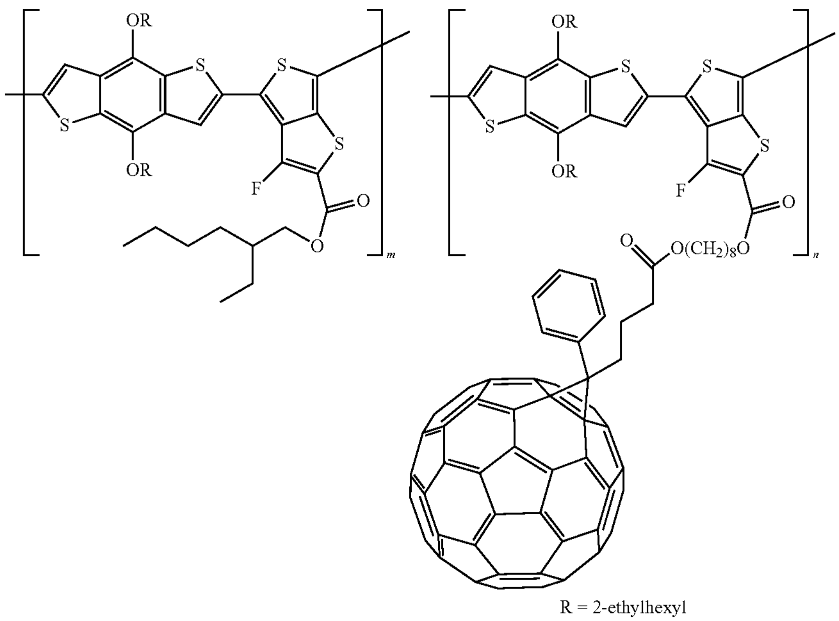
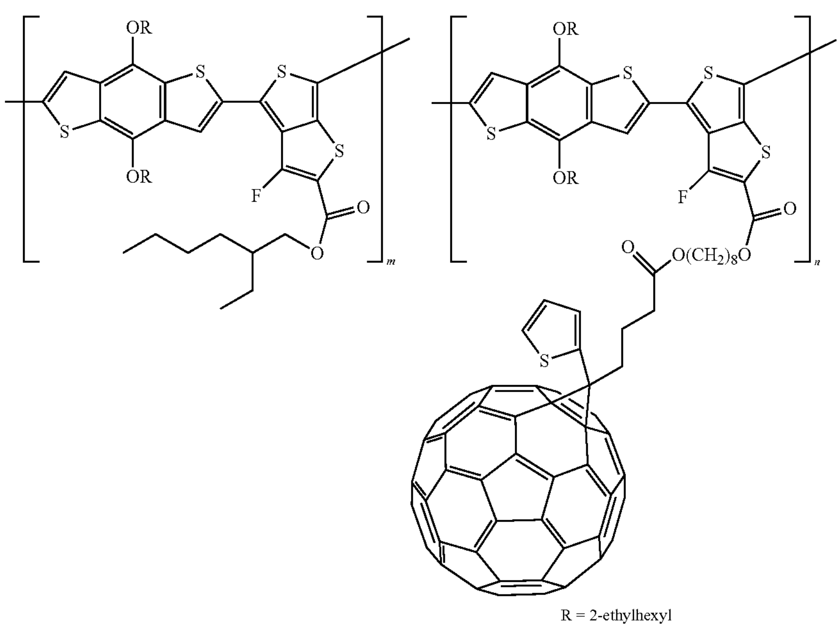

-continued
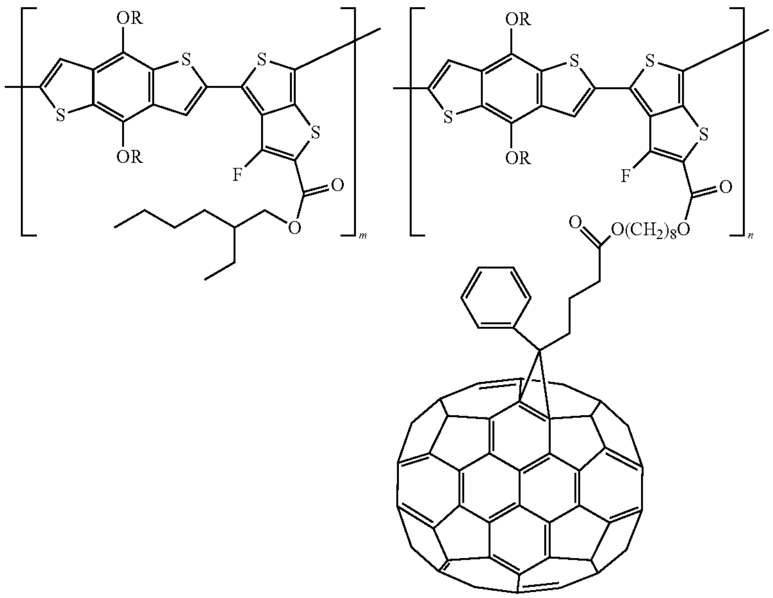
R = 2-ethylhexyl
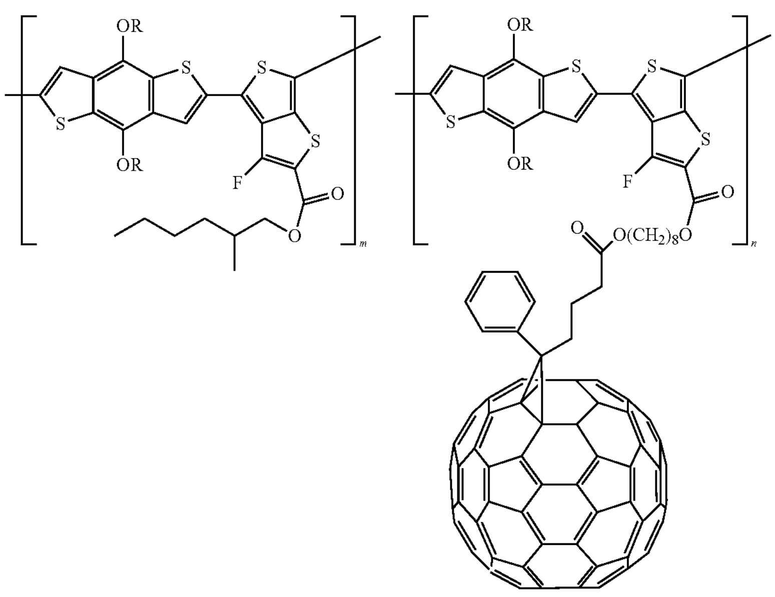
R = 2-ethylhexyl

-continued
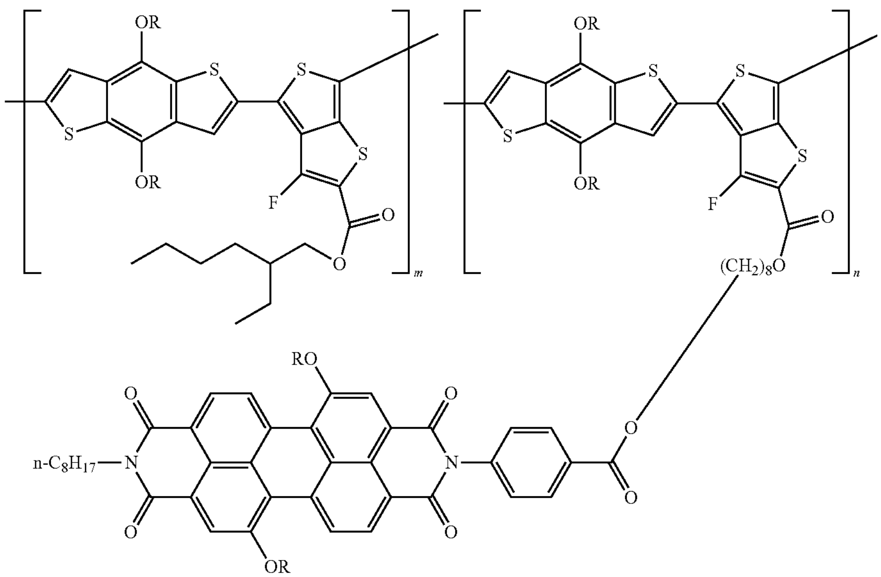
R = 2-ethylhexyl
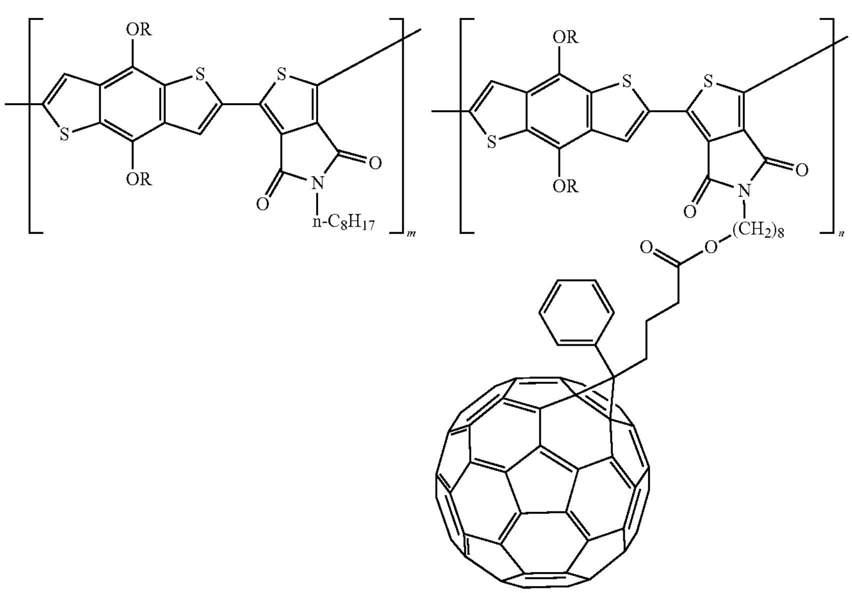
R = 2-ethylhexyl

-continued
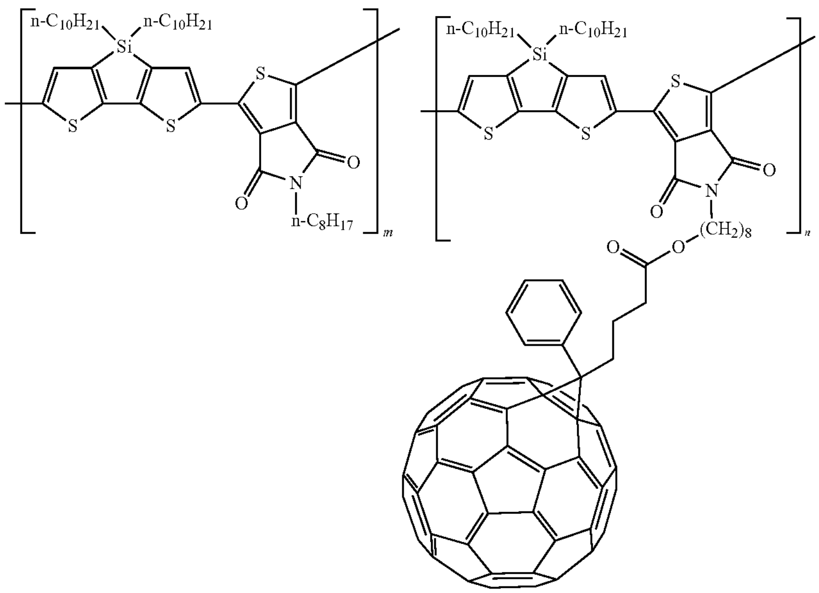
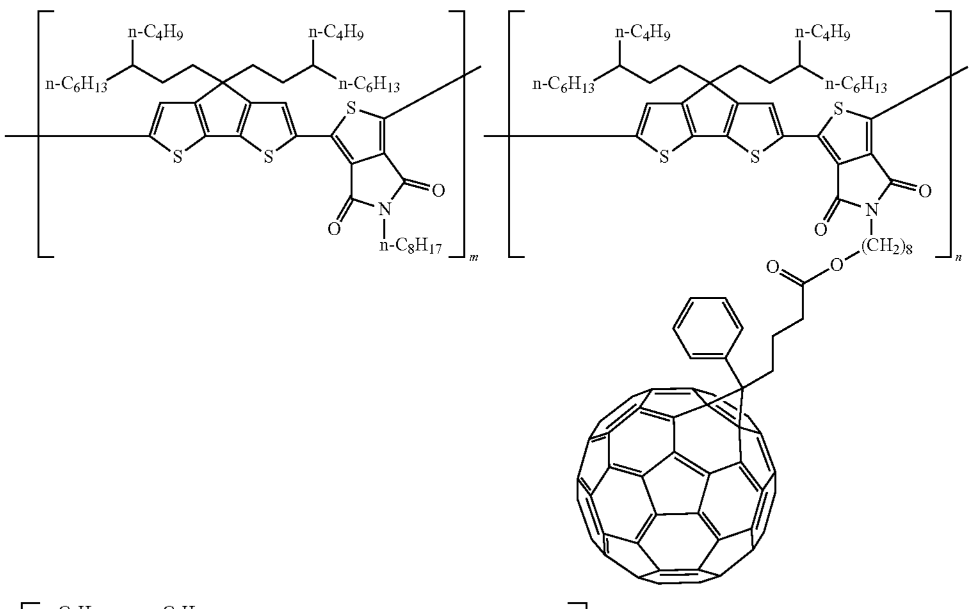
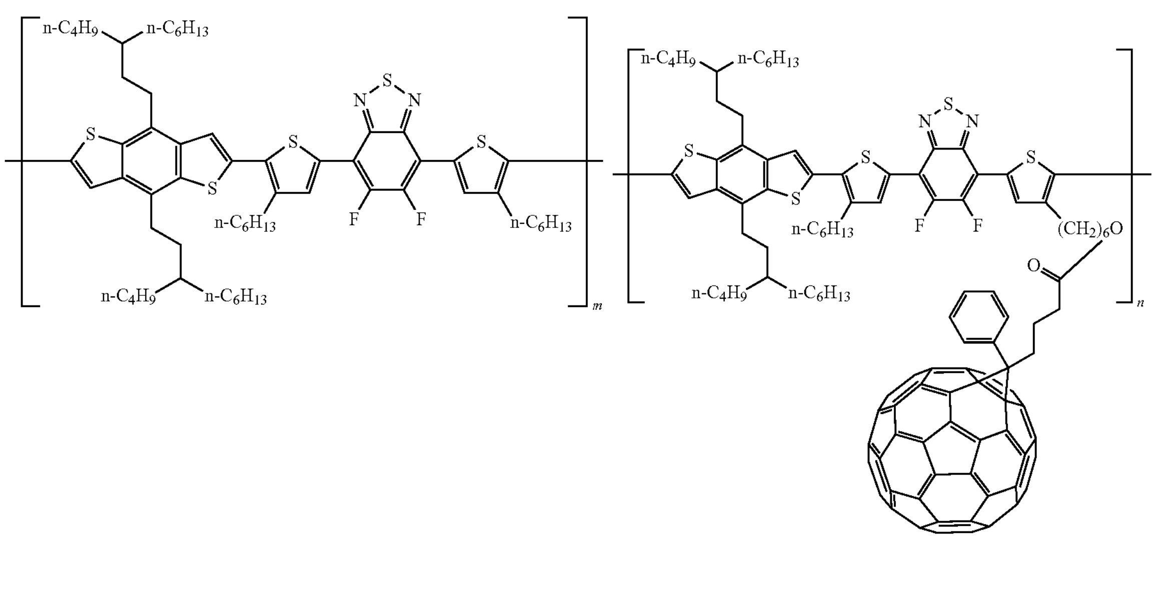

-continued
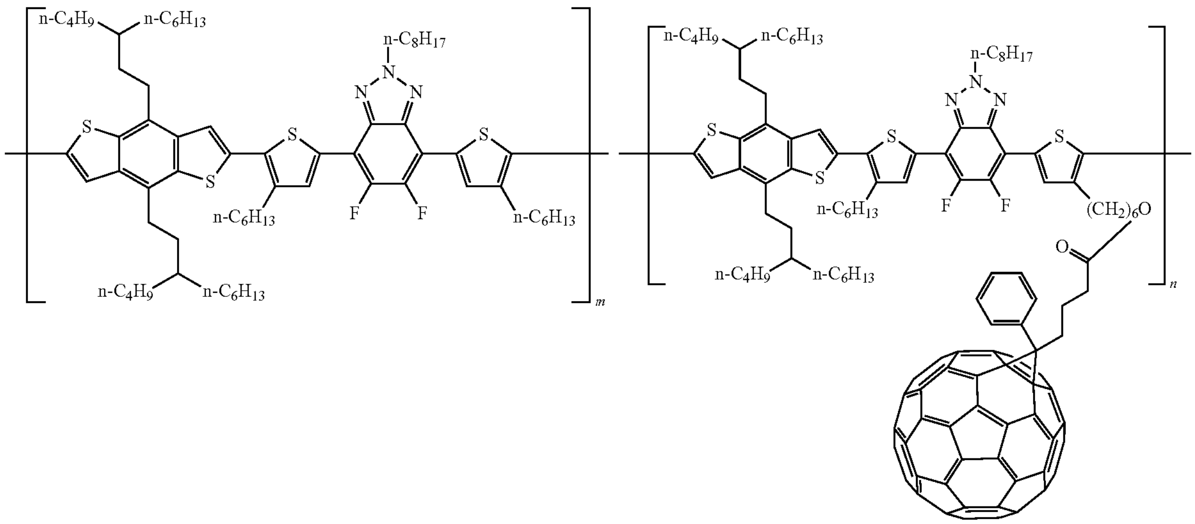
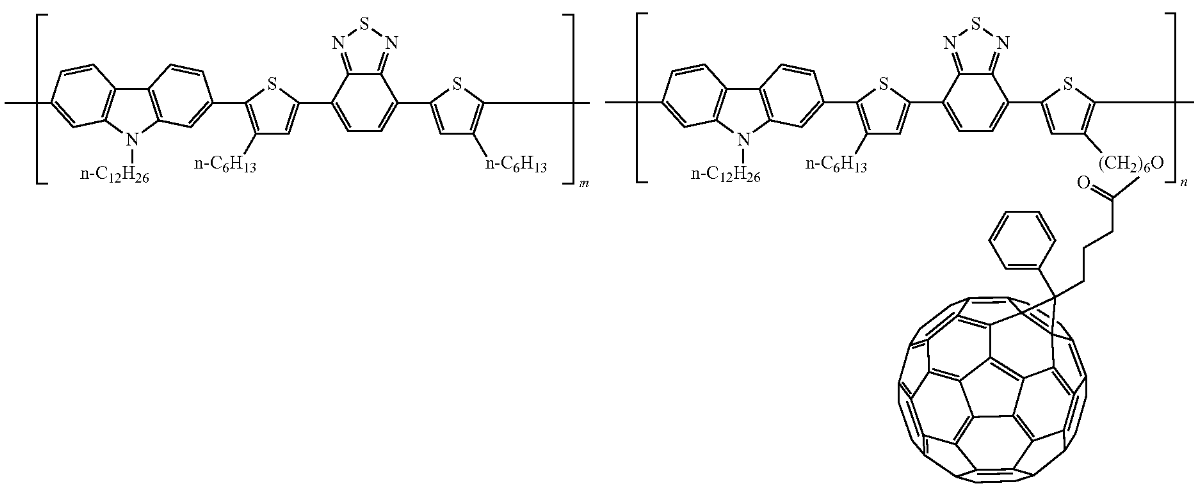
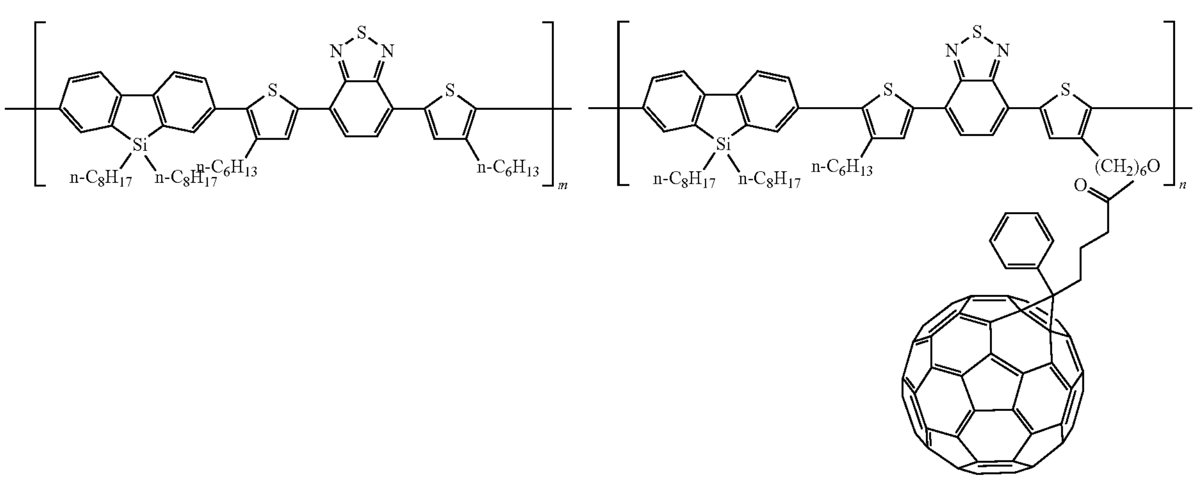

-continued
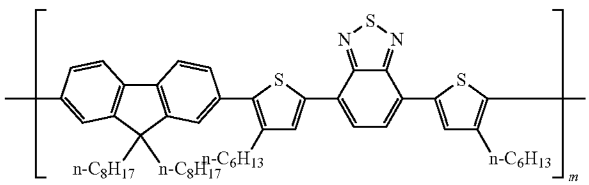
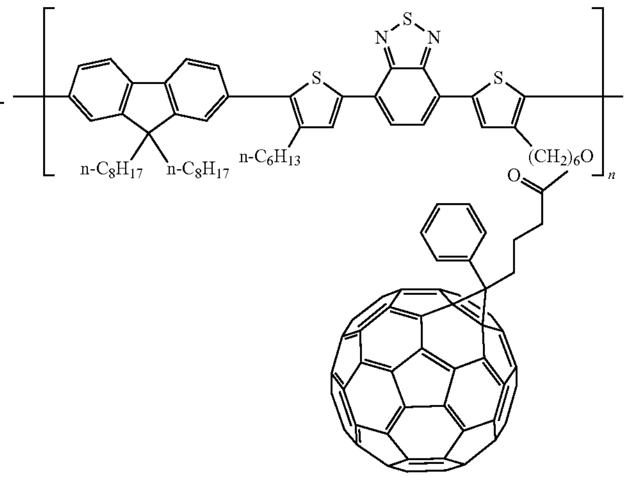
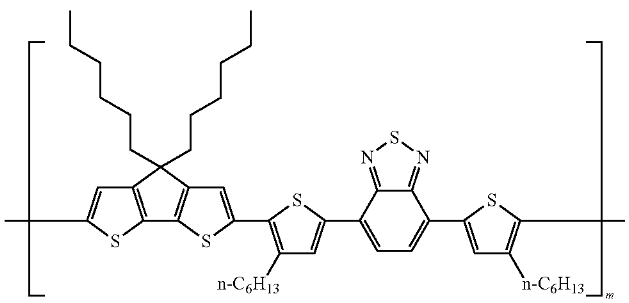
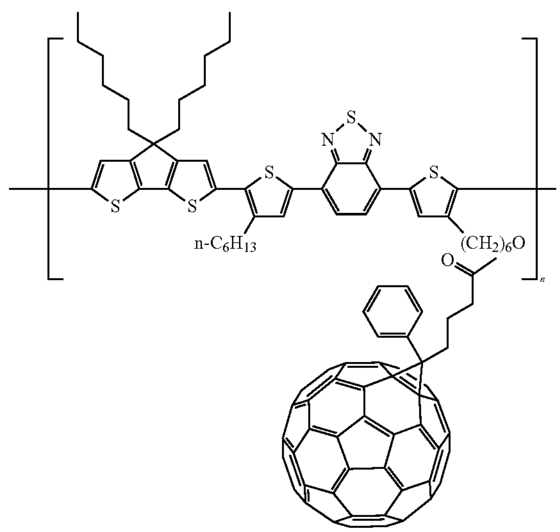
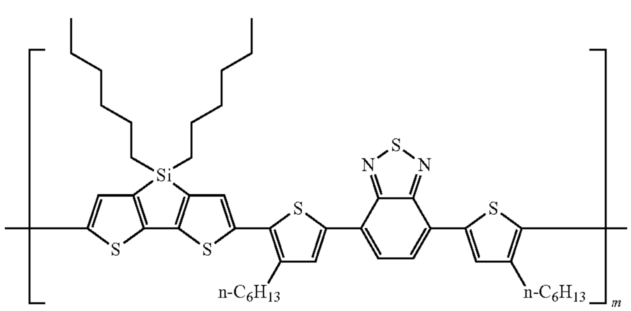
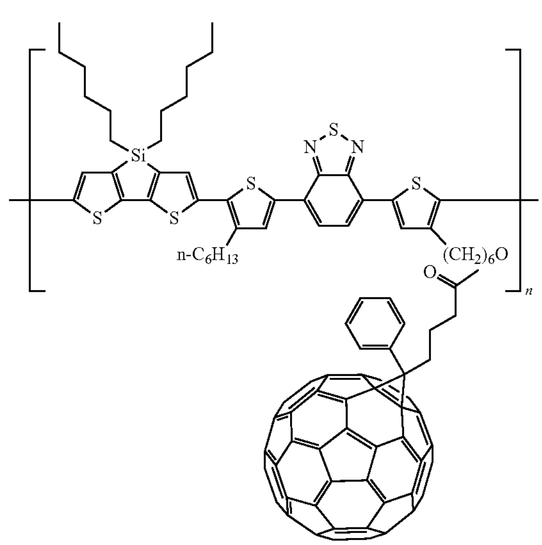

-continued
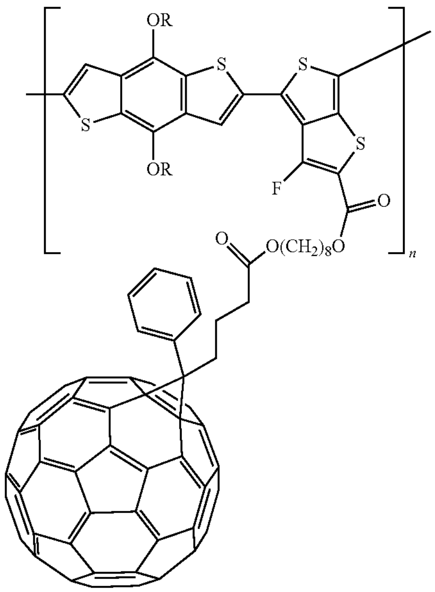
R = 2-ethylhexyl
p-type-and-n-type linked organic semiconductor polymer represented by formula (2)

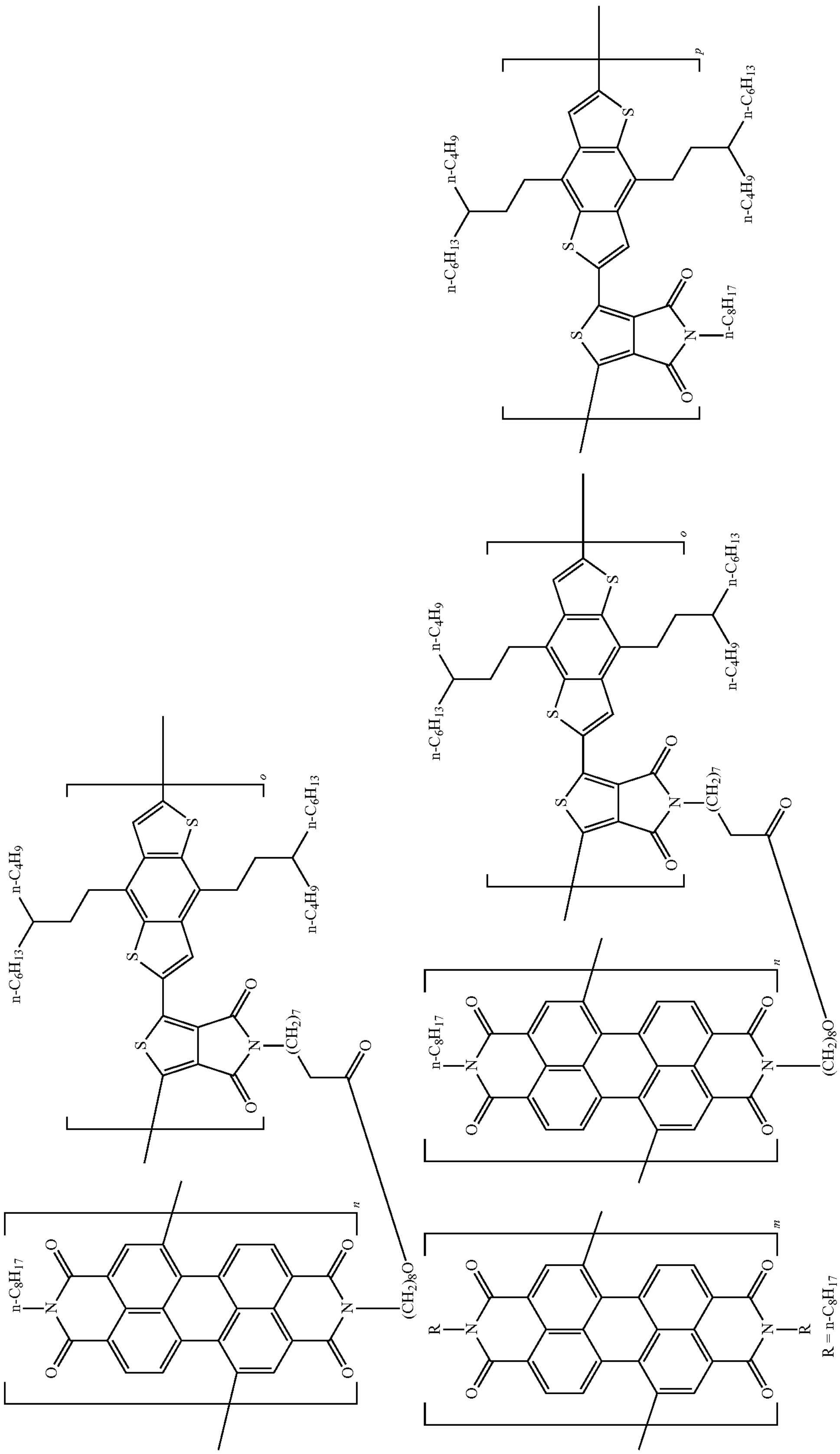

-continued
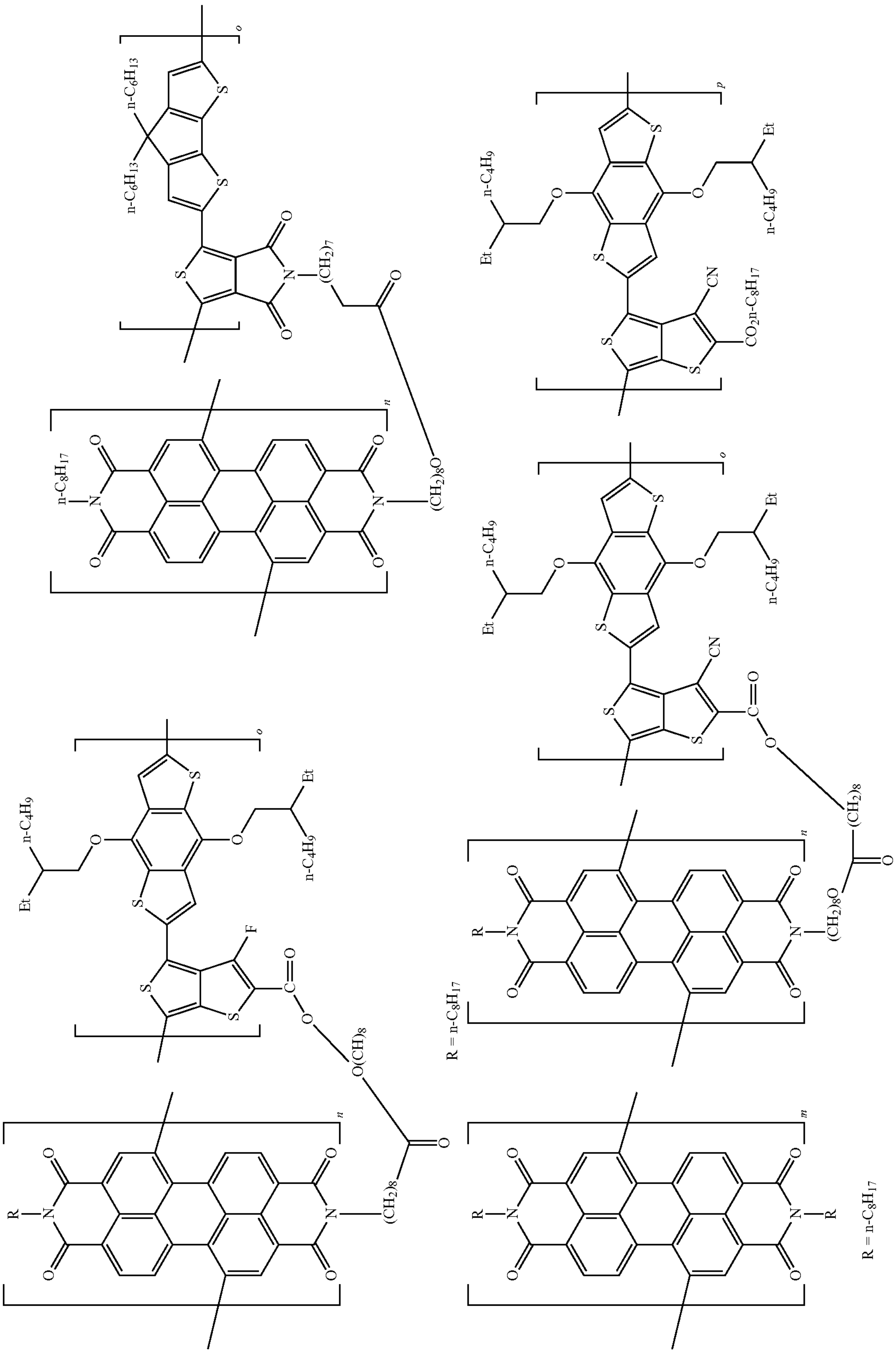

-continued
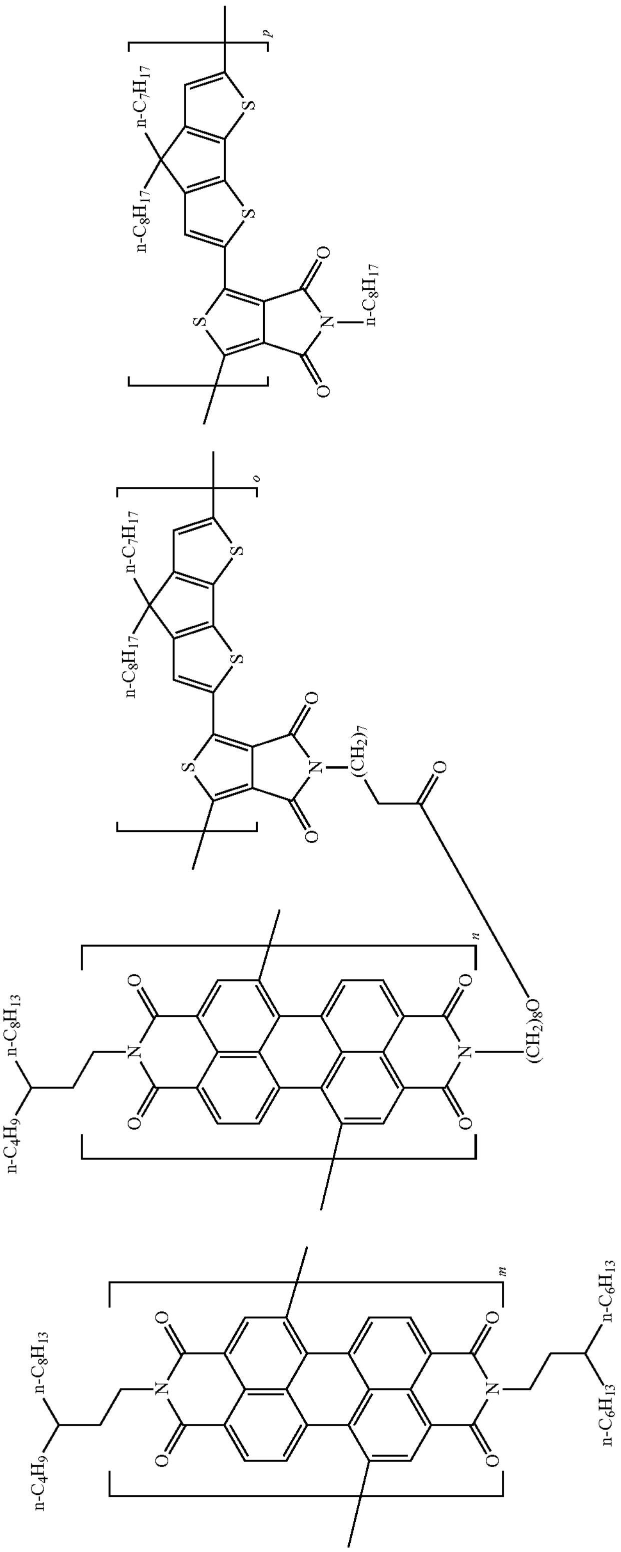
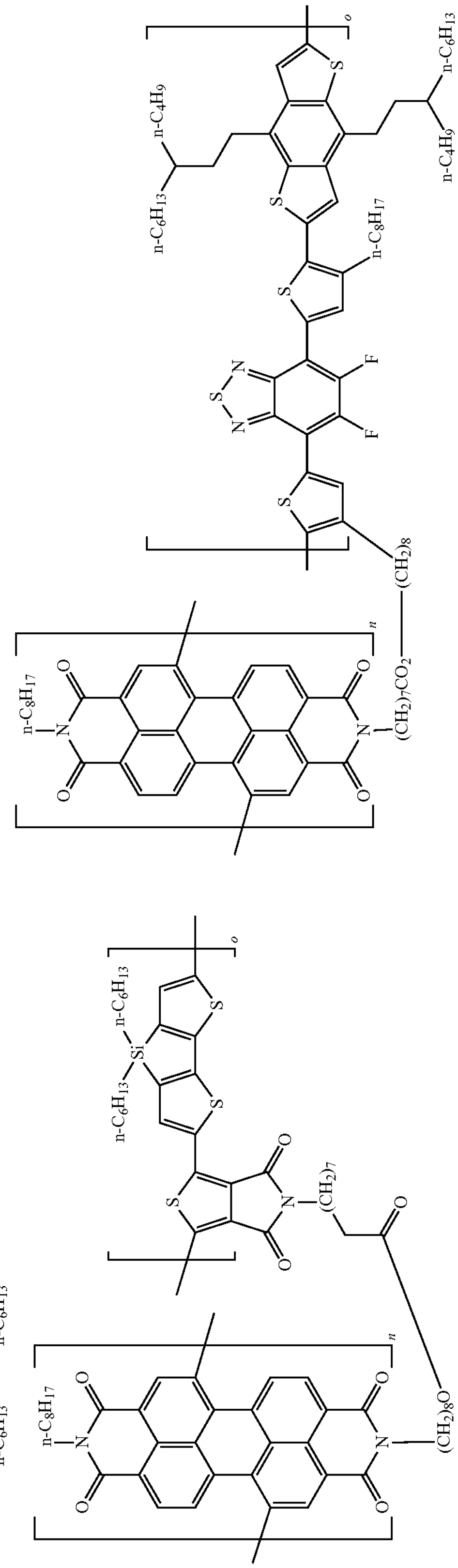

-continued
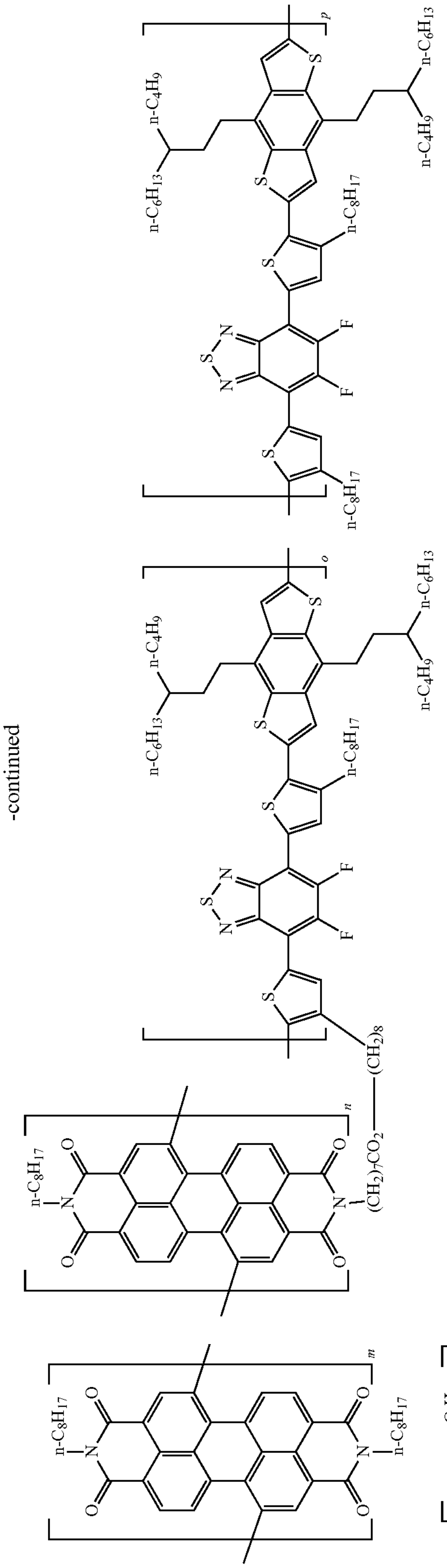
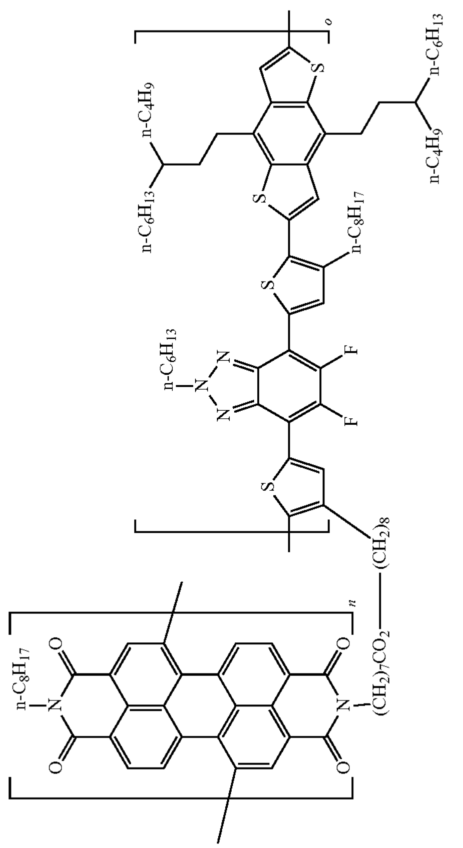

-continued
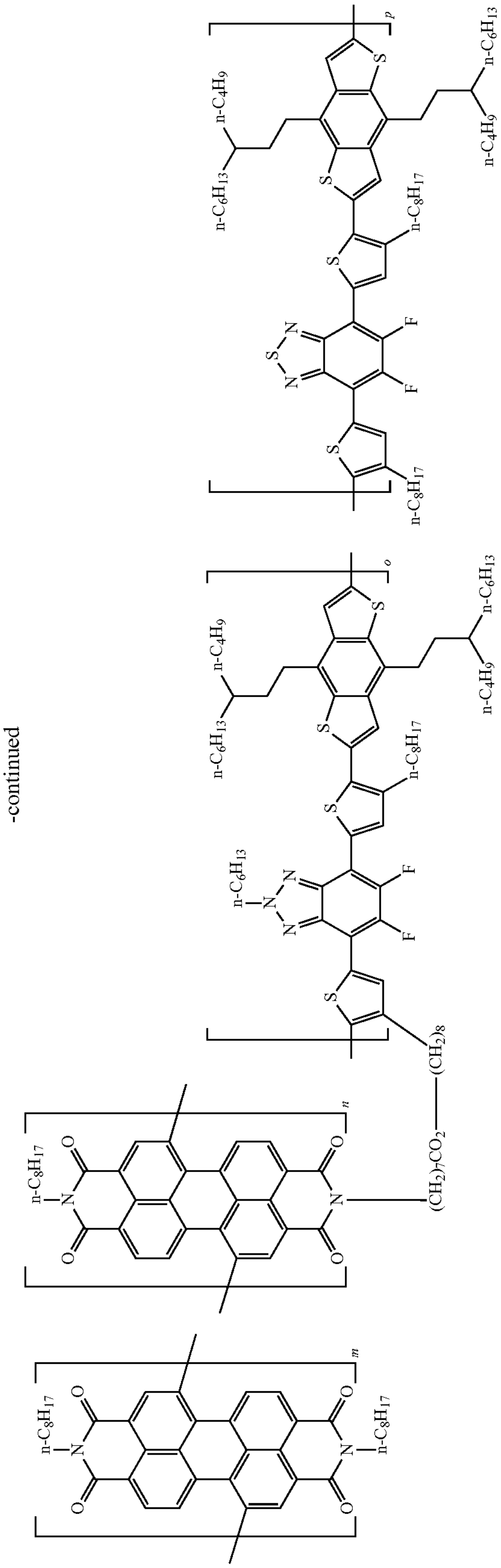
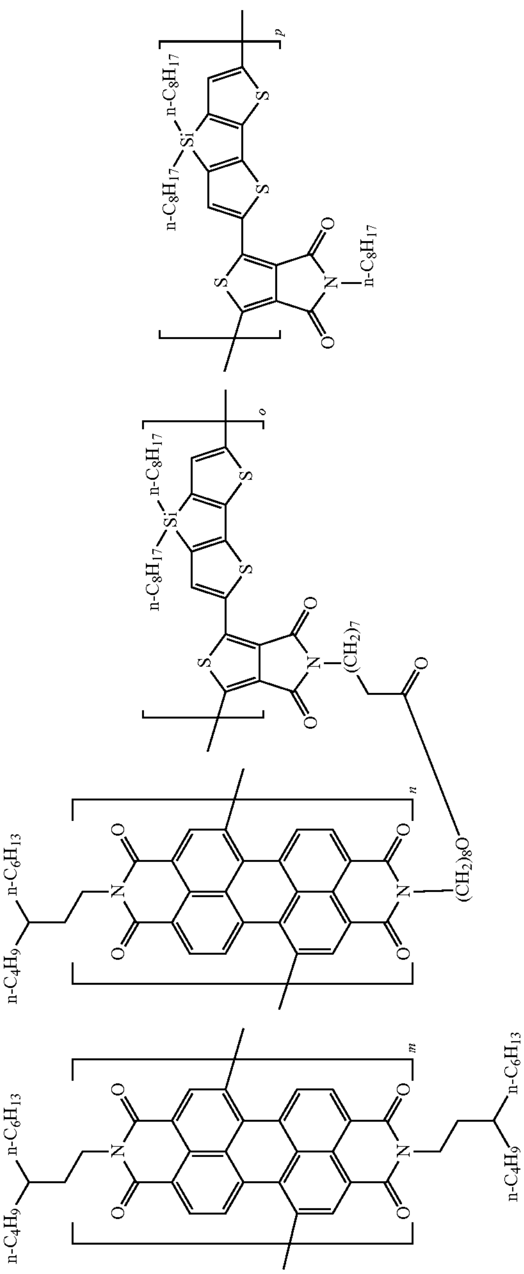

-continued
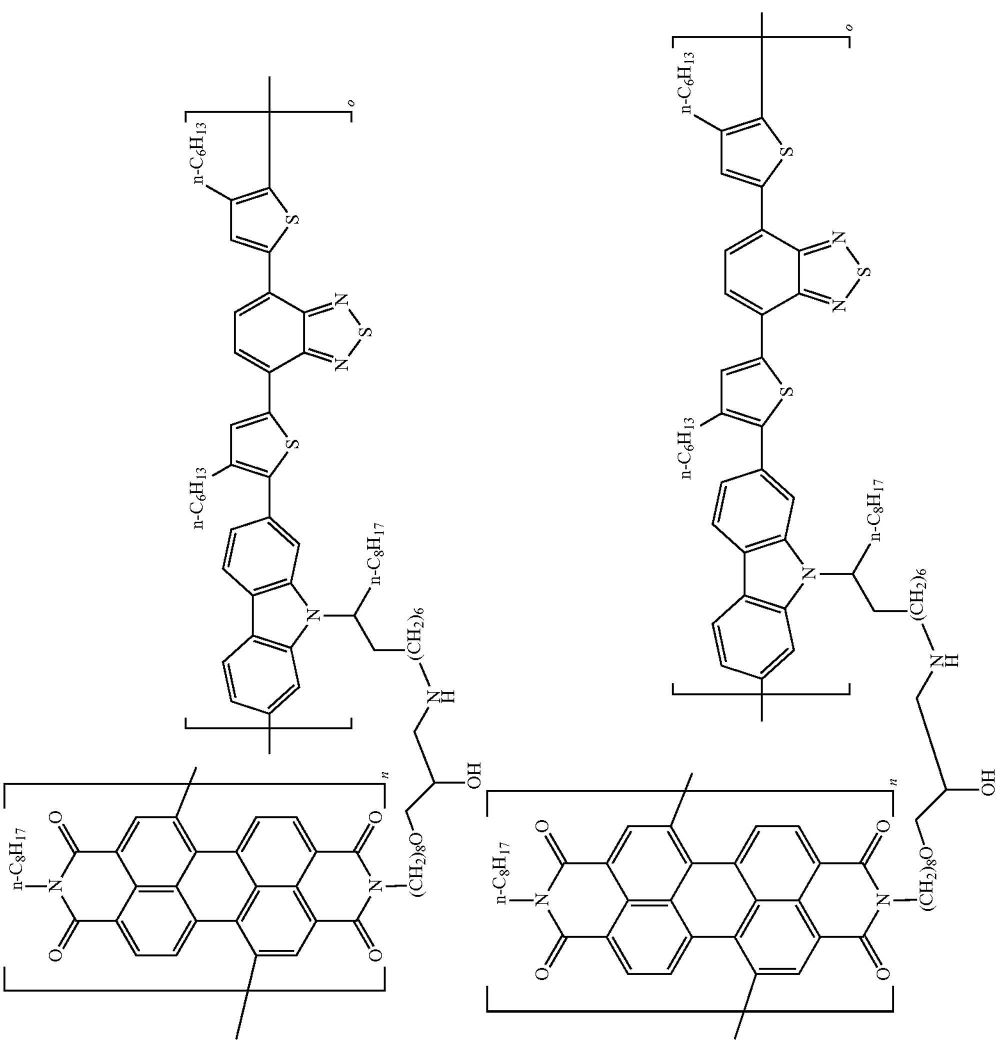

-continued
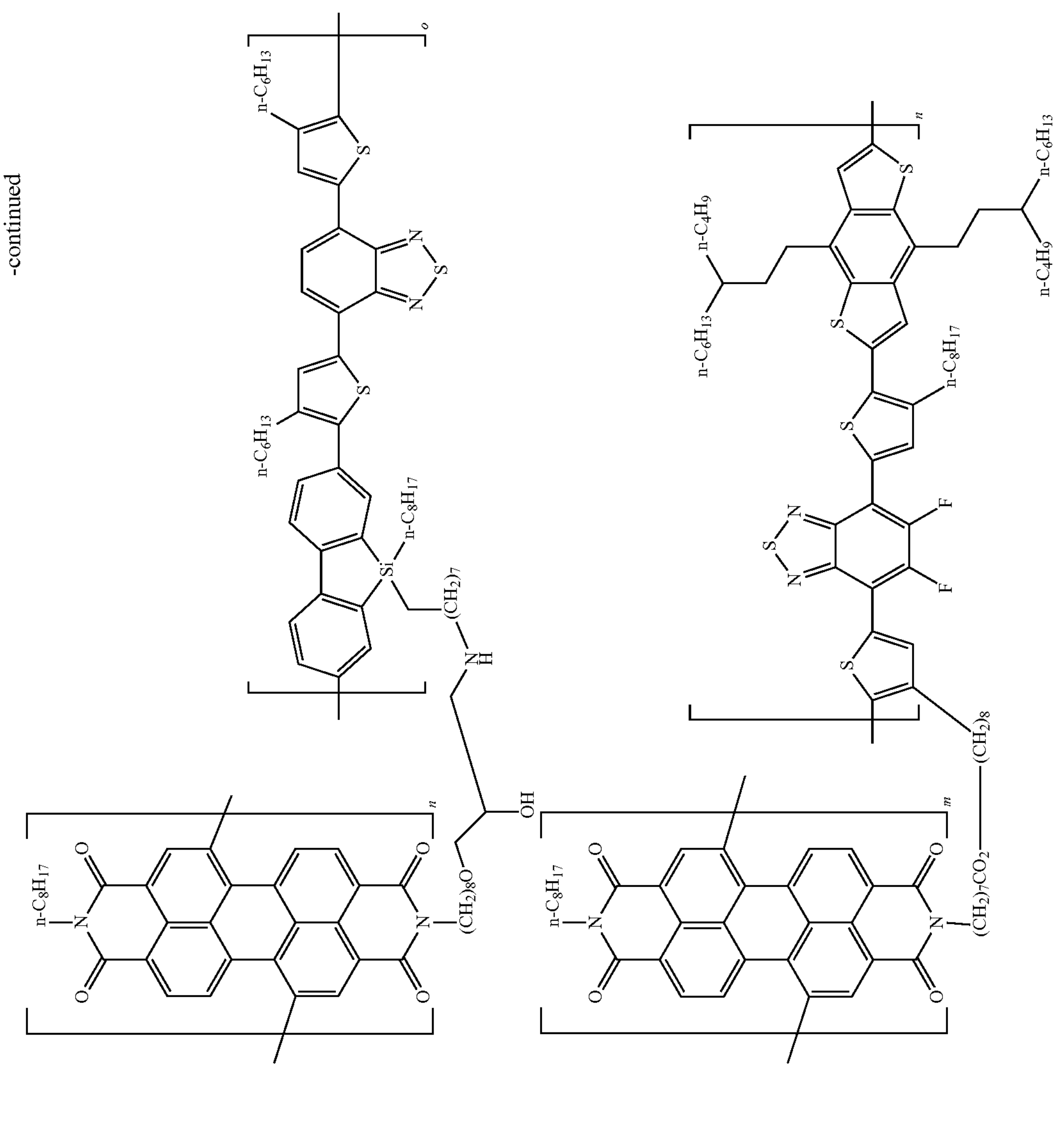

-continued
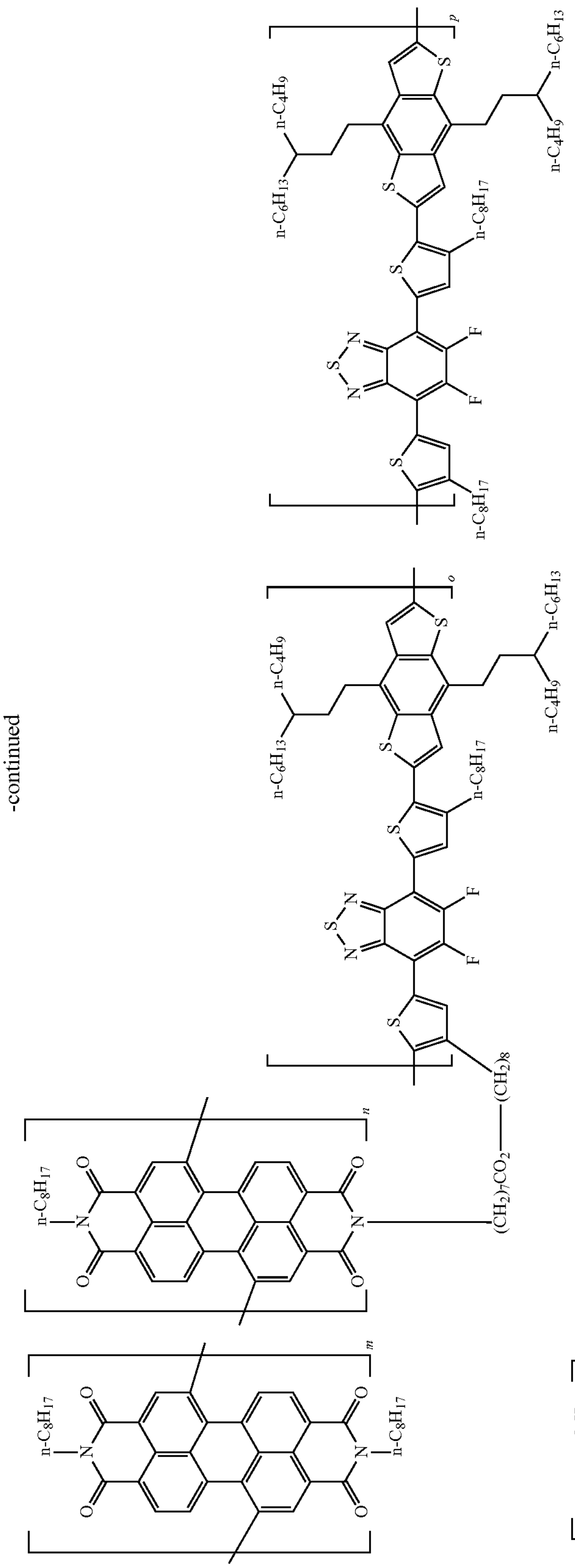
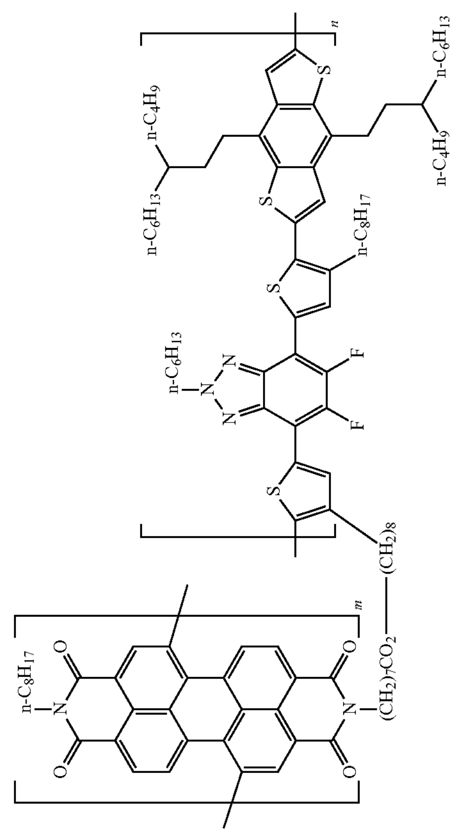

-continued
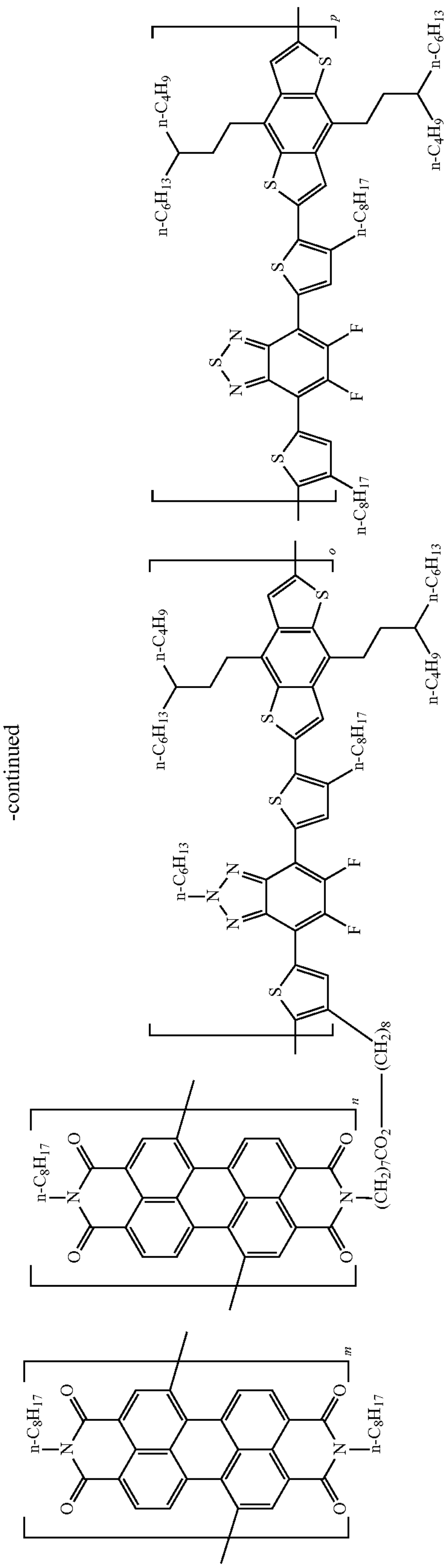

p-type-and-n-type linked organic semiconductor polymer represented by formula (3)

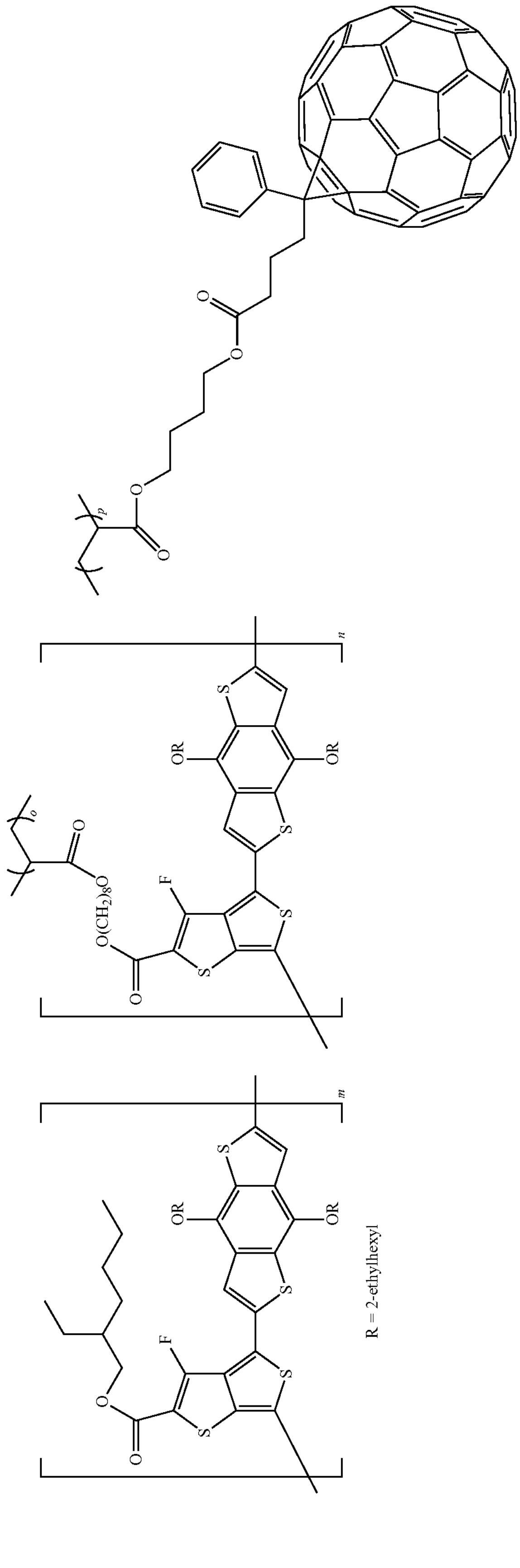
R = 2-ethylhexyl
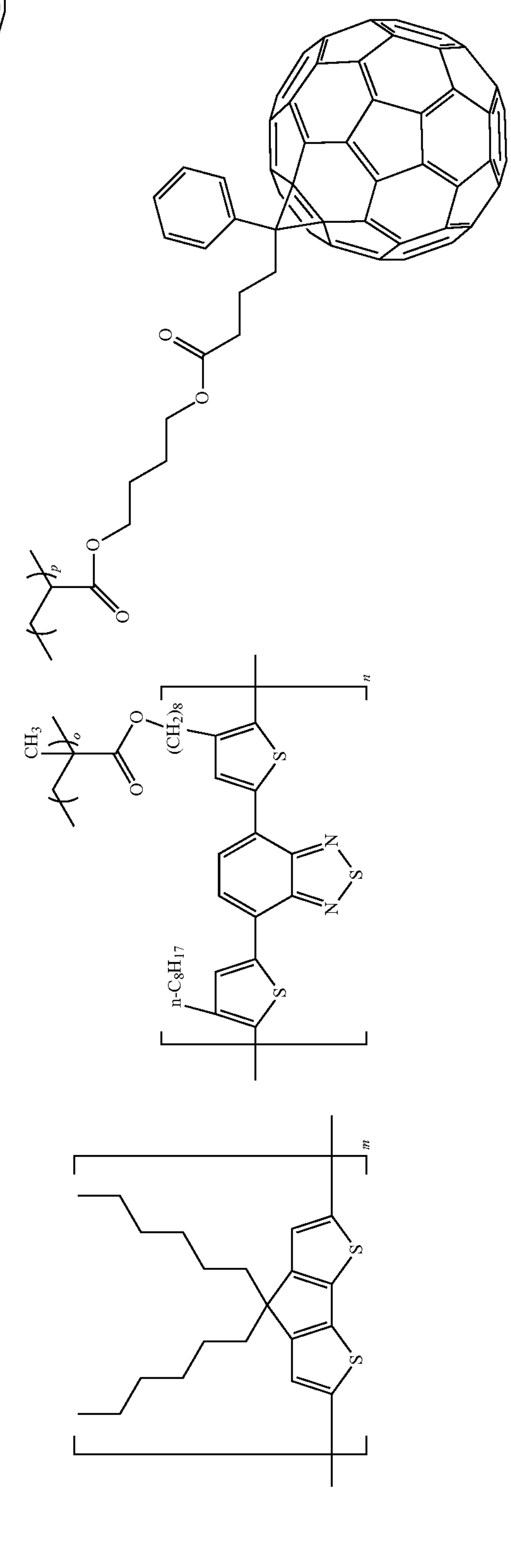

-continued
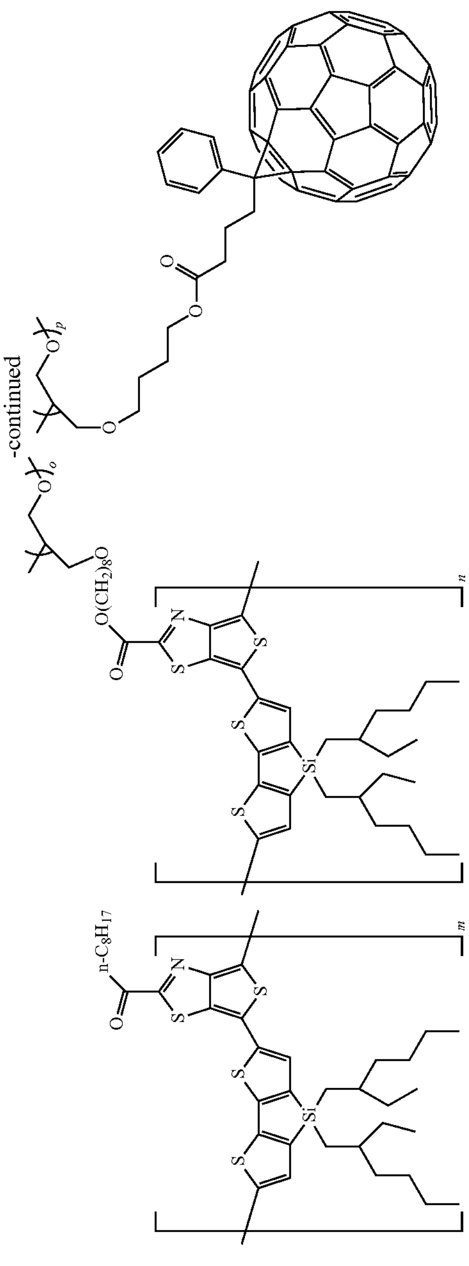
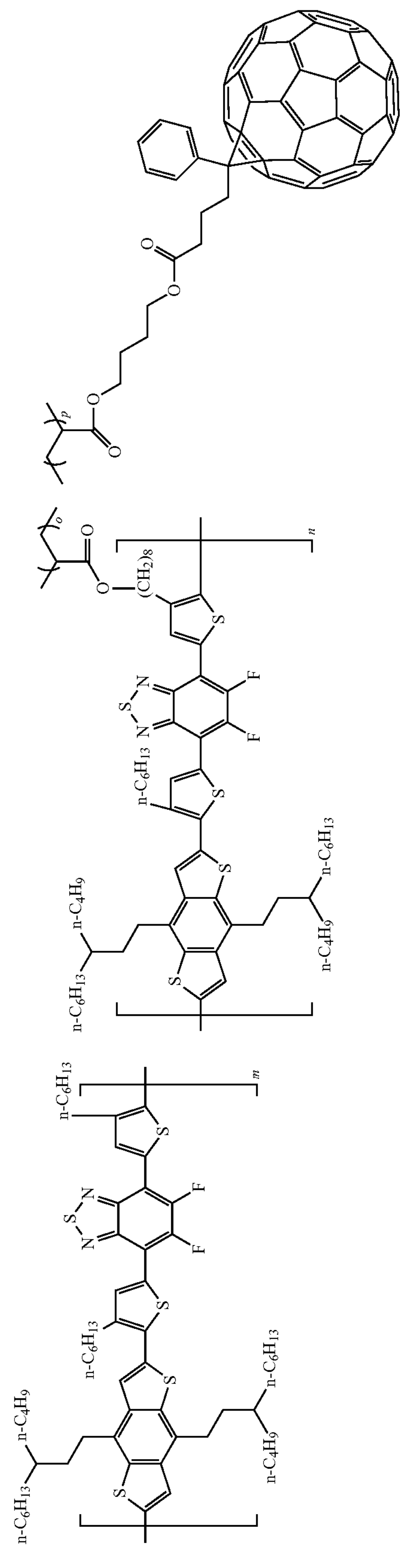

-continued
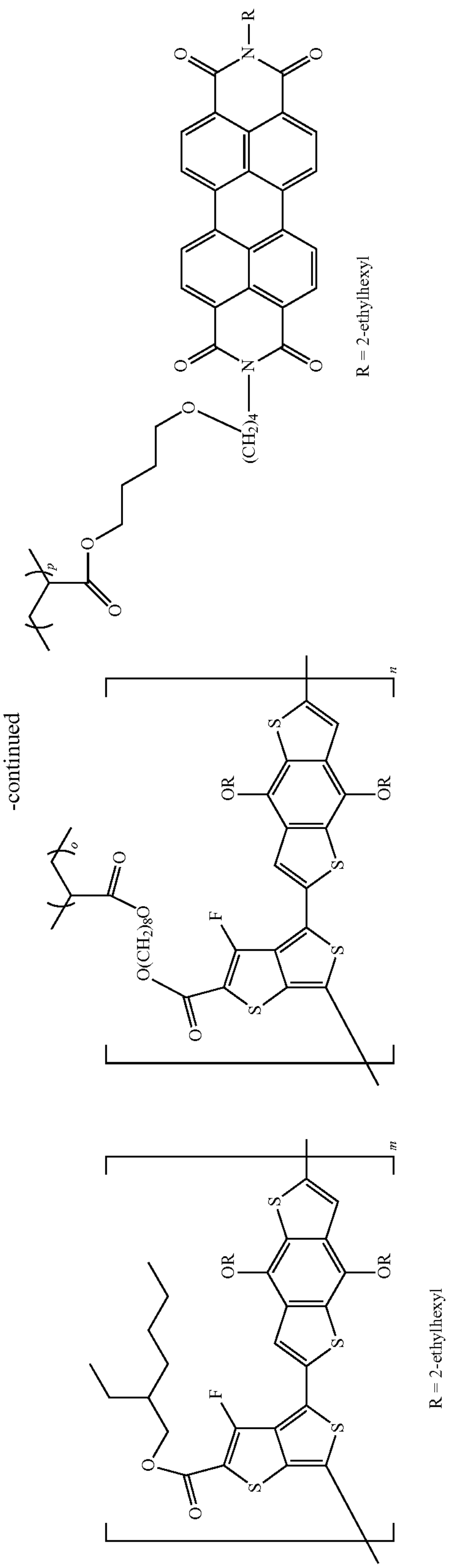
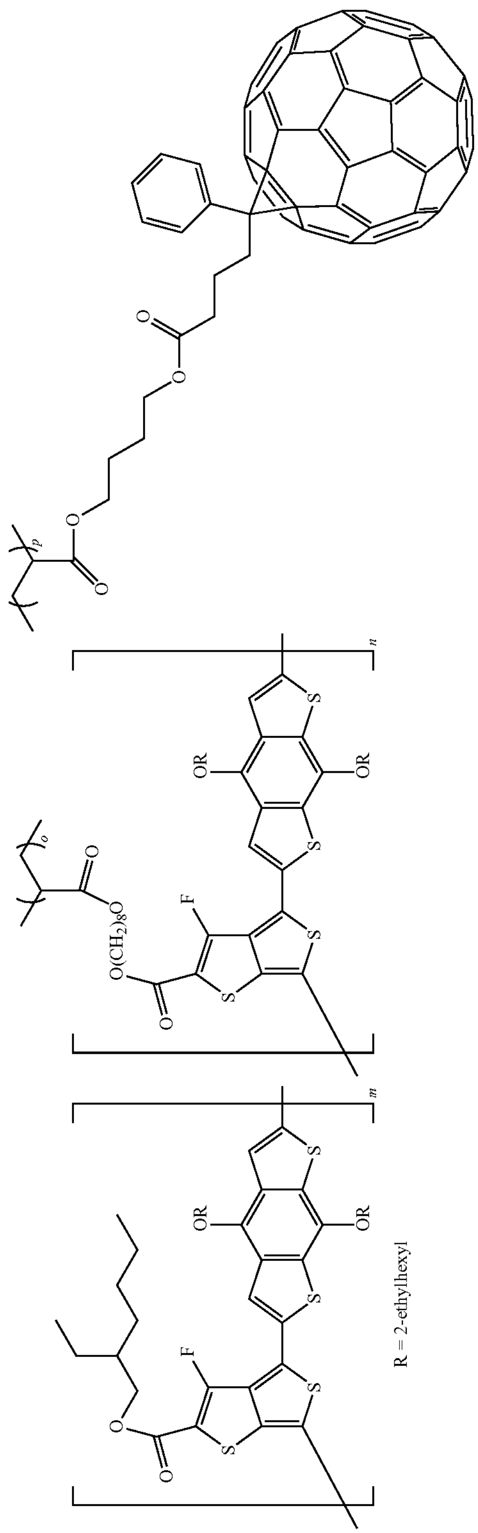

-continued
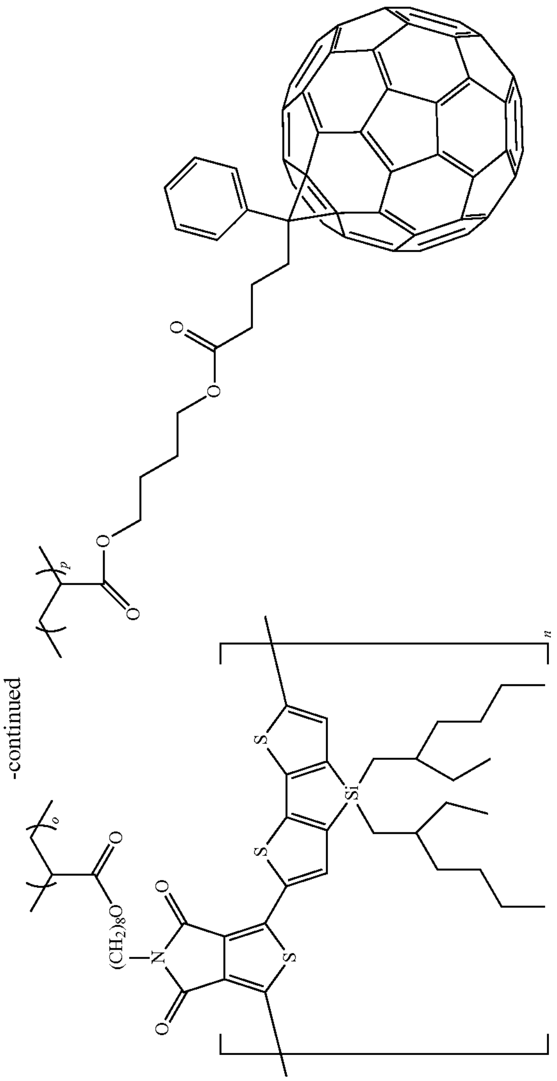
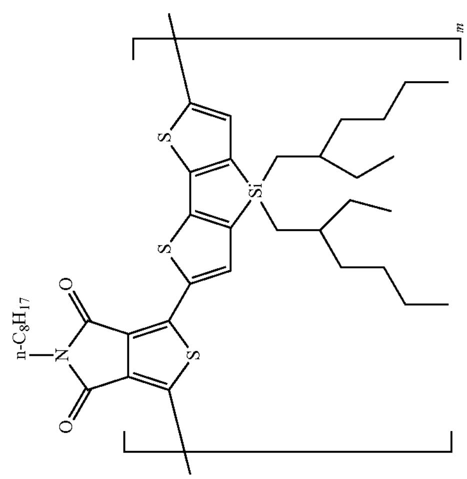

-continued
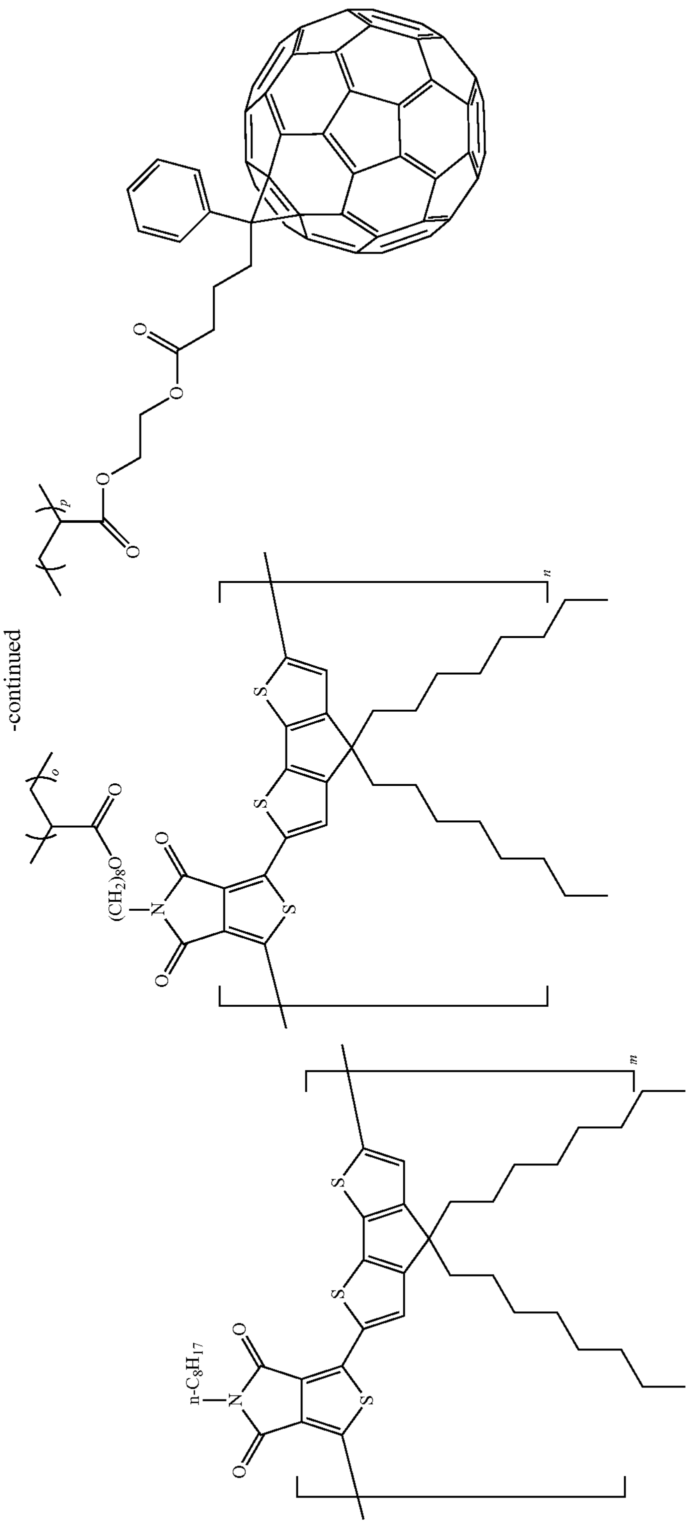

-continued
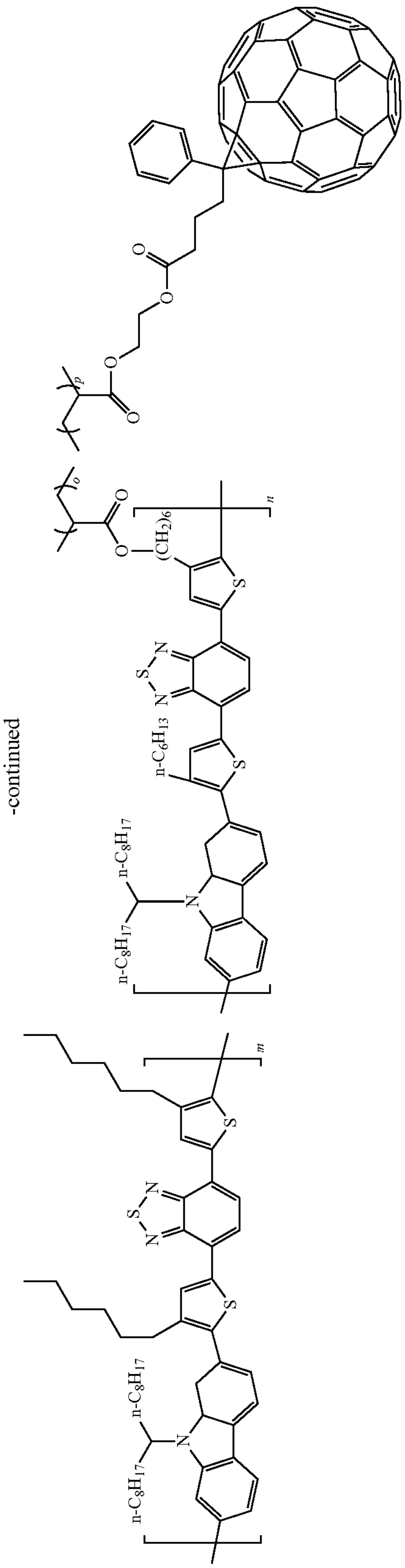
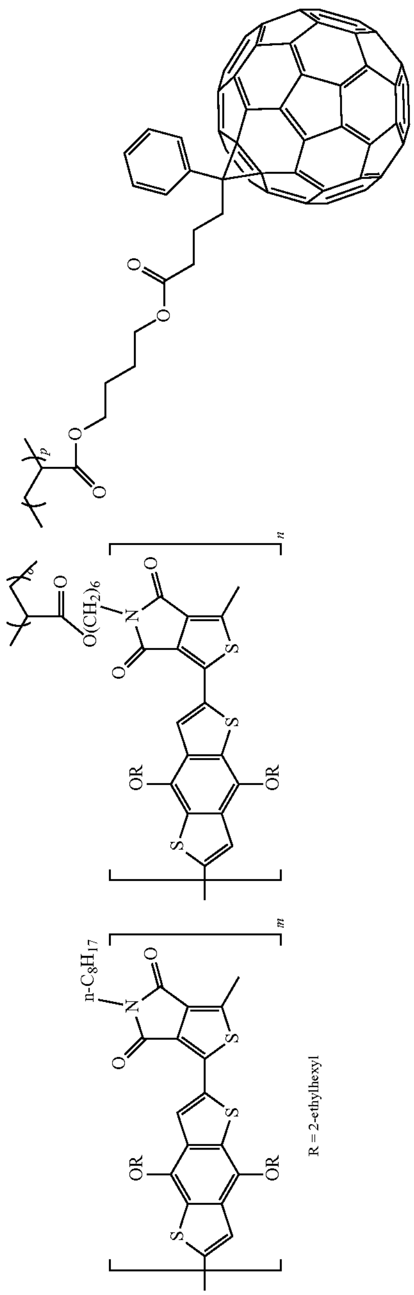
R = 2-ethylhexyl

-continued
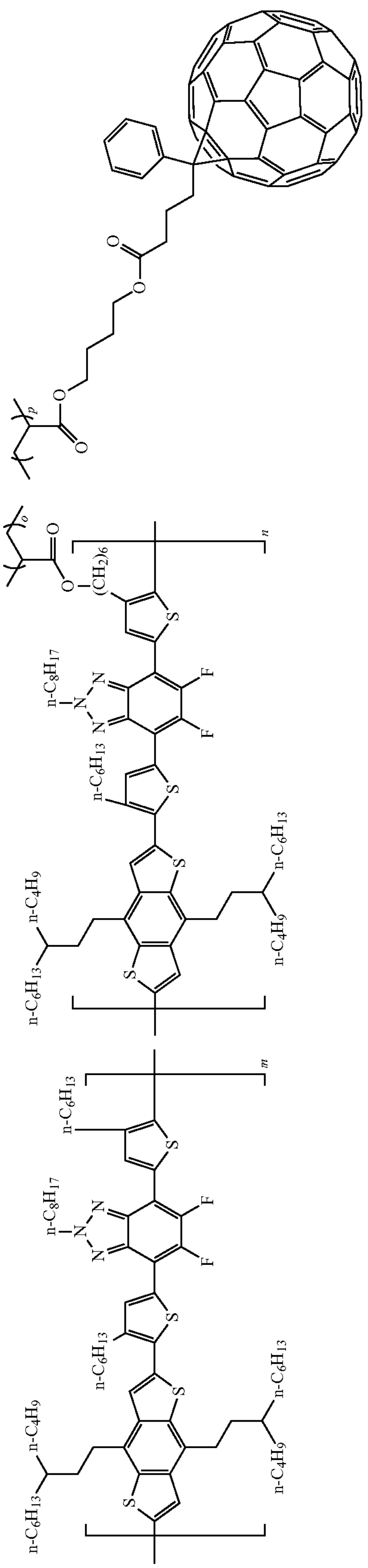
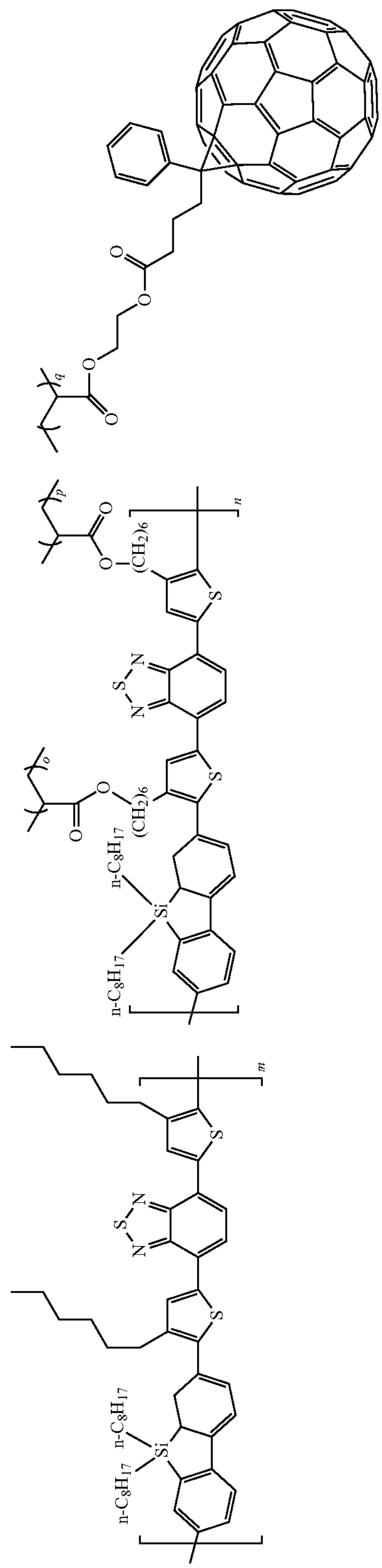

-continued
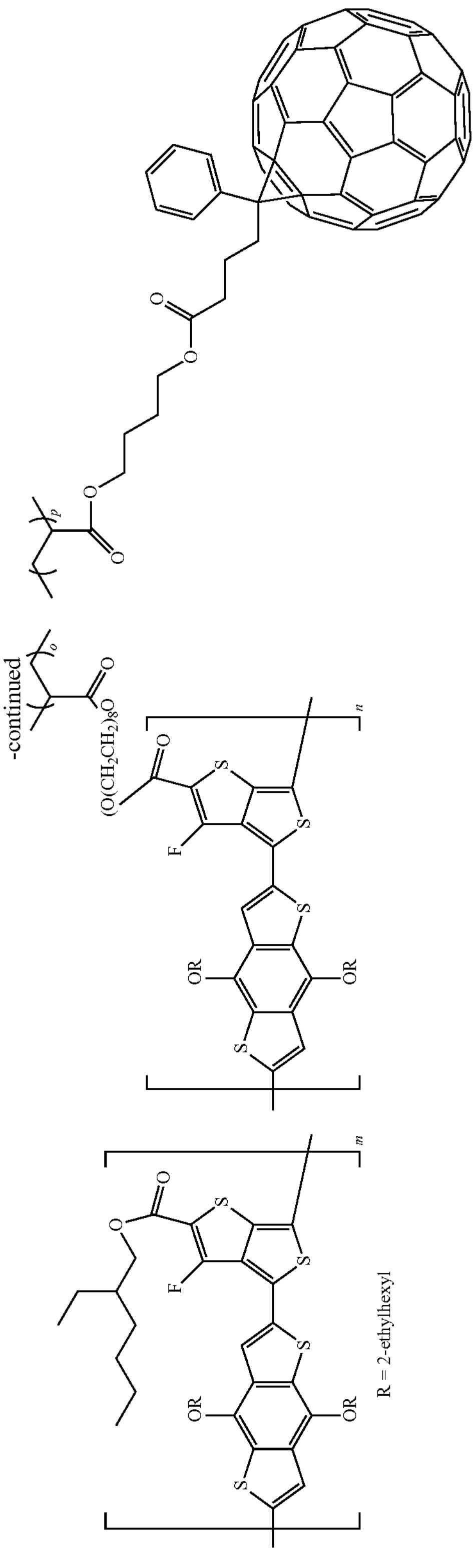
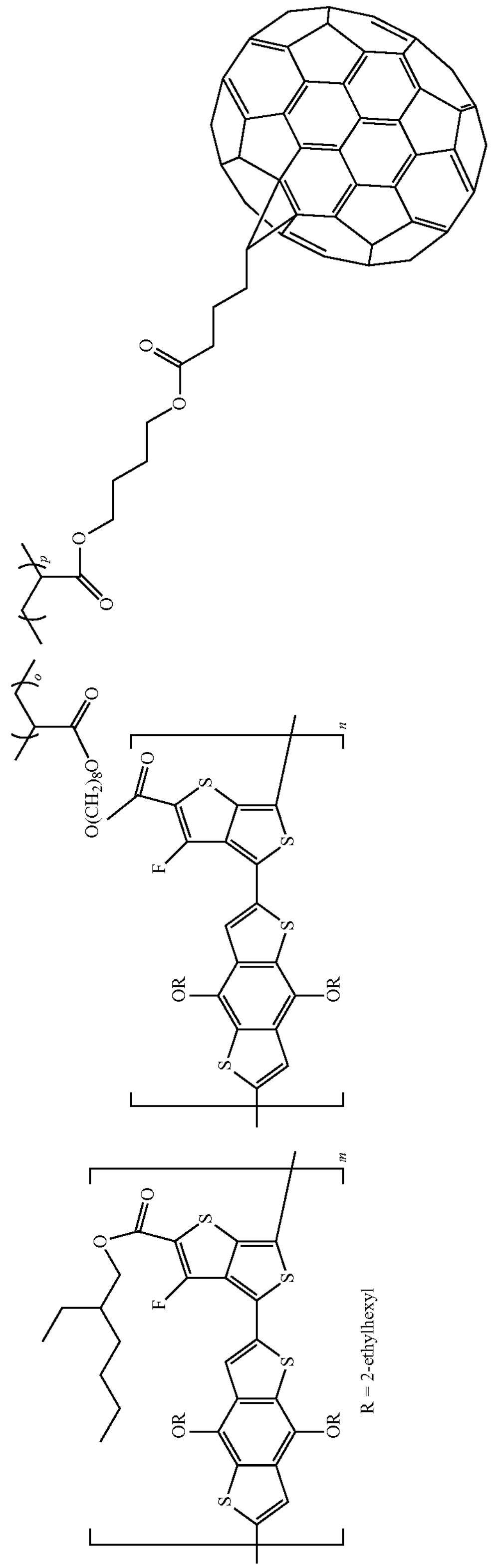

-continued
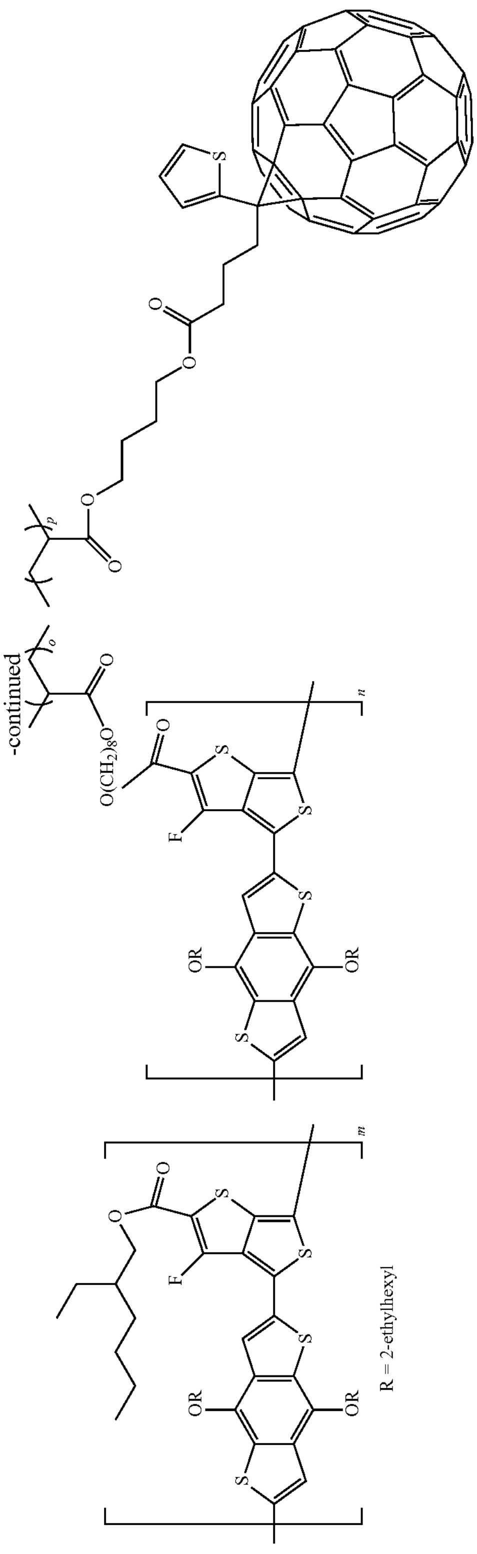
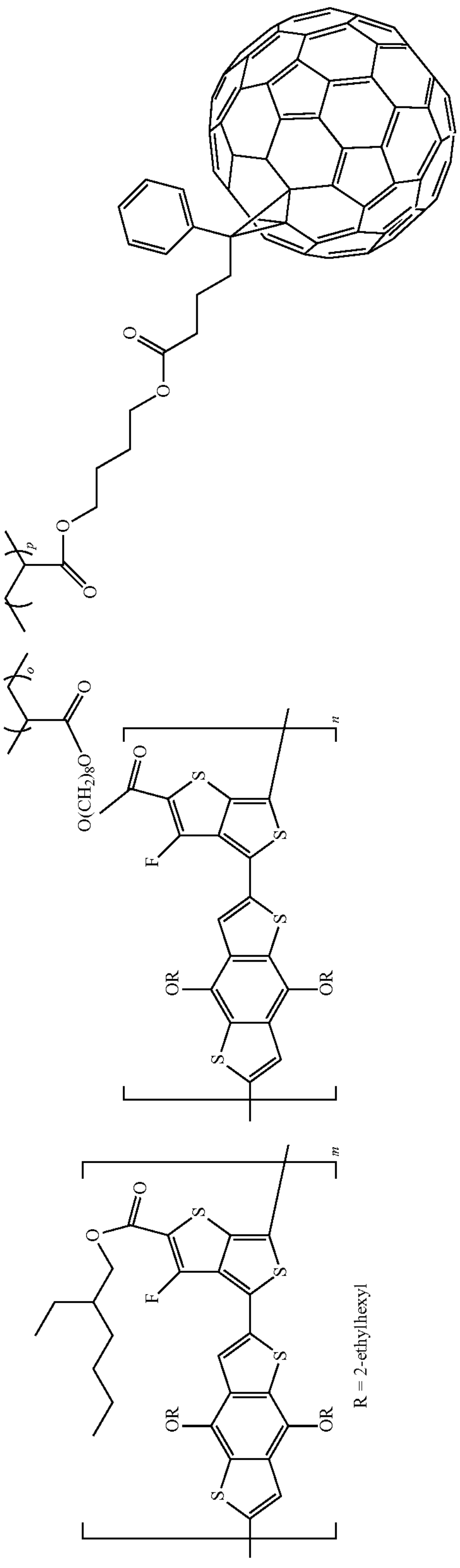

-continued
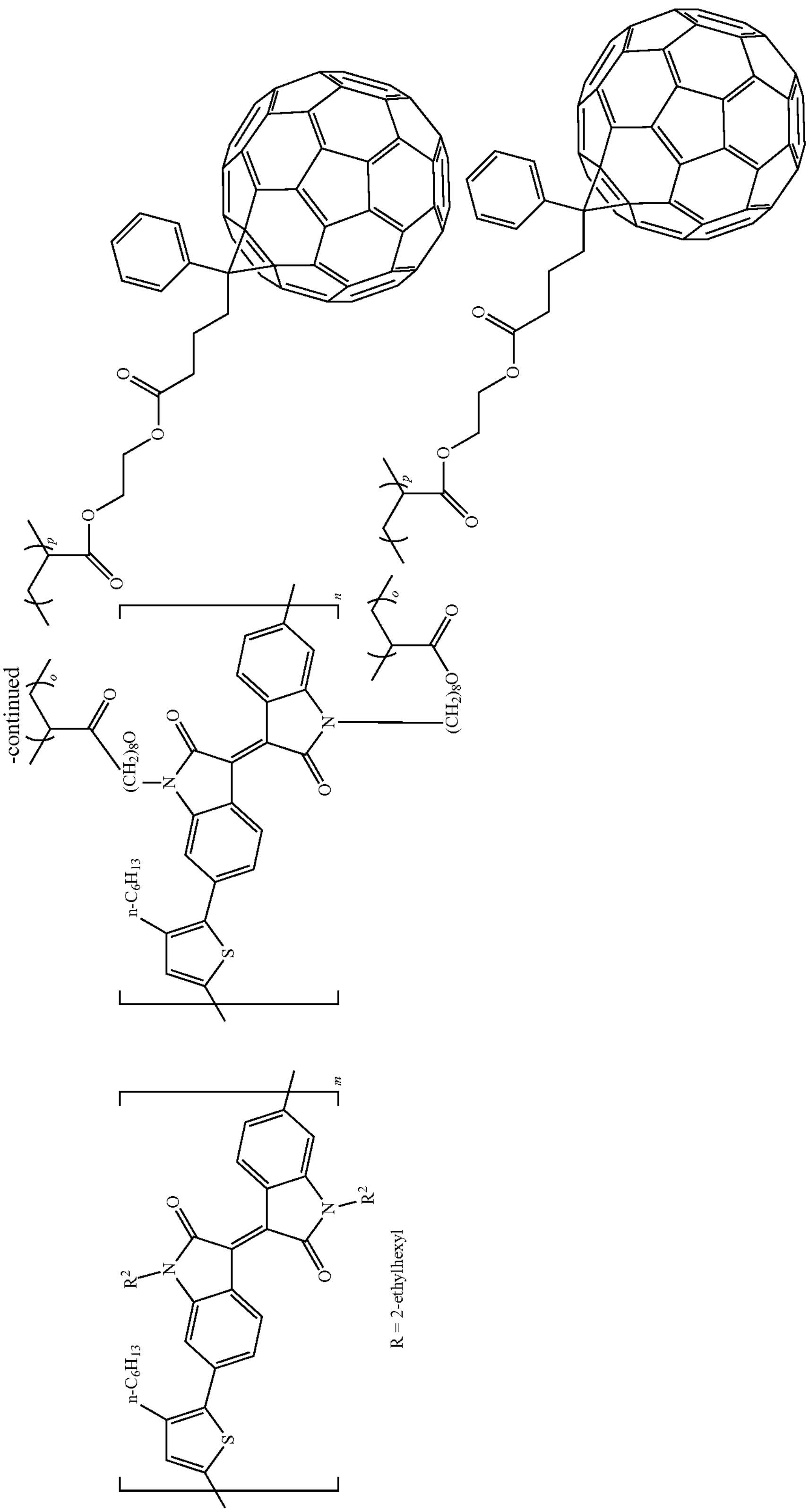

p-type-and-n-type linked organic semiconductor polymer represented by formula (4)

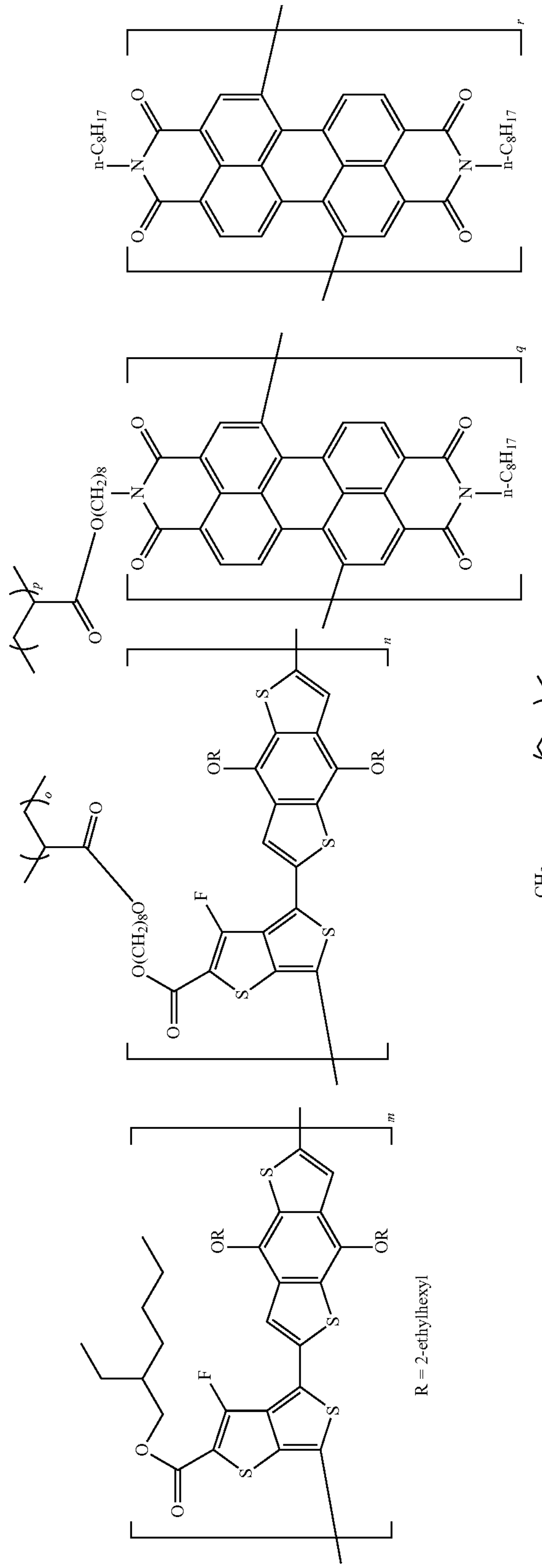
R = 2-ethylhexyl
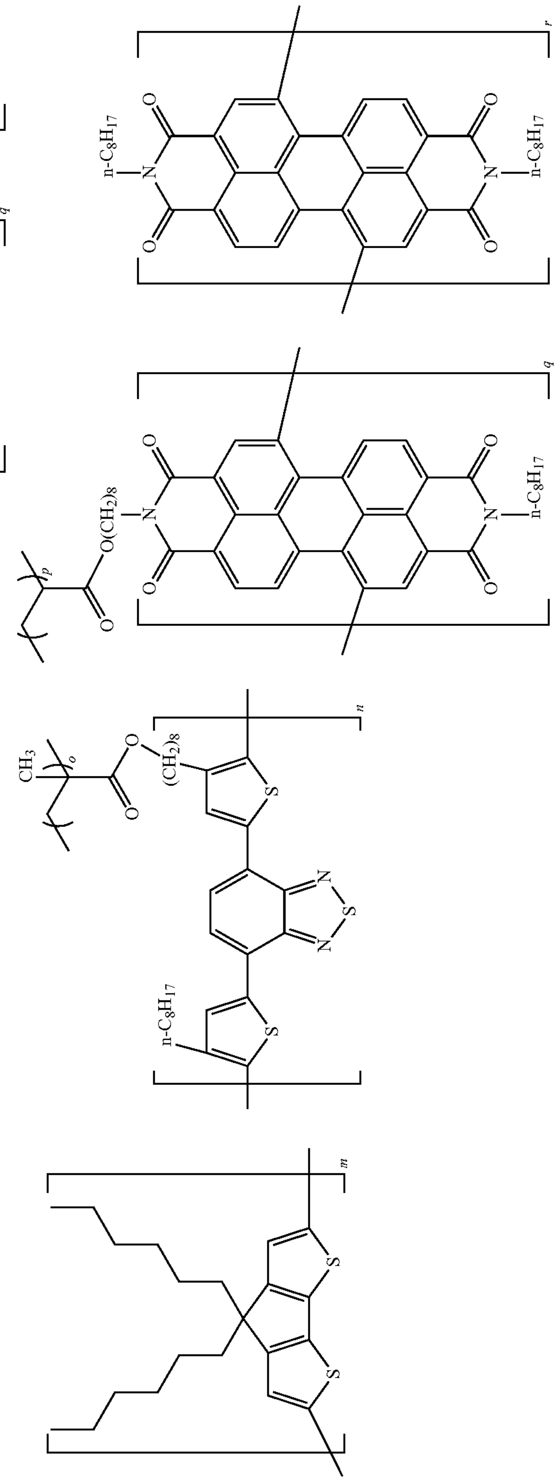

-continued
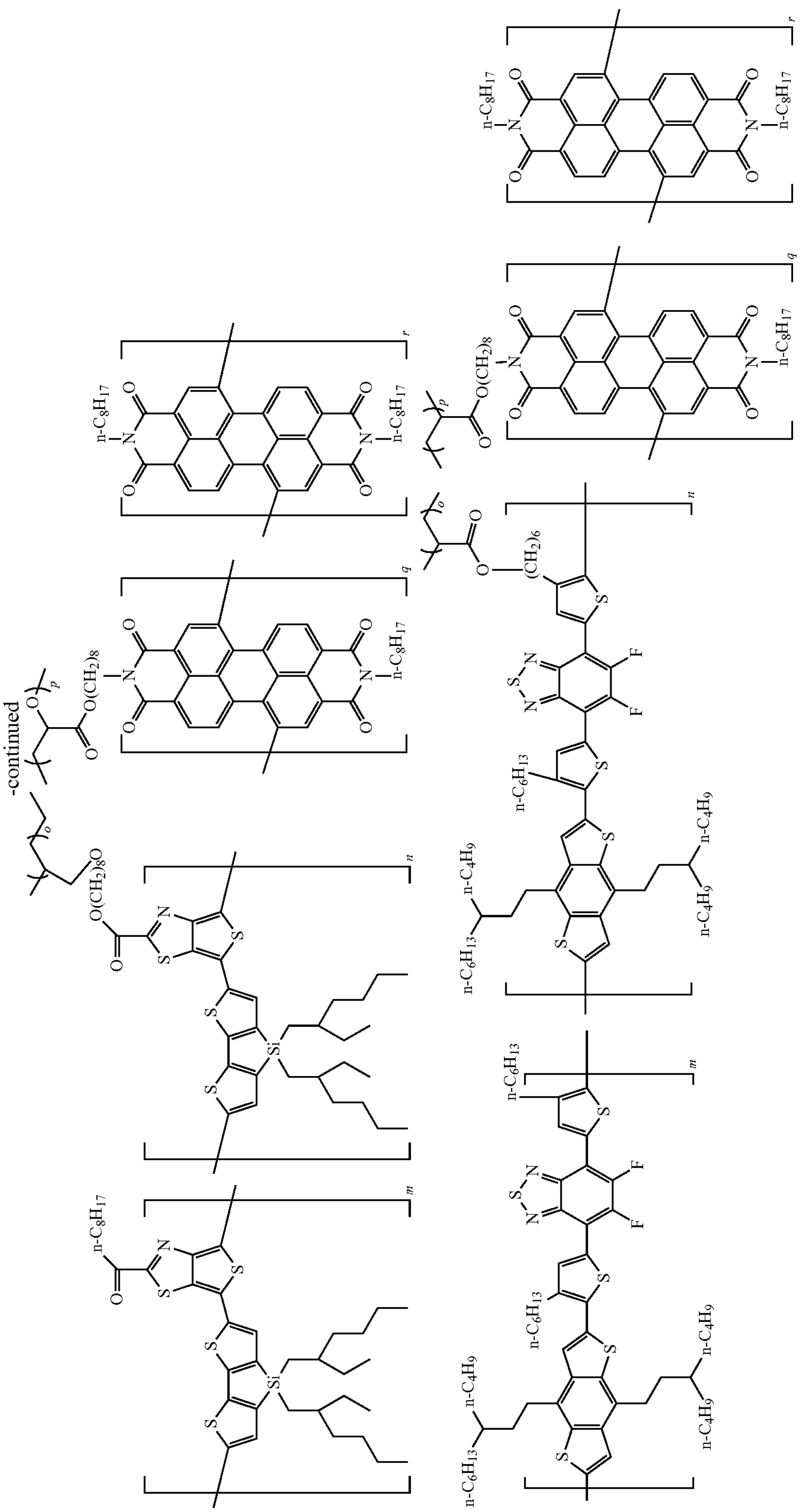

-continued
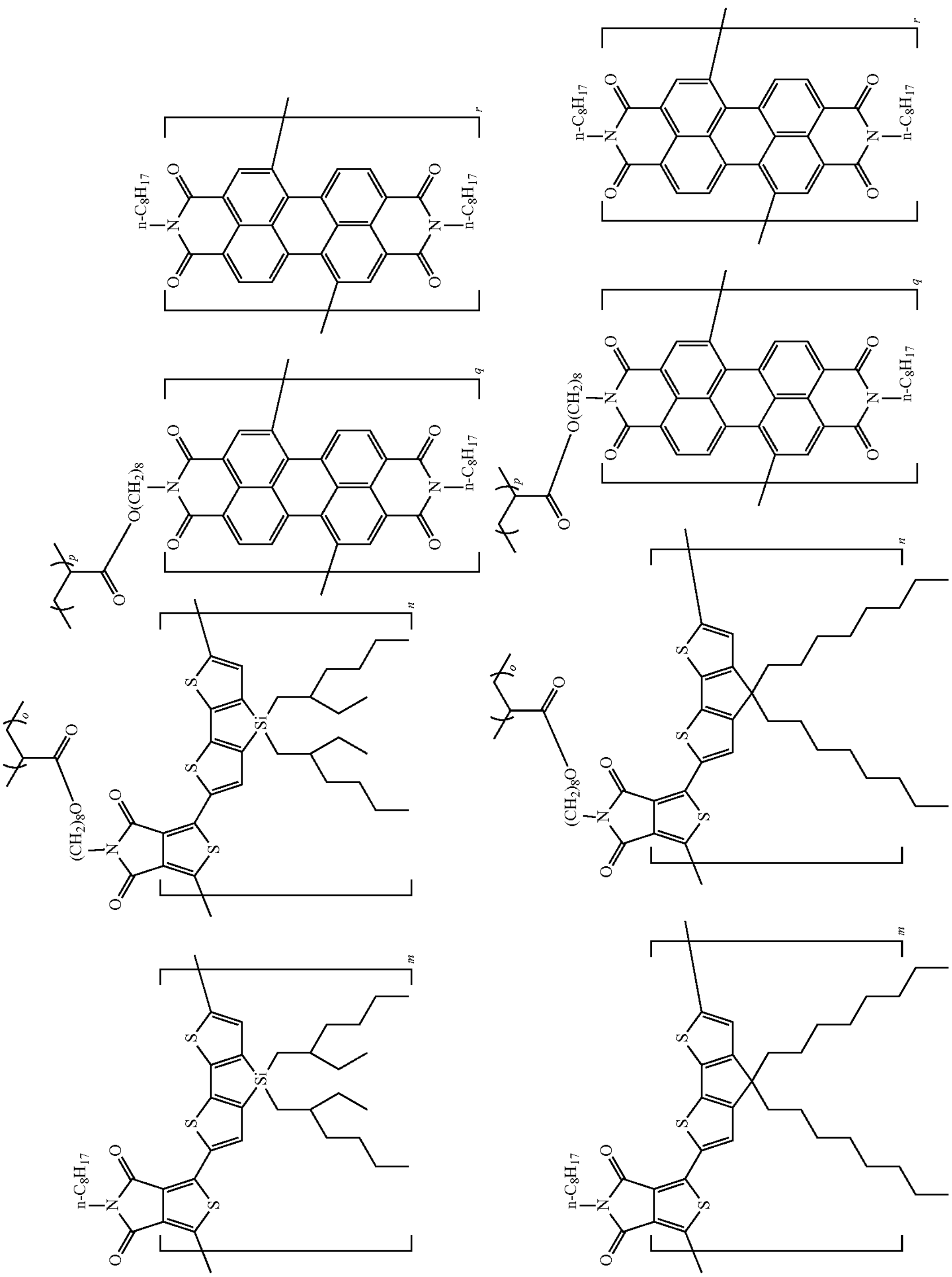

-continued
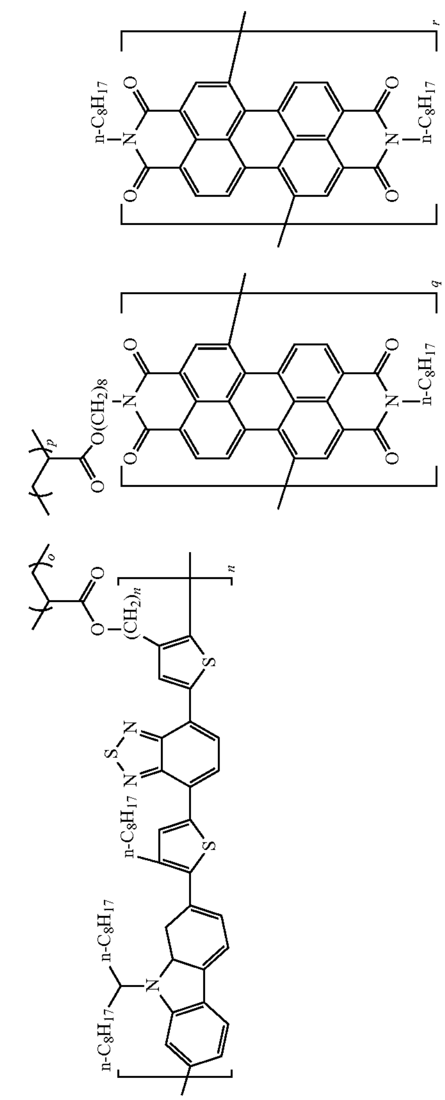
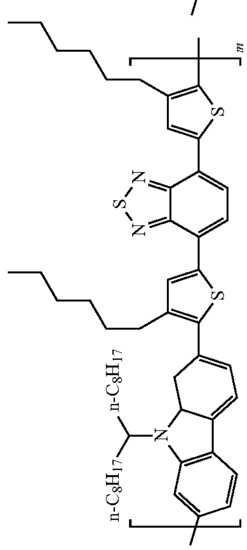
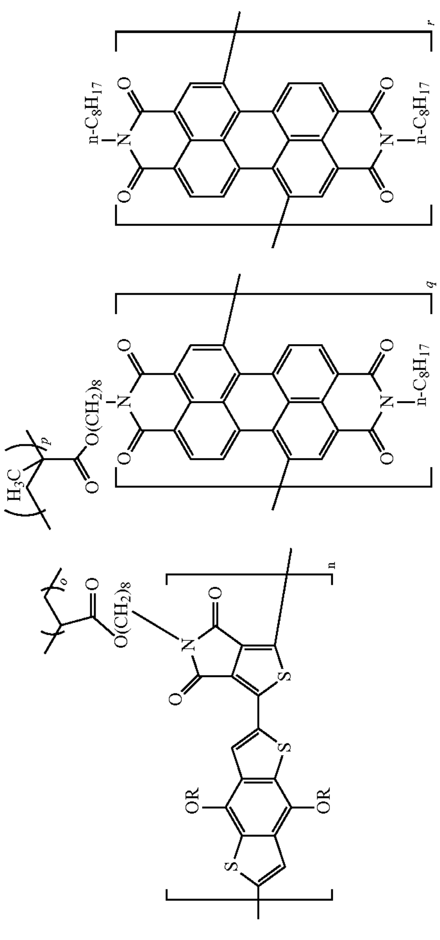
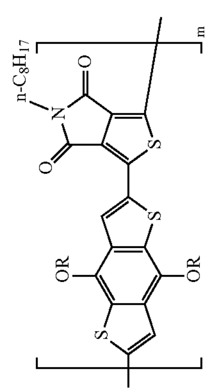
R = 2-ethylhexyl

-continued
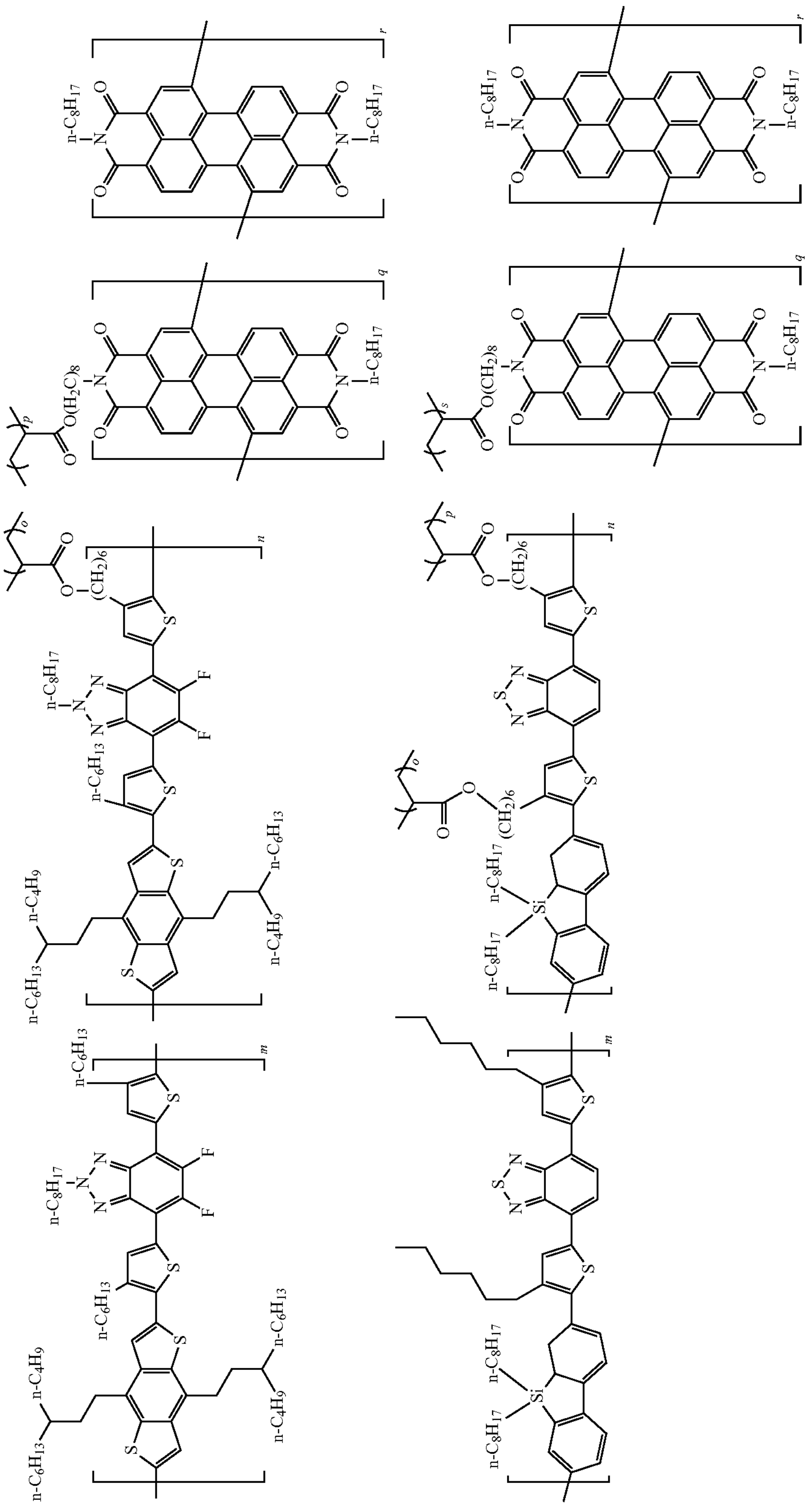

p-type-and-n-type linked organic semiconductor polymer represented by formula (5)

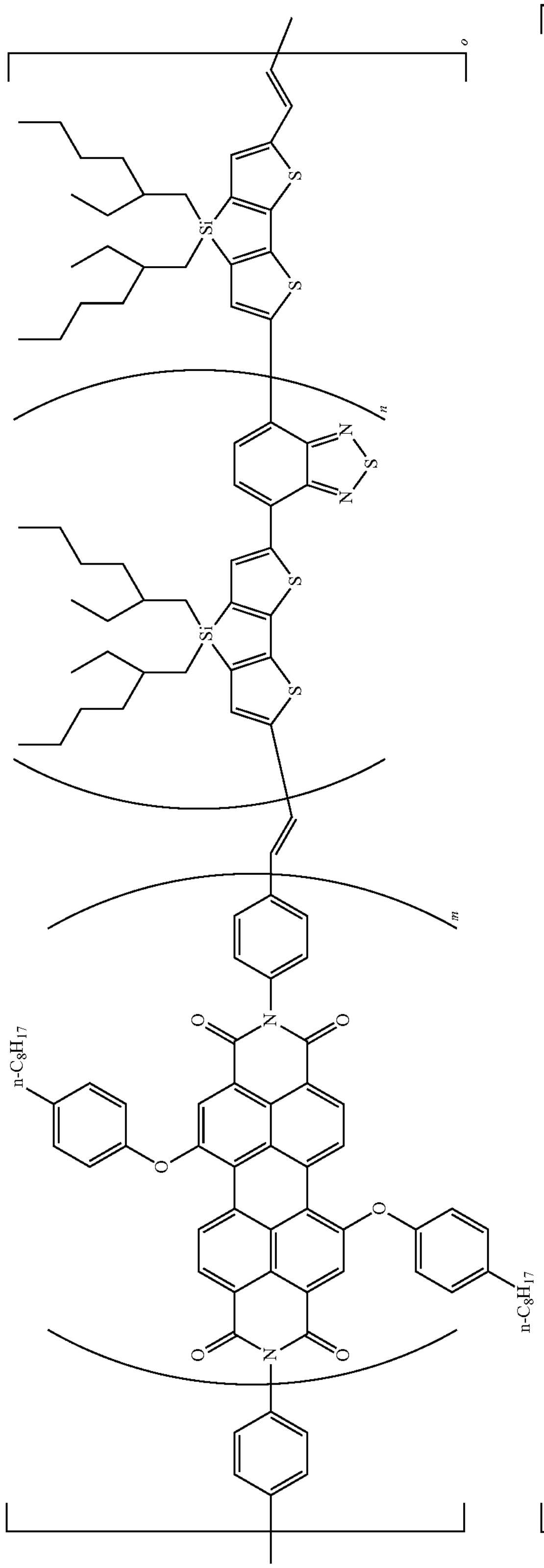
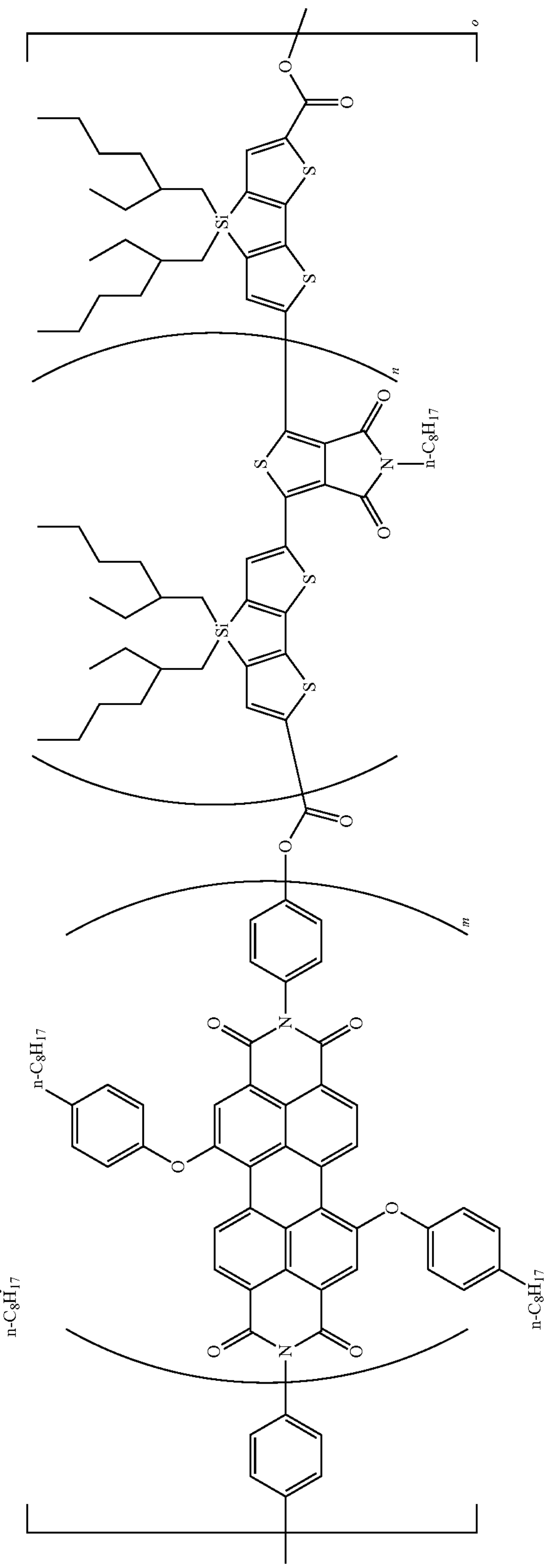

-continued
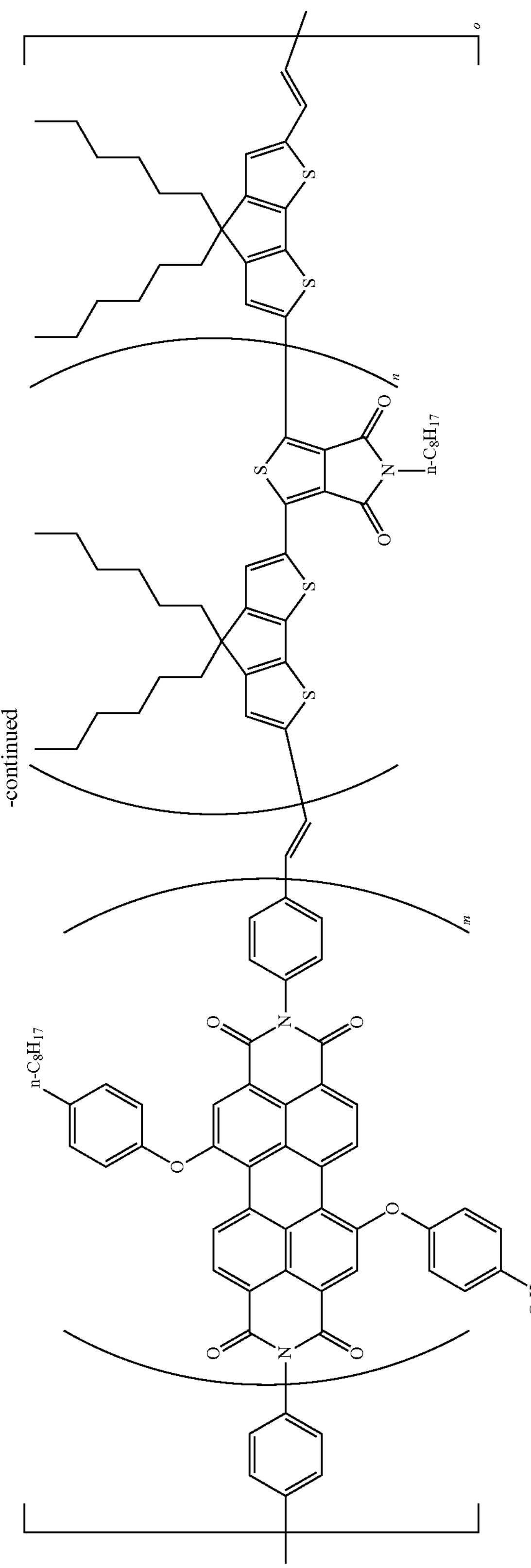
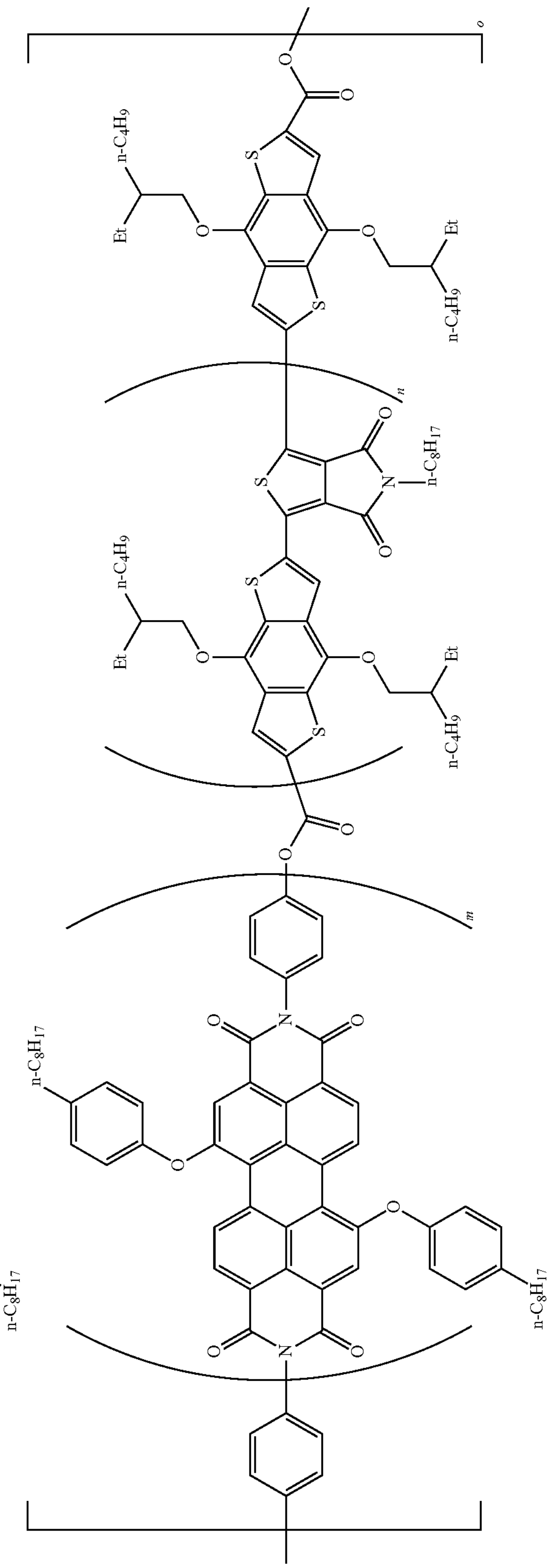

-continued
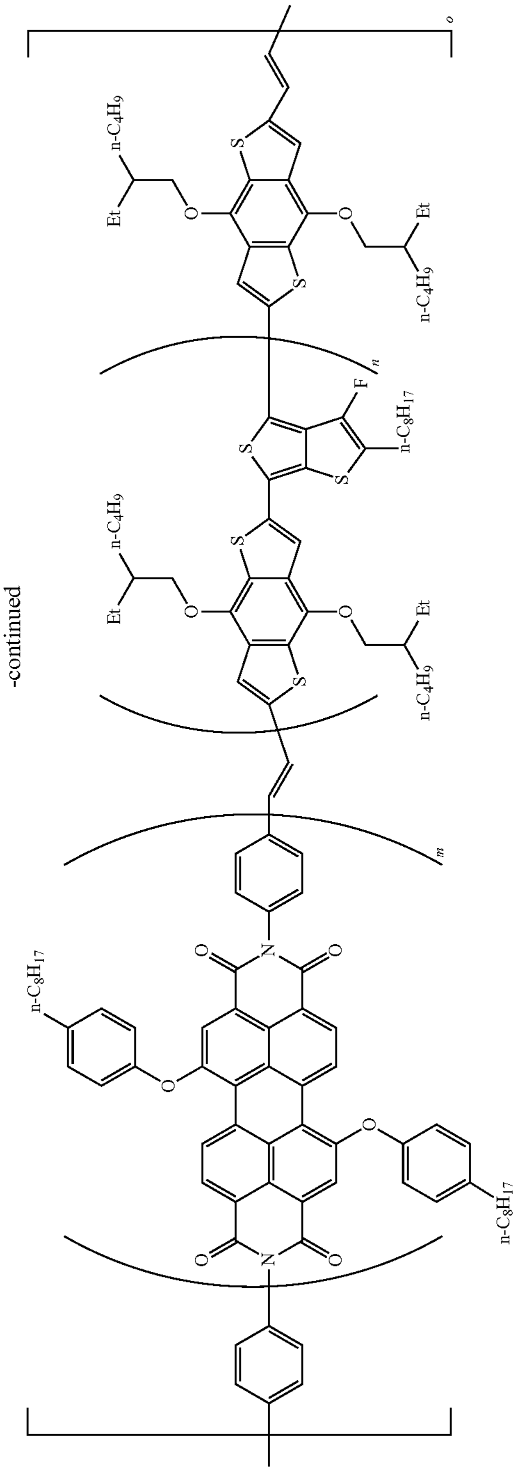
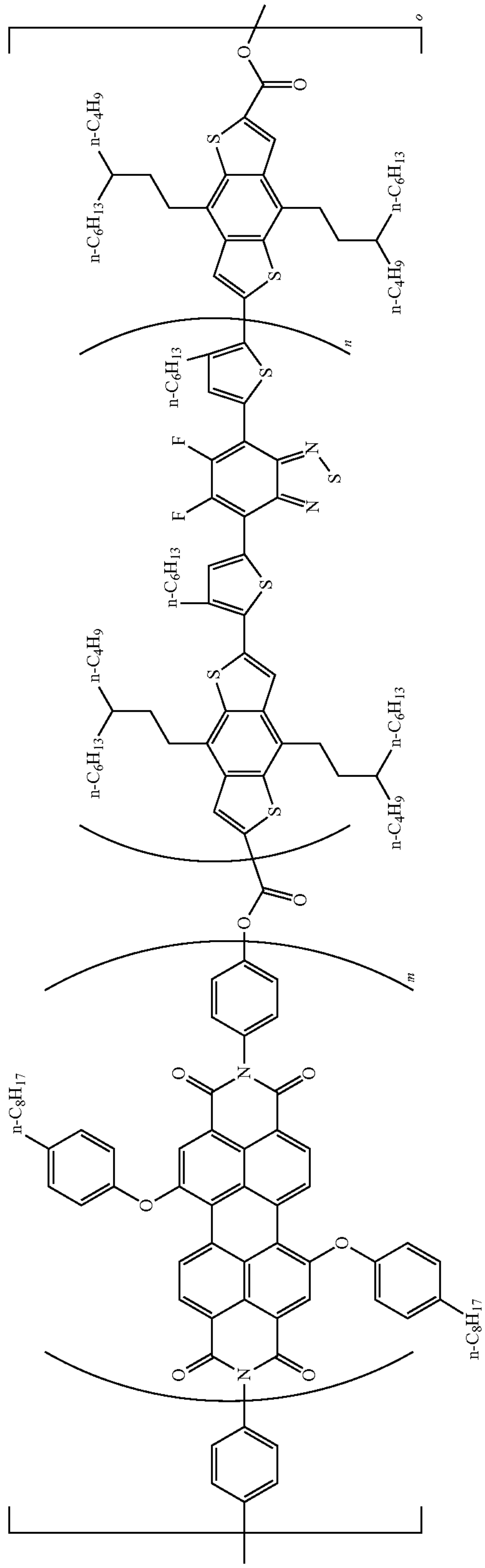

-continued
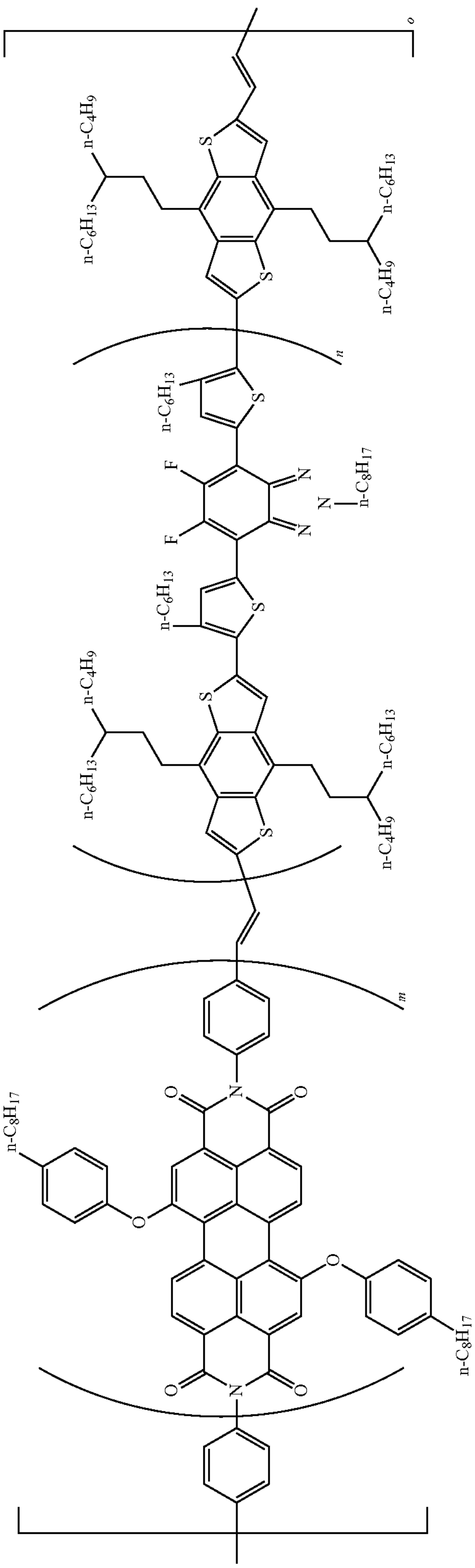
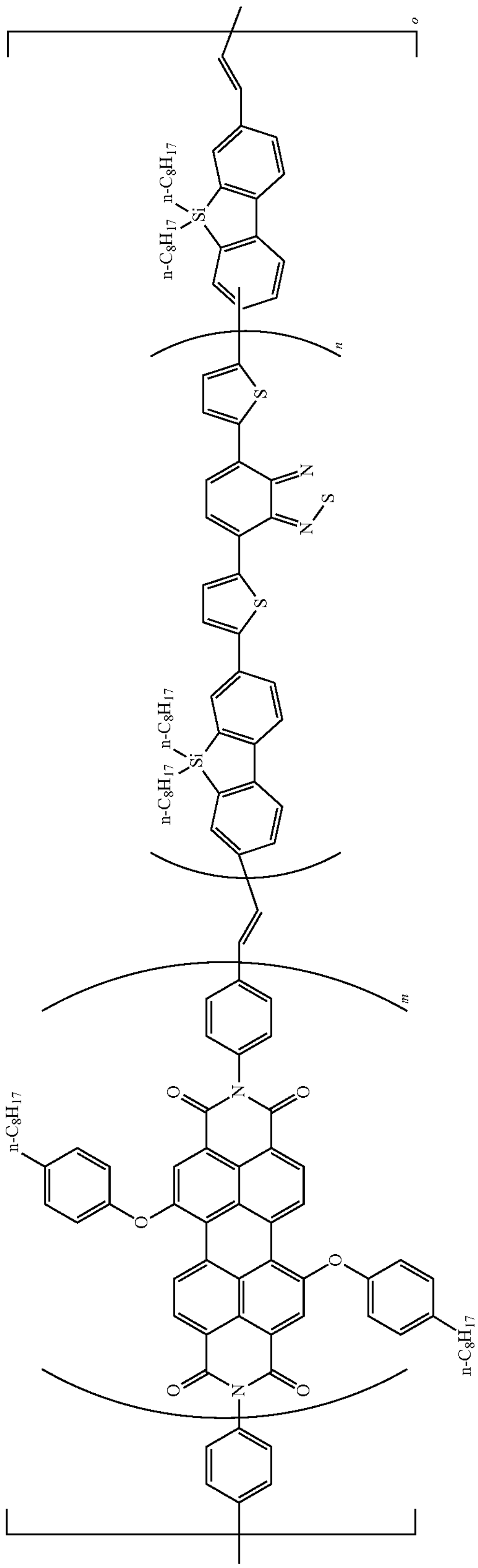

-continued
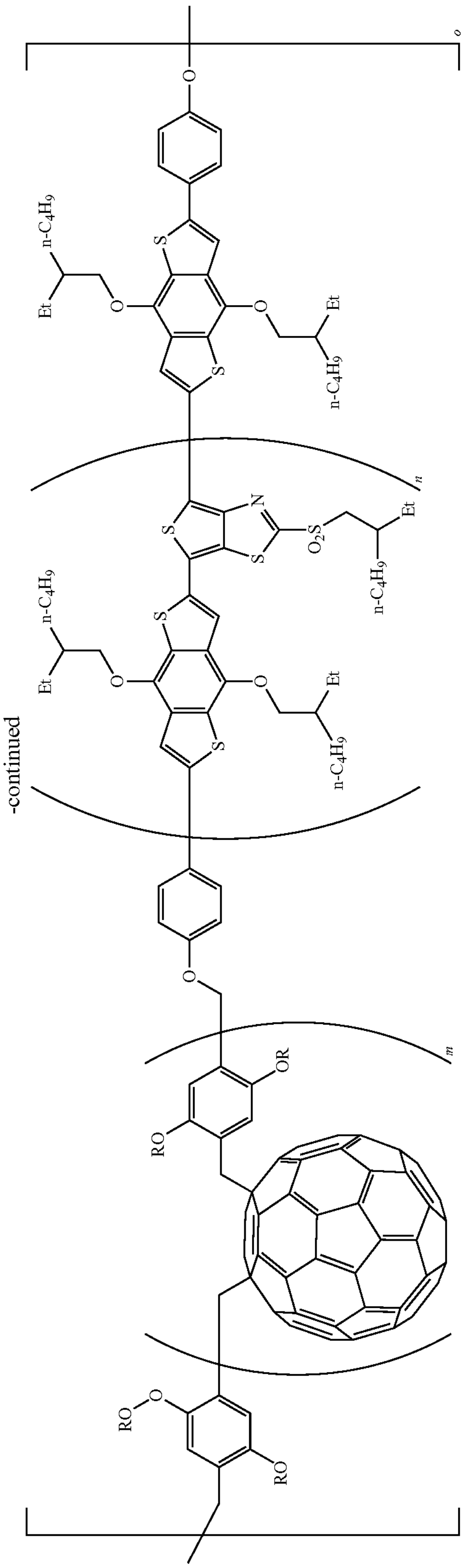
R = n-C6H13
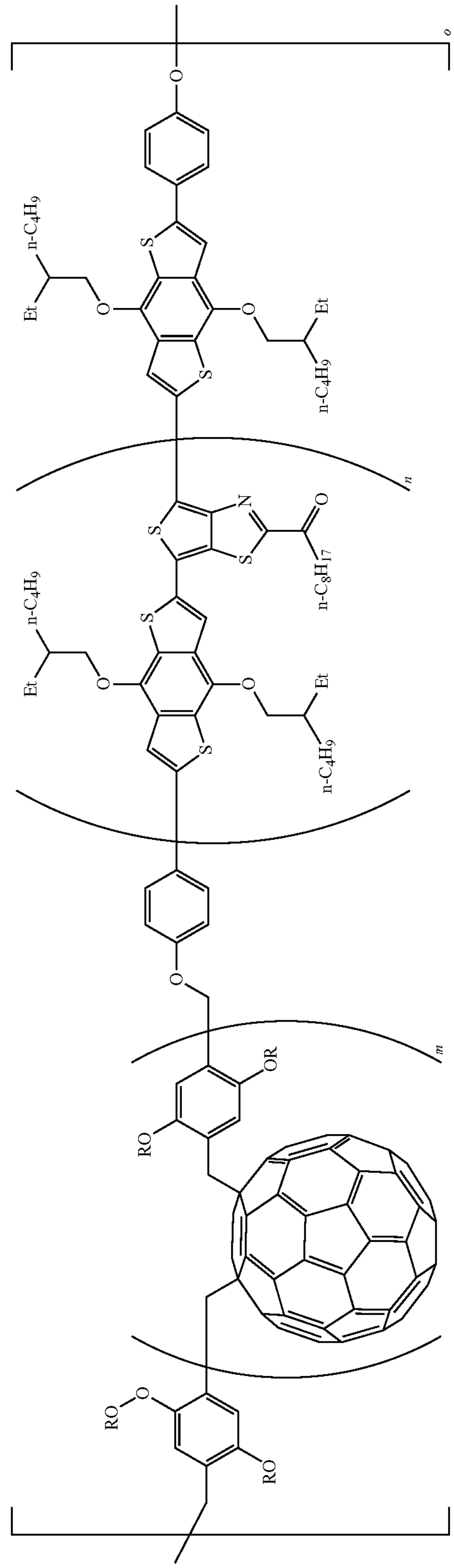
R =
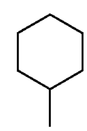

-continued
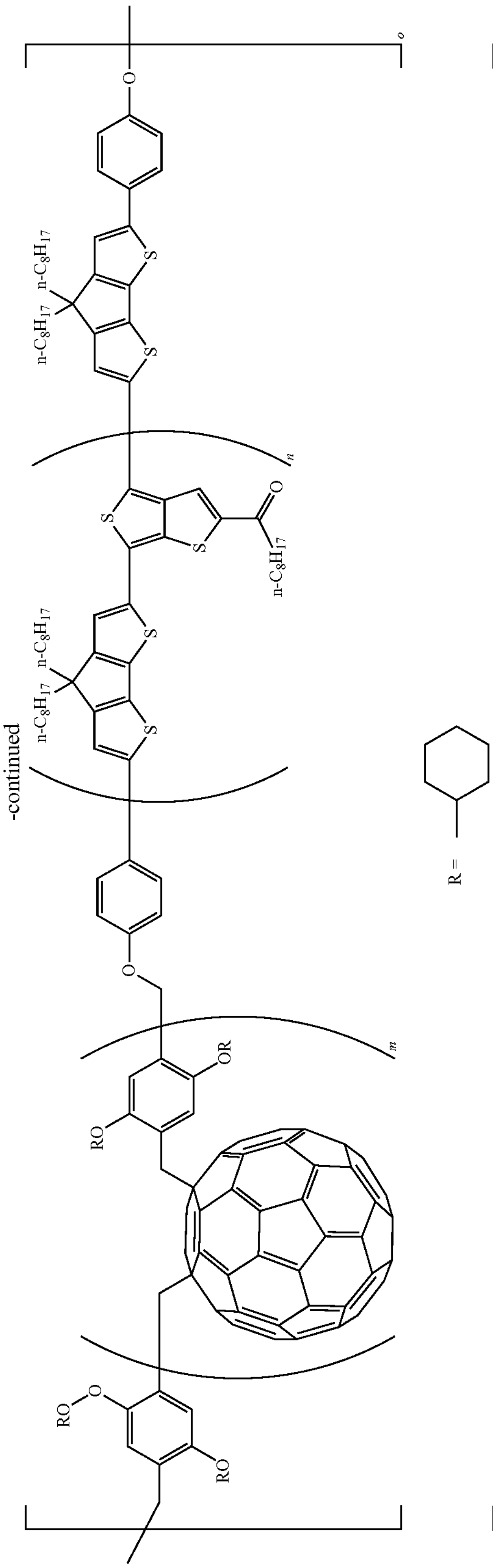
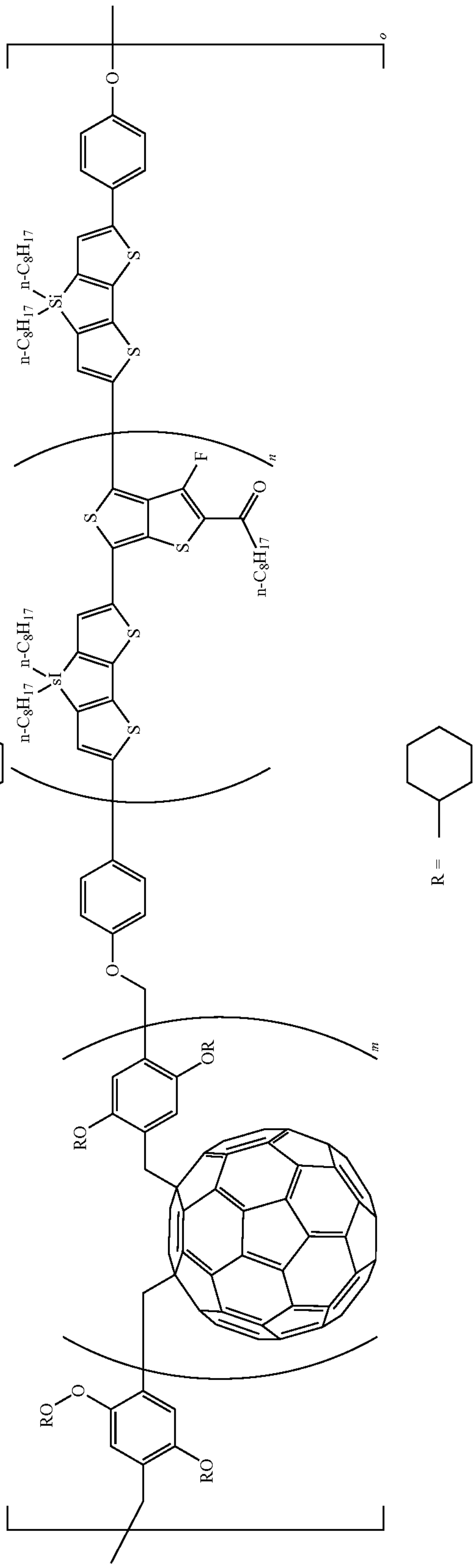

-continued
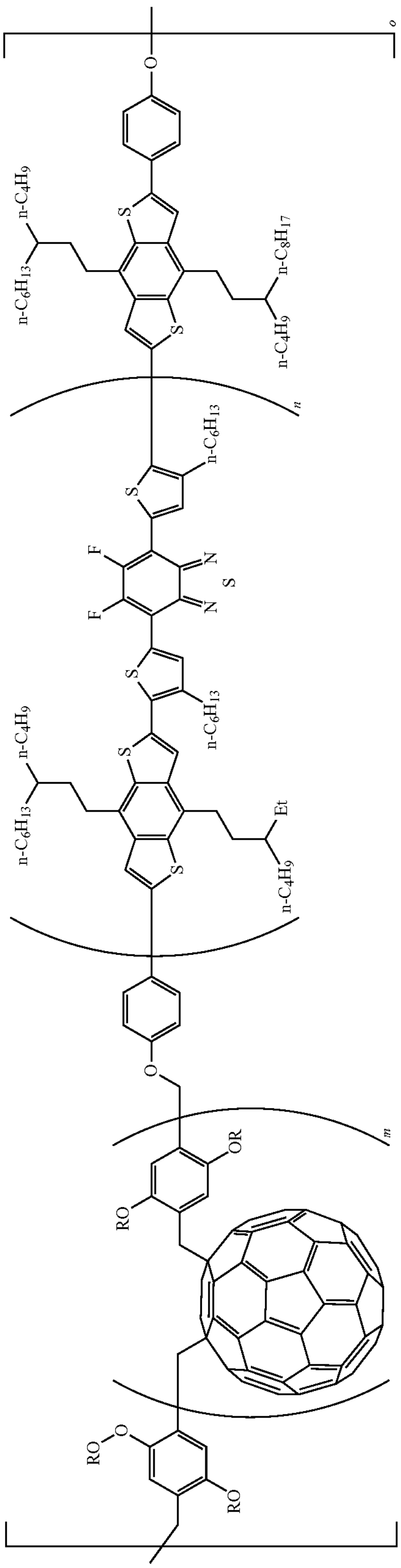
R = n-$C_6H_{13}$
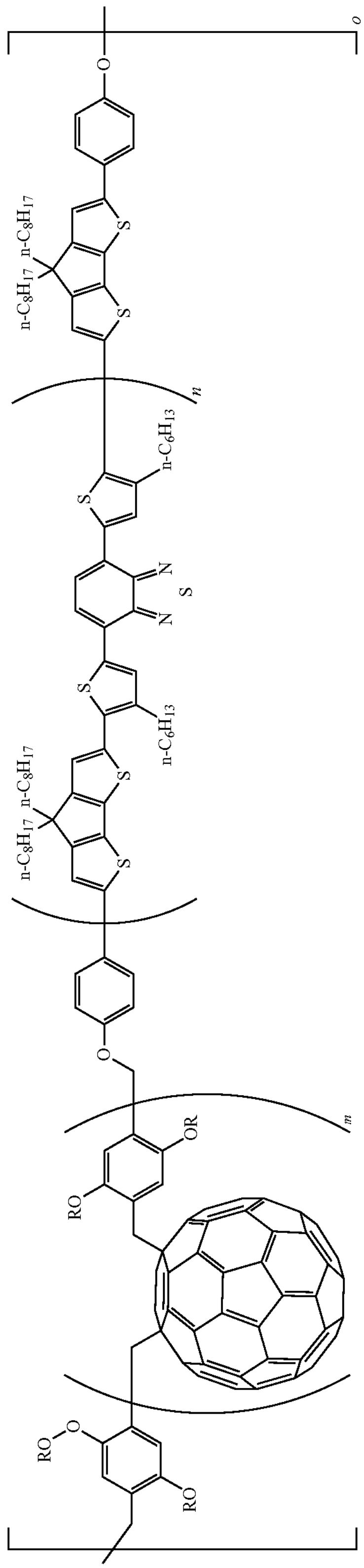
R = n-$C_6H_{13}$

-continued
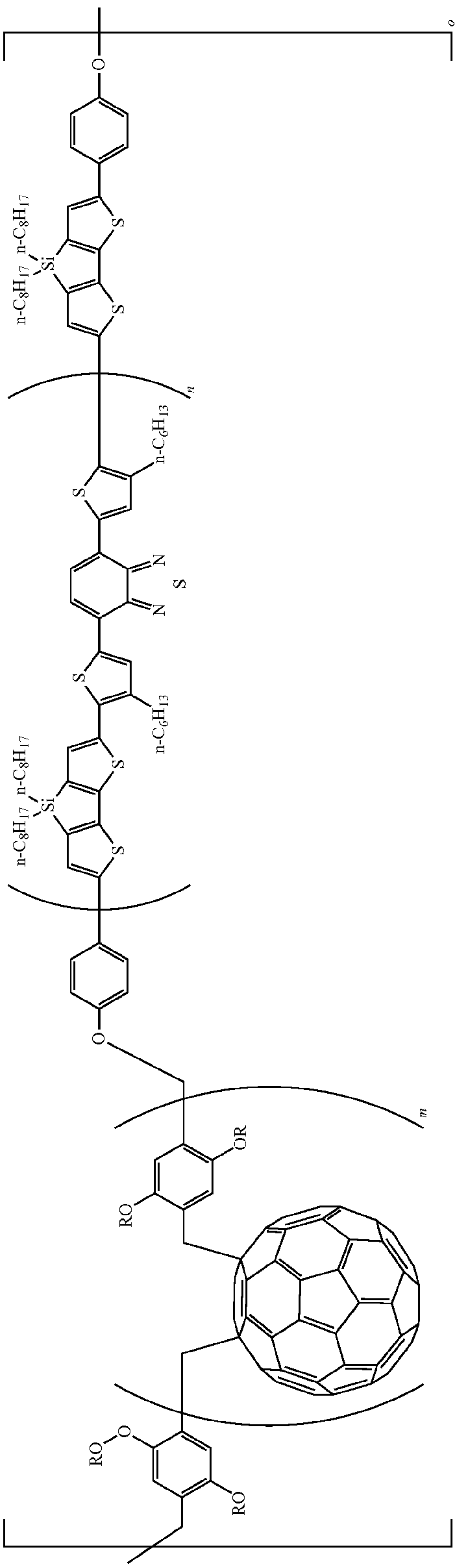
R = n-C6H13

<Method of Producing the p-Type-and-n-Type Linked Organic Semiconductor Polymer>

A method of producing the p-type-and-n-type linked organic semiconductor polymer represented by any one of formulas (1) to (5) according to the present invention will be explained below.

The p-type-and-n-type linked organic semiconductor polymer represented by any one of formulas (1) to (5) according to the present invention can be produced from compounds in the respective combination corresponding to the following [A] to [E].

In the present invention, a photoelectric conversion layer of the p-type-and-n-type linked organic semiconductor polymer represented by formula (3) or (4) is also preferably formed, by applying an organic semiconductor composition containing [C] and [D], and then subjecting the resultant coat to heating or irradiating with an electron beam, in a step for preparing an element.

[A]

(1a)

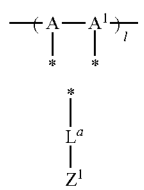

(1b)

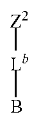

[B]

(1a)

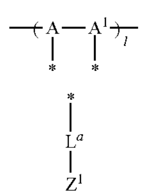

(2b)

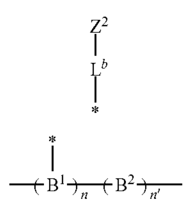

[C]

(ab)

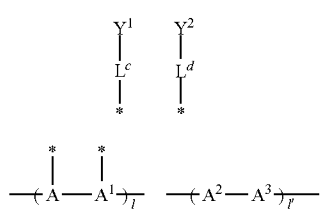

(bb)

-continued

[D]

(ab)

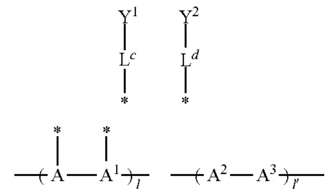

(4b)

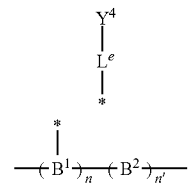

[E]

(5a)

$$Z^{1a}-L^{f}-(A^{4})_{u}-L^{g}-Z^{1b}$$

(5b)

$$Z^{2a}-L^{h}-(B^{3})_{v}-L^{i}-Z^{2b}$$

Herein, [A] is a combination of a compound represented by formula (1a) and a compound represented by formula (1b), [B] is a combination of a compound represented by formula (1a) and a compound represented by formula (2b), [C] is a combination of a compound represented by formula (ab) and a compound represented by formula (bb), [D] is a combination of a compound represented by formula (ab) and a compound represented by formula (4b), and [E] is a combination of a compound represented by formula (5a) and a compound represented by formula (5b).

In the compound represented by formula (1a) in [A] and [B], at least one bonding hand -* in A and $A^1$ bonds with a * part in *-$L^a$-$Z^1$, and when non-bonded therewith, bonds with a hydrogen atom or a monovalent substituent. In the compound represented by formula (2b) in [B], any one of bonding hands -* in n pieces of $B^1$ bonds with a * part in *-$L^b$-$Z^2$, and when non-bonded therewith, bonds with a hydrogen atom or a monovalent substituent. In the compound represented by formula (ab) in [C] and [D], at least one bonding hand -* in A and $A^1$ bonds with a * part in *-$L^c$-$Y^1$ or a * part in *-$L^d$-$Y^2$, and when non-bonded therewith, bonds with a hydrogen atom or a monovalent substituent. In the compound represented by formula (4b) in [D], any one of bonding hands -* in n pieces of $B^1$ bonds with a * part in *-$L^e$-$Y^4$, and when non-bonded therewith, bonds with a hydrogen atom or a monovalent substituent.

In formulas, A, $A^1$ to $A^4$, B, $B^1$ to $B^3$, l, l', n, n', s, u and v have the same meanings as A, $A^1$ to $A^4$, B, $B^1$ to $B^3$, l, l', n, n', s, u and v in formulas (1) to (5); $L^a$ to $L^i$ each independently represents a single bond or a divalent linking group.

$Z^1$ and $Z^2$ each independently represents a reactive functional group; $Z^{1a}$, $Z^{1b}$, $Z^{2a}$ and $Z^{2b}$ each independently represent a hydrogen atom or a substituent, and at least one of $Z^{1a}$ and $Z^{1b}$, and at least one of $Z^{2a}$ and $Z^{2b}$ each are a substituent that is a reactive functional group; $Y^1$ to $Y^4$ each independently represents a polymerizable group.

$Z^1$ and $Z^2$ each represents a reactive functional group necessary for $Z^1$ and $Z^2$ to react to form a linkage between these, and a partial structure of $Y^1$ forms $L^1$, a partial structure of $Y^2$ forms $L^2$, a partial structure of $Y^3$ forms $L^3$, and a partial structure of $Y^4$ forms $L^4$. Further, $Z^{1a}$ or $Z^{1b}$ is a reactive functional group necessary for $Z^{1a}$ or $Z^{1b}$ to react with $Z^{2a}$ or $Z^{2b}$ to form a linkage between these;

In formulas (1a), (2b), (ab) and (4b), bonding terminals on each side are each independently bonded with a hydrogen atom or a monovalent substituent.

In the combination in [A] or [B], $Z^1$ in formula (1a) or $Z^2$ in formula (1b) or (2b) represents a reactive functional group. $Z^1$ and $Z^2$ are subjected to a chemical reaction, to form a new bond, and $Z^1$ and $Z^2$ may be any kind of groups as long as the groups cause no reaction with the p-type organic semiconductor unit per se or the n-type organic semiconductor unit per se.

The groups preferably have a function to form a bond by a nucleophilic reaction or a dehydration reaction. For example, one of $Z^1$ and $Z^2$ is a hydroxyl group, an amino group or a mercapto group, and the other is —C(═O)Xa, —N═C═O or —$CH_2$Xb. Here, Xa represents a hydroxyl group, a halogen atom (for example, a fluorine atom, a chlorine atom, a bromine atom or an iodine atom), an alkoxy group, an aryloxy group, an acyloxy group, an alkanesulfonyloxy group or an arylsulfonyloxy group, and Xb represents a halogen atom or an alkanesulfonyloxy group or an arylsulfonyloxy group. The hydroxyl group may be an alcoholic hydroxyl group or a phenolic hydroxyl group.

Moreover, it is also preferred that one of $Z^1$ and $Z^2$ is a hydroxyl group, an amino group, a mercapto group, an epoxy group, or an oxetane group, and the other is an epoxy group or an oxetane group, and these form a chemical bond by a ring-opening reaction of an epoxy ring or an oxetane ring.

Synthesises using these reactive functional groups are described in "Daiyonhan Jikken Kagaku Koza (Experimental Chemistry Course, Fourth Edition)" (issued by Maruzen Co., Ltd.), edited by The Chemical Society of Japan, Vol. 22, pages 45-47, ditto, Vol. 22, pages 50-51, ditto, Vol. 20, pages 356-358, ditto, Vol. 20, pages 187-191, and JP-A-2004-189840, and the synthesis can be readily made according to the descriptions.

A compound represented by formula (1a) can be synthesized by various publicly-known methods without particular limitation. As described below, the compound can be produced by polymerizing a compound represented by formula (1a-a) and a compound represented by formula (1a-b), or a compound represented by formula (1a-a') and a compound represented by formula (1a-b'), in the presence of a transition metal catalyst, such as palladium.

Here, as a coupling reaction, synthesis can be made, for example, by applying a method described in Chemical Reviews, 2002, Vol. 102, page 1358. More specifically, synthesis can be made by applying cross-coupling using a transition metal catalyst, such as Negishi coupling using a zinc reagent, Migita-Kosugi-Stille coupling using a tin reagent, Suzuki-Miyaura coupling using a boron reagent, Kumada-Tamao-Corriu coupling using a magnesium reagent, and Hiyama coupling using a silicon reagent, or Ullmann reaction using copper, Yamamoto polymerization using nickel, or the like. As the transition metal catalyst, use can be made of any metal, such as palladium, nickel, copper, cobalt, iron, and the like (described, for example, in Journal of the American Chemical Society, 2007, Vol. 129, page 9844). Moreover, the metal may have a ligand, and use may be preferably made of a phosphorus ligand, such as $PPh_3$ and $P(t\text{-}Bu)_3$, an N-heterocyclic carbene ligand (described in Angewandte Chemie International Edition, 2002, Vol. 41, page 1290), or the like.

A metal reagent to serve as a raw material, such as the tin reagent and the boron reagent, can be synthesized with reference to the descriptions in Organic Synthesis Collective Volume, 2009, Vol. 11, page 393, ditto, 1998, Vol. 9, page 553, Tetrahedron, 1997, Vol. 53, page 1925, Journal of Organic Chemistry, 1993, Vol. 58, page 904, JP-A-2005-290001, JP-A-2010-526853, or the like. The reaction may be performed under irradiation with microwaves, as described in Macromolecular Rapid Communications, 2007, Vol. 28, page 387.

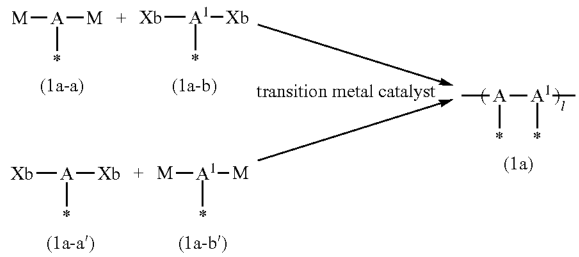

Here, A, $A^1$ and 1 have the same definitions as those in formula (1a), and M represents a trialkyltin group or a boronic acid (boronic acid ester) group, and Xb represents a halogen atom or a trifluoromethanesulfonyloxy group. -$L^a$-$Z^1$ is bonded with any of a * part in formula (1a-a) or (1a-b) or a * part in formula (1a-a') or (1a-b'), and a bonding hand -* not bonded with -$L^a$-$Z^1$ is bonded with a hydrogen atom or a monovalent substituent.

When $Z^1$ adversely affects the above-described polymerization reaction, $Z^1$ may be protected before the polymerization reaction, and then deprotected after the polymerization reaction, to allow production.

$L^a$ represents a single bond or a divalent linking group. The divalent linking group is preferably an alkylene group, an arylene group, —O—, —S—, —SO—, —$SO_2$—, —C(═O)—, —$NR^a$— or a group formed by combining these (for example, —C(═O)—O—, —$NR^a$C(═O)—, —$NR^a$C(═O)—, —$NR^aSO_2$—); and an alkylene group, —O—, —C(═O)—, —$NR^a$— or a group formed by combining these is further preferred. Here, $R^a$ represents a hydrogen atom, an alkyl group, an aryl group, or a heterocyclic group. The divalent aliphatic group may have —O—, —S—, —SO—, —$SO_2$—, —C(═O)— or —$NR^a$— or a group formed by combining these (for example, —C(═O)—O—, —$NR^a$C(═O)—, —$NR^a$C(═O)—, —$NR^aSO_2$—), inserted into an aliphatic moiety in the aliphatic group. Here, $R^a$ represents a hydrogen atom, an alkyl group, an aryl group, or a heterocyclic group.

$L^a$ is preferably any of the following groups. Here, a symbol * represents a part to be bonded with a group of the p-type organic semiconductor unit.

*—C(═O)O($CH_2$)ma-
*—$SO_2$($CH_2$)ma-
*—C(═O)$NR^a$($CH_2$)ma-
*—C(═O)—
*—($CH_2$)mc-
*—($CH_2$)mc-$OCH_2$—
*—O($CH_2$)mc-
*—($CH_2$)mc-C(═O)—

Here, ma to and represent an integer of 1 to 20.

A compound represented by formula (2b) can be synthesized by various publicly-known methods without particular limitation. For example, in the same manner as the compound represented by formula (1a), as described below, the compound can be produced by polymerizing a compound represented by formula (2b-a) and a compound represented by formula (2b-b), or a compound represented by formula (2b-a') and a compound represented by formula (2b-b'), in the presence of a transition metal catalyst, such as palladium.

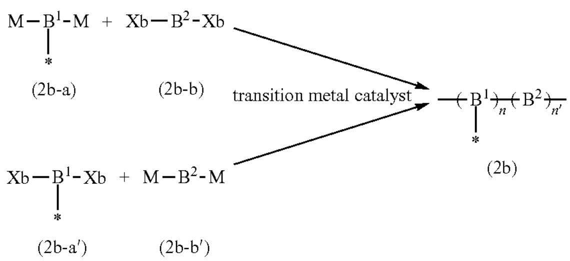

Here, $B^1$, $B^2$, n and n' have the same definitions as those in formula (2b), and M represents a trialkyltin group or a boronic acid (boronic acid ester) group, and Xb represents a halogen atom or a trifluoromethanesulfonyloxy group. $-L^b-Z^2$ is bonded with a * part in formula (2b-a) or (2b-a').

When $Z^2$ adversely affects the above-described polymerization reaction, $Z^2$ may be protected before the polymerization reaction, and then deprotected after the polymerization reaction, to allow production.

$L^b$ in formula (1b) or (2b) represents a single bond or a divalent linking group. The divalent linking group is preferably an alkylene group, an arylene group, —O—, —S—, —SO—, —$SO_2$—, —C(═O)—, —$NR^a$— or a group formed by combining these (for example, —C(═O)—O—, —$NR^a$C(═O)—, —$NR^a$C(═O)—, —$NR^aSO_2$—); and an alkylene group, —O—, —C(═O)—, —$NR^a$— or a group formed by combining these is further preferred. Here, $R^a$ represents a hydrogen atom, an alkyl group, an aryl group, or a heterocyclic group. The divalent aliphatic group may have —O—, —S—, —SO—, —$SO_2$—, —C(═O)— or —$NR^a$— or a group formed by combining these (for example, —C(═O)—O—, —$NR^a$C(═O)—, —$NR^a$C(═O)—, —$NR^aSO_2$—), inserted into an aliphatic moiety in the aliphatic group. Here, $R^a$ represents a hydrogen atom, an alkyl group, an aryl group, or a heterocyclic group.

$L^b$ is preferably any of the following groups. Here, a symbol * represents a part to be bonded with a group of the n-type organic semiconductor unit.

*—$C_6H_4$—$(CH_2)$ma-
*—$C_6H_4$—C(═O)—
*—$(CH_2)$mc-
*—$(CH_2)$mc-$OCH_2$—
*—$(CH_2)$mc-C(═O)— ma to mc represent an integer of 1 to 20.

Specific examples of the compound represented by formula (1a) are shown below. However, the present invention is not construed as being limited to these examples.

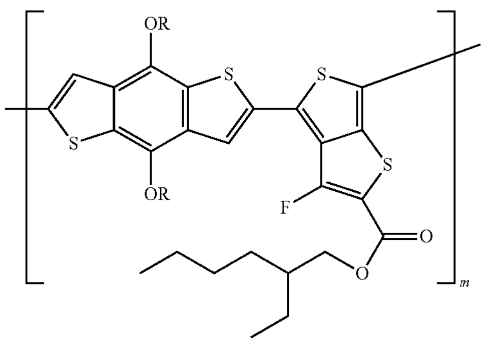

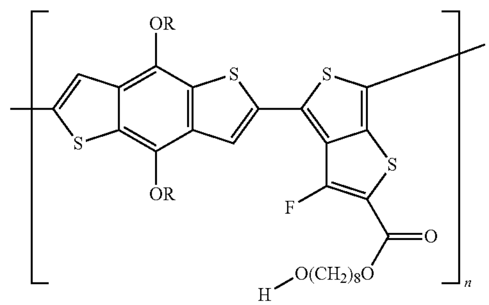

R = 2-ethylhexyl

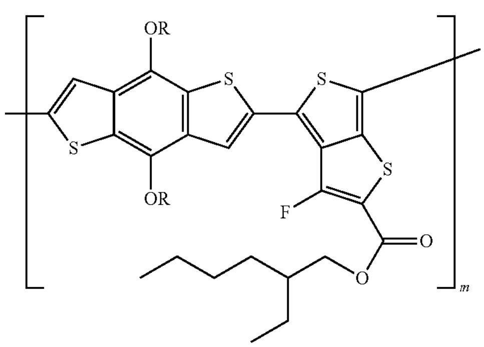

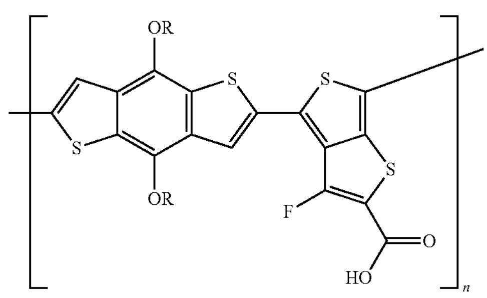

R = 2-ethylhexyl

-continued
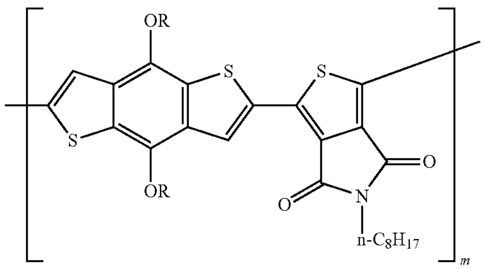
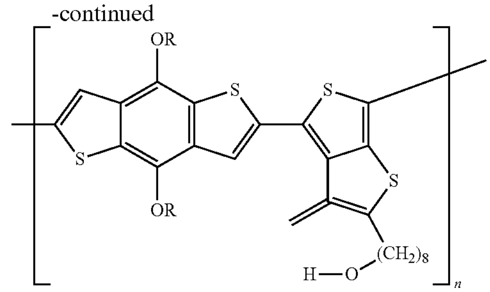
R = 2-ethylhexyl
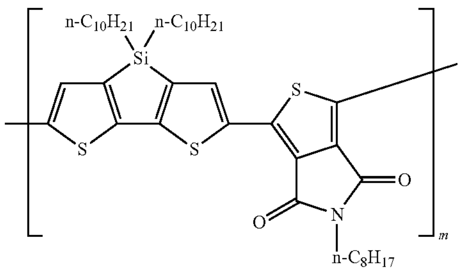
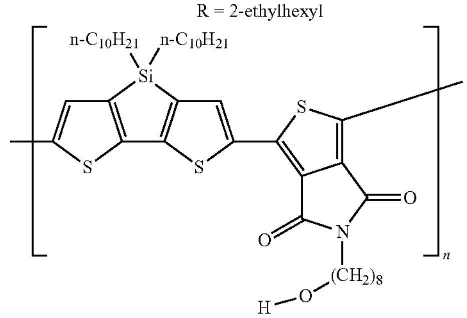
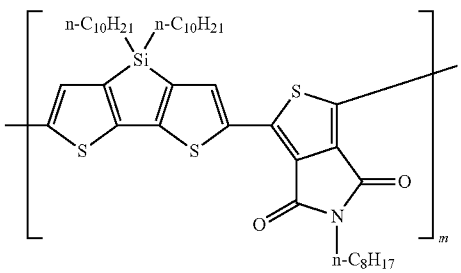
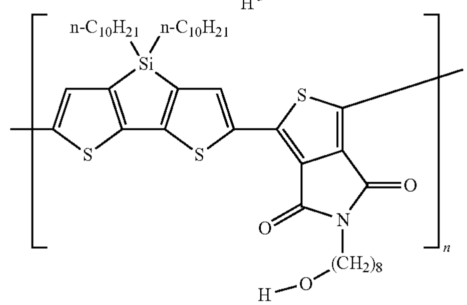
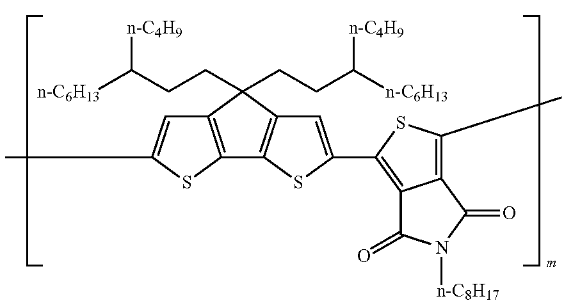
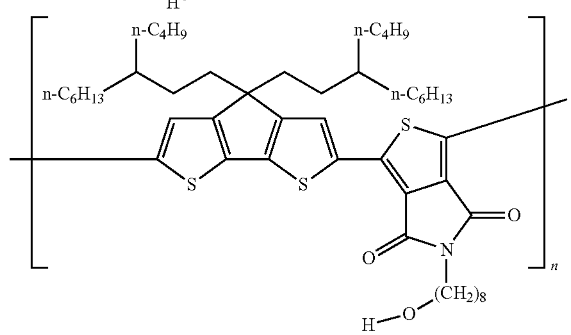
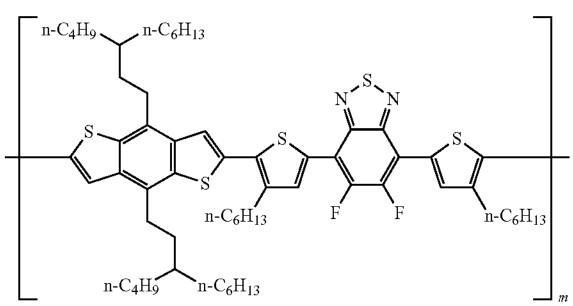
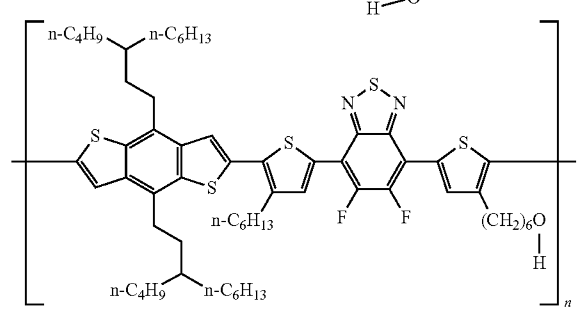
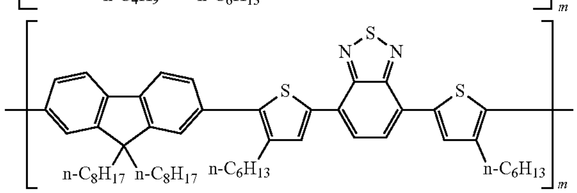
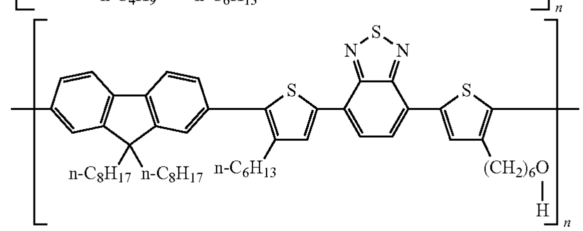

-continued
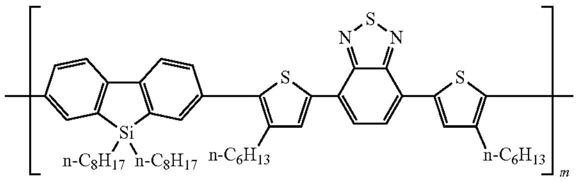
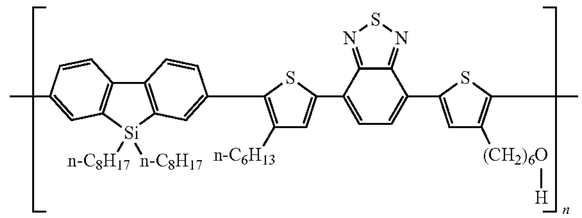
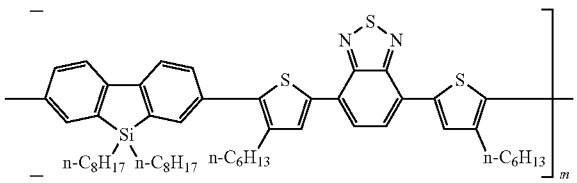
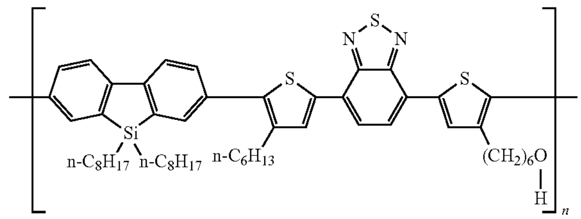
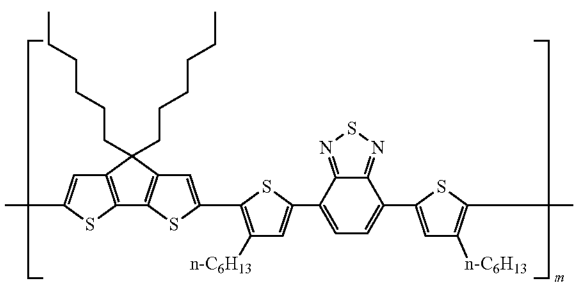
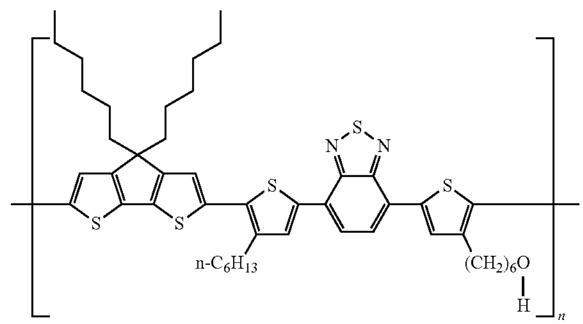
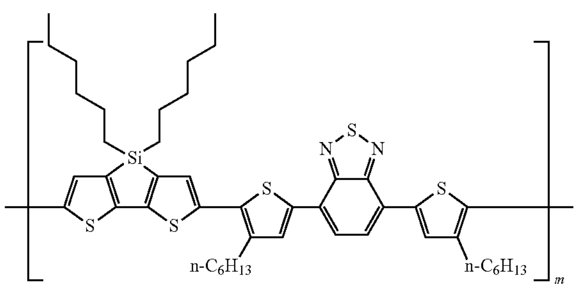
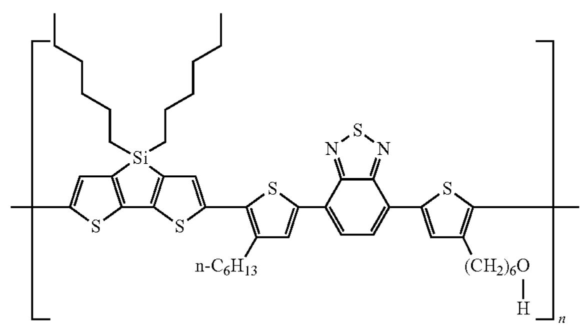
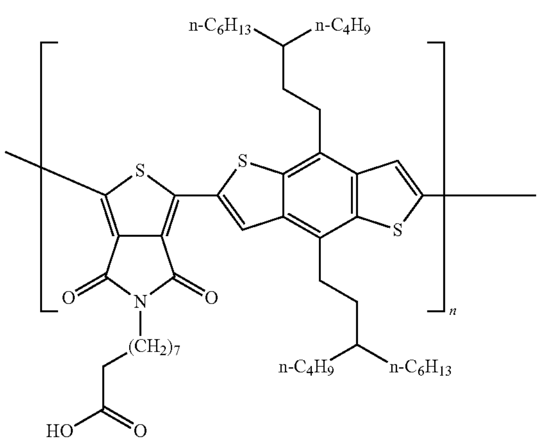
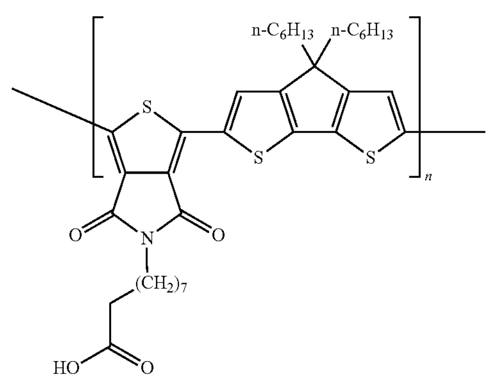

-continued
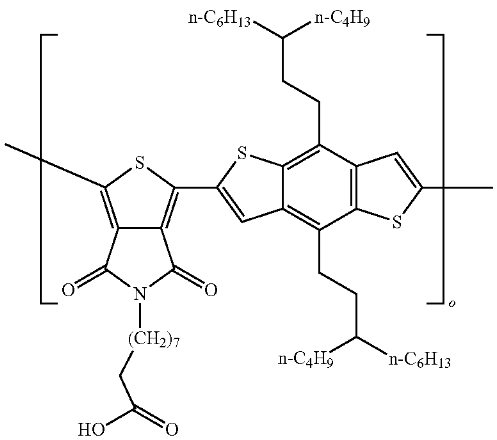
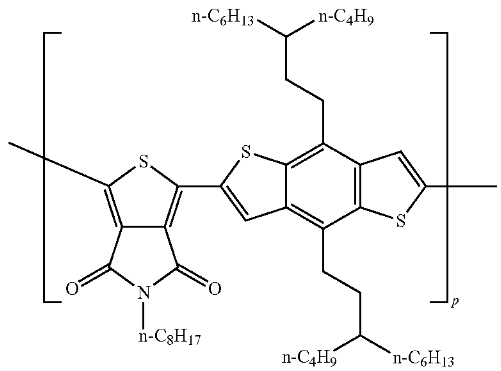
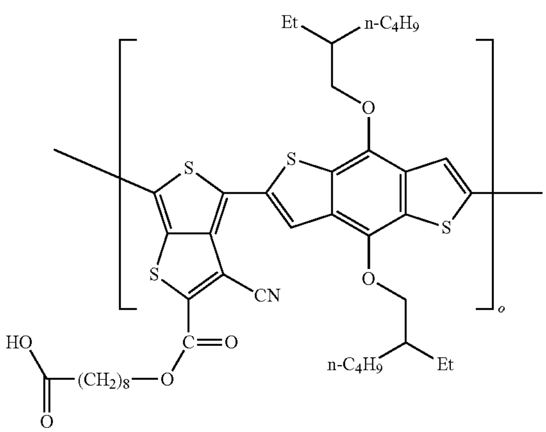
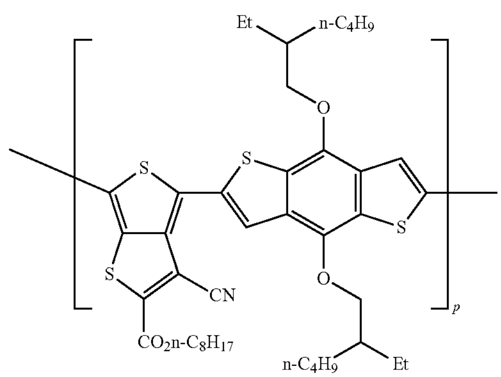
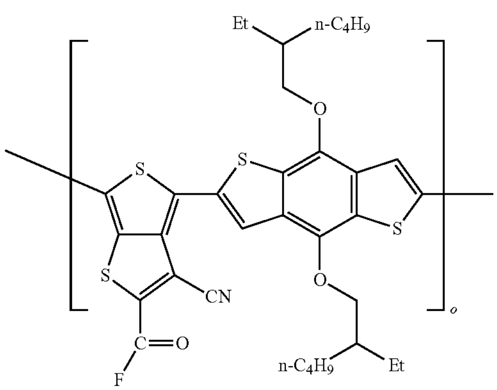
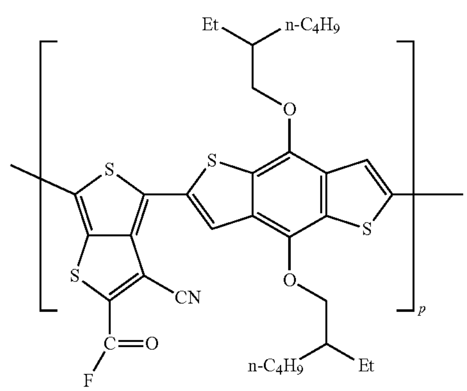
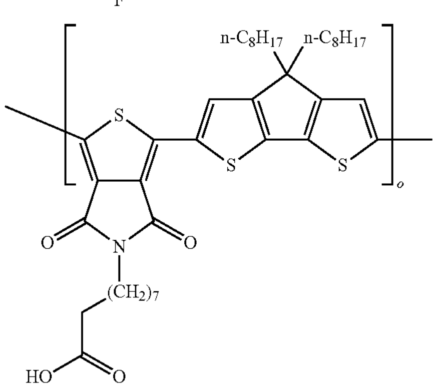
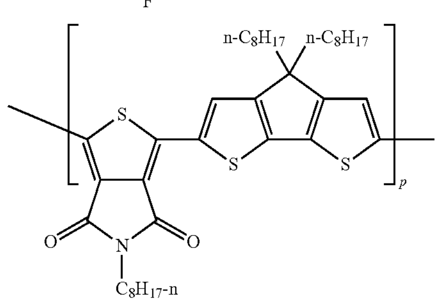

-continued
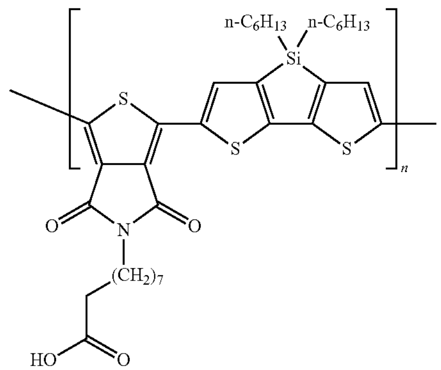
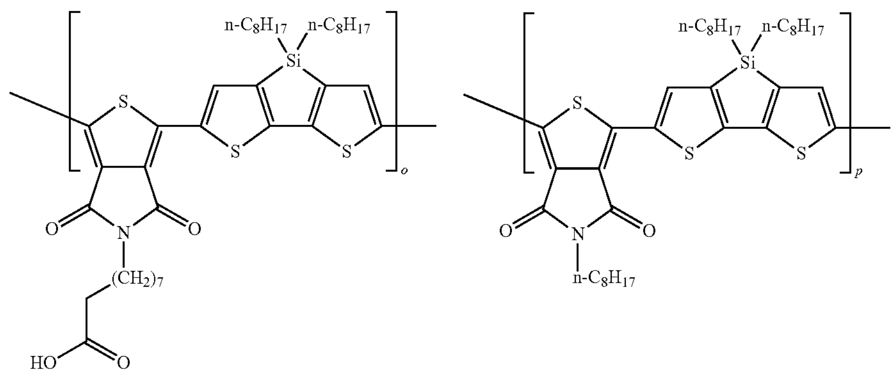
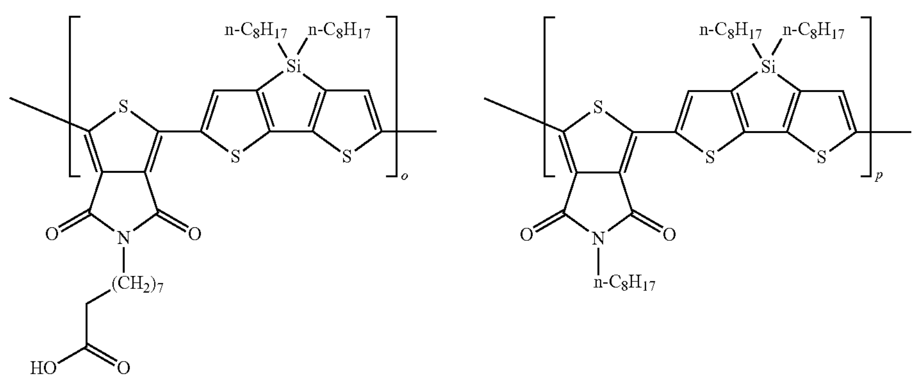
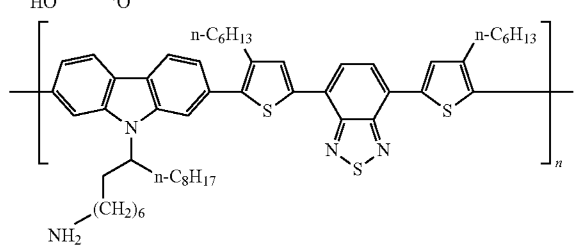
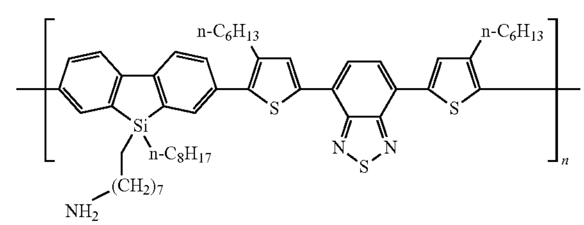
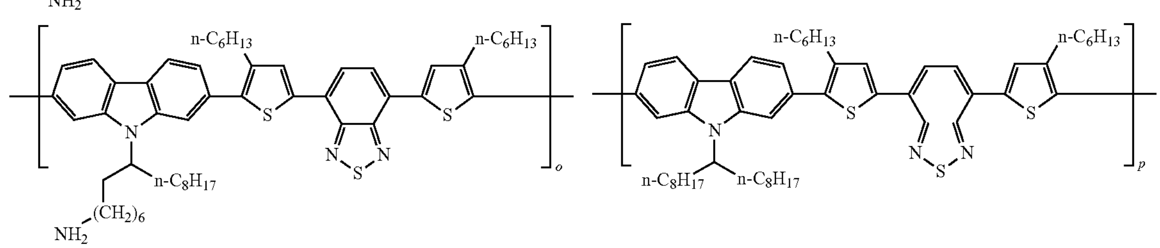

-continued
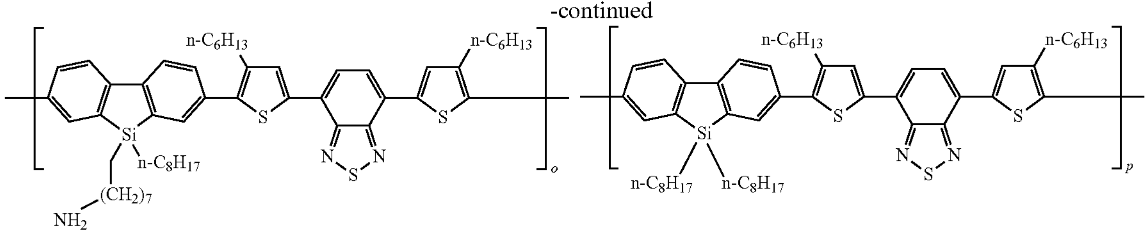
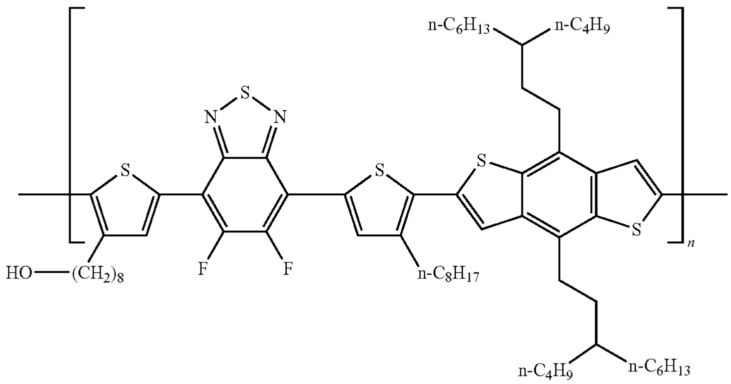
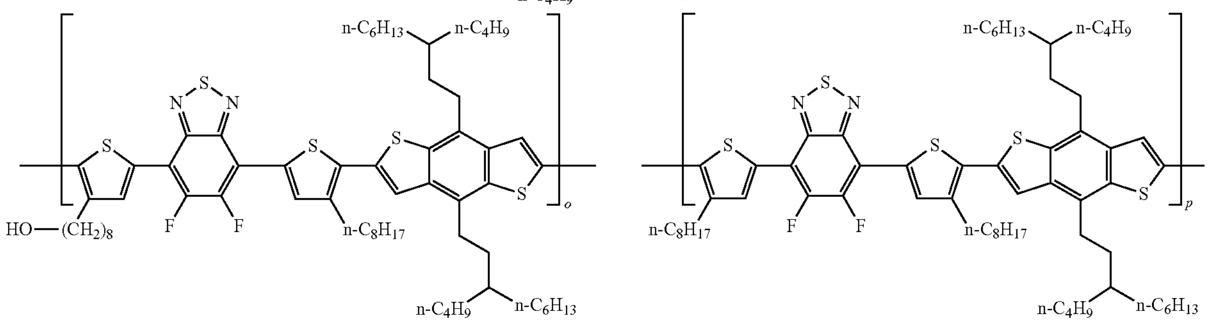
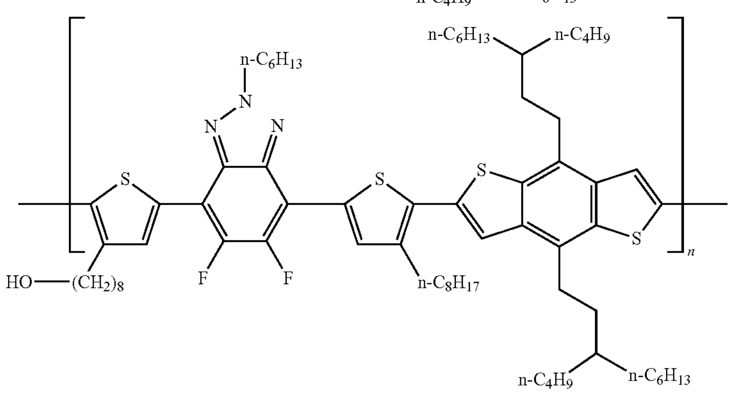
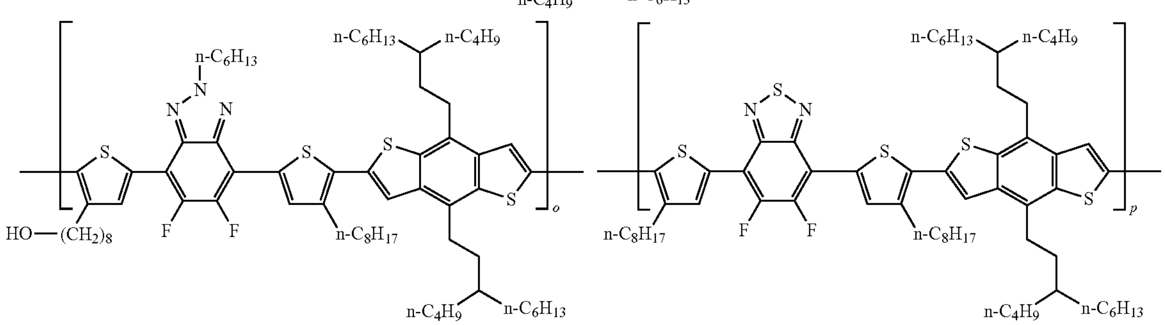

Specific examples of the compound represented by formula (1b) are shown below. However, the present invention is not construed as being limited to these examples.
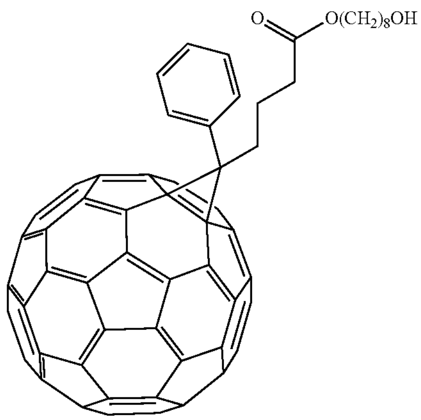
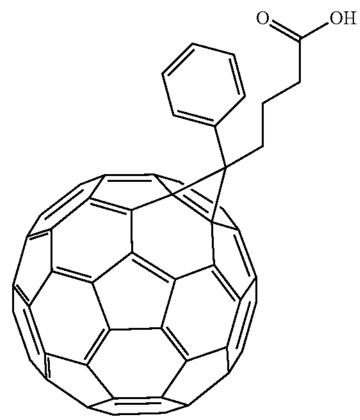
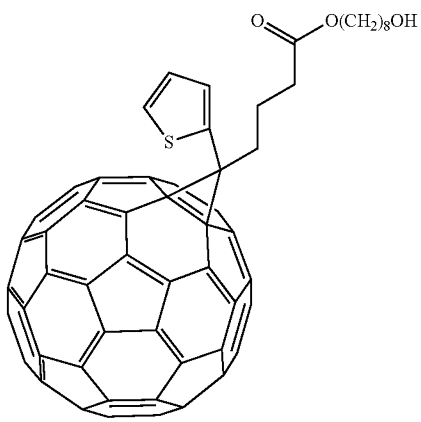
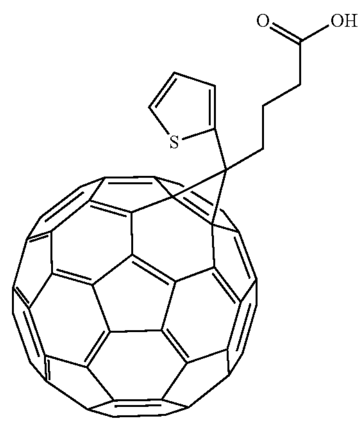
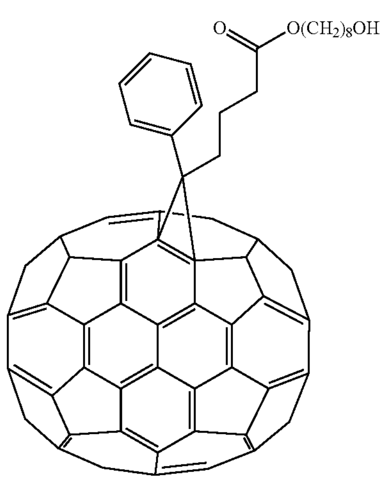
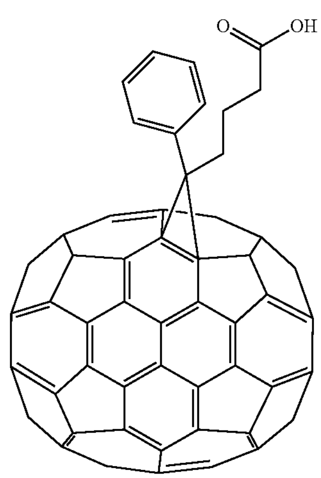

-continued
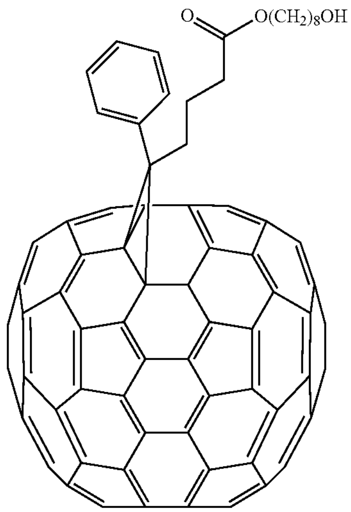
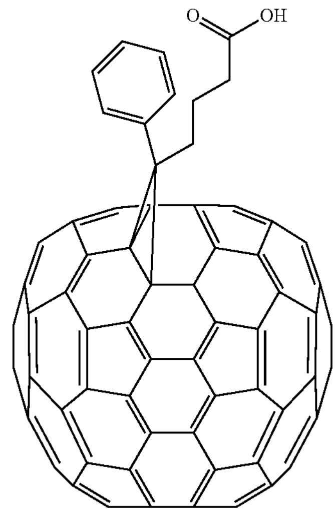
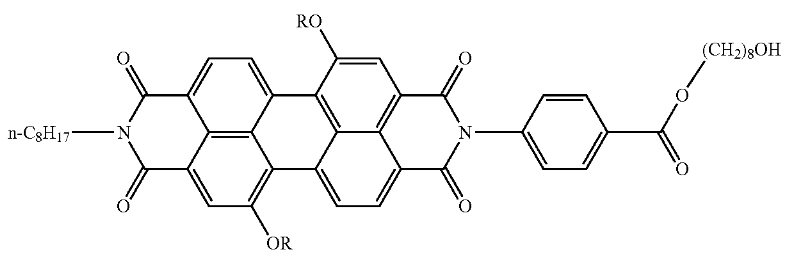
R = 2-ethylhexyl
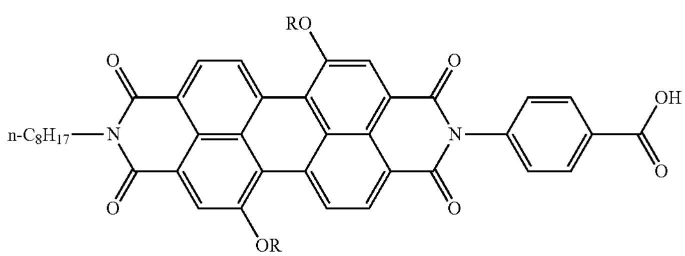
R = 2-ethylhexyl
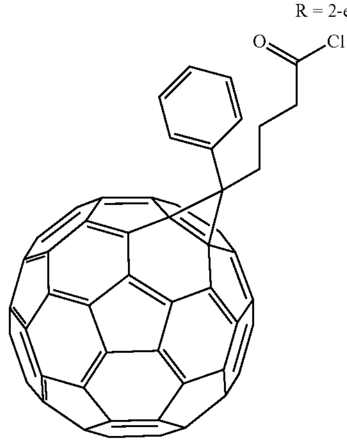
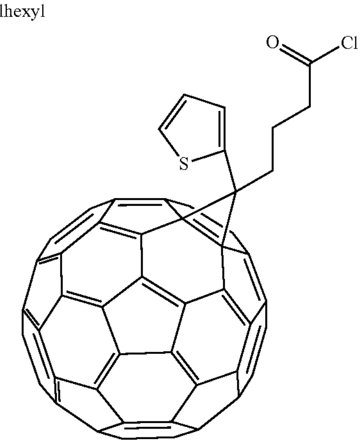
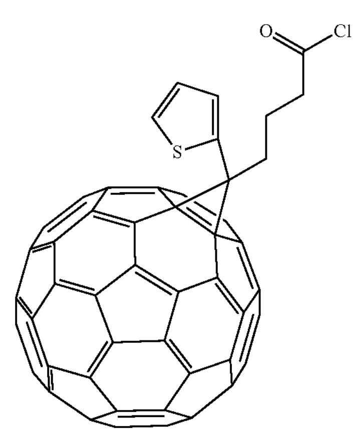

-continued
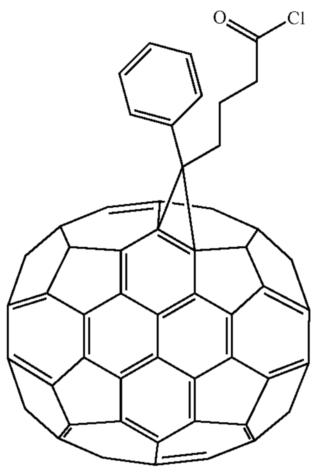
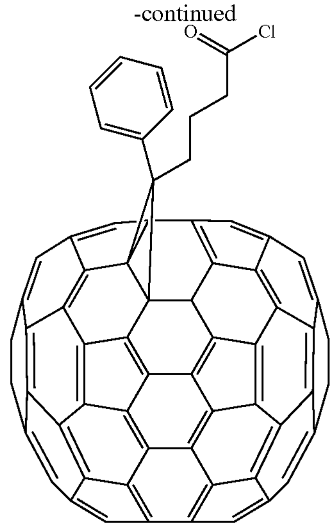
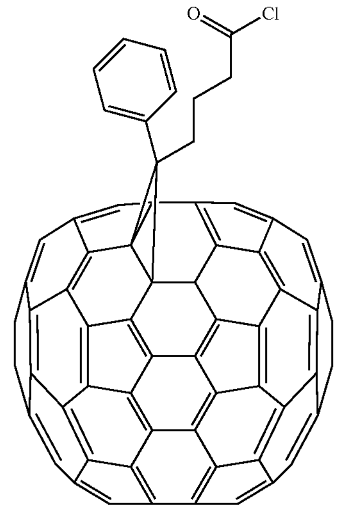
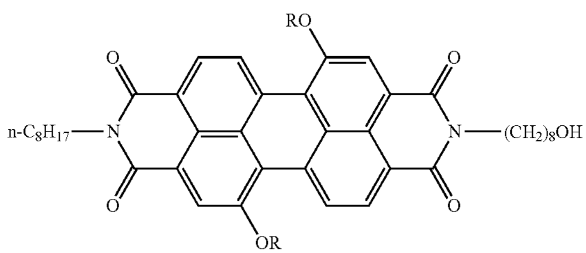
R = n-$C_8H_{17}$
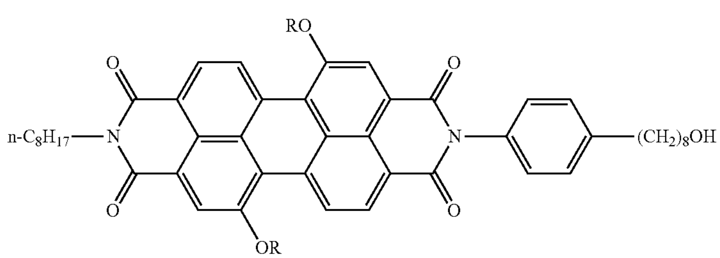
R = 2-ethylhexyl Specific examples of the compound represented by formula (2b) are shown below. However, the present invention is not construed as being limited to these examples.
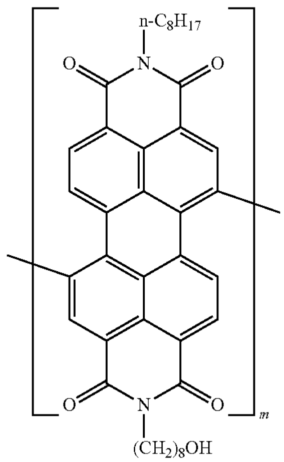
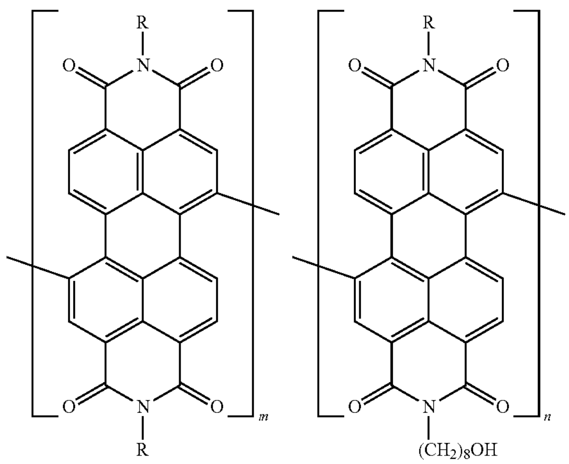
R = n-$C_8H_{17}$
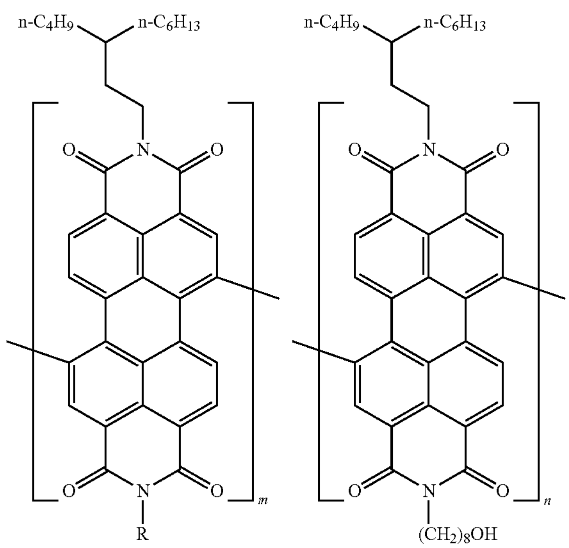
R = $-(CH_2)_2-CH(n\text{-}C_4H_9)(n\text{-}C_6H_{13})$
-continued
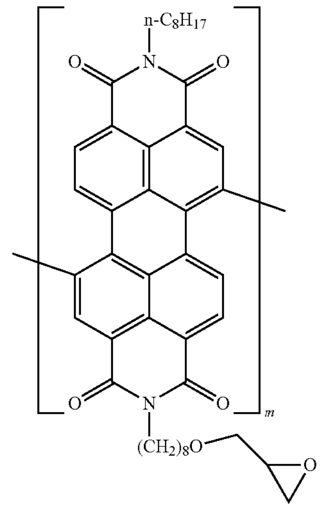
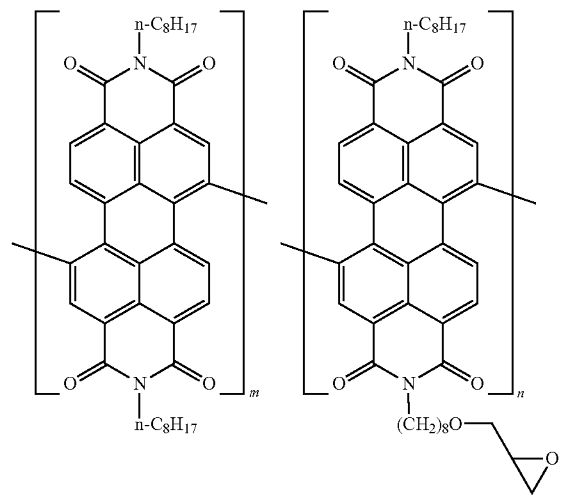
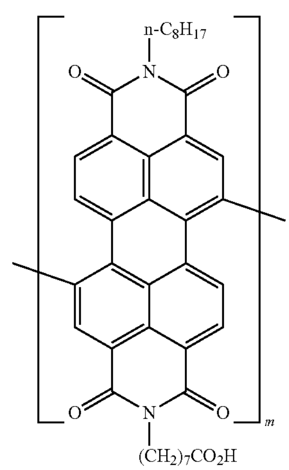

-continued

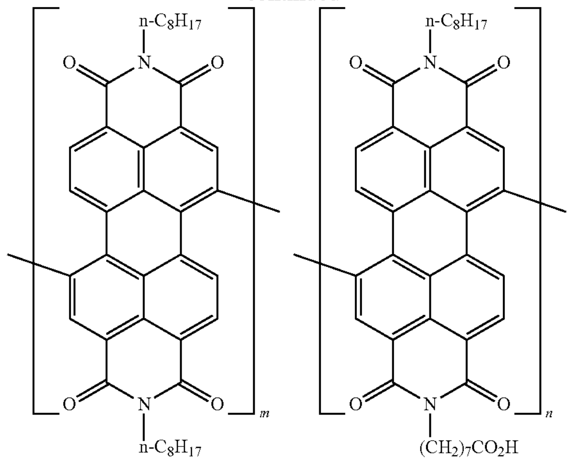

The compound represented by formula (3) can be synthesized by polymerizing a compound represented by formula (ab) and a compound represented by formula (bb). Moreover, the compound represented by formula (4) can be synthesized by polymerizing a compound represented by formula (ab) and a compound represented by formula (4b).

The compound represented by formula (ab) or the compound represented by formula (4b) can be synthesized in the same manner as the compound represented by formula (1a) or (2b). However, when $Y^1$, $Y^2$ or $Y^4$ polymerizes under synthesis conditions of the compounds represented by formula (ab) or (4b), $Y^1$, $Y^2$ or $Y^4$ is preferably introduced thereinto after formation of a polymer main chain of formulas (ab) or (4b).

Here, $Y^1$ to $Y^4$ each independently represent a polymerizable group; and preferred is an ethylenically unsaturated group, an epoxy group, or an oxetane group. As the ethylenically unsaturated group, preferred is a vinyl group, a vinyl ether group, a group derived from (meth)acrylic acid or ester or amide thereof, and these may have a substituent. Examples thereof include a group derived from a halogen atom-substituted one, namely, 2-trifluoromethylacrylic acid or ester or amide thereof.

$L^c$, $L^d$, and $L^e$ each represents a single bond or a divalent linking group. The divalent linking group is preferably an alkylene group, an arylene group, —O—, —S—, —SO—, —$SO_2$—, —C(═O)—, —$NR^a$— or a group formed by combining these (for example, —C(═O)—O—, —$NR^a$C(═O)—, —$NR^a$C(═O)—, —$NR^aSO_2$—); and an alkylene group, —O—, —C(═O)—, —$NR^a$— or a group formed by combining these is further preferred. Here, $R^a$ represents a hydrogen atom, an alkyl group, an aryl group, or a heterocyclic group. The divalent aliphatic group may have —O—, —S—, —SO—, —$SO_2$—, —C(═O)—, —$NR^a$— or a group formed by combining these (for example, —C(═O)—O—, —$NR^a$C(═O)—, —$NR^a$C(═O)—, —$NR^aSO_2$—), inserted into an aliphatic moiety in the aliphatic group. Here, $R^a$ represents a hydrogen atom, an alkyl group, an aryl group, or a heterocyclic group.

$L^c$ and $L^d$ are preferably any of the following groups. A * part bonds with a group of the p-type organic semiconductor unit.

*—C(═O)O($CH_2$)ma-OC(═O)—

*—($CH_2$)ma-$NR^a$C(═O)—

*—O($CH_2$)ma-OC(═O)—

*—$SO_2$($CH_2$)ma-OC(═O)—

*—C(═O)$NR^a$($CH_2$)ma-OC(═O)—

*—($CH_2$)mc-OC(═O)—

*—C(═O)O($CH_2$)ma-O$CH_2$—

*—C(═O)O($CH_2CH_2$O)me-$CH_2CH_2$OC(═O)—

Here, $R^a$ represents a hydrogen atom, an alkyl group, an aryl group or a heterocyclic group; and ma, mc and me represent an integer of 1 to 20.

Moreover, preferred examples of the above-mentioned divalent linking group LL, which $L^3$ has as a bonding site to B, include the following groups. A * part bonds with a group of an n-type organic semiconductor unit.

*>C($R^x$)—($CH_2$)mb-C(═O)O($CH_2$)ma-OC(═O)—

*—($CH_2$)mb-OC(═O)—

*—$R^x$—($CH_2$)mb-OC(═O)—

*>CH—CH═CH—($CH_2$)mc-C(═O)O($CH_2$)ma-OC(═O)—

*—($CH_2$)mb-$NR^a$C(═O)—

*—$R^x$—($CH_2$)mb-OC(═O)—

Here, $R^a$ represents a hydrogen atom, an alkyl group, an aryl group or a heterocyclic group; IV represents a phenyl group or a thienyl group; and ma to mc represent an integer of 1 to 20.

$L^e$ is preferably any of the following groups. A * part bonds with a group of the n-type organic semiconductor unit.

*—($CH_2$)mb-OC(═O)—

*—($CH_2$)mb-$NR^a$C(═O)—

*—($CH_2$)ma-O—$CH_2$—

*—($R^x$)ma-($CH_2$)mb-

*—($R^x$)ma-($CH_2$)mb-O—$CH_2$—

Here, $R^a$ represents a hydrogen atom, an alkyl group, an aryl group or a heterocyclic group; IV represents a phenyl group or a thienyl group; and ma and mb represent an integer of 1 to 20.

A polymerization method of these compounds is not particularly limited, and can be conducted in accordance with various publicly-known methods. When a compound has a polymerizable unsaturated bond group, the polymerization can be performed, for example, according to a method described in JP-A-2002-69331, and when a compound has an epoxy or oxetane group, the polymerization can be performed, for example, according to a method described in JP-A-2004-189840.

Specific examples of the compound represented by formula (ab) are shown below. However, the present invention is not construed as being limited to these examples.

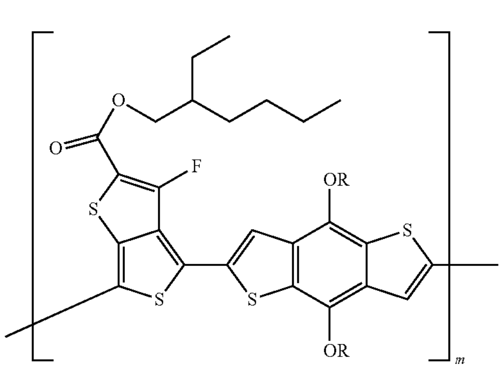
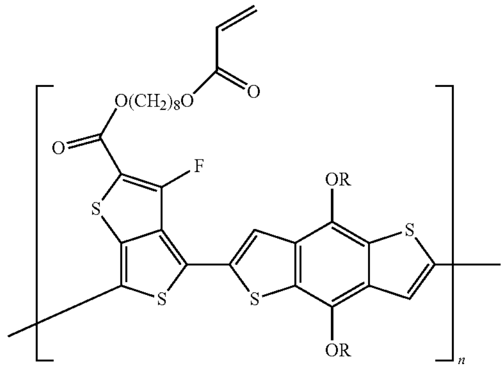
R = ethylhexyl
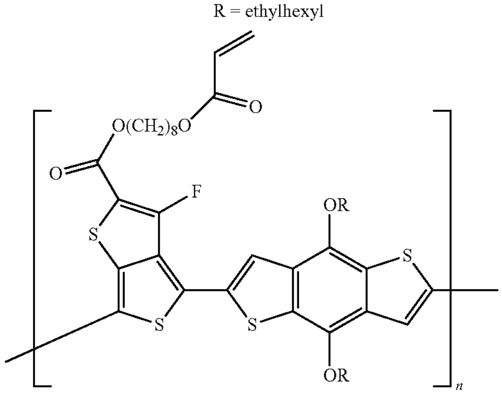
R = 2-ethylhexyl
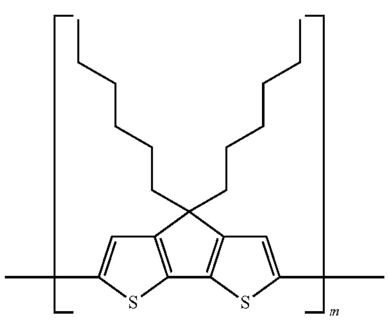
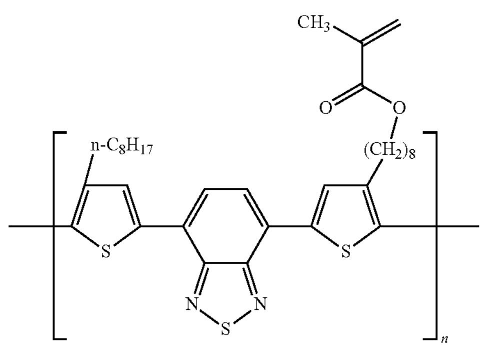
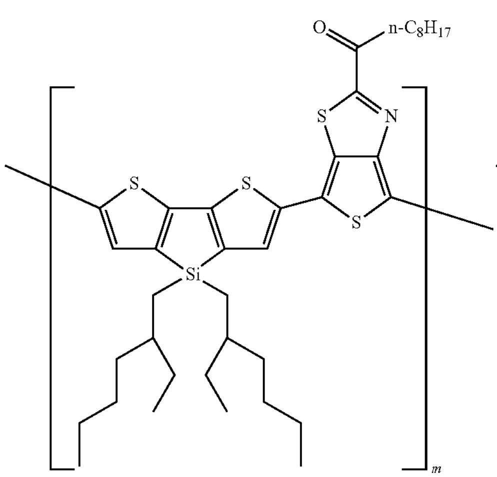
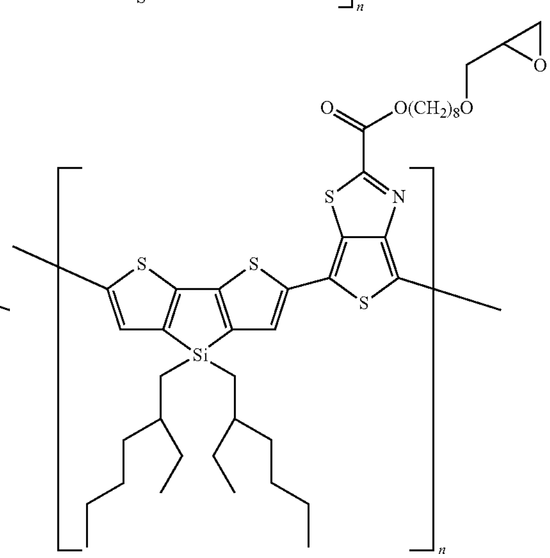

-continued
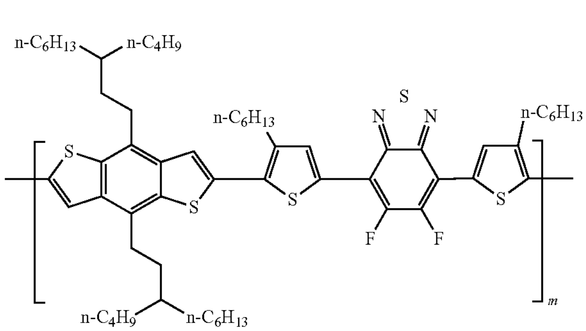
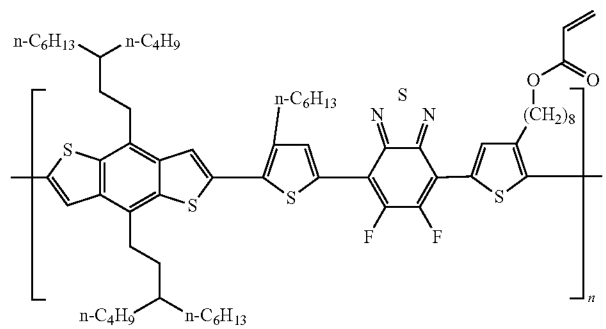
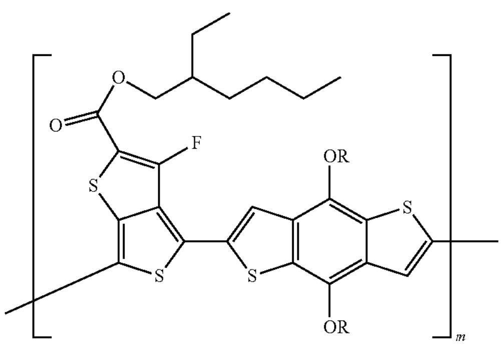
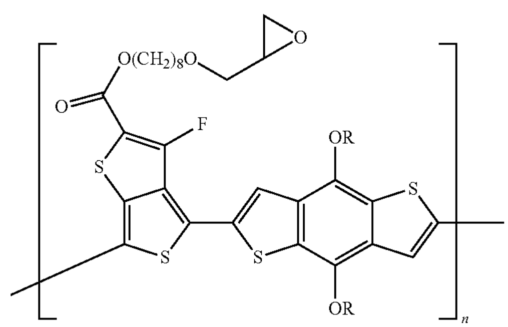
R = 2-ethylhexyl
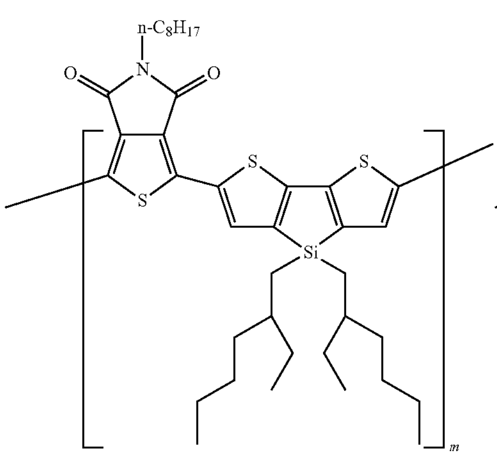
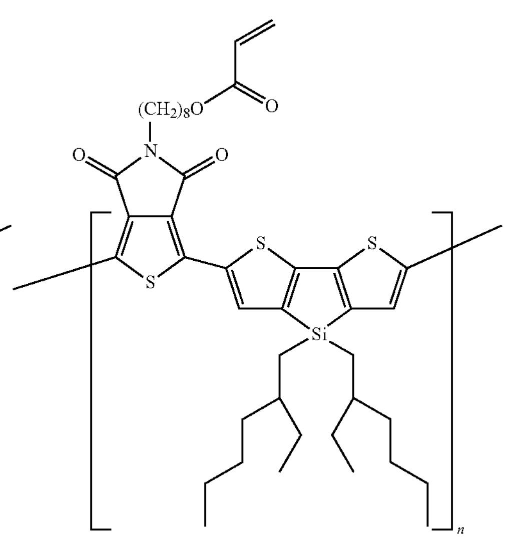

-continued
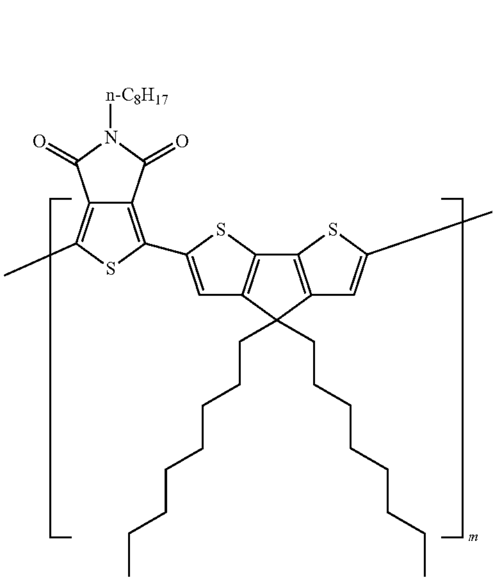
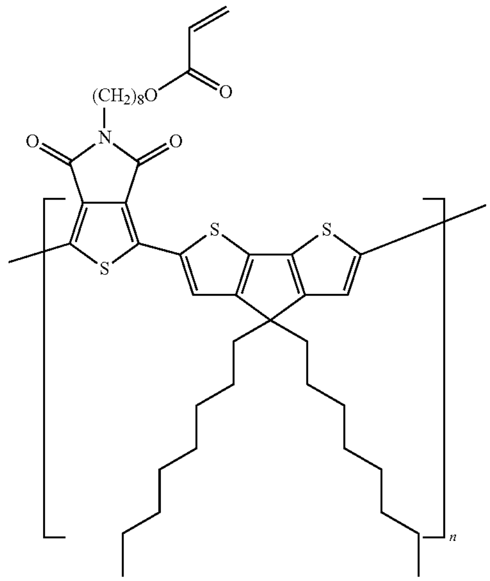
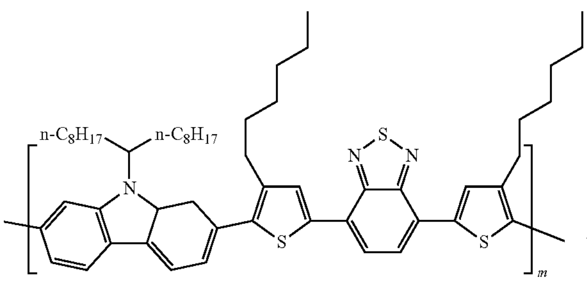
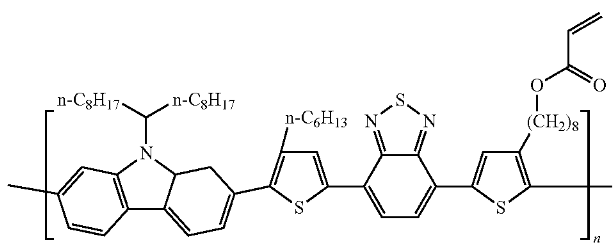
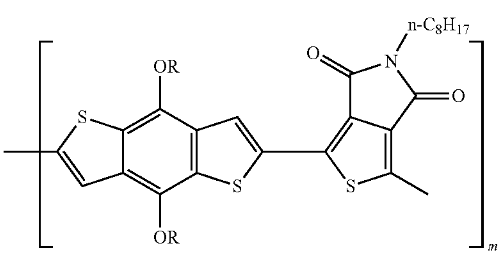
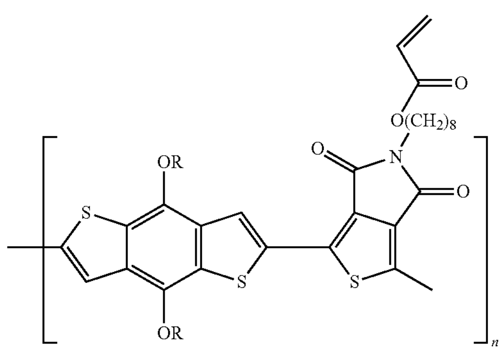
R = 2-ethylhexyl
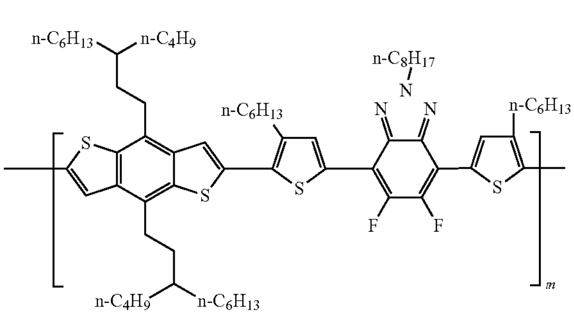
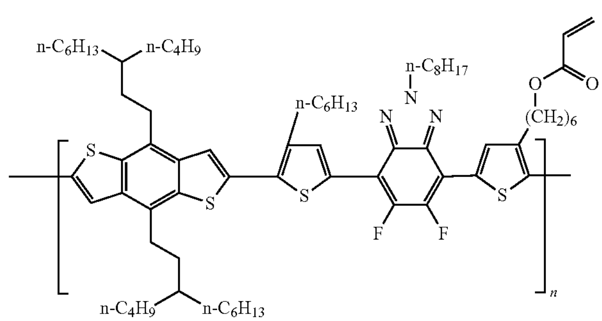

-continued
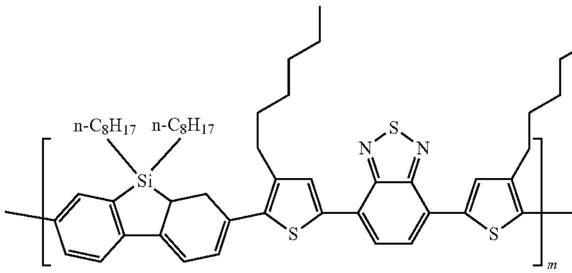
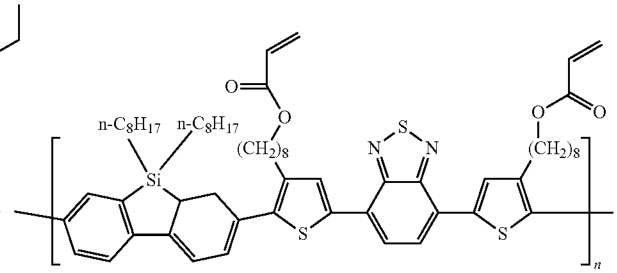
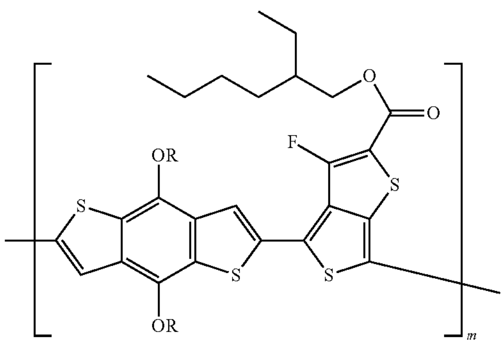
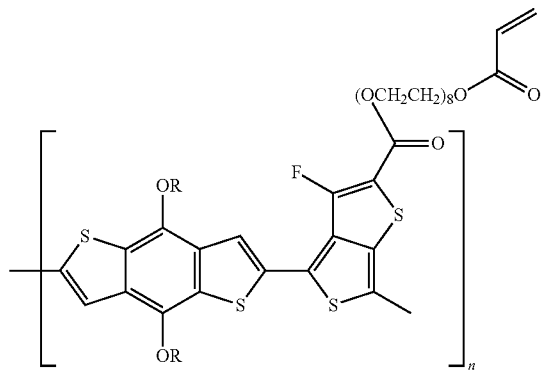
$R^2$ = 2-ethylhexyl
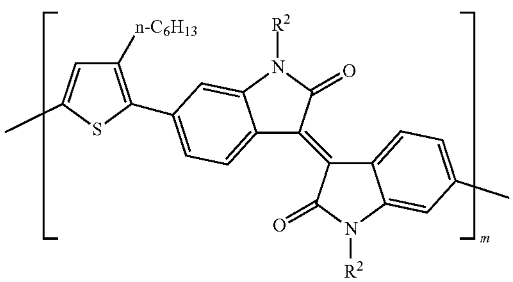
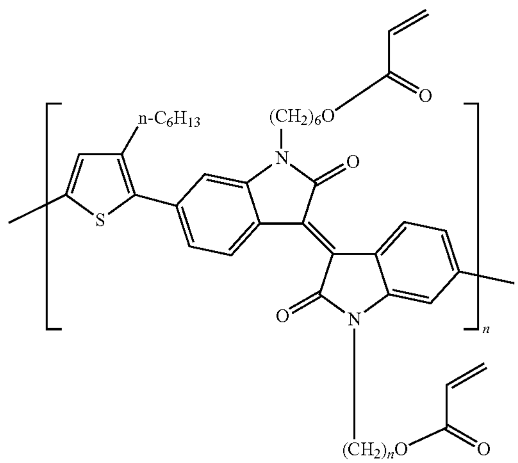
$R^2$ = 2-ethylhexyl
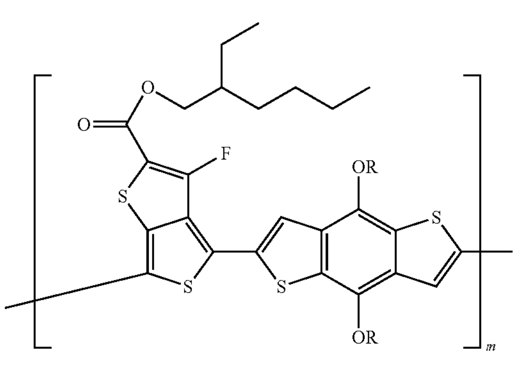
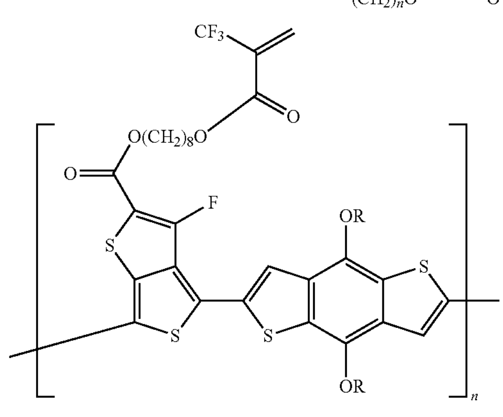
R = 2-ethylhexyl -continued
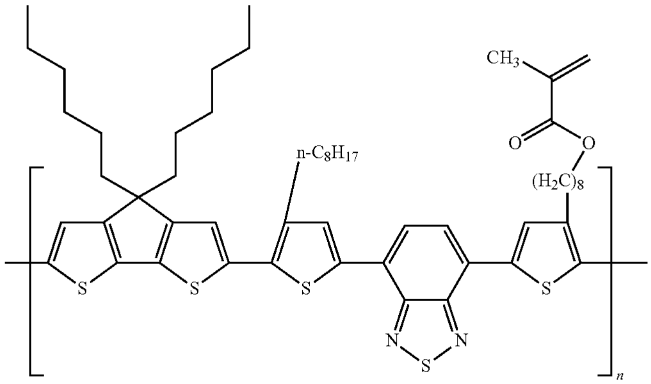
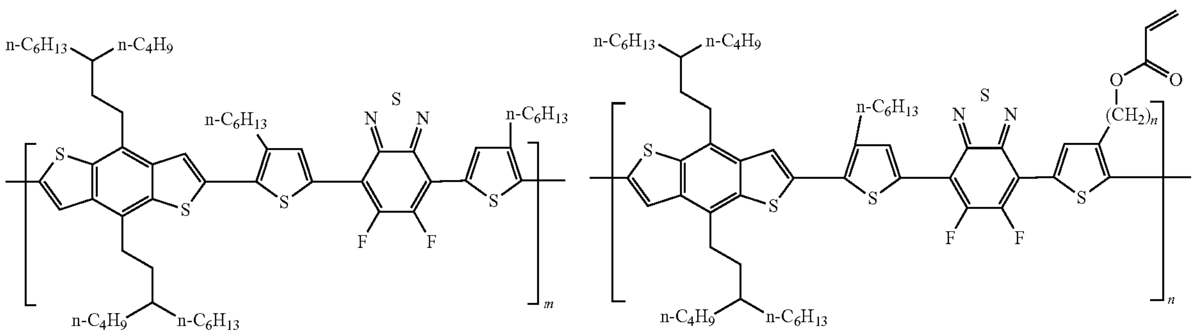
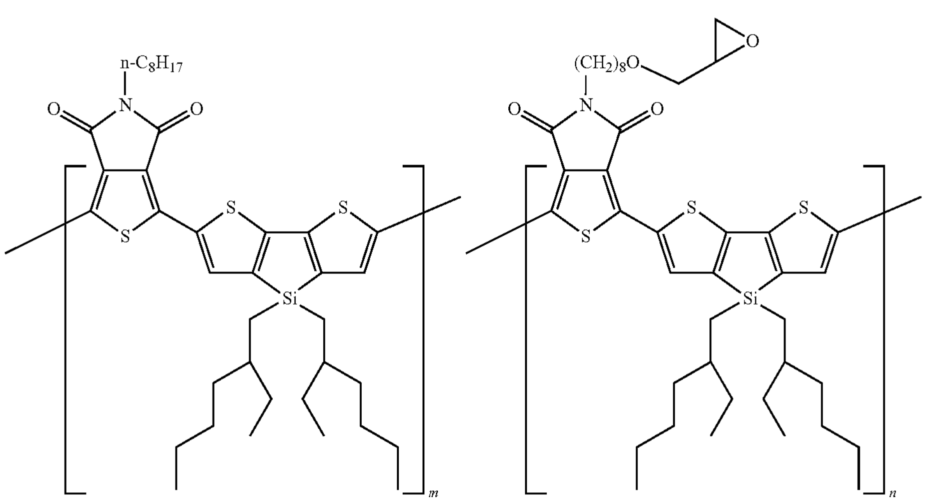

-continued
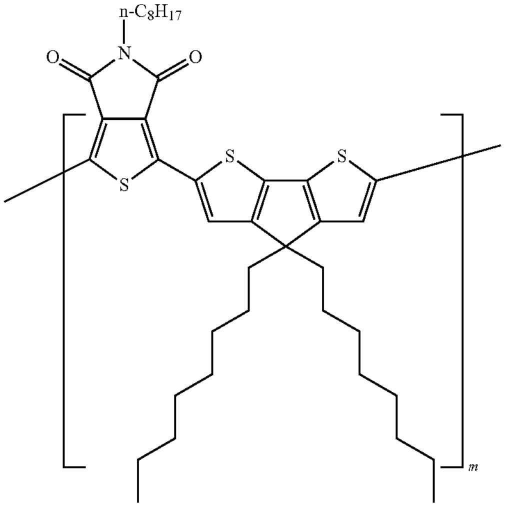
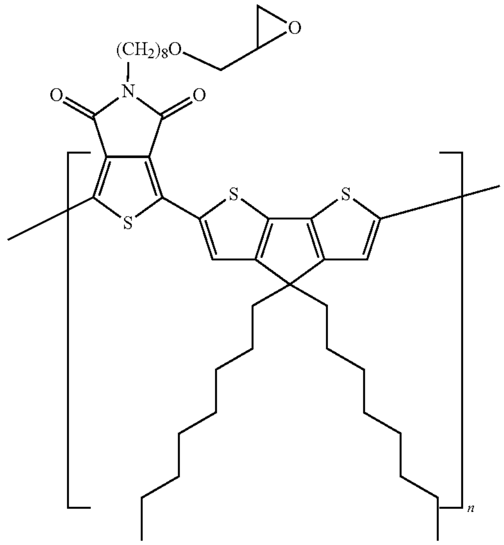
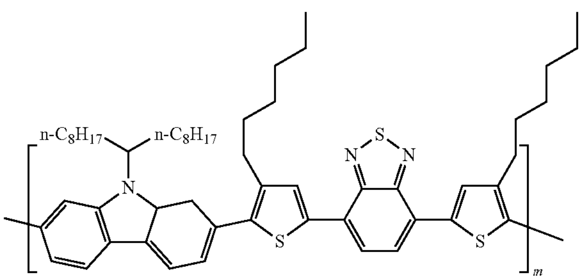
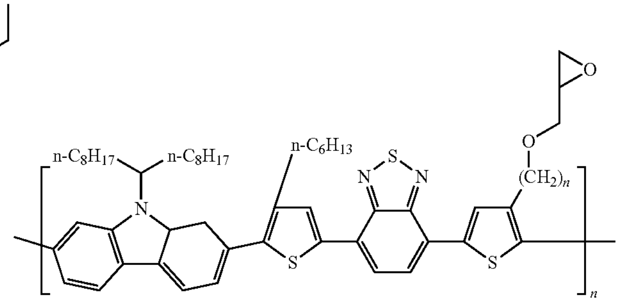
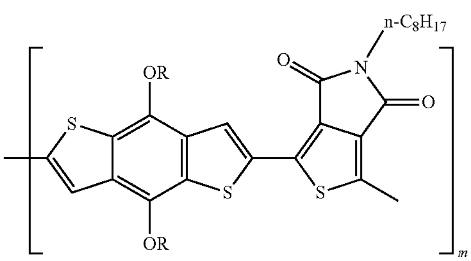
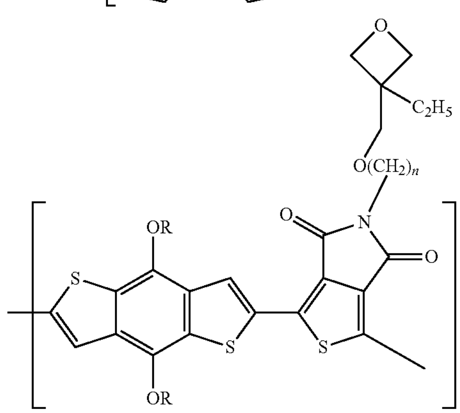
R = 2-ethylhexyl
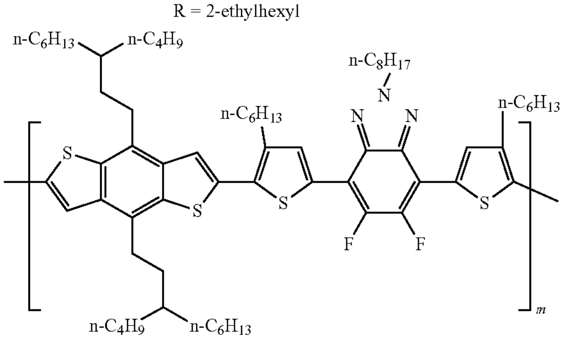
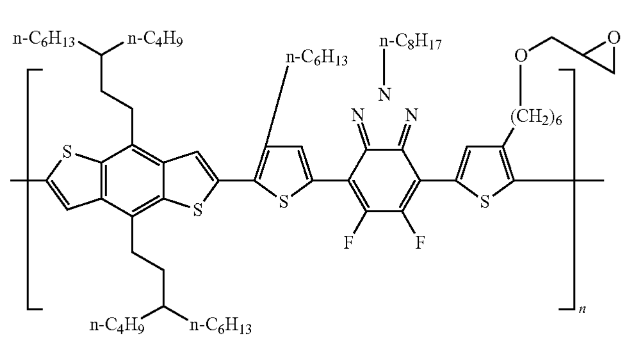

-continued
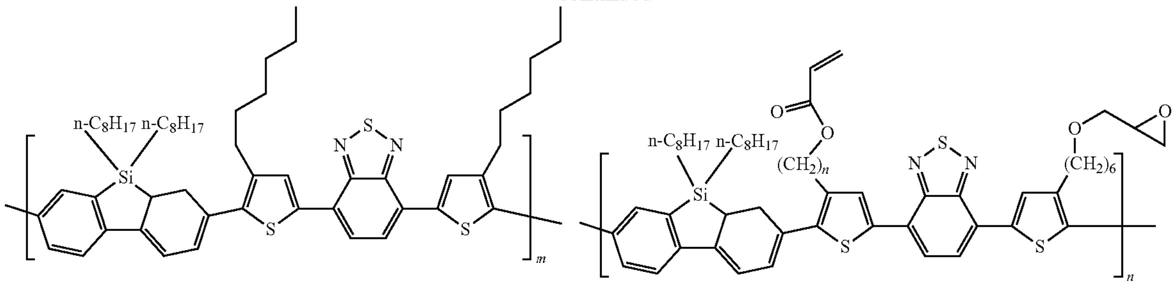
Specific examples of the compound represented by formula (bb) are shown below. However, the present invention is not construed as being limited to these examples.
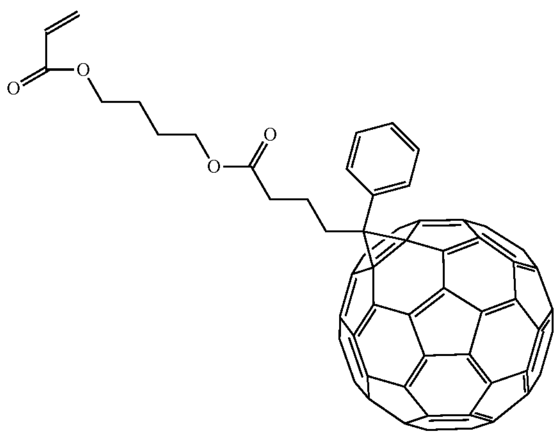
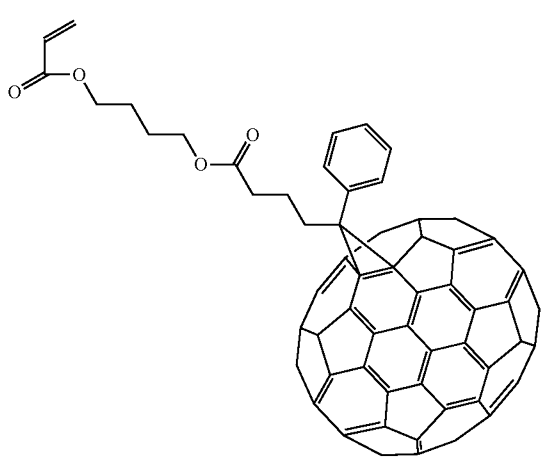
-continued
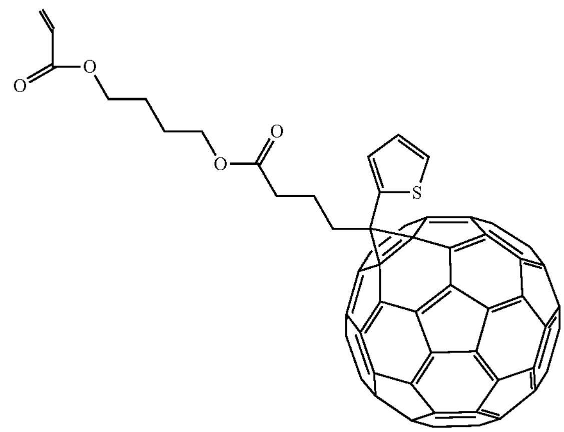
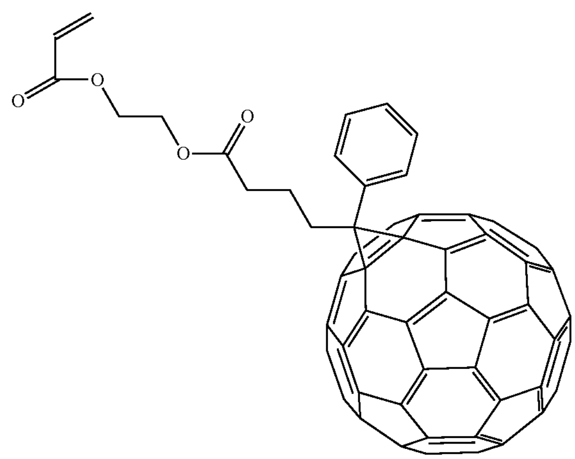
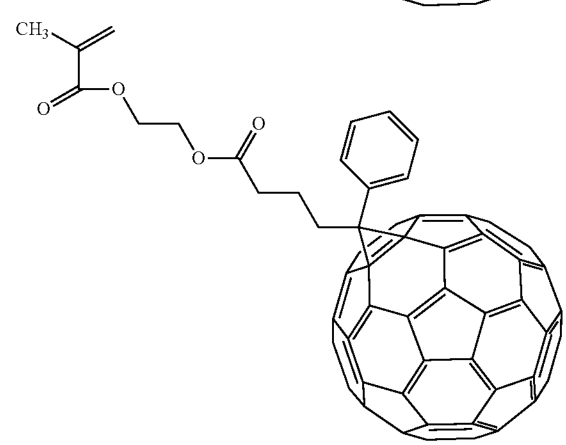

-continued
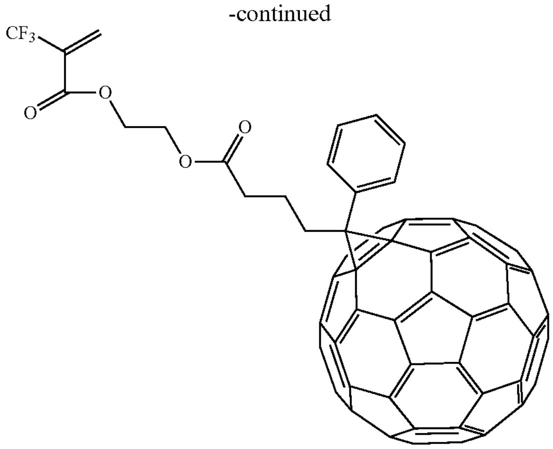
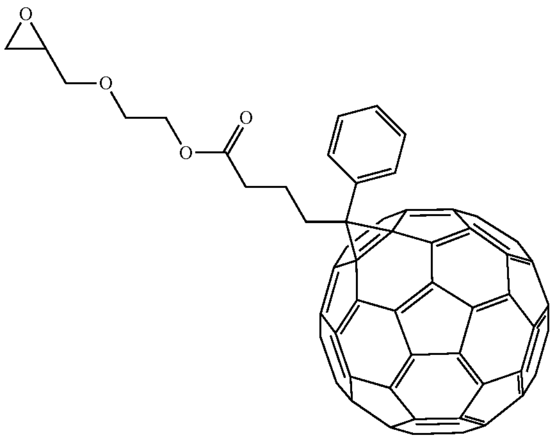
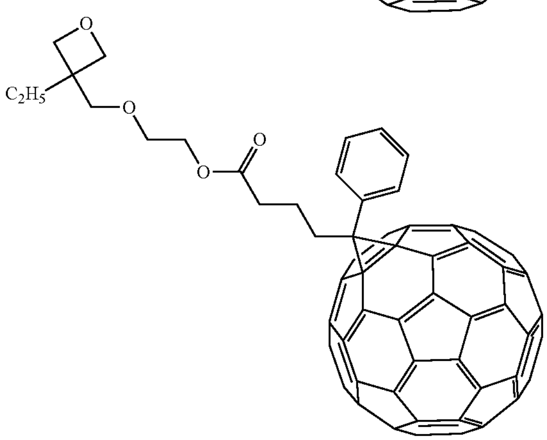
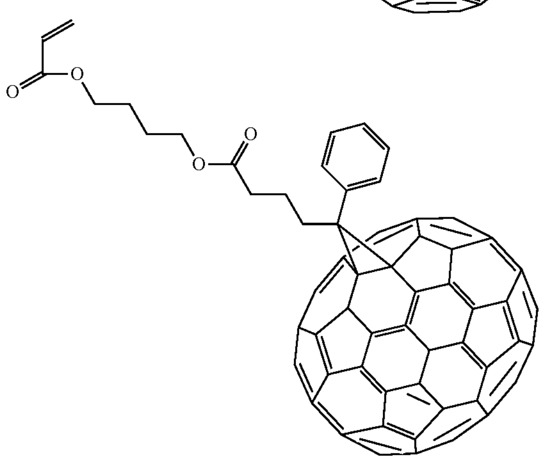
-continued
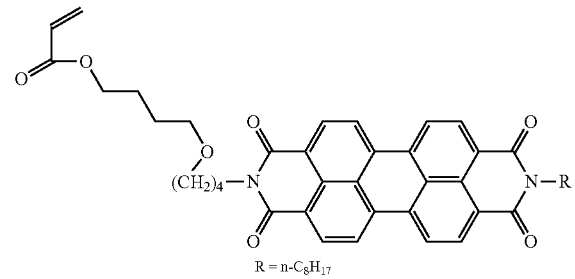
Specific examples of the compound represented by formula (4b) are shown below. However, the present invention is not construed as being limited to these examples.
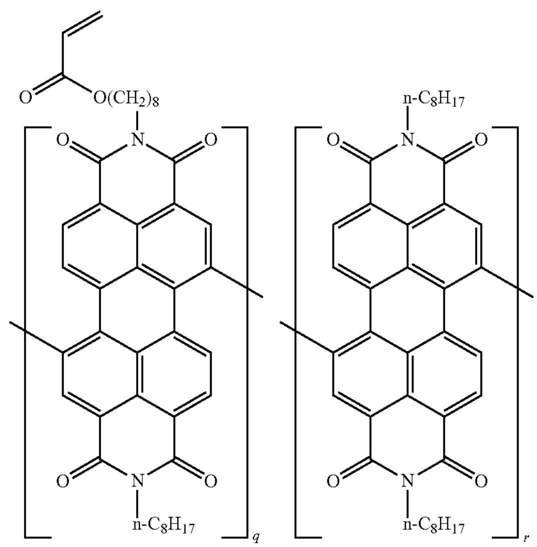
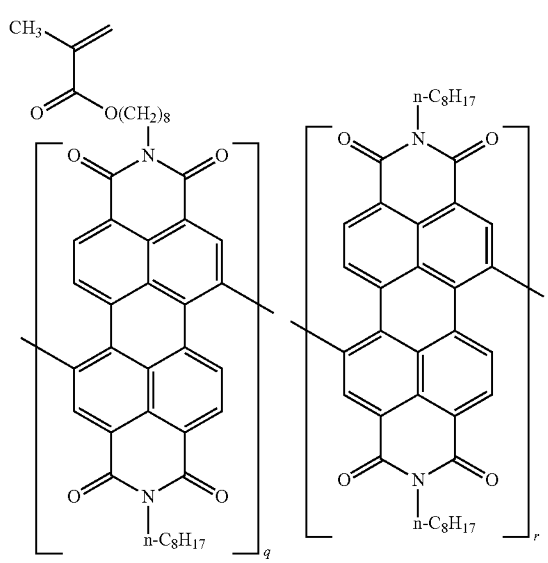

-continued

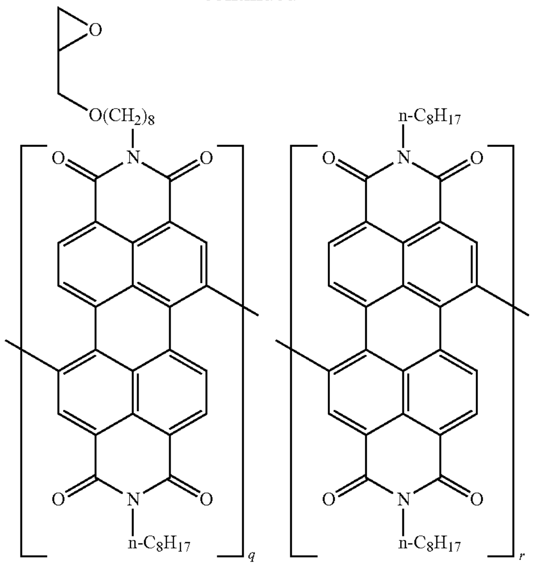

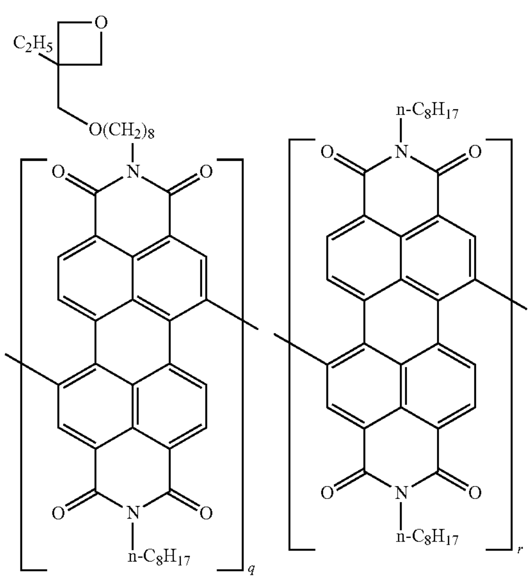

The compound represented by formula (5) can be produced by various publicly-known methods. For example, the compound represented by formula (5) can be produced by allowing a compound represented by formula (5a) to react with a compound represented by formula (5b).

$Z^{1a}$, $Z^{1b}$, $Z^{2a}$ and $Z^{2b}$ in formula (5a) or (5b) each independently represent a hydrogen atom or a substituent, and at least one of $Z^{1a}$ and $Z^{1b}$ and at least one of $Z^{2a}$ and $Z^{2b}$ are a substituent that is a reactive functional group. Examples of the substituent include the substituent T described later.

As the reactive functional group, a group which can form a bond by a nucleophilic reaction or a dehydration reaction in a reaction between $Z^{1a}$ and $Z^{2a}$ or $Z^{2b}$ or between $Z^{1b}$ and $Z^{2a}$ or $Z^{2b}$ is preferred; and, for example, one is a hydroxyl group, and the other is —C(═O)Xa, —N═C═O or —$CH_2$Xb. Here, Xa represents a hydroxyl group, a halogen atom (for example, a fluorine atom, a chlorine atom, a bromine atom, or an iodine atom), an alkoxy group, an aryloxy group, an acyloxy group, an alkanesulfonyloxy group, or an arylsulfonyloxy group; and Xb represents a halogen atom, an alkanesulfonyloxy group, or an arylsulfonyloxy group. The hydroxyl group may be an alcoholic hydroxyl group or a phenolic hydroxyl group.

Moreover, it is also preferable that one is a hydroxyl group, an amino group, a carboxyl group, a mercapto group, an epoxy group, or an oxetane group, and the other is an epoxy group or an oxetane group, and these form a chemical bond by a ring-opening reaction of an epoxy ring or an oxetane ring.

Further, a further example is that one is a vinyl group or an ethynyl group, and the other is a haloarene group (—Ar—Xb; Ar represents an arylene group and Xb represents a halogen atom or a fluoromethanesulfonyloxy group), and these form a chemical bond by a carbon-carbon bond forming reaction.

$L^f$ to $L^i$ each represents a single bond or a divalent linking group. The divalent linking group of $L^f$ to $L^i$ is preferably an alkylene group, an arylene group, —O—, —S—, —SO—, —$SO_2$—, —C(═O)—, —$NR^a$— or a group formed by combining these (for example, —C(═O)—O—, —$NR^a$C(═O)—, —$NR^a$C(═O)—, —$NR^aSO_2$—); and an alkylene group, —O—, —C(═O)—, —$NR^a$— or a group formed by combining these is further preferred. Here, $R^a$ represents a hydrogen atom, an alkyl group, an aryl group, or a heterocyclic group. The divalent aliphatic group may have —O—, —S—, —SO—, —$SO_2$—, —C(═O)— or —$NR^a$— or a group formed by combining these (for example, —C(═O)—O—, —$NR^a$C(═O)—, —$NR^a$C(═O)—, —$NR^aSO_2$—), inserted into an aliphatic moiety in the aliphatic group. Here, $R^a$ represents a hydrogen atom, an alkyl group, an aryl group, or a heterocyclic group.

The divalent linking group of $L^f$ to $L^i$ is preferably any of the following groups. A * part bonds with a group of the p-type organic semiconductor unit or a group of n-type organic semiconductor unit.

*—CH═CH—

*—C(═O)O—

*—C(═O)—

*—$C_6H_4$—

*—$CH_2$—Ar—$CH_2$—

*—$CH_2$—Ar—$CH_2$O—Ar—

Here, Ar represents a divalent aryl group that may have a substituent, and examples of the substituent include the substituent T described later.

Synthesis using the reactive functional group is described in "Daiyonhan Jikken Kagaku Koza (Experimental Chemistry Course, Fourth Edition)" (issued by Maruzen Co., Ltd.), edited by The Chemical Society of Japan, Vol. 22, pages 45-47, ditto, Vol. 22, pages 50-51, ditto, Vol. 20, pages 356-358, ditto, Vol. 20, pages 187-191, ditto, Vol. 4, pages 124-129, ditto, Vol. 5, pages 298-300, and JP-A-2004-189840, and the synthesis can be conducted in accordance with the descriptions.

Specific examples of the compound represented by formula (5a) are shown below. However, the present invention is not construed as being limited to these examples.

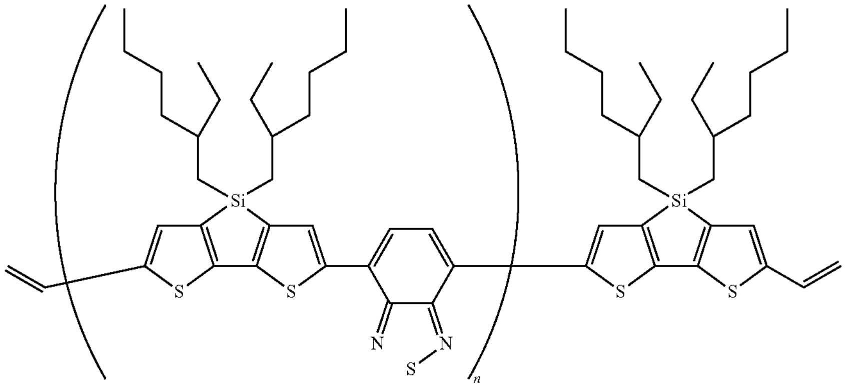
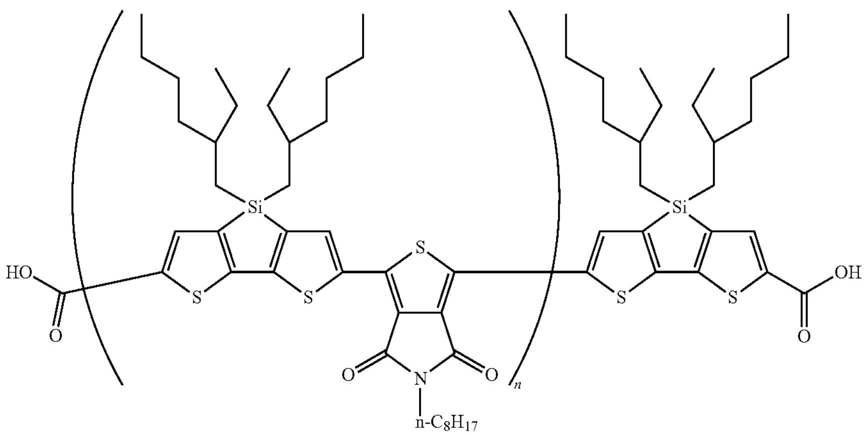
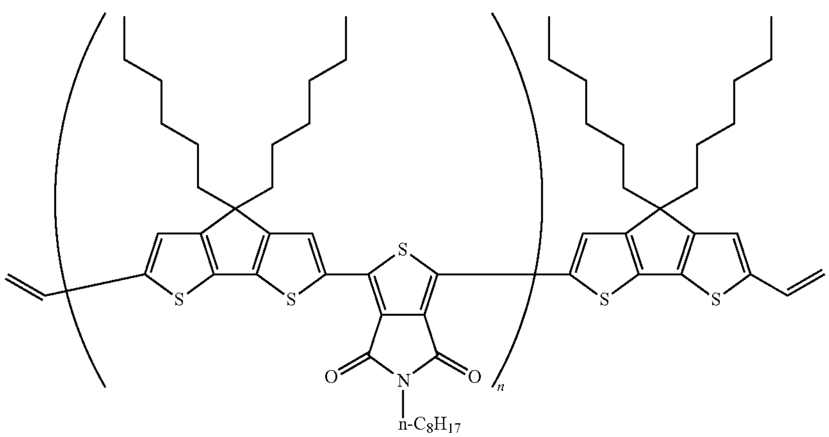
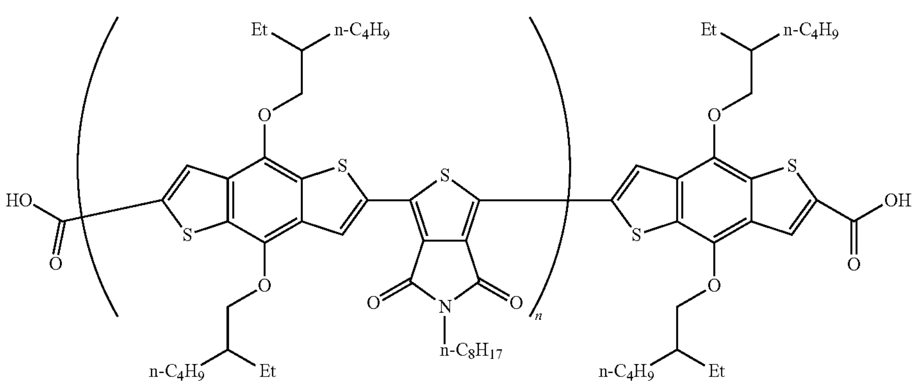

-continued
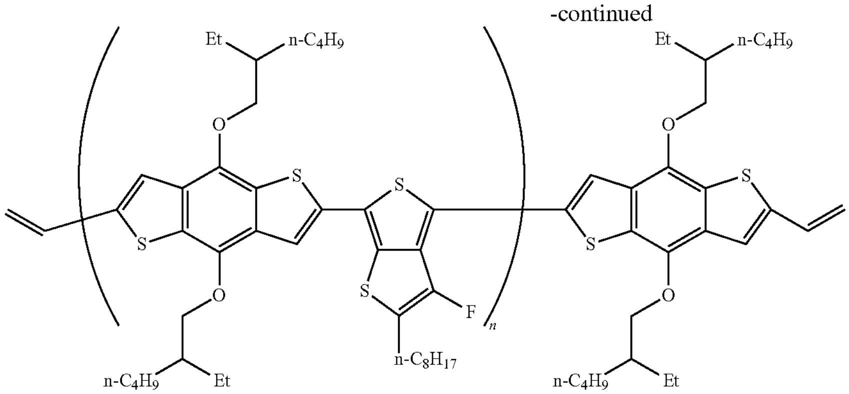
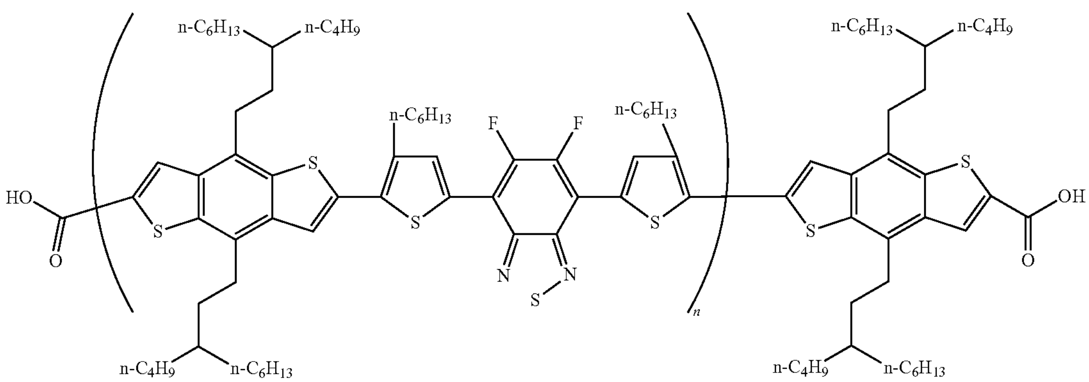
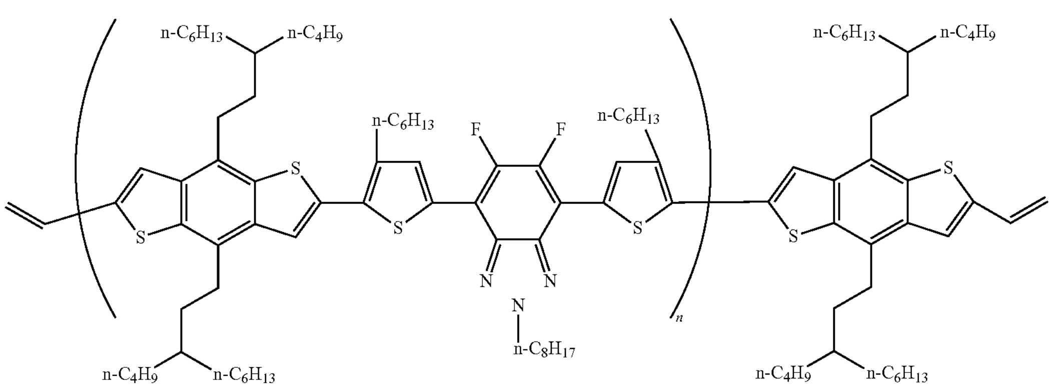
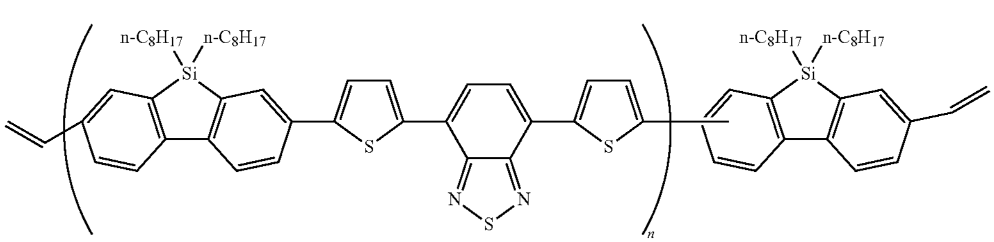

-continued
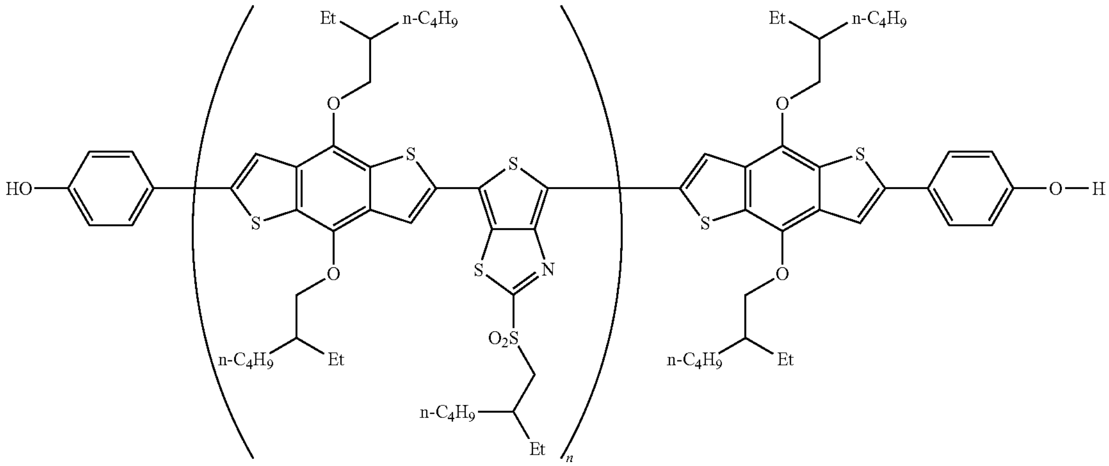
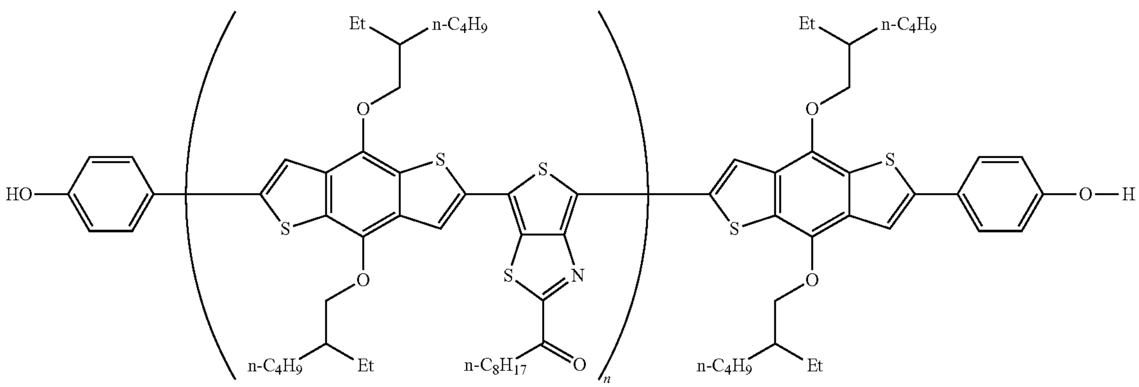
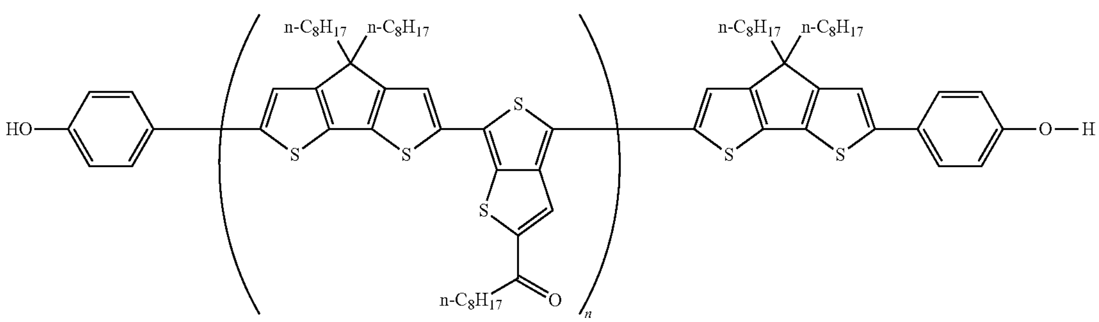
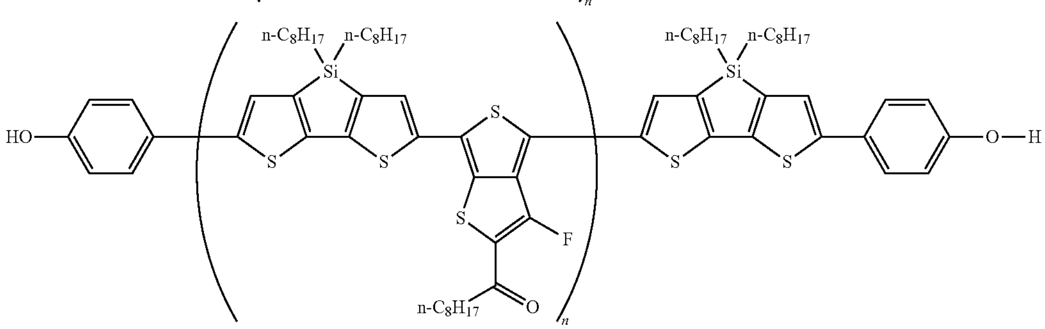

-continued
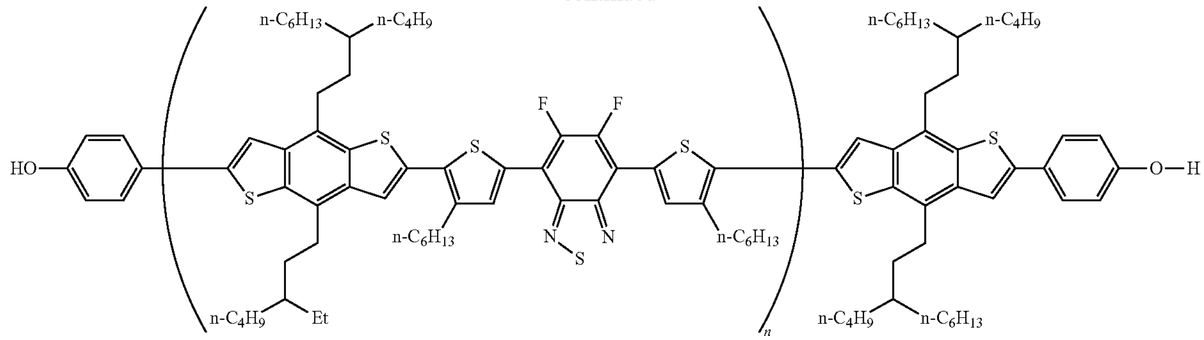
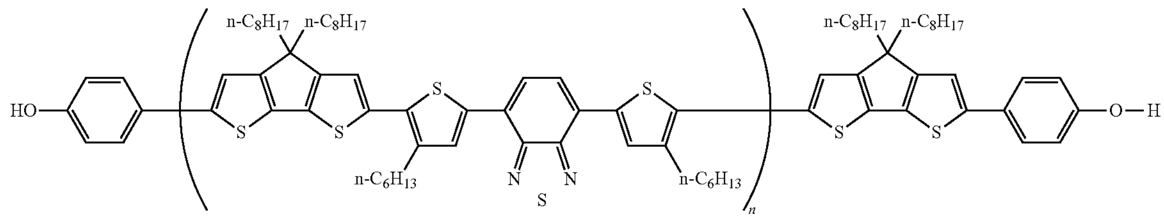
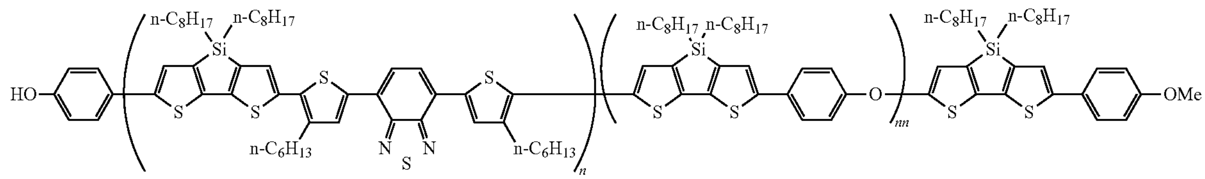
Specific examples of the compound represented by formula (5b) are shown below. However, the present invention is not construed as being limited to these examples.
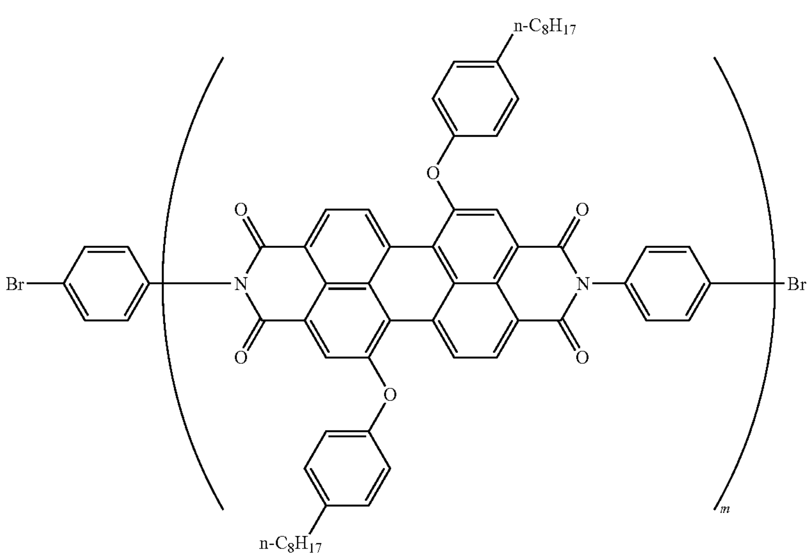

-continued
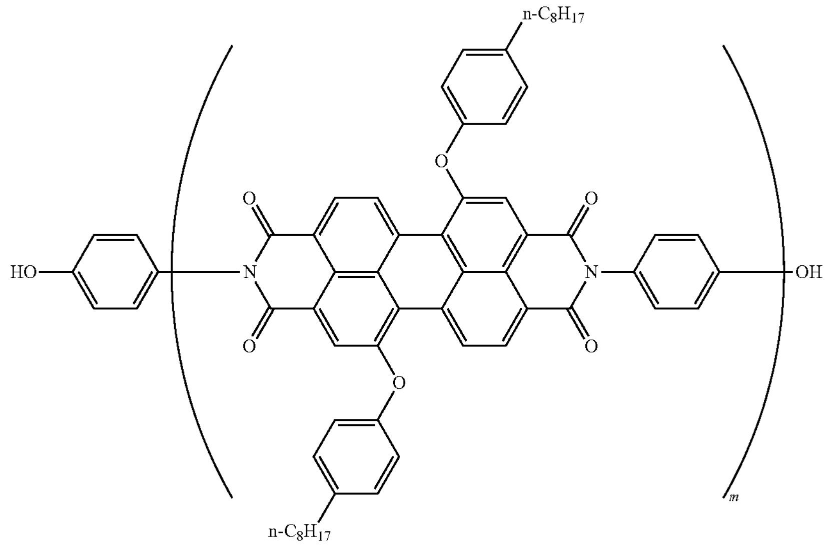
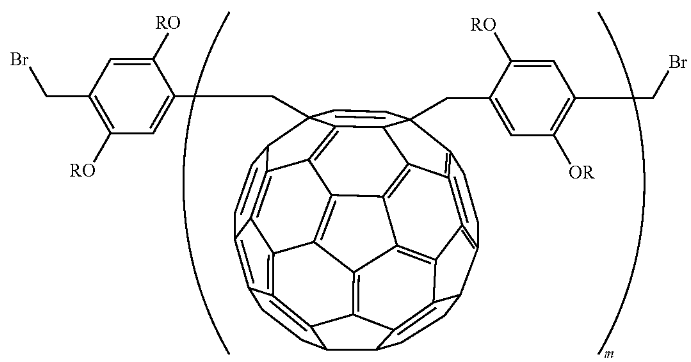
R = n-$C_6H_{13}$
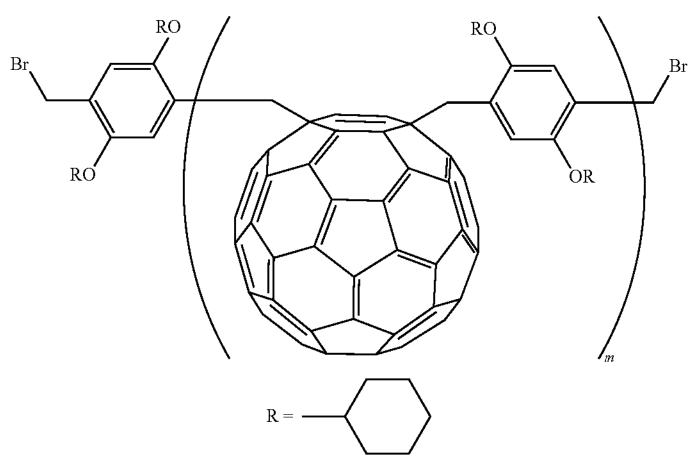

-continued

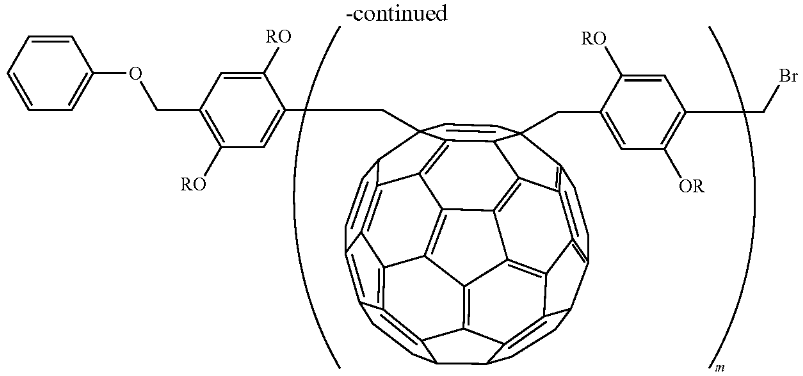

R = n-$C_6H_{13}$

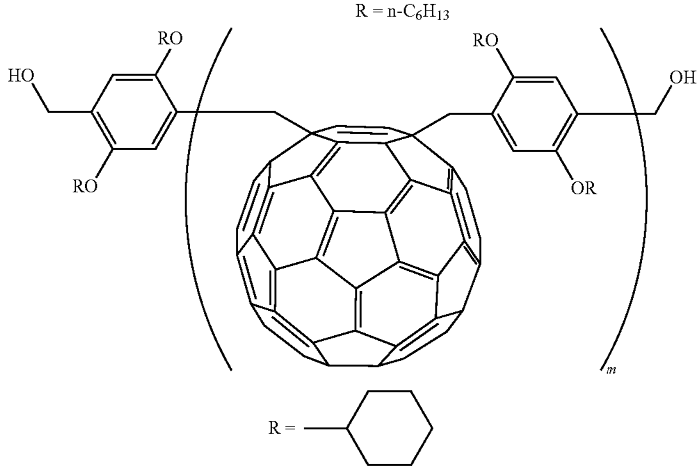

As a precursor of the p-type-and-n-type linked organic semiconductor polymer according to the present invention, a compound represented by formula (1a), (ab) or (5a) is preferred.

Among the compounds, a compound or organic semiconductor polymer represented by formula (ab) or (5a) is preferred.

(Substituent T)

The terms "compound" and "polymer" (including "organic semiconductor polymer") used in the present specification are defined to include, in addition to the compound and the polymer themselves, their salts, their complexes, and their ionic forms. Further, they are defined to include their derivatives which have been modified in a predetermined configuration to the extent that a desired effect is produced. Furthermore, when a "substituent" (including a linking group) is not specified as to whether substituted or unsubstituted in the present specification, this means that the group may have an optional substituent. This also similarly applies to a compound and a polymer that are not specified as to whether substituted or unsubstituted.

Moreover, the substituent in the present invention is also described as a monovalent substituent.

Examples of preferred substituent include those of the substituent T shown below.

The substituent T includes the followings:

an alkyl group (preferably an alkyl group having 1 to 20 carbon atoms, e.g. methyl, ethyl, isopropyl, t-butyl, pentyl, heptyl, 1-ethylpentyl, benzyl, 2-ethoxyethyl, or 1-carboxymethyl), an alkenyl group (preferably an alkenyl group having 2 to 20 carbon atoms, e.g. vinyl, allyl, or oleyl), an alkynyl group (preferably an alkynyl group having 2 to 20 carbon atoms, e.g. ethynyl, butadiynyl, or phenylethynyl), a cycloalkyl group (preferably a cycloalkyl group having 3 to 20 carbon atoms, and preferably a 3- to 7-membered ring, e.g. cyclopropyl, cyclopentyl, cyclohexyl, or 4-methylcyclohexyl), an aryl group (preferably an aryl group having 6 to 26 carbon atoms, e.g. phenyl, 1-naphthyl, 4-methoxyphenyl, 2-chlorophenyl, or 3-methylphenyl), a heterocyclic group (preferably a heterocyclic group having 2 to 20 carbon atoms and at least one of oxygen atom, nitrogen atom, sulfur atom, and silicon atom, and more preferably a 5- or 6-membered ring which may further form a condensed ring with other ring(s), e.g. 2-pyridyl, 4-pyridyl, 2-imidazolyl, 2-benzimidazolyl, 2-thiazolyl, or 2-oxazolyl), an alkoxy group (preferably an alkoxy group having 1 to 20 carbon atoms, e.g. methoxy, ethoxy, isopropyloxy, or benzyloxy), an aryloxy group (preferably an aryloxy group having 6 to 26 carbon atoms, e.g. phenoxy, 1-naphthyloxy, 3-methylphenoxy, or 4-methoxyphenoxy);

an alkylthio group (preferably an alkylthio group having 1 to 20 carbon atoms, e.g. methylthio, ethylthio, isopropylthio, or benzylthio), an arylthio group (preferably an arylthio group having 6 to 26 carbon atoms, e.g. phenylthio, 1-naphthylthio, 3-methylphenylthio, or 4-methoxyphenylthio), an alkoxycarbonyl group (preferably an alkoxycarbonyl group having 2 to 20 carbon atoms, e.g. ethoxycarbonyl, or 2-ethylhexyloxycarbonyl), an aryloxycarbonyl group (preferably an aryloxycarbonyl group having 6 to 20 carbon atoms, e.g. phenyloxycarbonyl, or naphthyloxycarbonyl), an amino group (preferably an amino group having 0 to 20 carbon atoms including an amino group, an alkylamino group, and an arylamino group, e.g. amino, N,N-dimethylamino, N,N-diethylamino, N-ethylamino, or anilino), a sulfonamide group (preferably a sulfonamide group having 0 to 20 carbon atoms, e.g. N,N-dimethylsulfonamide, or N-phenylsulfonamide), an acyloxy group (preferably an acyloxy group having 1 to 20 carbon atoms, e.g. acetyloxy, or benzoyloxy), a carbamoyl group (preferably a carbamoyl group having 1 to 20 carbon atoms, e.g. N,N-dimethylcarbamoyl, or N-phenylcarbamoyl), an acylamino group (preferably an acylamino group having 1 to 20 carbon atoms, e.g. acetylamino, or benzoylamino), an acyl group (preferably an acyl group having 1 to 20 carbon atoms, e.g. formyl, acetyl, pivaloyl, stearoyl, acryloyl, methacryloyl, or benzoyl), an acyloxy group (preferably an acyloxy group having 1 to 20 carbon atoms, e.g. formyloxy, acetyloxy, pivaloyloxy, acryloyloxy, or benzoyloxy), a sulfonyl group (preferably, an alkylsulfonyl or arylsulfonyl group, and in the case of the alkylsulfonyl group, preferably, an alkylsulfonyl group having 1 to 20 carbon atoms, and in the case of the arylsulfonyl group, preferably, an arylsulfonyl group having 6 to 20 carbon atoms, e.g. methanesulfonyl, octanesulfonyl, hexadecanesulfonyl, benzenesulfonyl or toluenesulfonyl), a silyl group (preferably a silyl group having 1 to 20 carbon atoms, e.g. tetramethylsilyl, dimethylphenylsilyl, trimethoxysilyl), a cyano group, a hydroxyl group, a carboxyl group, a sulfo group, a halogen atom (e.g. fluorine atom, chlorine atom, bromine atom, or iodine atom), a trialkyltin group, and a boronic acid (boronic acid ester) group; more preferably, an alkyl group, an alkenyl group, an aryl group, a heterocyclic group, an alkoxy group, an aryloxy group, an alkoxycarbonyl group, an acyl group, a sulfonyl group, an amino group, an acylamino group, a cyano group, and a halogen atom; particularly preferably, an alkyl group, an alkenyl group, an aryl group, a heterocyclic group, an alkoxy group, an alkoxycarbonyl group, an acyl group, a sulfonyl group, an amino group, an acylamino group, a cyano group, or a halogen atom. A trialkyltin group or a boronic acid (boronic acid ester) group each derived from the monomer may possibly remain at a polymer terminal.

<Organic Photoelectric Conversion Element Composition>

The organic photoelectric conversion element composition according to the present invention will be described.

As a first aspect of the present invention, the organic photoelectric conversion element composition according to the present invention contains at least a p-type-and-n-type linked organic semiconductor polymer represented by any one of formulas (1) to (5).

As a second aspect of the present invention, the composition contains organic semiconductor polymers or compounds in any one of the combinations of [A] to [E].

As a third aspect of the present invention, the composition contains a compound or organic semiconductor polymer represented by any one of formulas (1a), (ab) and (5a). In this case, above all, a compound or organic semiconductor polymer represented by formula (ab) or (5a) is preferred.

The amount of the p-type-and-n-type linked organic semiconductor polymer is not particularly limited, but when a total amount of the composition in terms of mass (preferably, a total solid mass) is taken as 100, the polymer (preferably, a polymer solid mass) is contained preferably in an amount of 0.01 to 90% by mass, further preferably in an amount of 0.05 to 50% by mass, and particularly preferably in an amount of 0.1 to 30% by mass.

Meanwhile, the term "composition" in the present invention means that two or more components are substantially uniformly present at a specific constitution. Herein, being substantially uniform means that each component may be unevenly distributed to the extent that the functional effect of the present invention is provided. Furthermore, regarding the composition, as long as the definition described above is satisfied, the form is not particularly limited. That is, the form is not limited to a fluid liquid or a paste, and the composition means to include a solid, a powder and the like, all containing plural components. Furthermore, even in a case where a precipitate is present, the term "composition" is defined to include those of which dispersed state is maintained for a predetermined time by stirring.

The organic photoelectric conversion element composition according to the present invention may simultaneously use, in addition to the above-described organic semiconductor polymer or compound according to the present invention, when necessary, a conventional p-type semiconductor polymer or compound, or an n-type semiconductor polymer or compound.

As the semiconductor polymers or compounds, use can be made of a compound having a group(s) listed in the group of the n-type organic semiconductor unit or in the group of the p-type organic semiconductor unit, according to the present invention, and a polymer of the compound; and a preferred range is also the same. Here, the semiconductor compounds may be the same with or different from a partial structure of the polymer described in formulas (1) to (5) in the present invention.

As the conventional p-type semiconductor compound, use can be made of condensed polycyclic aromatic low-molecular-weight compound such as anthracene, tetracene, pentacene, hexacene, heptacene, chrysene, picene, fulminene, pyrene, peropyren, perylene, terrylene, quaterrylene, coronene, ovalene, circumanthracene, bisanthene, zethrene, heptazethrene, pyranthrene, violanthrene, isoviolanthrene, circobiphenyl, and anthradithiophene; porphyrin and copper phthalocyanine.

As the conventional n-type organic semiconductor compound, in addition to fullerene or a derivative thereof; use can be made of octaazaporphyrin, perfluoro compounds obtained by substituting the hydrogen atoms of a p-type organic semiconductor compound with fluorine atoms (for example, perfluoropentacene or perfluorophthalocyanine); and polymer compounds containing, as skeletal structures, aromatic carboxylic acid anhydrides or imidation products thereof, such as naphthalenetetracarboxylic acid anhydride, naphthalenetetracarboxylic acid diimide, perylenetetracarboxylic acid anhydride, and perylenetetracarboxylic acid diimide.

<Photovoltaic Cell>

The p-type-and-n-type linked organic semiconductor polymer or the compound, the organic photoelectric conversion element composition, and the thin film comprising the same, according to the present invention are useful for the photovoltaic cell, in particular, for the organic photovoltaic cell.

FIG. 1 is a side view schematically showing one example of a photovoltaic cell, in particular, an organic photovoltaic cell, according to the present invention. A solar cell 10 according to this embodiment has a photoelectric conversion layer 3 containing an organic photoelectric conversion element composition containing a p-type-and-n-type linked organic semiconductor polymer.

In a particularly preferred organic photovoltaic cell according to this embodiment, the photoelectric conversion layer 3 is constituted of the p-type-and-n-type linked organic semiconductor polymer, and a p-type semiconductor phase (electron donating phase) of a p-type linked organic semiconductor unit and an n-type semiconductor phase (electron accepting phase) of an n-type linked organic semiconductor unit form a microphase separation structure. The photoelectric conversion layer 3 is disposed between a first electrode 11 and a second electrode 12. In the present invention, it is preferred that a hole transporting layer 21 is disposed between the first electrode and the photoelectric conversion layer, and it is preferred that an electron transporting layer 22 is disposed between the second electrode and the photoelectric conversion layer. An effective extraction of the charge generated in the photoelectric conversion layer can be achieved by virtue of providing the hole transporting layer and the electron transporting layer. In the solar cell of the present embodiment, differentiation between the upperward side and the downward side is not particularly important. However, if needed for descriptive purposes, the first electrode 11 side is defined as an "upper" or "top" side, while the second electrode 12 side is defined as a "down" or "bottom" side.

The microphase separation structure means one having a phase separation structure in which a domain size of each phase formed of the electron donating phase or the electron accepting phase is about several nanometers to several hundred nanometers (generally about 1 to 500 nm), and the domain size can be measured using an electron microscope, a scanning probe microscope or the like. Furthermore, in the thin film formed of the p-type-and-n-type linked organic semiconductor polymer according to the present invention, the domain size in the microphase separation structure is within 10 times as long as the exciton diffusion length, preferably within 5 times, and further preferably within 1 time (the same length). In addition, the exciton diffusion length means a distance in which an exciton diffuses while the amount of the exciton generated by optical absorption becomes 1/e. The value can be obtained by measuring photoluminescence quenching of a polymer or an oligomer formed of each unit constituting the p-type-and-n-type linked organic semiconductor polymer, as a function of a film thickness thereof.

The measured exciton diffusion length takes a different value in the p-type semiconductor phase and the n-type semiconductor phase, and generally takes a value of about several tens of nanometers. Furthermore, it is preferred that, in a thin film formed of the block copolymer according to the present invention, the domain structure of the microphase separation structure formed in the thin film is a continuous layer or a quantum well structure. Here, the domain structure being a continuous layer means, for example, as in FIG. 2 in WO 03/075364 A1, a structure in which one of the individual domain structures formed of the p-type semiconductor phase and the n-type semiconductor phase in the p-type-and-n-type linked organic semiconductor polymer is continuously connected. Moreover, the domain structure being a quantum well structure means a state in which, for example, as in FIG. 3 in WO 03/075364 A1, each domain structure formed of the p-type semiconductor phase or the n-type semiconductor phase in the p-type-and-n-type linked organic semiconductor polymer are being in an alternately stacked structure.

(Thin Film and Photoelectric Conversion Layer)

The organic photoelectric conversion element composition according to the present invention is preferably used as a composition for forming a thin film, in particular, as a coating composition for a photoelectric conversion layer. As a method of forming such a thin film or photoelectric conversion layer, the thin film or the layer can be prepared by a vapor deposition method or a coating method using at least one solvent, and a coating method is preferred. Examples of the solvent include an aromatic hydrocarbon-based solvent such as toluene, xylene and mesitylene; an ether-based solvent such as tetrahydrofuran and 1,4-dioxane; a halogen solvent such as chloroform, dichloromethane, dichloroethane and tetrachloroethane; and an aromatic halogen solvent such as chlorobenzene and o-dichlorobenzene; and an aromatic halogen solvent is preferred. The organic photoelectric conversion element composition according to the present invention may further contain an additive such as 1,8-diiodooctane and 1,8-octanedithiol. The content of the p-type-and-n-type linked organic semiconductor polymer in a solution composition is appropriately changed depending on the polymer, and therefore the content is not particularly limited, but when a mass of the total amount of the solution composition is taken as 100, the polymer is contained preferably in an amount of 0.01 to 50% by mass, and further preferably, in an amount of 0.05 to 25% by mass.

Herein, for the purpose of promoting the phase separation of the p-type organic semiconductor region and the n-type organic semiconductor region in the p-type-and-n-type linked organic semiconductor polymer in the photoelectric conversion layer, crystallization of the organic matters contained in the photoelectric conversion layer, transparentization of the electron transporting layer, and the like, the photoelectric conversion layer and the other layers may be subjected to a heating treatment (annealing) by various methods. In the case of a dry film forming method such as deposition, for example, there is a method of adjusting the substrate temperature to 50° C. to 150° C. during film formation. In the case of a wet film forming method such as printing or coating, there is a method of adjusting the drying temperature after coating to 50° C. to 150° C. Furthermore, the photoelectric conversion layer and the other layers may also be heated to 50° C. to 150° C. in a post-process, for example, after completion of the formation of a metal negative electrode. As the phase separation is promoted, the carrier mobility increases, and high photoelectric conversion efficiency can be obtained.

(Electrode)

The photoelectric conversion element according to the present invention has at least a first electrode and a second electrode. The first electrode and the second electrode are such that any one of them serves as a positive electrode, and the other serves as a negative electrode. Furthermore, in the case of adopting a tandem configuration, a tandem configuration can be achieved by using an intermediate electrode. Meanwhile, in the present invention, the electrode through which holes flow primarily is referred to as a positive electrode, while the electrode through which electrons flow primarily is referred to as a negative electrode. Furthermore, from the aspect of function of having translucency or not, an electrode having translucency is referred to as a transparent electrode, and an electrode having no translucency is referred to as a counter electrode or a metal electrode. Usually, the positive electrode is a transparent electrode having translucency, while the negative electrode is a counter electrode or a metal electrode having no translucency. However, the negative electrode can be formed as a transparent electrode, and the positive electrode can also be formed as a counter electrode or a metal electrode. Moreover, both the first electrode and the second electrode can be formed as transparent electrodes.

(First Electrode)

The first electrode is a cathode. In the case of using it for a solar cell, it is preferably a transparent electrode transparent to light ranging from visible light to near infrared light (380 to 800 nm). As the raw material thereof, use can be made of transparent conductive metal oxides such as indium tin oxide (ITO), $SnO_2$, and ZnO; a metal nanowire; and a carbon nanotube. A mesh electrode in which a metal such as silver is formed into a mesh shape to secure transparent properties can also be used. Further, use can be made of a conductive polymer selected from the group consisting of derivatives of polypyrrole, polyaniline, polythiophene, polythienylene vinylene, polyazulene, polyisothianaphthene, polycarbazole, polyacethylene, polyphenylene, poly(phenylene vinylene), polyacene, polyphenylacetylene, polydiacetylene, and polynaphthalene. Furthermore, a plural number of these electrically conductive compounds can be combined, and the combination can be used in the positive electrode. Meanwhile, in the case where translucency is not required, the positive electrode may be formed using a metal material such as nickel, molybdenum, silver, tungsten, or gold. In the case where a transparent solar cell is to be produced, the transmittance of the positive electrode is preferably such that the average light transmittance at the thickness to be used in a solar cell (for example, a thickness of 0.2 μm) in the wavelength range of 380 nm to 800 nm is preferably 75% or more, and further preferably 85% or more.

(Second Electrode)

The second electrode of the present invention is a negative electrode, and is a metal negative electrode having a standard electrode potential of a positive value.

The negative electrode may be an independent layer made of a conductive material, and, in addition to the material which has conductivity, a resin which holds such material together can be used in combination. As a conducting material used for a negative electrode, use can be made of a metal, an alloy, an electric conductive compound, and a mixture thereof, which have a small work function (4 eV or less). Specific examples of such electrode material include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare earth metal. Among these, from the viewpoint of an electron extraction property and resistivity to oxidation, a mixture of these metals and the second metal having a larger work function than these metals is suitable. Examples of these include a magnesium/silver mixture, a magnesium/aluminum mixture, a magnesium/indium mixture, an aluminum/aluminum oxide ($Al_2O_3$) mixture, a lithium/aluminum mixture and aluminum. A negative electrode can be produced, with using these electrode materials, by forming a thin film with a method such as a vapor deposition method or a sputtering method. Moreover, the coating thickness is usually chosen from the range of 10 nm to 5 μm, preferably from the range of 50 to 200 nm.

When a metallic material is used as a conducting material of the negative electrode, the light arriving at the negative electrode side will be reflected to the first electrode side, and this light can be reused. As a result, the light is again absorbed by the photoelectric conversion layer to result in improvement of photoelectric conversion efficiency. This is desirable. Moreover, the negative electrode may be nanoparticles, nanowires, or nanostructures which are made of a metal (for example, gold, silver, copper, platinum, rhodium, ruthenium, aluminum, magnesium and indium) and carbon. When it is a dispersion of nanowires, a transparent and highly conductive negative electrode can be formed by a coating method, and it is preferable.

When the negative electrode side is made to be light transparent, it can be achieved as follows. After producing a thin film of a conductive material suitable for negative electrodes, such as aluminum, an aluminum alloy, silver or a silver compound, with a coating thickness of about 1 to 20 nm, a transparent negative electrode can be prepared by providing on the thin film with a film of a conductive light transparent material cited in the description of the above-mentioned positive electrode. Moreover, the negative electrode can be made transparent, by forming an inverted constitution, such as ITO/electron transporting layer/photoelectric conversion layer/hole transporting layer/positive electrode.

(Hole Transporting Layer)

In the present invention, it is preferable to provide a hole transporting layer between the first electrode and the photoelectric conversion layer.

Examples of the electrically conductive polymer that forms the hole transporting layer include polythiophene, polypyrrole, polyaniline, poly(phenylenevinylene), polyphenylene, polyacetylene, polyquinoxaline, polyoxadiazole, polybenzothiadiazole, and polymers having a plural number of these conductive skeletal structures.

Among these, polythiophene and derivatives thereof are preferred, and polyethylenedioxythiophene and polythienothiophene are particularly preferred. These polythiophenes are usually partially oxidized in order to obtain electrical conductivity. The electrical conductivity of the conductive polymer can be regulated by the degree of partial oxidation (doping amount), and as the doping amount increases, the electrical conductivity increases. Since polythiophene becomes cationic as a result of partial oxidation, a counter anion for neutralizing the electrical charge is required. Examples of such a polythiophene include polyethylenedioxythiophene having polystyrene sulfonic acid as a counter ion (PEDOT-PSS), and polyethylenedioxythiophene having p-toluenesulfonic acid as a counter anion (PEDOT-TsO).

(Electron Transporting Layer)

In the present invention, it is preferable to provide an electron transporting layer between the second electrode and the photoelectric conversion layer, and it is particularly preferable to provide a hole transporting layer between the first electrode and the photoelectric conversion layer and to provide an electron transporting layer between the photoelectric conversion layer and the second electrode.

Examples of the electron transporting material that can be used in the electron transporting layer include the conventional n-type semiconductor compounds described above, and the materials described as electron-transporting and hole-blocking materials in Chemical Review, Vol. 107, pp. 953-1010 (2007). In the present invention, it is preferable to use an inorganic salt or an inorganic oxide. Preferred examples of the inorganic salt include alkali metal compounds such as lithium fluoride, sodium fluoride, and cesium fluoride. Various metal oxides are preferably used as materials for electron transporting layer having high stability, examples thereof include lithium oxide, magnesium oxide, aluminum oxide, calcium oxide, titanium oxide, zinc oxide, strontium oxide, niobium oxide, ruthenium oxide, indium oxide, zinc oxide, and barium oxide. Among these, relatively stable aluminum oxide, titanium oxide, and zinc oxide are more preferred. The film thickness of the electron transporting layer is 0.1 nm to 500 nm, and preferably 0.5 nm to 300 nm. The electron transporting layer can be suitably formed by any of a wet film forming method based on coating or the like, a dry film forming method according to a PVD method such as deposition or sputtering, a transfer method, a printing method, and the like.

Meanwhile, the electron transporting layer that has a HOMO energy level deeper than the HOMO energy level of the p-type semiconductor compound used in the photoelectric conversion layer, i.e. a p-type organic semiconductor part of the p-type-and-n-type linked organic semiconductor polymer or of the organic semiconductor polymer in the present invention, is imparted with a hole blocking function of having a rectification effect in which holes produced in the photoelectric conversion layer are not passed to the negative electrode side. More preferably, the material having the HOMO energy level deeper than the HOMO energy level of the n-type semiconductor compound, i.e. an n-type semiconductor part of the p-type-and-n-type linked organic semiconductor polymer in the present invention, is used as the electron transporting layer. Further, in view of the characteristics of transporting electrons, it is preferable to use a compound having high electron mobility. Such an electron transporting layer is also called a hole blocking layer, and it is preferable to use an electron transporting layer having such a function. As such a material, phenanthrene-based compounds such as bathocuproine; n-type semiconductor compounds such as naphthalenetetracarboxylic acid anhydride, naphthalenetetracarboxylic acid diimide, perylenetetracarboxylic acid anhydride, and perylenetetracarboxylic acid diimide; n-type inorganic oxides such as titanium oxide, zinc oxide, and gallium oxide; and alkali metal compounds such as lithium fluoride, sodium fluoride, and cesium fluoride, can be used. Furthermore, a layer formed from the above-mentioned ordinary n-type semiconductor compound alone can also be used.

(Substrate)

The substrate that constitutes the photovoltaic cell of the present invention is not particularly limited as long as at least a first electrode (positive electrode), a photoelectric conversion layer, and a second electrode (metal negative electrode), and in a more preferred embodiment, a first electrode (positive electrode), a hole transporting layer, a photoelectric conversion layer, an electron transporting layer, and a second electrode (metal negative electrode), can be formed on the substrate and retained thereon. For example, the substrate can be appropriately selected from a glass plate, a plastic film and the like according to the purpose.

Additionally, layers in common use may be adopted, and an easy adhesion layer/an undercoat layer, a functional layer, a recombination layer, another semiconductor layer, a protective layer, a gas-barrier layer, a UV absorbing layer or the like may be provided thereon.

<Applications Other than Photovoltaic Cells>

The p-type-and-n-type linked organic semiconductor polymer or compound according to the present invention can be used in an element or a system other than photovoltaic cells. For example, such a polymer can be used in suitable organic semiconductor elements such as field effect transistors, photodetectors (for example, infrared light detectors), photovoltaic detectors, image sensors (for example, RGB image sensors of cameras or medical imaging systems), light emitting diodes (LED) (for example, organic LED's or infrared or near-infrared LED's), laser elements, conversion layers (for example, layers that convert visible light emission to infrared light emission), amplifier radiators for electric communication (for example, doping agent for fibers), memory elements (for example, holographic memory elements), and electrochromic elements (for example, electrochromic displays).

EXAMPLES

The present invention will be described in more detail based on examples given below, but the invention is not meant to be limited by these.

Here, the proton nuclear magnetic resonance method is described as $^1$H-NMR, and the size exclusion chromatography as SEC. In $^1$H-NMR, measurement was carried out using tetramethylsilane (TMS) as an internal standard. Measurement by SEC was carried out using a polystyrene standard as a standard material. Ultra-violet and visible absorption spectrum was measured using chloroform as a measurement solvent.

Example 1

Synthesis of p-Type-and-n-Type Linked Organic Semiconductor Polymer (1-9)

According to the following reaction scheme, organic semiconductor polymer (1-6) and fullerene (1-8) were synthesized.

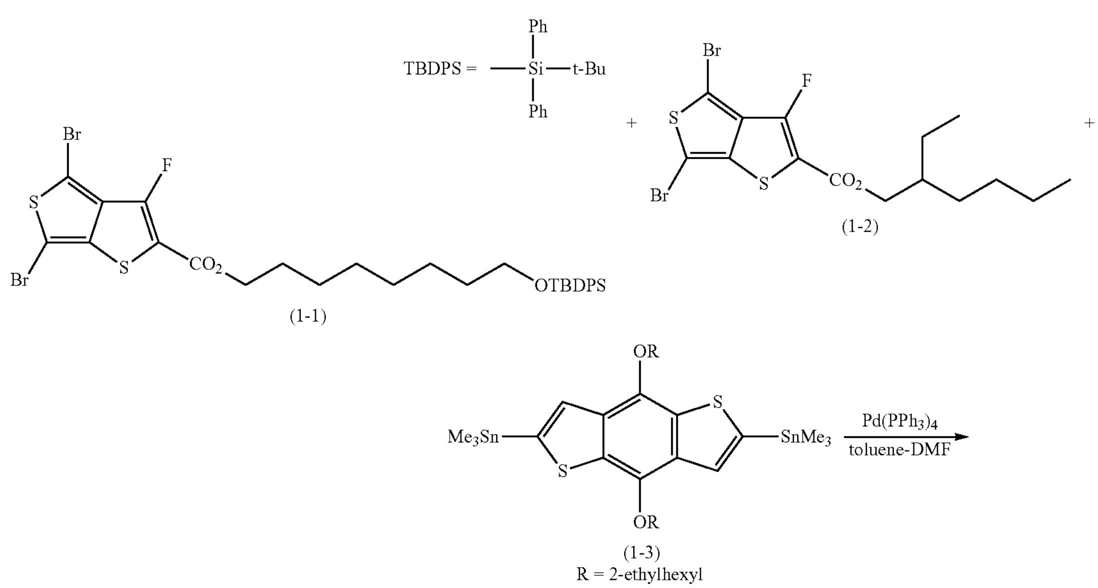

-continued
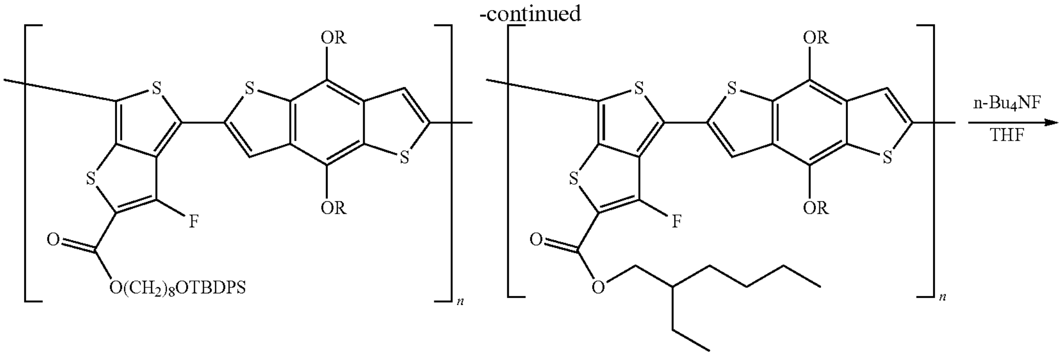
(1-4)
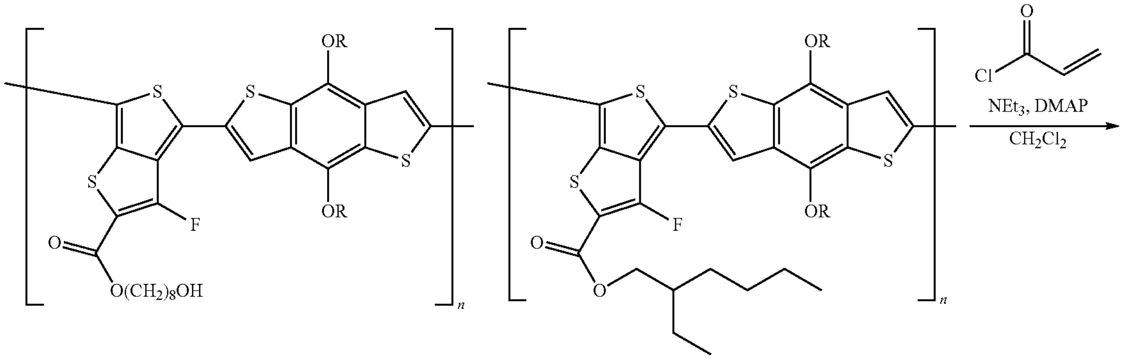
(1-5)
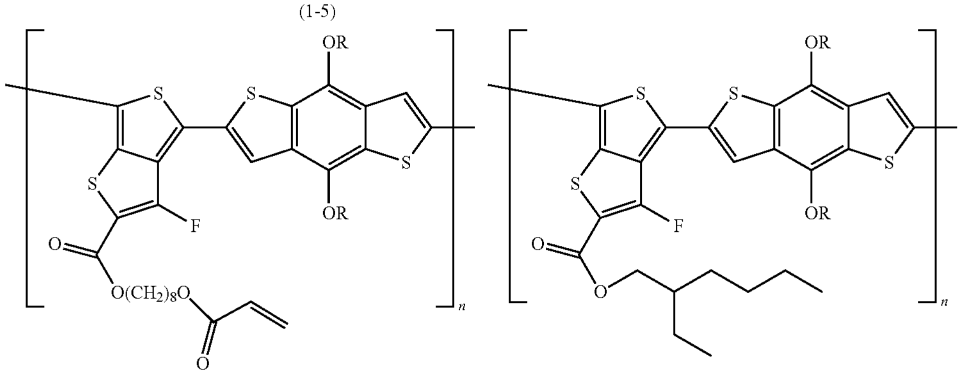
(1-6)
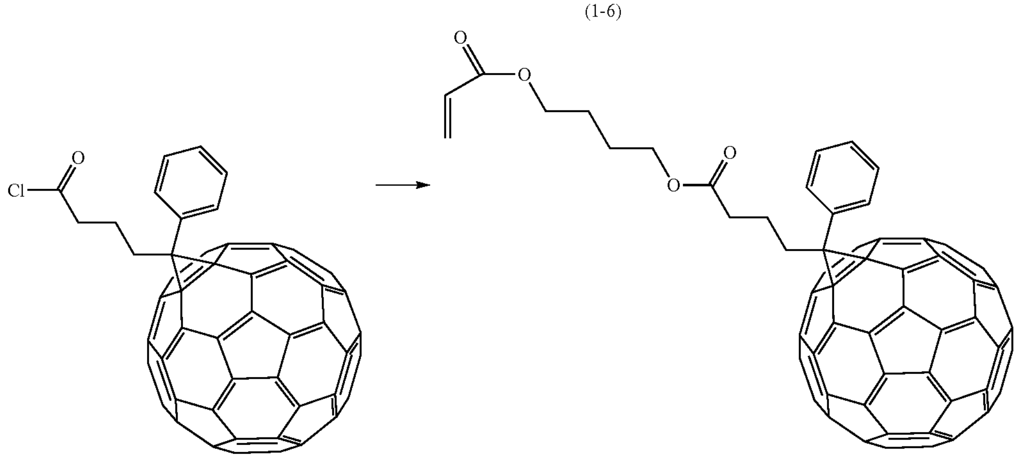
(1-7) (1-8)
1) Synthesis of Polymer (1-4)
Into a 25 mL flask equipped with a cooling tube, 105 mg (0.139 mmol) of compound (1-1), 65.5 mg (0.139 mmol) of compound (1-2), 214 mg (0.277 mmol) of compound (1-3), and 13.9 mg of tetrakis(triphenylphosphine)palladium were taken, and the atmosphere was replaced by argon. Then, 4.5 mL of toluene (dehydrated) and 1.1 mL of N,N-dimethylformamide (dehydrated) were added thereto, and the resultant mixture was allowed to react at 120° C. for 12 hours. After being allowed to cool, the resultant reaction liquid was poured into 500 mL of methanol, and the resultant mixture was stirred for 30 minutes. The solid was separated by filtration, dried under reduced pressure, then, dissolved into 20 mL of chloroform, and subjected to Celite filtration. The resultant filtrate was concentrated, dissolved into 20 mL of chloroform, and then added to 500 mL of methanol to perform crystallization. After separation by filtration, the resultant residue was dried under reduced pressure, to obtain 200 mg of polymer (1-4) (yield 81.6%).

Mw of polymer (1-4) obtained by SEC (solvent: tetrahydrofuran) was $8.1\times10^4$, and Mn was $4.5\times10^4$.

Polymer (1-4): $^1$H-NMR ($CDCl_3$); δ [ppm]=0.80-2.20 (96H), 3.60-4.70 (14H), 7.20-7.90 (14H). λmax=670 nm, Tg>300° C. (decomposed)

2) Synthesis of Polymer (1-5)

Into a three-necked flask, 450 mg of polymer (1-4) was taken, and dissolved into 200 mL of tetrahydrofuran (dehydrated). After ice-cooling, 6.10 g (102 mmol) of acetic acid, and 51 mL (51 mmol) of 1 mol/L tetrabuthylammonium fluoride (tetrahydrofuran solution) was added thereto, and the resultant mixture was stirred at room temperature for 20 hours. The resultant reaction liquid was poured into 1.5 L of water, and the resultant mixture was stirred for 30 minutes, and then separated by filtration. The resultant separated material was washed with methanol, and then dried under reduced pressure. The resultant solid was purified by silica gel column chromatography, and then crystallized in chloroform-methanol, to obtain 380 mg of polymer (1-5) (yield 97.4%).

Mw of polymer (1-5) obtained was $7.8\times10^4$, and Mn was $4.2\times10^4$.

Polymer (1-5): $^1$H-NMR ($CDCl_3$); δ [ppm]=0.80-2.20 (87H), 3.60-4.70 (14H), 7.20-7.90 (4H). λmax=670 nm, Tg>300° C. (decomposed)

3) Synthesis of Polymer (1-6)

Into a three-necked flask, 50 mg of polymer (1-5) was taken and dissolved into 10 mL of dichloromethane. Then, 10 mg of nitrobenzene and 496 mg (4.91 mmol) of triethylamine were added thereto. Under ice-cooling, 296 mg (3.27 mmol) of acrylic acid chloride was added thereto, and the resultant mixture was stirred at room temperature for 8 hours. The resultant reaction liquid was poured into 500 mL of acetonitrile, and the resultant mixture was stirred for 30 minutes, and then subjected to separation by filtration. The resultant solid was purified by silica gel column chromatography, and then crystallized in chloroform-methanol, to obtain 30 mg of polymer (1-6) (yield 58.0%).

Mw of the polymer (1-6) obtained was $7.9\times10^4$, and Mn was $4.3\times10^4$.

Polymer (1-6): $^1$H-NMR ($CDCl_3$); δ [ppm]=0.80-2.20 (87H), 3.60-4.70 (14H), 5.75-5.90 (1H), 6.05-6.30 (1H), 6.30-6.52 (1H), 7.20-7.90 (4H). λmax=670 nm, Tg>300° C. (decomposed)

4) Synthesis of Fullerene (1-8)

Into a reaction vessel made of glass, 100 mg (0.109 mmol) of fullerene (1-7) synthesized according to a method described in Adv. Mater., 20, 2211 (2008) was taken, and dissolved into 10 mL of pyridine. Under ice-cooling, 150 mg (1.04 mmol) of 4-hydroxybutyl acrylate was added thereto, and the resultant mixture was stirred at room temperature for 12 hours. The resultant reaction liquid was poured into 500 mL of acetonitrile, and the resultant mixture was stirred for 30 minutes, and then subjected to separation by filtration. The resultant solid was purified by silica gel column chromatography, to obtain 83 mg (0.0811 mmol, yield 74.4%) of (1-8).

5) Preparation of Element

On a washed and UV-ozone-treated glass-ITO substrate, PEDOT-PSS (Clevios P VP AI 4083, manufactured by H. C. Stark GmbH) to be used as a hole transporting layer was spin-coated (3,000 rpm), and dried at 140° C. for 30 minutes. A mixture of 10 mg of polymer (1-6) and 15 mg of fullerene (1-8) was dissolved into 1 mL of o-dichlorobenzene, and the resultant mixture was filtrated using a 0.45-μm filter made of polytetrafluoroethylene. The resultant filtrate was applied onto the PEDOT-PSS layer by spin coating (1,500 rpm, 120 seconds), to prepare a photoelectric conversion layer. After drying, the resultant material was irradiated with an electron beam having 100 Kgy (ultra-compact electron beam radiation system Min-EB, manufactured by Ushio, Inc.), to form a photoelectric conversion layer of polymer (1-9) in which polymer (1-6) and fullerene (1-8) were cross-linked. On the layer of polymer (1-9), an upper electrode was formed by vapor deposition of aluminum, to obtain a 2-mm square element.

(1-9)

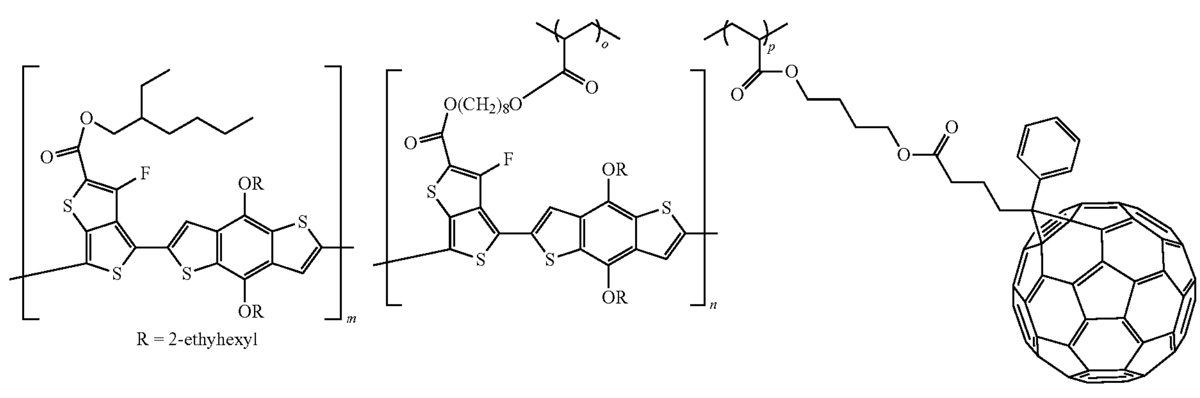

Example 2
Synthesis of p-Type-and-n-Type Linked Organic Semiconductor Polymer (2-3)
The polymer was synthesized according to the following reaction scheme.
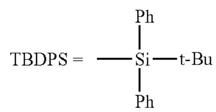
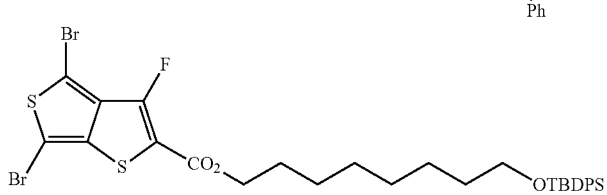
(1-1)
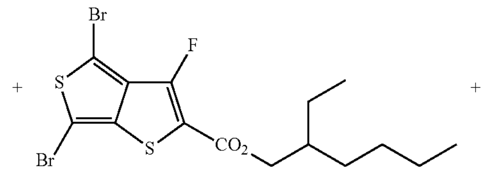
(1-2)
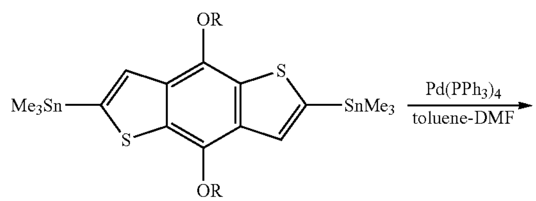
(1-3)
R = 2-ethylhexyl
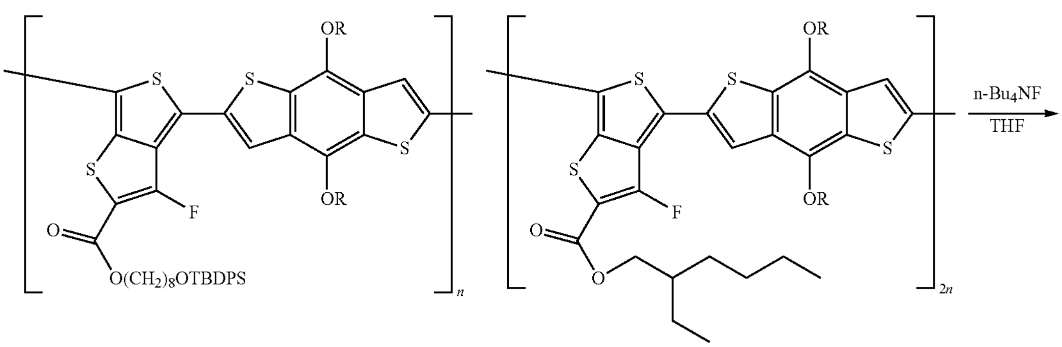
(2-1)
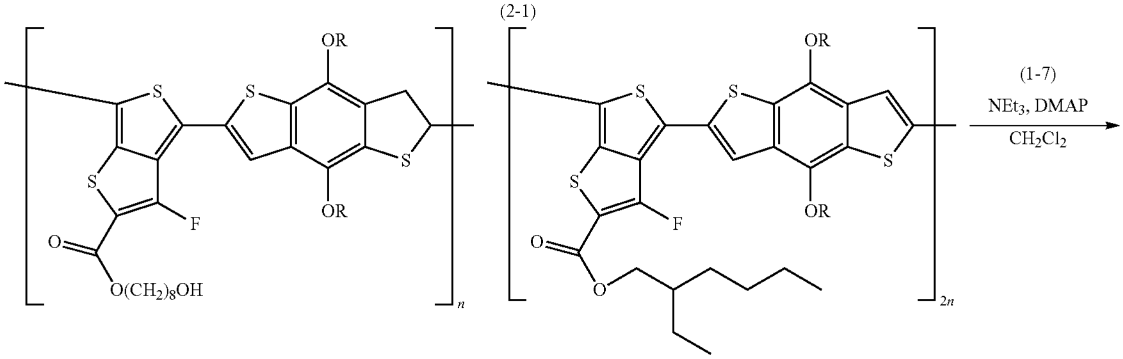
(2-2)

-continued

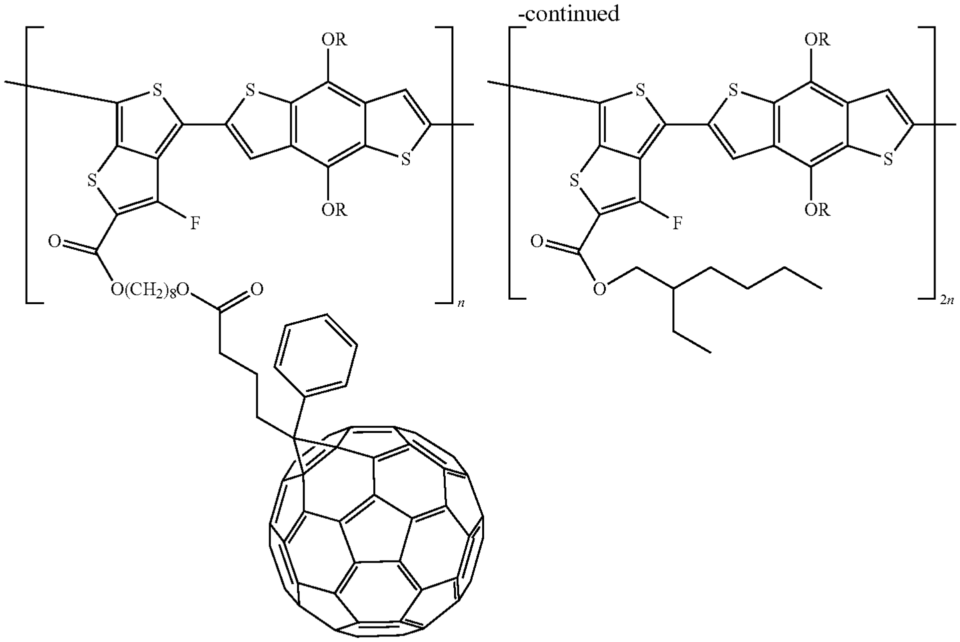

(2-3)

1) Synthesis of Polymer (2-1)

Polymer (2-1) (yield 90.1%) was obtained in the same manner as the synthesis of polymer (1-4) in Example 1, except that a mole ratio of compounds (1-1), (1-2) and (1-3) was adjusted to 1:2:3.

Polymer (2-1): Mw=$7.1\times10^4$, Mn=$3.5\times10^4$, $^1$H-NMR ($CDCl_3$); δ [ppm]=0.80-2.20 (96H), 3.60-4.70 (14H), 7.22-7.95 (14H). λmax=670 nm, Tg>300° C. (decomposed)

2) Synthesis of Polymer (2-2)

Polymer (2-2) (yield 91.0%) was obtained in the same manner as the synthesis of polymer (1-5) in Example 1, except that polymer (1-4) was changed to polymer (2-1).

Polymer (2-2): Mw=$7.0\times10^4$, Mn=$3.5\times10^4$, $^1$H-NMR ($CDCl_3$); δ [ppm]=0.80-2.20 (87H), 3.60-4.70 (14H), 7.22-7.95 (4H). λmax=670 nm, Tg>300° C. (decomposed)

3) Synthesis of Polymer (2-3)

Polymer (2-3) (yield 80.1%) was obtained in the same manner as the synthesis of polymer (1-6) in Example 1, except that acrylic acid chloride was changed to fullerene (1-7) in an amount of 1.1 mol equivalent based on the hydroxyl groups in polymer (2-2).

Polymer (2-3): Mw=$7.2\times10^4$, Mn=$3.6\times10^4$, $^1$H-NMR ($CDCl_3$); δ [ppm]=0.79-2.29 (91H), 3.62-4.70 (14H), 7.15-7.90 (9H). λmax=671 nm, Tg>300° C. (decomposed)

4) Preparation of Element

On a washed and UV-ozone-treated glass-ITO substrate, PEDOT-PSS (Clevios P VP AI 4083, manufactured by H. C. Stark GmbH) to be used as a hole transporting layer was spin-coated (3,000 rpm), and dried at 140° C. for 30 minutes. A mixture of 10 mg of polymer (2-3) and 15 mg of $PC_{61}BM$ ([60]PCBM, manufactured by Solenne BV) was dissolved into 1 mL of o-dichlorobenzene, and the resultant mixture was filtrated using a 0.45-μm filter made of polytetrafluoroethylene. The resultant filtrate was applied onto the PEDOT-PSS layer by spin coating (1,500 rpm, 120 seconds), to prepare a photoelectric conversion layer. After drying, an upper electrode was formed by vapor deposition of aluminum, to obtain a 2-mm square element.

Example 3

Synthesis of p-Type-and-n-Type Linked Organic Semiconductor Polymer (3-5)

According to the following reaction scheme, semiconductor polymer (3-3) was synthesized.

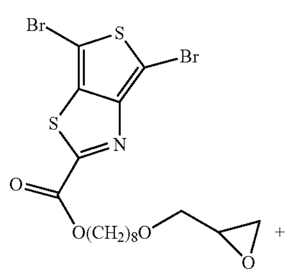

(3-1)

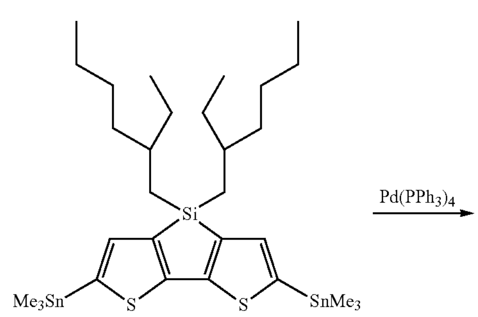

(3-2)

-continued

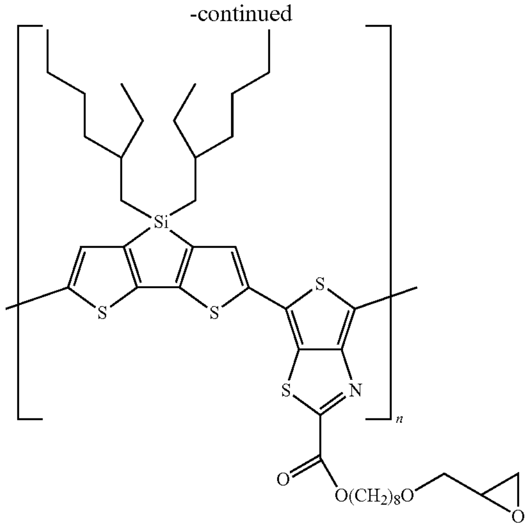

(3-4)

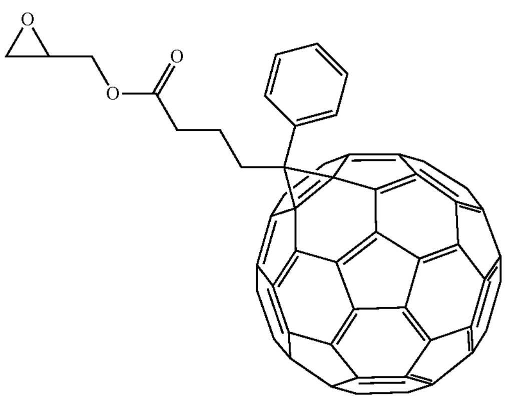

1) Synthesis of Polymer (3-3)

Polymer (3-3) (yield 87.3%) was obtained using compound (3-1) and compound (3-2) at a mole ratio of 1:1 in the same manner as polymer (1-4) in Example 1.

Polymer (3-3): Mw=6.0×$10^4$, Mn=2.5×$10^4$, $^1$H-NMR ($CDCl_3$); δ [ppm]=0.74-2.21 (46H), 3.57-4.77 (9H), 7.24-7.82 (2H). λmax=665 nm, Tg>300° C. (decomposed)

2) Preparation of Element

On a washed and UV-ozone-treated glass-ITO substrate, PEDOT-PSS (Clevios P VP AI 4083, manufactured by H. C. Stark GmbH) to be used as a hole transporting layer was spin-coated (3,000 rpm), and dried at 140° C. for 30 minutes. A mixture of 10 mg of polymer (3-3) and 15 mg of fullerene (3-4) synthesized according to a method described in Journal of Materials Chemistry, 15, 5158-5163 (2005), was dissolved into 1 mL of o-dichlorobenzene, a small amount of 4-methyl-1,2,3,6-tetrahydrophthalic anhydride was added thereto, and then the resultant mixture was filtrated using a 0.45-μm filter made of polytetrafluoroethylene. The resultant filtrate was applied onto the PEDOT-PSS layer by spin coating (1,500 rpm, 120 seconds), to prepare a photoelectric conversion layer. The layer was heated at 140° C. for 10 minutes, to form a photoelectric conversion layer of polymer (3-5) described below in which polymer (3-3) and fullerene (3-4) were cross-linked. An upper electrode was formed on the layer of polymer (3-5) by vapor deposition of aluminum, to obtain a 2-mm square element.

(3-5)

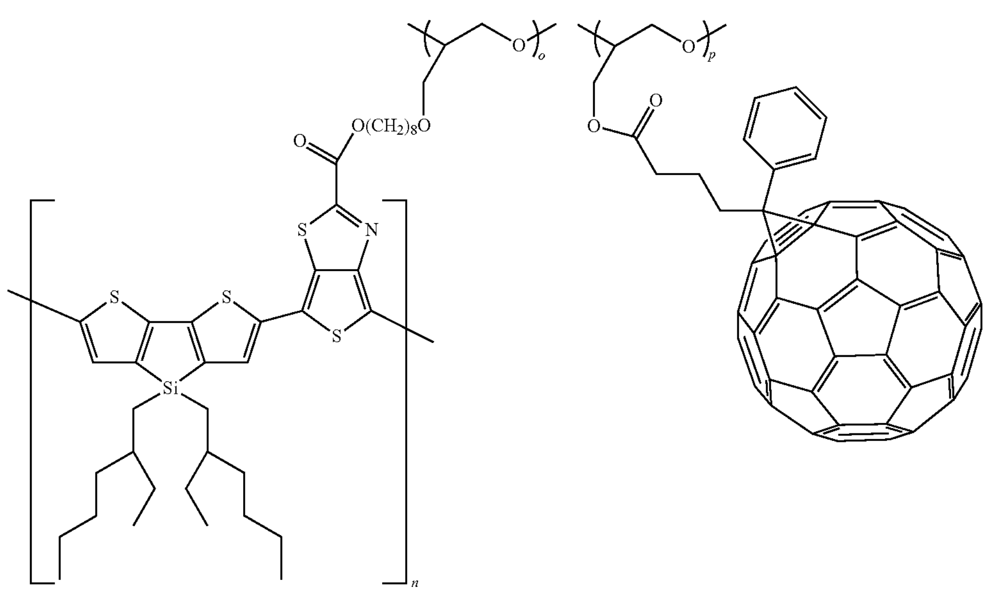

Example 4
Synthesis of p-Type-and-n-Type Linked Organic Semiconductor Polymer (4-7)
According to the following reaction scheme, semiconductor polymer (4-5) and fullerene (4-6) were synthesized.
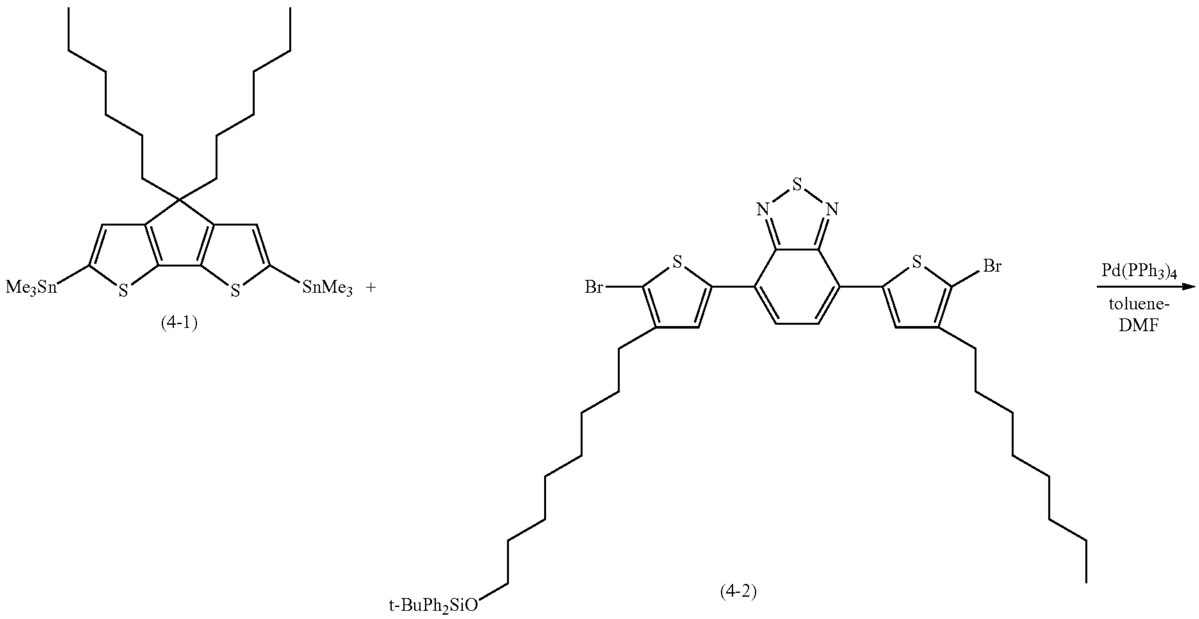
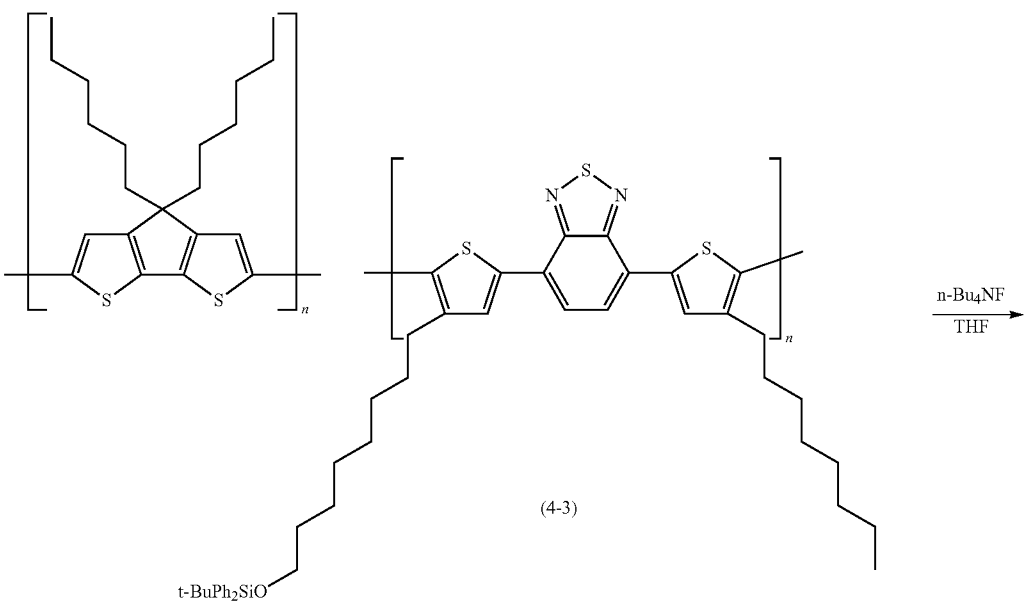

-continued
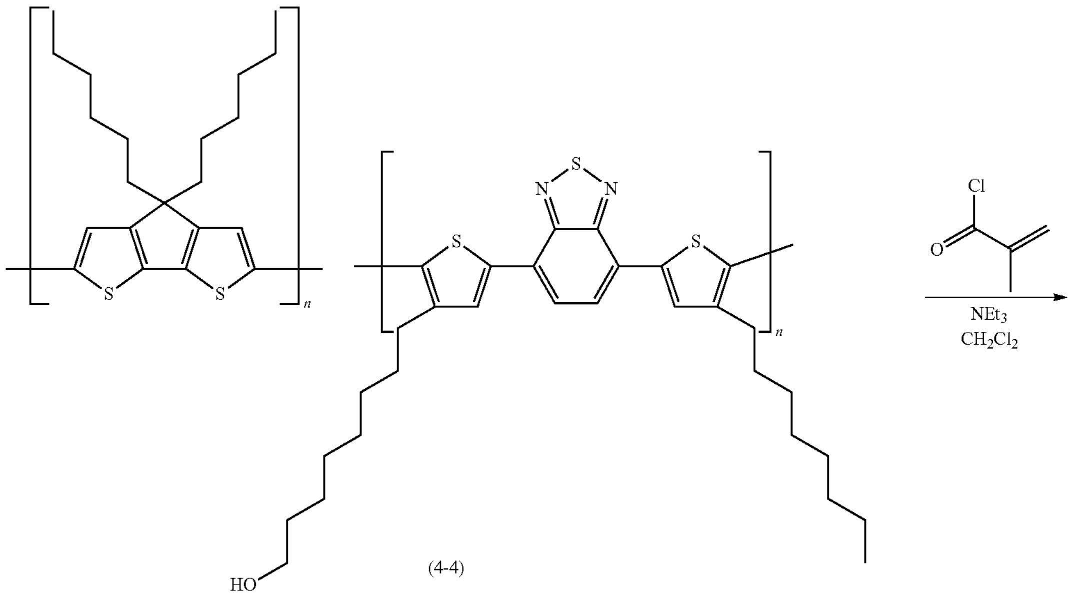
(4-4)
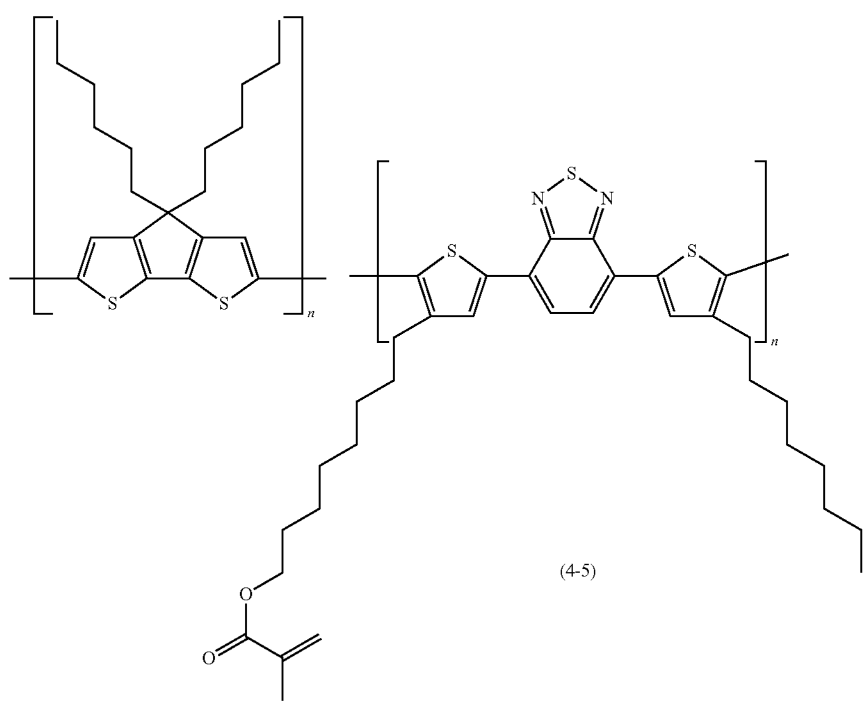
(4-5)

-continued

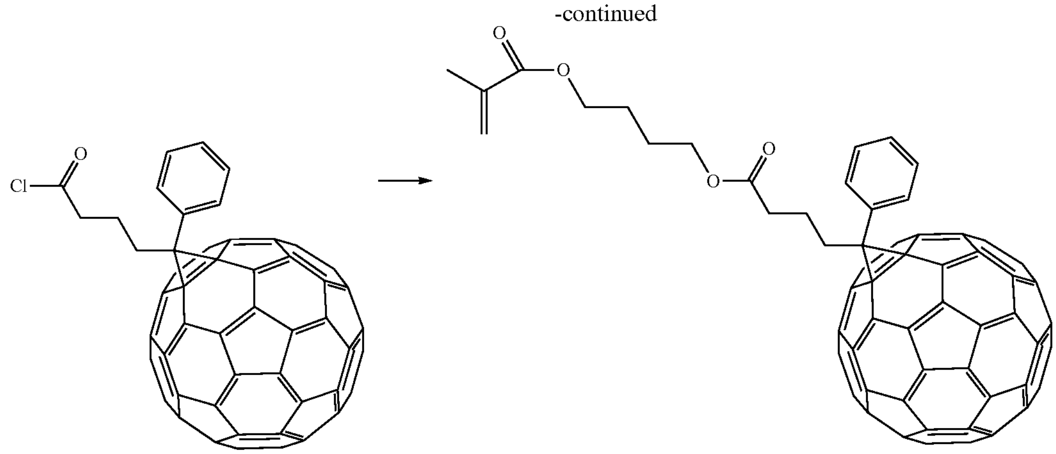

(1-7) (4-6)

1) Synthesis of Polymer (4-3)

Polymer (4-3) (yield 86.5%) was synthesized using compound (4-1) and compound (4-2) (mole ratio 1:1) in the same manner as polymer (1-4) in Example 1.

Polymer (4-3): Mw=4.1×$10^4$, Mn=1.9×$10^4$, $^1$H-NMR ($CDCl_3$); δ [ppm]=0.75-2.14 (57H), 3.79-3.93 (2H), 7.20-7.90 (16H). λmax=618 nm, Tg>300° C. (decomposed)

2) Synthesis of Polymer (4-4)

Polymer (4-4) (yield 87.9%) was obtained in the same manner as the synthesis method of polymer (1-5) in Example 1, except that polymer (1-4) was changed to polymer (4-3).

Polymer (4-4): Mw=4.0×$10^4$, Mn=1.8×$10^4$, $^1$H-NMR ($CDCl_3$); δ [ppm]=0.75-2.14 (57H), 3.79-3.93 (2H), 7.20-7.90 (6H). λmax=618 nm, Tg>300° C. (decomposed)

3) Synthesis of Polymer (4-5)

Polymer (4-5) (yield 62.3%) was obtained in the same manner as the synthesis method of polymer (1-6) in Example 1, except that polymer (1-5) was changed to polymer (4-4), and acrylic acid chloride was changed to methacrylic acid chloride.

Polymer (4-5): Mw=4.2×$10^4$, Mn=2.0×$10^4$, $^1$H-NMR ($CDCl_3$); δ [ppm]=0.75-2.14 (60H), 3.79-3.93 (2H), 5.76-5.92 (1H), 6.03-6.28 (1H), 7.20-7.90 (16H). λmax=618 nm, Tg>300° C. (decomposed)

4) Synthesis of Fullerene (4-6)

Fullerene (4-6) (yield 72.3%) was obtained in the same manner as the synthesis of fullerene (1-8) in Example 1, except that acrylic acid chloride was changed to methacrylic acid chloride.

5) Preparation of Element

A 2-mm square element having a photoelectric conversion layer of polymer (4-7) in which polymer (4-5) and fullerene (4-6) were cross-linked was obtained in the same manner as the preparation of the element in Example 1, except that polymer (1-6) was changed to polymer (4-5) and fullerene (1-8) was changed to fullerene (4-6).

(4-7)

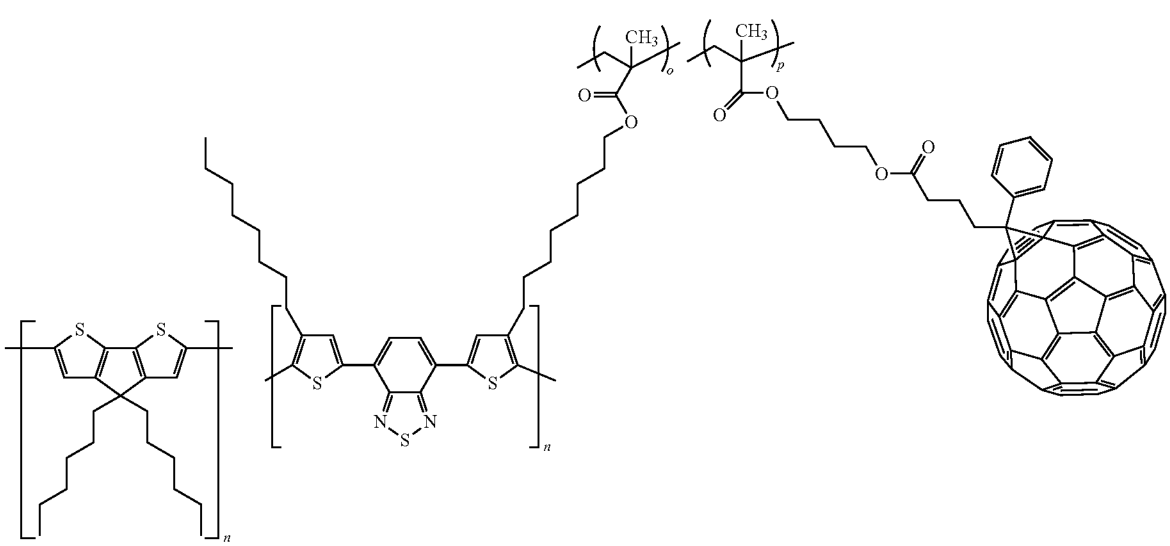

Example 5
Synthesis of p-Type-and-n-Type Linked Organic Semiconductor Polymer (5-8)
The polymer was synthesized according to the following reaction scheme.
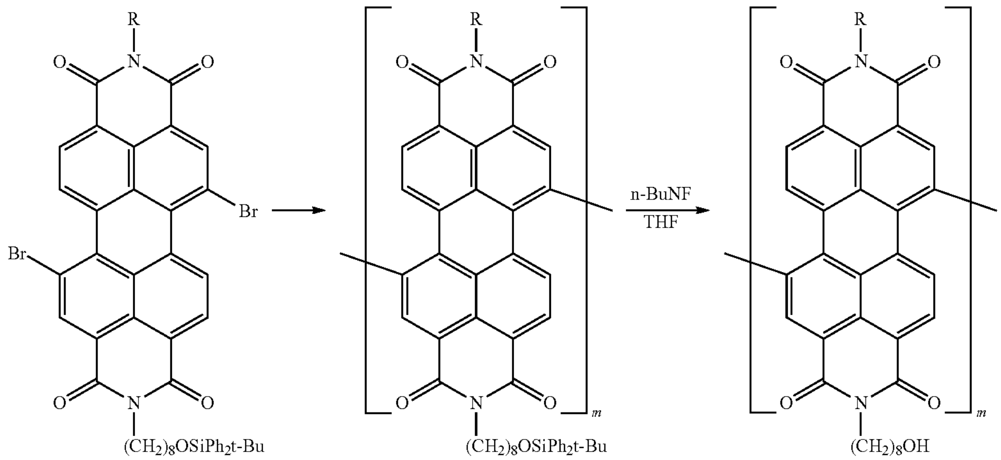
(5-1) (5-2) (5-3)
R = n-$C_8H_{17}$
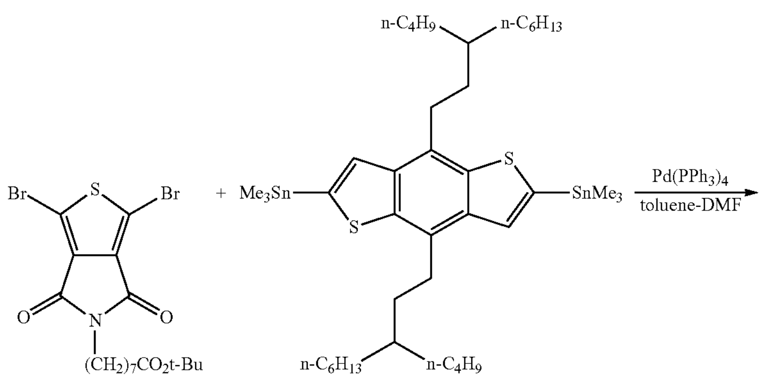
(5-4) (5-5)
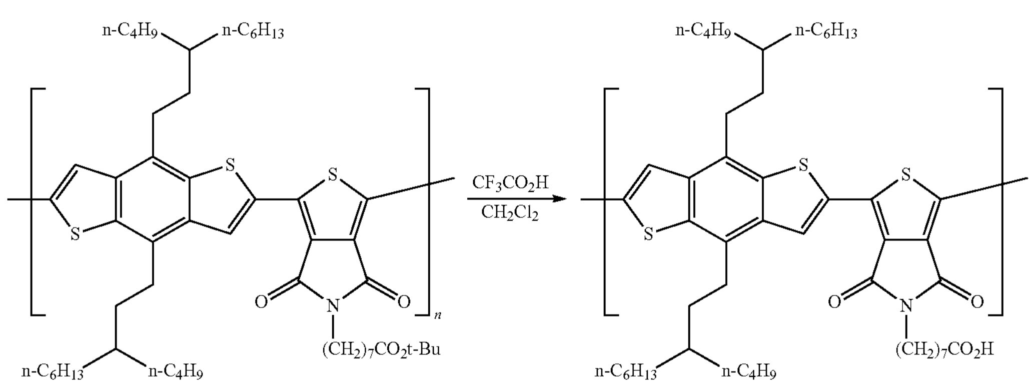
(5-6) (5-7)

-continued

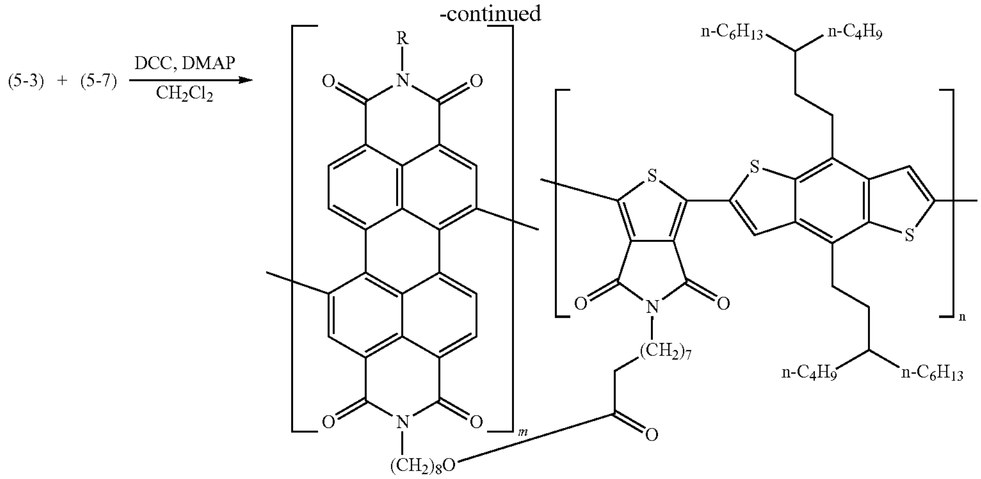

(5-8)

1) Synthesis of Polymer (5-2)

Polymer (5-2) (yield 80.8%) was obtained by polymerizing compound (5-1), according to a method described in U.S. Pat. No. 6,805,922.

Polymer (5-2): Mw=$2.1\times10^4$, Mn=$9.8\times10^3$, $^1$H-NMR ($CDCl_3$); δ [ppm]=0.80-2.18 (36H), 3.13-4.67 (6H), 7.24-8.80 (16H), λmax=543 nm, Tg>300° C. (decomposed)

2) Synthesis of Polymer (5-3)

Polymer (5-3) (yield 89.9%) was obtained in the same manner as the synthesis of polymer (1-5) in Example 1, except that polymer (1-4) was changed to polymer (5-2).

Polymer (5-3): Mw=$2.0\times10^4$, Mn=$9.8\times10^3$, $^1$H-NMR ($CDCl_3$); δ [ppm]=0.80-2.18 (27H), 3.13-4.67 (6H), 7.24-8.80 (6H), λmax=543 nm, Tg>300° C. (decomposed)

3) Synthesis of Polymer (5-6)

Polymer (5-6) (yield 87.9%) was synthesized using compound (5-4) and compound (5-6) (mole ratio 1:1), in the same manner as polymer (1-4) in Example 1.

Polymer (5-6): Mw=$5.2\times10^4$, Mn=$1.7\times10^4$, $^1$H-NMR ($CDCl_3$); δ [ppm]=0.80-2.35 (75H), 3.16-3.89 (2H), 7.31-7.80 (2H). λmax=703 nm, Tg>300° C. (decomposed)

4) Synthesis of Polymer (5-7)

100 mg of polymer (5-6) was dissolved into 100 mL of dichloromethane, and the resultant mixture was ice-cooled. Then, 10 mL of trifluoromethanesulfonic acid was added thereto, and the resultant mixture was stirred at room temperature for 3 hours. The solvent was distilled off under reduced pressure, and the resultant concentrate was suspended into hexane and separated by filtration, to obtain polymer (5-7) (yield 88.3%).

Polymer (5-7): Mw=$5.0\times10^4$, Mn=$1.3\times10^4$, $^1$H-NMR ($CDCl_3$); δ [ppm]=0.80-2.35 (66H), 3.16-3.89 (2H), 7.31-7.80 (2H). λmax=703 nm, Tg>300° C. (decomposed).

5) Synthesis of Polymer (5-8)

Into a reaction vessel made of glass, 80 mg of polymer (5-3) and 86 mg of polymer (5-7) were taken, and the atmosphere in the vessel was replaced by nitrogen. The resultant mixture was dissolved into 50 mL of chlorobenzene, 262 mg (1.27 mmol) of N,N-dicyclohexylcarbodiimide and 4.6 mg (0.038 mmol) of N,N-dimethylaminopyridine were added thereto, and the resultant mixture was allowed to react at room temperature for 24 hours. The solvent was distilled off under reduced pressure, and the resultant concentrate was purified by silica gel column chromatography, to obtain polymer (5-8) (yield 61.6%).

Polymer (5-8): Mw=$9.4\times10^4$, Mn=$2.2\times10^4$, $^1$H-NMR ($CDCl_3$); δ [ppm]=0.80-2.35 (95H), 3.14-3.90 (8H), 7.25-8.80 (8H). λmax=703 nm, Tg>300° C. (decomposed).

6) Preparation of Element

A 2-mm square element was obtained in the same manner as Example 2, except that polymer (2-3) was changed to polymer (5-8).

Example 6

Synthesis of p-Type-and-n-Type Linked Organic Semiconductor Polymer (6-11)

According to the following reaction scheme, semiconductor polymer (6-5) and compound (6-10) were synthesized.

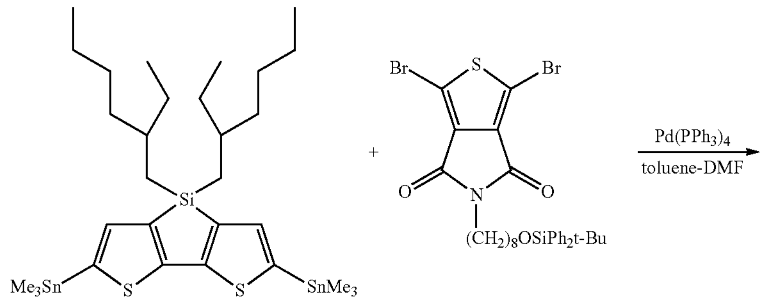
(6-1) (6-2)
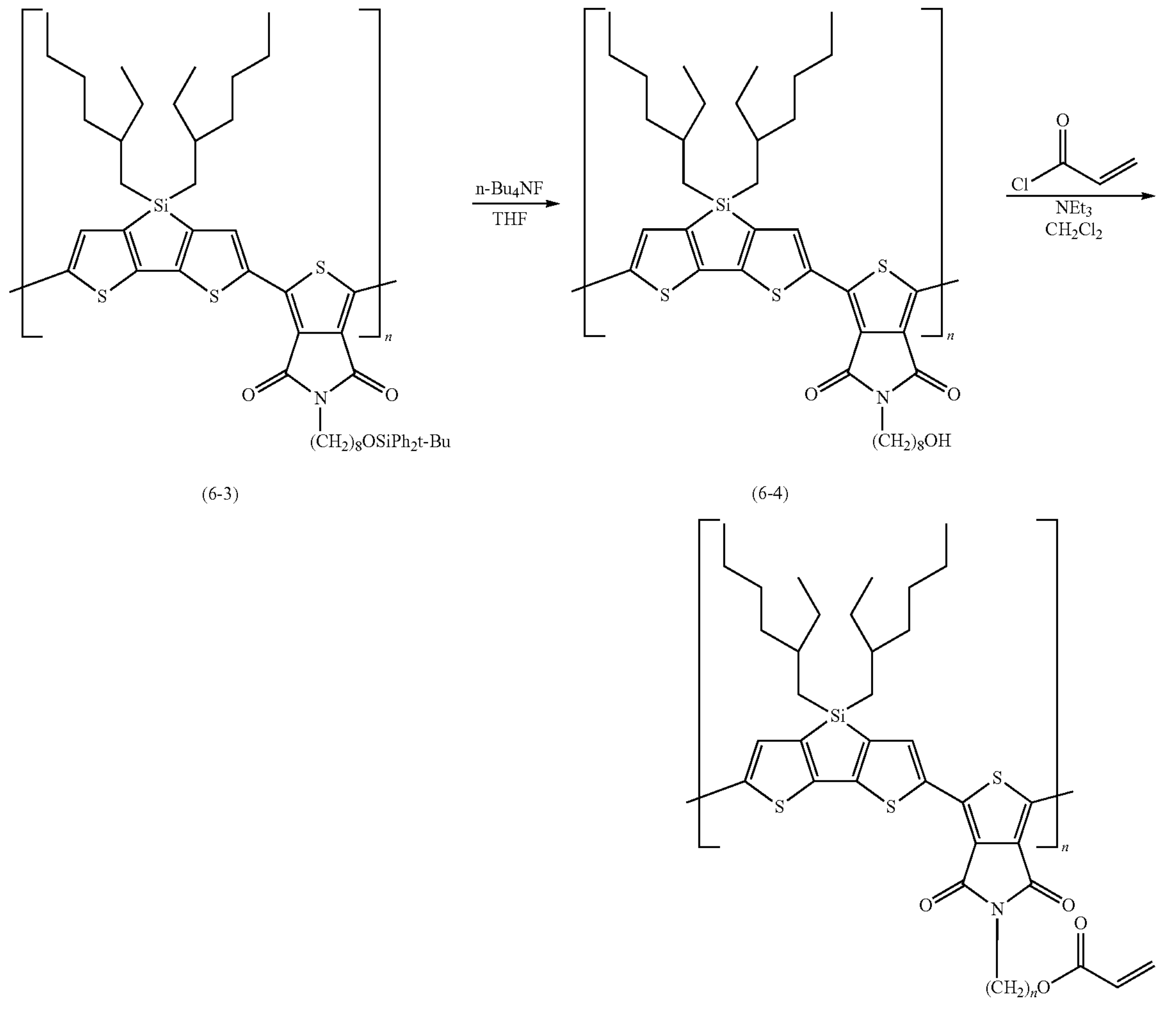
(6-3) (6-4)
(6-5)
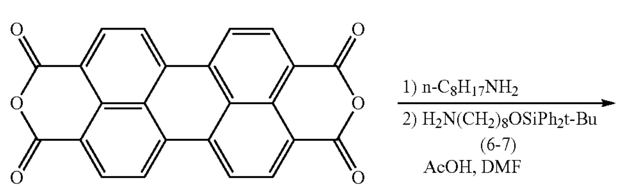
(6-6)

-continued

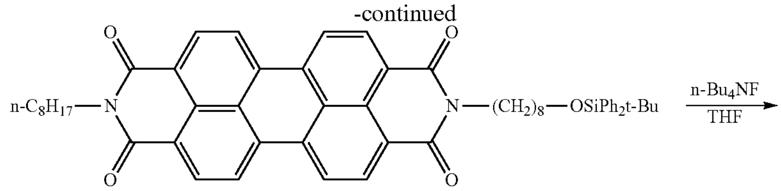

(6-8)

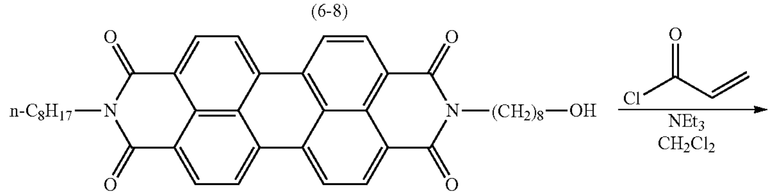

(6-9)

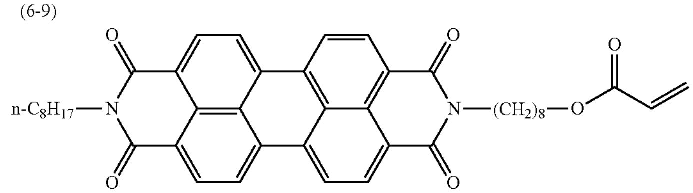

(6-10)

1) Synthesis of Polymer (6-5)

Polymer (6-5) (yield 39.8%) was synthesized from compound (6-1) and compound (6-2) (mole ratio 1.05:1) in the same manner as polymers (1-4) to (1-6) in Example 1.

Polymer (6-5): $Mw=4.7\times10^4$, $Mn=2.3\times10^4$, $^1$H-NMR ($CDCl_3$); δ [ppm]=0.77-2.22 (46H), 3.60-4.70 (4H), 5.73-5.87 (1H), 6.06-6.29 (1H), 6.31-6.50 (1H), 7.32-7.81 (2H). λmax=660 nm, Tg>300° C. (decomposed)

3) Synthesis of Compound (6-8)

Into a reaction vessel made of glass, 5 mmol of compound (6-6) and 5 mmol of n-octylamine were taken, and the atmosphere in the vessel was replaced by argon. Then, 30 mL of N,N-dimethylformamide (DMF) and 45 mmol of acetic acid were added thereto, and the resultant mixture was heated and refluxed for 18 hours. Further, 5 mmol of compound (6-7) was added thereto, and the resultant mixture was heated and refluxed for 18 hours, and then the solvent was distilled off under reduced pressure. The resultant concentrate was dissolved into ethyl acetate, and sequentially washed with 7.5 wt % sodium hydrogen carbonate water and 25 wt % brine. The resultant organic layer was dried over anhydrous sodium sulfate, and then the solvent was distilled off under reduced pressure. The resultant concentrate was purified by silica gel column chromatography, to obtain compound (6-8) (yield 47.1%).

3) Synthesis of Compound (6-10)

Compound (6-10) (yield 72.7%) was obtained using compound (6-8), in the same manner as the synthesis of polymers (1-5) to (1-6) in Example 1.

4) Preparation of Element

A 2-mm square element having a photoelectric conversion layer of polymer (6-11) in which polymer (6-5) and compound (6-10) were cross-linked was obtained in the same manner as the preparation of the element in Example 1, except that polymer (1-6) was changed to polymer (6-5), fullerene (1-8) was changed to compound (6-10), and the solvent was changed from o-dichlorobenzene to chlorobenzene.

(6-11)

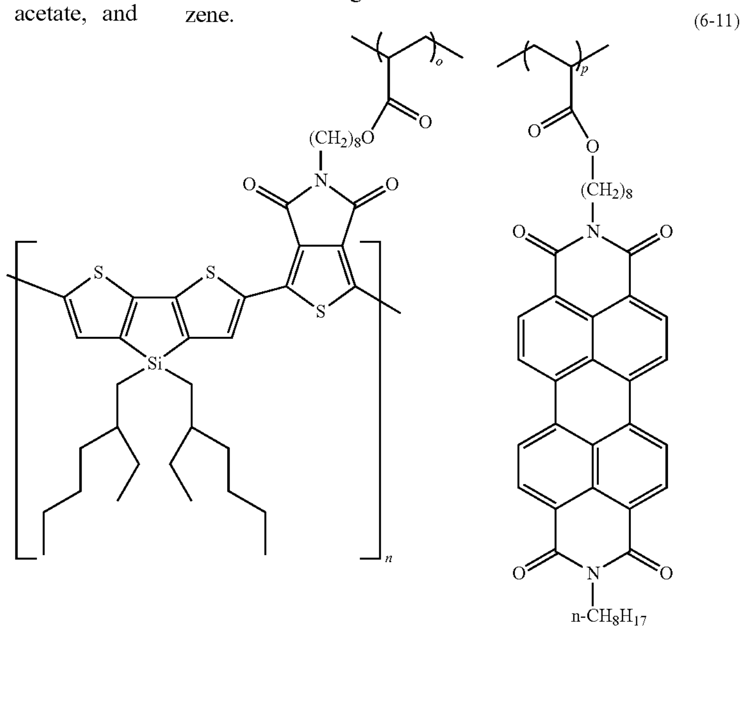

-continued
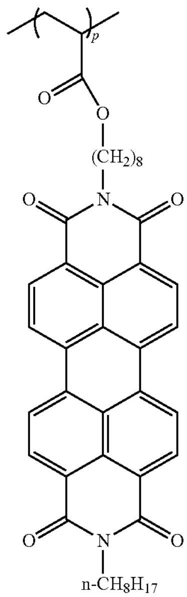
Example 7
Synthesis of p-Type-and-n-Type Linked Organic Semiconductor Polymer (7-15)
According to the following reaction scheme, compound (7-10) was synthesized.
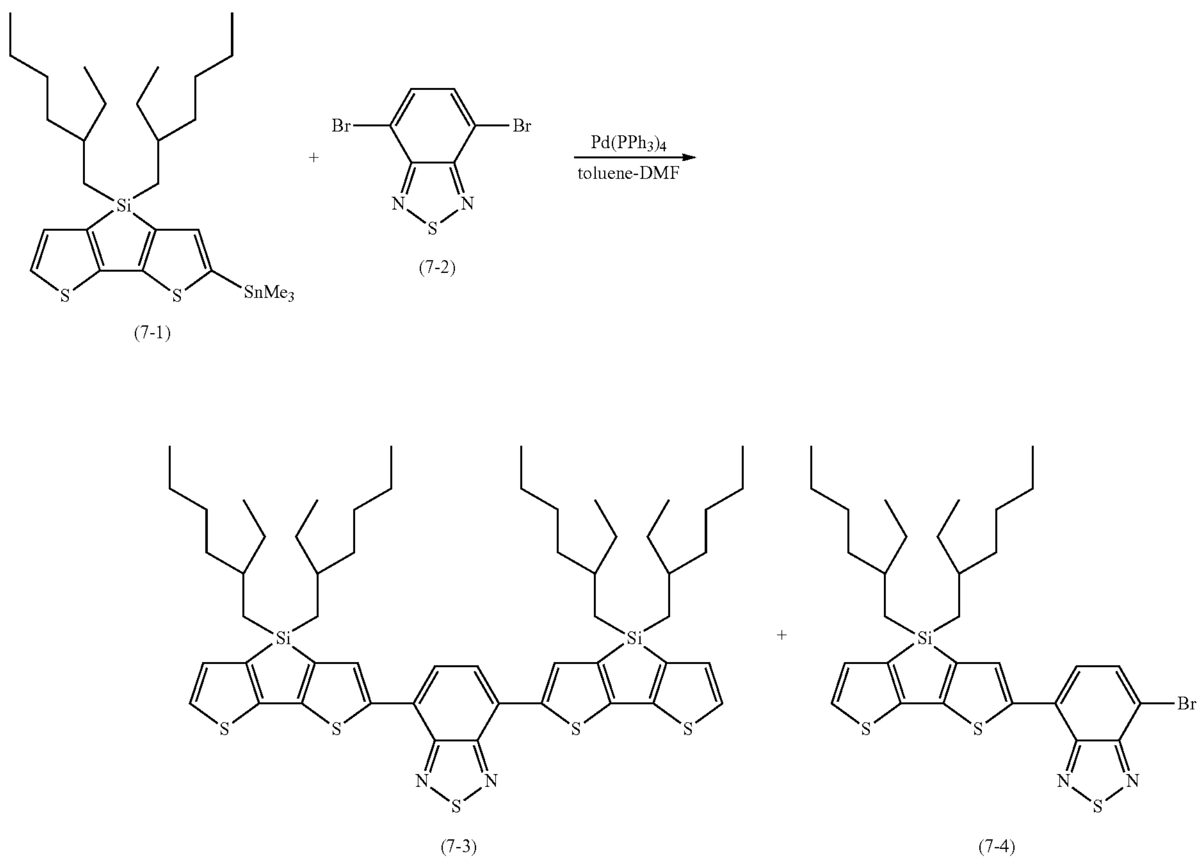

-continued
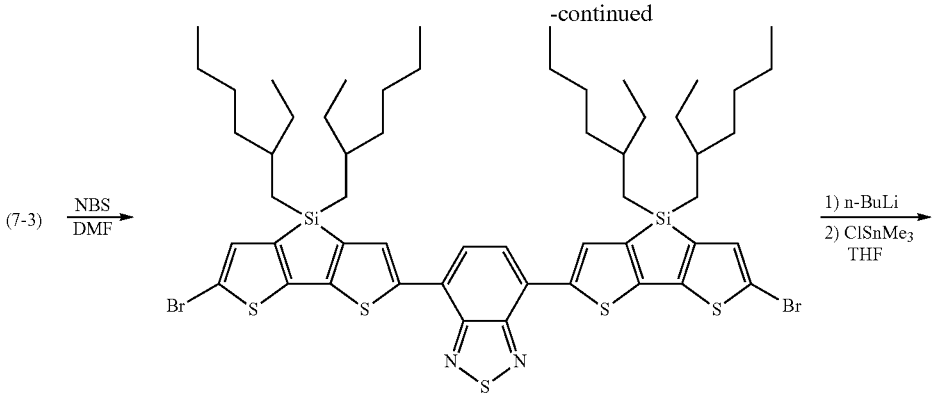
(7-5)
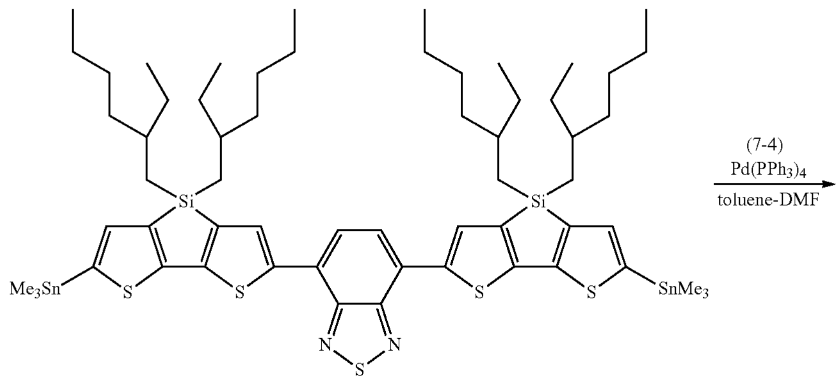
(7-6)
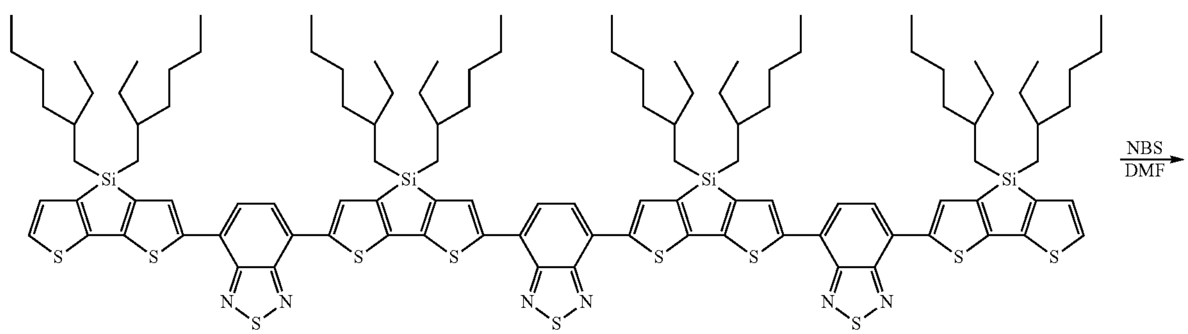
(7-7)
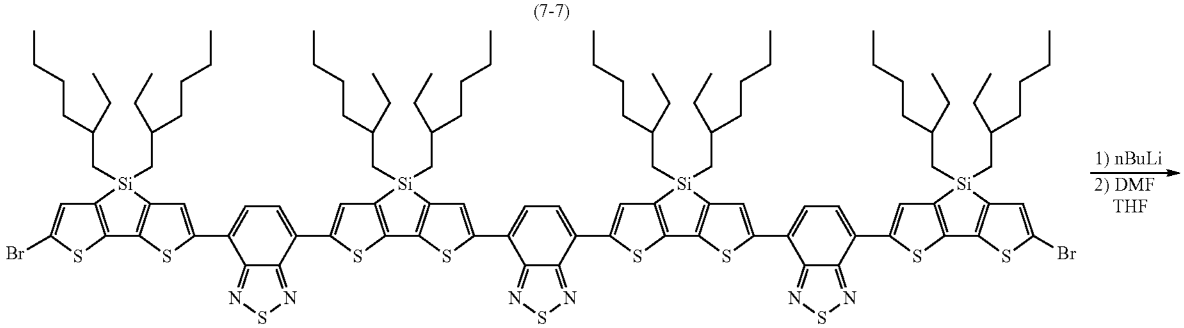
(7-8)

-continued

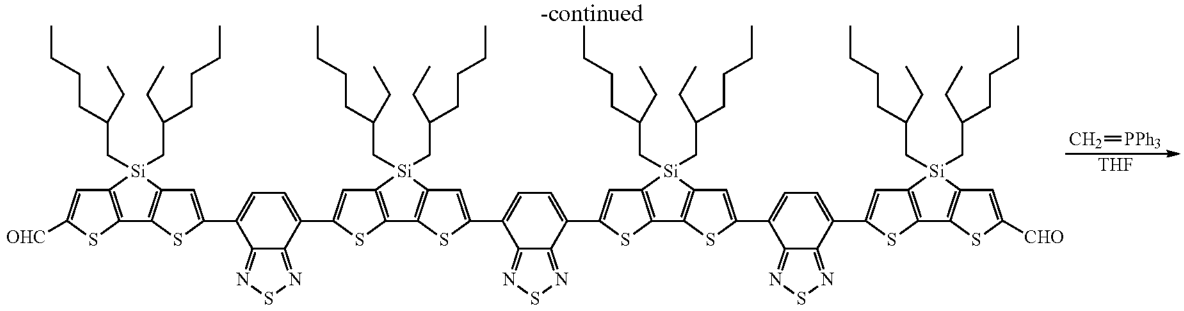

(7-9)

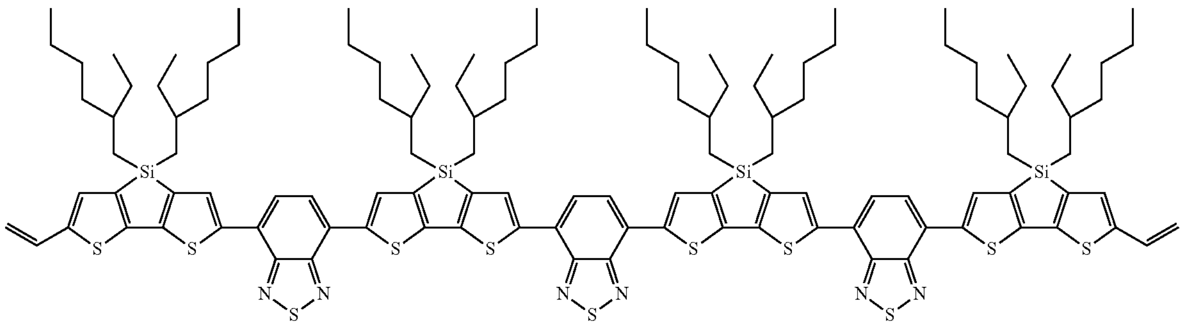

(7-10)

1) Synthesis of Compound (7-3)

Into a reaction vessel made of glass, 5.00 mmol of compound (7-1) and 2.50 mmol of compound (7-2) were taken, 2.5 mmol of tetrakis(triphenylpholphine)palladium was put therein, and the atmosphere in the vessel was replaced by argon. Then, 16 mL of toluene and 4 mL of N,N-dimethylformamide (DMF) were added thereto, and the resultant mixture was allowed to react at 120° C. for 12 hours. The resultant reaction liquid was subjected to liquid separation with toluene-water, and then the resultant organic layer was washed with 25 wt % brine and dried over anhydrous sodium sulfate. After filtration, the solvent was distilled off under reduced pressure, and the resultant concentrate was purified by silica gel column chromatography, to obtain 2.25 mmol of compound (7-3) (yield 90.0%).

2) Synthesis of Compound (7-4)

3.50 mmol of compound (7-4) (yield 70.0%) was obtained in the same manner as the synthesis of compound (7-3), except that compound (7-2) was changed to 20.0 mmol.

3) Synthesis of Compound (7-5)

Into a reaction vessel made of glass, 2.00 mmol of compound (7-3) was taken, and dissolved into 10 mL of N,N-dimethylformamide (DMF), and the resultant mixture was ice-cooled. Then, 4.20 mmol of N-bromosuccinimide dissolved in 10 mL of N,N-dimethylformamide (DMF) was added dropwise thereto at an internal temperature of 10° C. or lower, and after the dropwise addition, the resultant mixture was stirred at room temperature for 2 hours. After cooling, 60 mL of water was added thereto, and the organic matter was extracted with dichloromethane. The resultant organic layer was dried over anhydrous sodium sulfate, and then filtered, and the solvent was distilled off under reduced pressure. The resultant concentrate was purified by silica gel column chromatography, to obtain 1.96 mmol of compound (7-5) (yield 97.9%).

4) Synthesis of Compound (7-6)

Into a reaction vessel made of glass, 1.50 mmol of compound (7-5) was taken, the atmosphere in the vessel was replaced by nitrogen, and then the compound was dissolved into 50 mL of tetrahydrofuran, and the resultant mixture was cooled to −78° C. Then, 3.60 mmol of n-butyllithium was added thereto, and the resultant mixture was stirred at −78° C. for 1 hour. Then, 4.20 mmol of trimethyltin chloride was added thereto, and the resultant mixture was stirred at room temperature for 3 hours. The resultant reaction liquid was poured into hexane-water and subjected to liquid separation. The resultant organic layer was sequentially washed with 7.5 wt % sodium hydrogen carbonate water and 25 wt % brine, and the organic layer was dried over anhydrous sodium sulfate. After filtration, the solvent was distilled off under reduced pressure, to obtain 1.44 mmol of compound (7-6) (yield 96.2%).

5) Synthesis of Compound (7-7)

1.17 mmol of compound (7-7) (yield 83.2%) was obtained using 1.40 mmol of compound (7-6) and 2.80 mmol of compound (7-4) in the same manner as compound (7-3).

6) Synthesis of Compound (7-8)

Compound (7-8) (yield 94.8%) was obtained in the same manner as the synthesis of polymer (7-5), except that compound (7-3) was changed to compound (7-7).

7) Synthesis of Compound (7-9)

Compound (7-9) (yield 66.7%) was obtained in the same manner as the synthesis of compound (7-6), except that compound (7-5) was changed to compound (7-8), and trimethyltin chloride was changed to N,N-dimethylformamide (DMF), and by performing purification by silica gel column chromatography.

8) Synthesis of Compound (7-10)

Dissolution into 10 mL of tetrahydrofuran was made. Then, 3.3 mmol of potassium t-butoxide was added thereto, and the resultant mixture was stirred at room temperature for 1 hour. The resultant reaction liquid was cooled to −78° C., and then a mixture of 1.0 mmol of compound (7-9) and 10 mL of tetrahydrofuran was added dropwise thereto, and the resultant mixture was stirred at −78° C. for 1 hour, and at room temperature for 2 hours. The resultant mixture was quenched with water, and then extracted with toluene, and the resultant organic layer was washed with 25 wt % brine. The resultant organic layer was dried over anhydrous sodium sulfate, and then the solvent was distilled off under reduced pressure. The resultant concentrate was purified by silica gel column chromatography, to obtain compound (7-10) (yield 78.2%).

Compound (7-14) was synthesized according to the following reaction scheme.

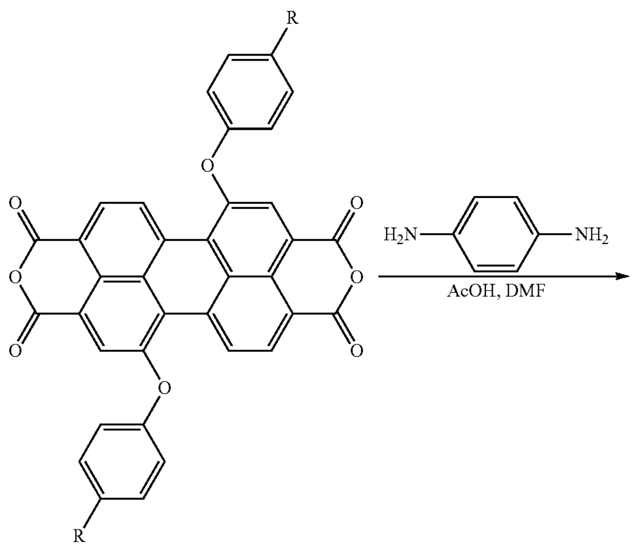

(7-11)

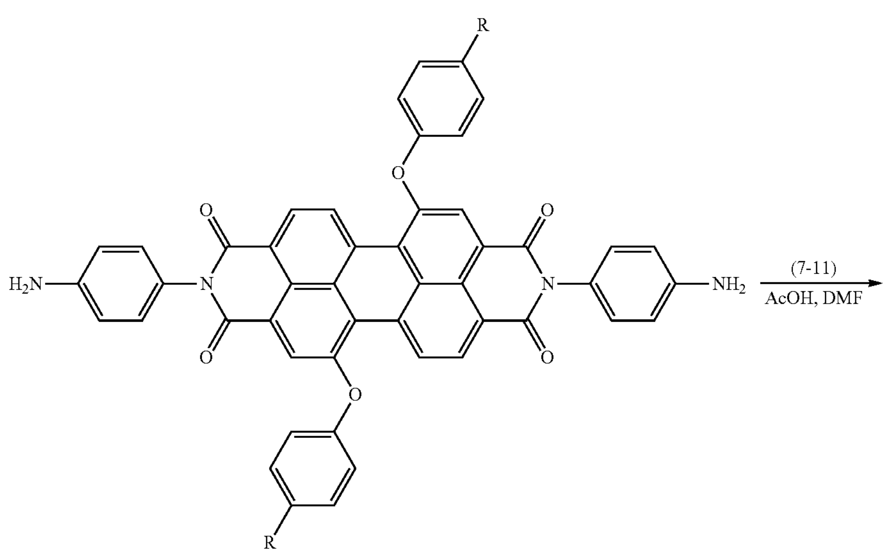

(7-12)

-continued

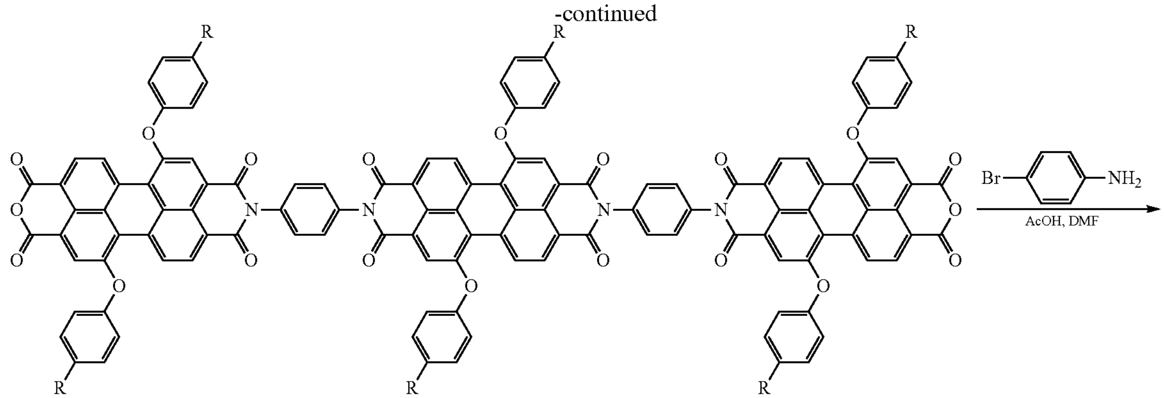

(7-13)

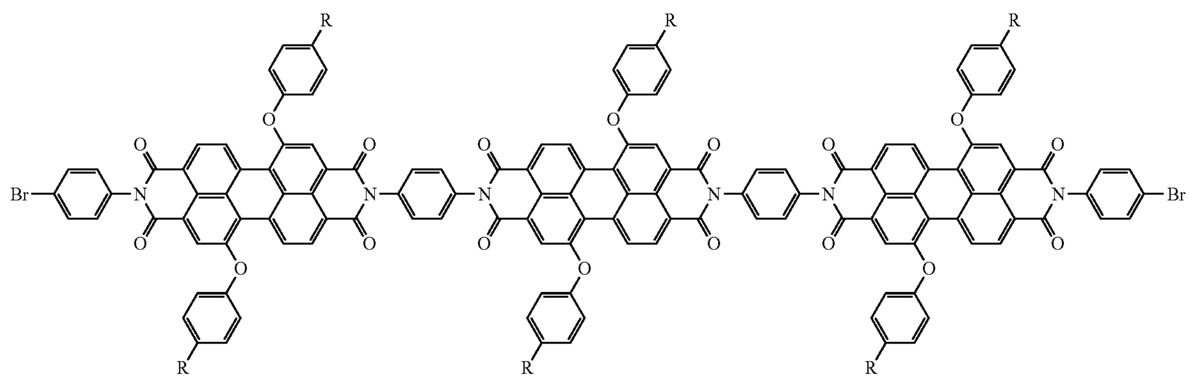

(7-14)

R = $n$-$C_6H_{17}$

9) Synthesis of Compound (7-12)

Into a reaction vessel made of glass, 2 mmol of compound (7-11) and 40 mmol of p-phenylenediamine were taken, and the atmosphere in the vessel was replaced by argon. Then, 200 mL of N,N-dimethylformamide (DMF) and 350 mmol of acetic acid were added thereto, and the resultant mixture was heated and refluxed for 18 hours. The solvent was distilled off under reduced pressure, and then the residue was dissolved into ethyl acetate, and sequentially washed with 7.5 wt % sodium hydrogen carbonate water and 25 wt % brine. The resultant organic layer was dried over anhydrous sodium sulfate, and then the solvent was distilled off under reduced pressure. The resultant concentrate was purified by silica gel column chromatography, to obtain 0.86 mmol of compound (7-12) (yield 42.8%).

9) Synthesis of Compound (7-13)

0.64 mmol of compound (7-13) (yield 63.7%) was obtained using 10.0 mmol of compound (7-11) and 1.00 mmol of compound (7-12) in the same manner as compound (7-12).

10) Synthesis of Compound (7-14)

0.78 mmol of compound (7-14) (yield 77.9%) was obtained using 1.00 mmol of compound (7-13) and 4.00 mmol of p-bromoaniline in the same manner as the synthesis of compound (7-12).

11) Synthesis of Polymer (7-15)

0.250 mmol of compound (7-10), 0.250 mmol of compound (7-14), 0.015 mmol of palladium(II) acetate, and 0.057 mmol of o-tolylphosphine were added, and the atmosphere in the vessel was replaced by argon. Then, 8 mL of N,N-dimethylformamide (DMF), 16 mL of toluene, and 6 mL of triethylamine were added thereto. After a reaction at 90° C. for 24 hours, the resultant reaction solution was poured into 500 mL of methanol, to cause crystallization. The resultant solid was separated by filtration, dissolved into chloroform, subjected to Celite filtration, and then the solvent was distilled off under reduced pressure. The resultant concentrate was purified by silica gel column chromatography, subjected to Soxhlet extraction (acetone, 10 hours), and then the extract was dried under reduced pressure, to obtain polymer (7-15) (yield 63.3%).

Polymer (7-15): $Mw=3.8\times10^4$, $Mn=1.1\times10^4$, $^1H$-NMR ($CDCl_3$); δ [ppm]=0.79-2.61 (238H), 7.22-8.89 (76H). λmax=578 nm, Tg>300° C. (decomposed)

(7-10) + (7-14) $\xrightarrow[\text{toluene-DMF, } NEt_3]{Pd(PPh_3)_4}$
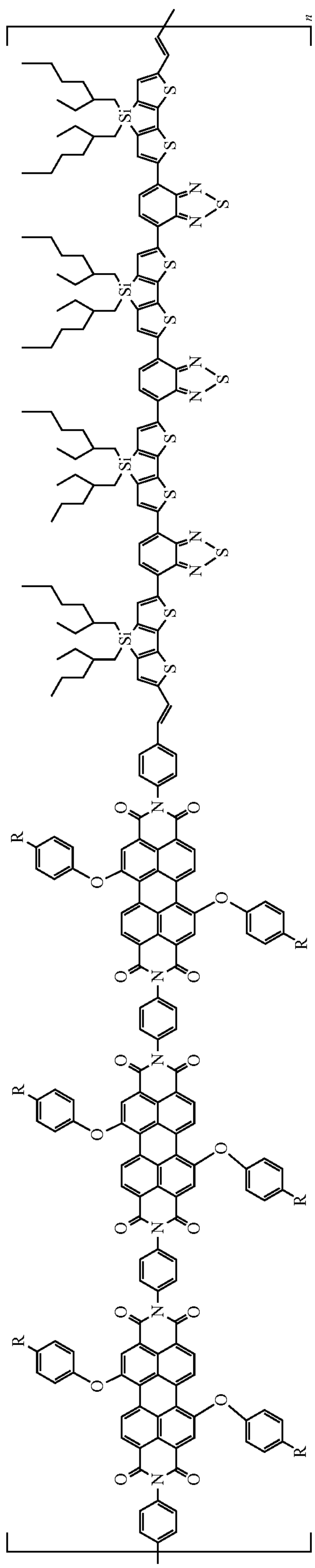
(7-15)

12) Preparation of Element
A 2-mm square element was obtained in the same manner as Example 2, except that polymer (2-3) was changed to polymer (7-15), and the solvent was changed from o-dichlorobenzene to chlorobenzene.
Example 8
Synthesis of p-Type-and-n-Type Linked Organic Semiconductor Polymer (8-7)
The polymer was synthesized according to the following reaction scheme.
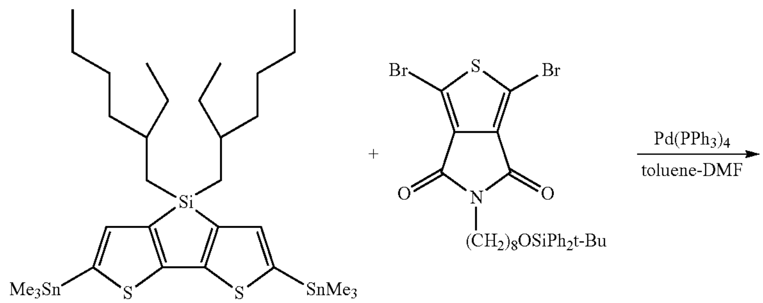
(8-1) (8-2)
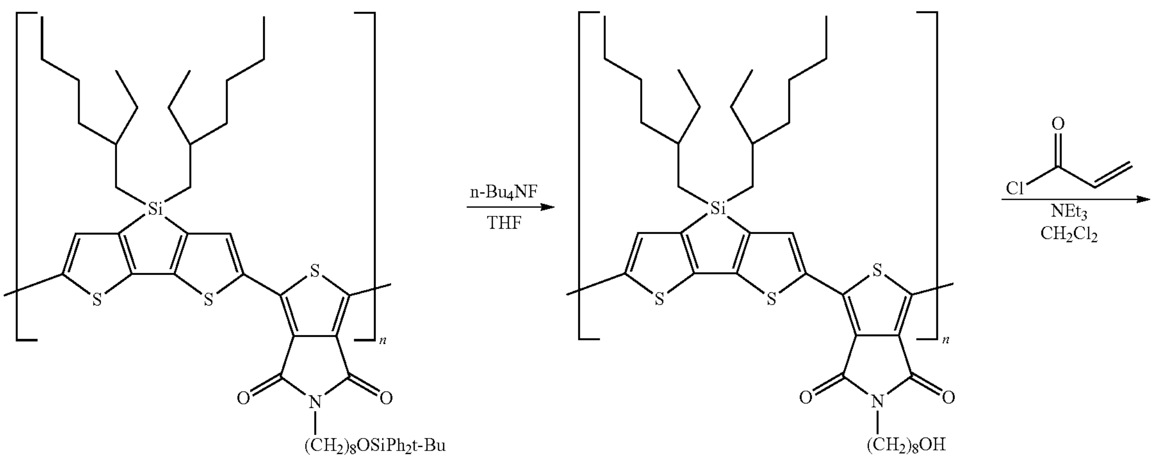
(8-3) (8-4)
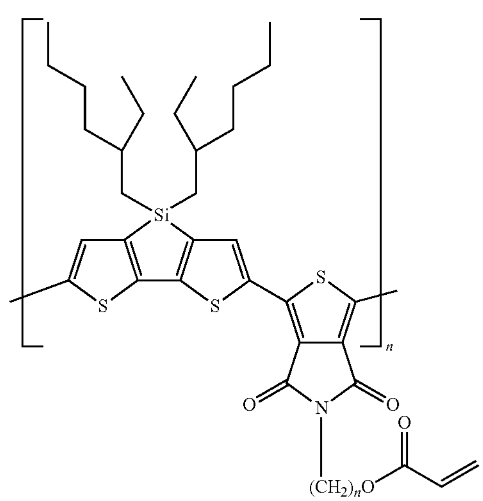
(8-5)

1) Synthesis of Polymer (8-5)
Polymer (8-5) was synthesized from compound (8-1) and compound (8-2) (mole ratio 1:1) in the same manner as polymers (1-4) to (1-6) in Example 1.
Polymer (8-5): $Mw=5.9\times10^4$, $Mn=2.7\times10^4$,
$^1$H-NMR ($CDCl_3$); δ [ppm]=0.77-2.32 (46H), 3.60-4.64 (4H), 5.73-5.91 (1H), 6.00-6.27 (1H), 6.29-6.46 (1H), 7.24-7.93 (2H). λmax=680 nm, Tg>300° C. (decomposed)
(8-6)
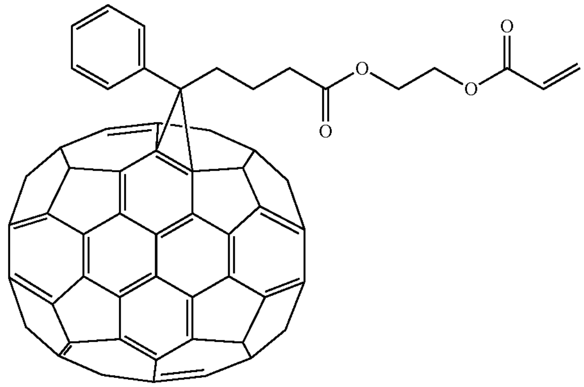
(8-7)
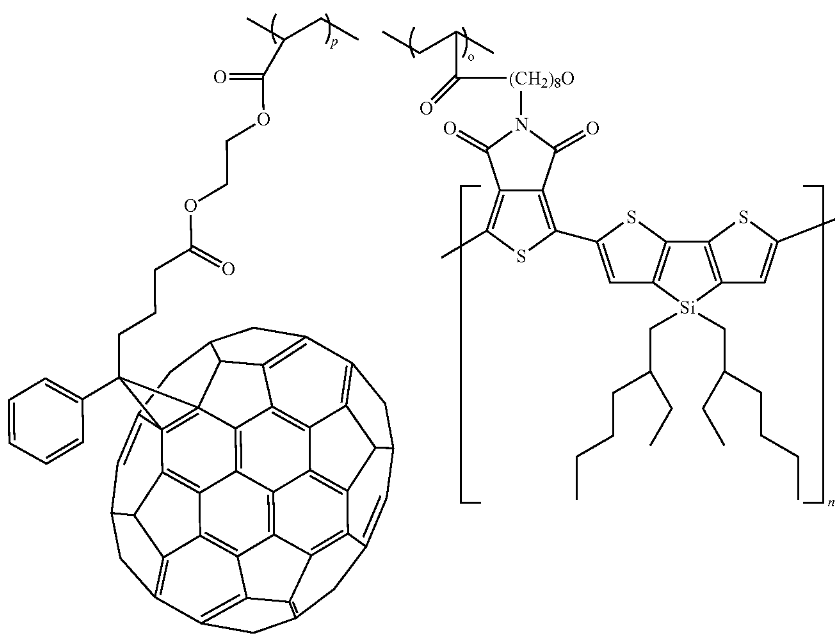

2) Preparation of Element

A 2-mm square element having a photoelectric conversion layer of polymer (8-7) in which polymer (8-5) and compound (8-6) were cross-linked was obtained in the same manner as the preparation of the element in Example 1, except that polymer (1-6) was changed to polymer (8-5), fullerene (1-8) was changed to fullerene (8-6), and the solvent was changed from o-dichlorobenzene to chlorobenzene.

Example 9

Synthesis of p-Type-and-n-Type Linked Organic Semiconductor Polymer (9-7)

The polymer was synthesized according to the following reaction scheme.

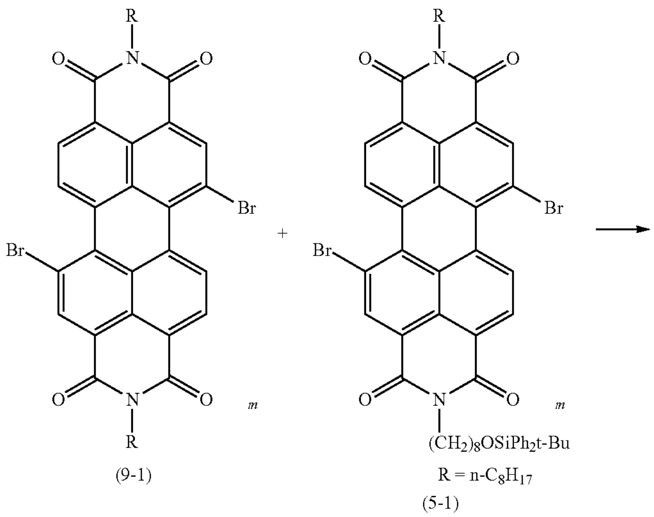

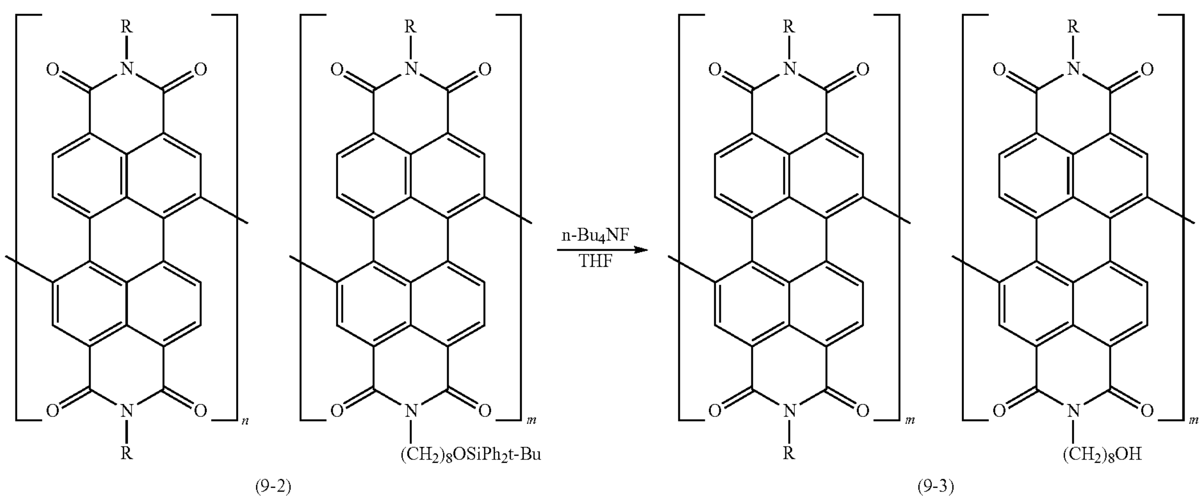

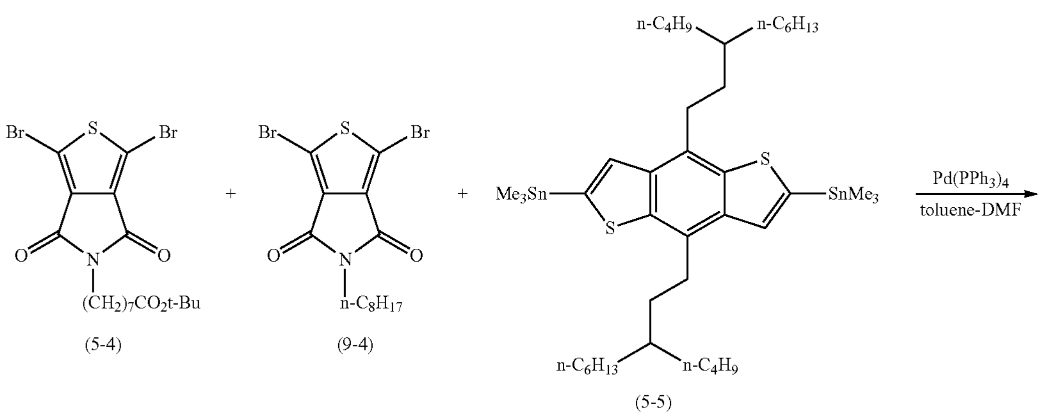

-continued

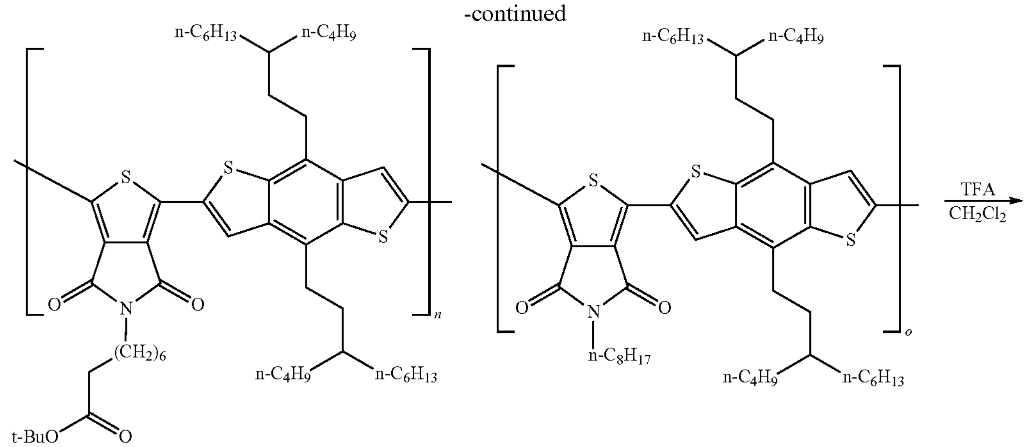

(9-5)

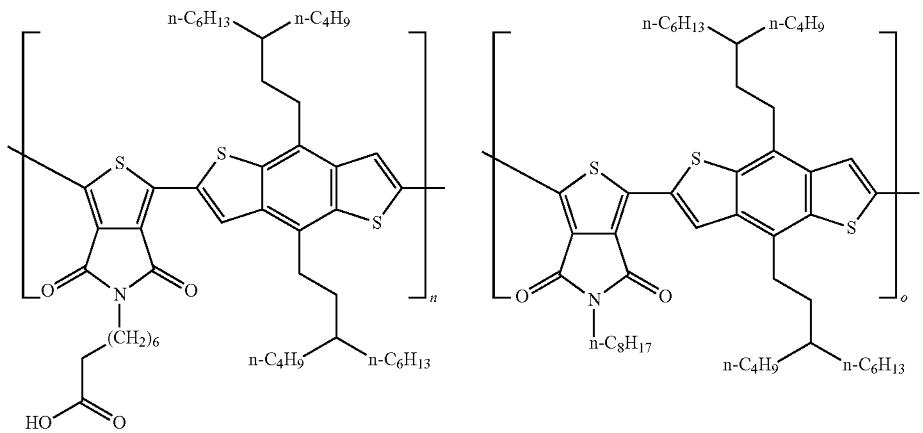

(9-6)

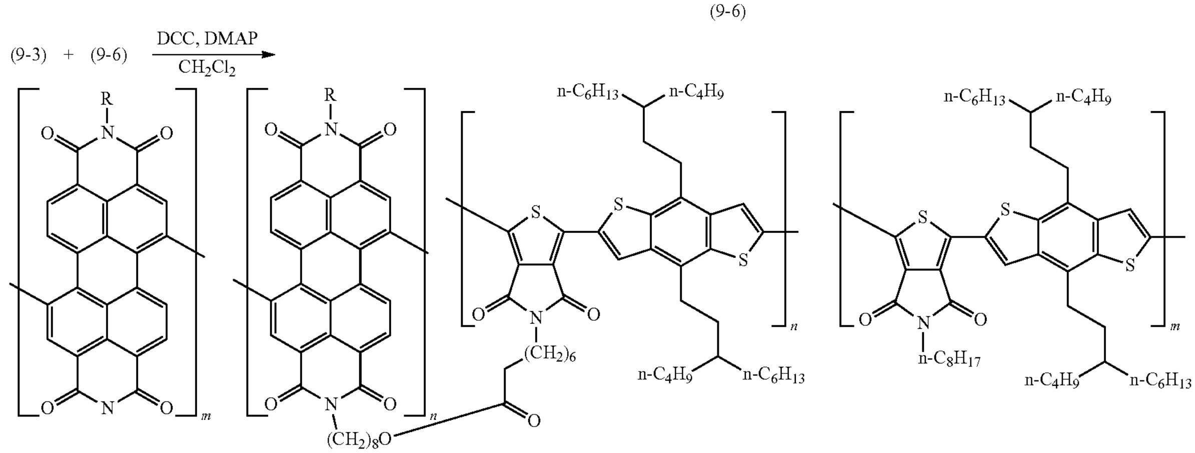

(9-7)

1) Synthesis of Polymer (9-3)

Polymer (9-3) (yield 69.9%) was synthesized from compound (9-1) and compound (5-1) (mole ratio 1:1) in the same manner as polymers (5-2) to (5-3) in Example 5.

Polymer (9-3): Mw=$3.9\times10^4$, Mn=$1.3\times10^4$, $^1$H-NMR ($CDCl_3$); δ [ppm]=0.80-2.18 (57H), 3.13-4.67 (10H), 7.24-8.80 (12H), λmax=541 nm, Tg>300° C. (decomposed)

2) Synthesis of Polymer (9-6)

Polymer (9-6) (yield 75.3%) was synthesized from compound (5-4), compound (9-4), and compound (5-5) (mole ratio 1:1:2) in the same manner as polymers (5-6) to (5-7) in Example 5.

Polymer (9-6): Mw=$6.9\times10^4$, Mn=$2.6\times10^4$, $^1$H-NMR ($CDCl_3$); δ [ppm]=0.84-2.41 (135H), 3.14-3.90 (4H), 7.31-7.80 (4H). λmax=703 nm, Tg>300° C. (decomposed)

3) Synthesis of Polymer (9-7)

Polymer (9-7) (yield 68.3%) was obtained using polymer (9-3) and polymer (9-6) (mass ratio 1.03:1) in the same manner as the synthesis of polymer (5-8) in Example 5.

Polymer (9-7): $Mw=8.2\times10^4$, $Mn=2.6\times10^4$, $^1H$-NMR ($CDCl_3$); δ [ppm]=0.80-2.18 (194H), 3.13-4.67 (12H), 7.24-8.80 (16H), λmax=627 nm, Tg>300° C. (decomposed)

4) Preparation of Element

A 2-mm square element was obtained in the same manner as Example 2, except that polymer (2-3) was changed to polymer (9-7), and the solvent was changed from o-dichlorobenzene to chlorobenzene.

Example 10

Synthesis of p-Type-and-n-Type Linked Organic Semiconductor Polymer (10-7)

According to the following reaction scheme, semiconductor polymer (10-5) was synthesized.

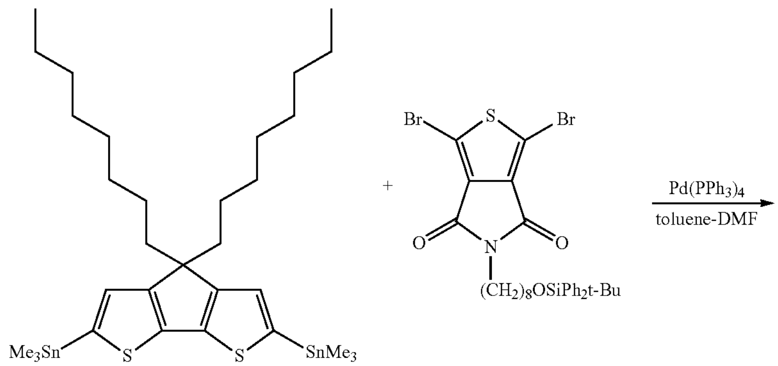

(10-1) (10-2)

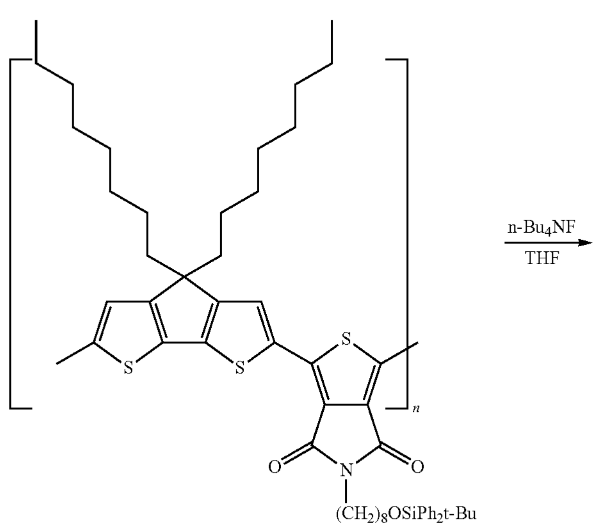

(10-3)

-continued

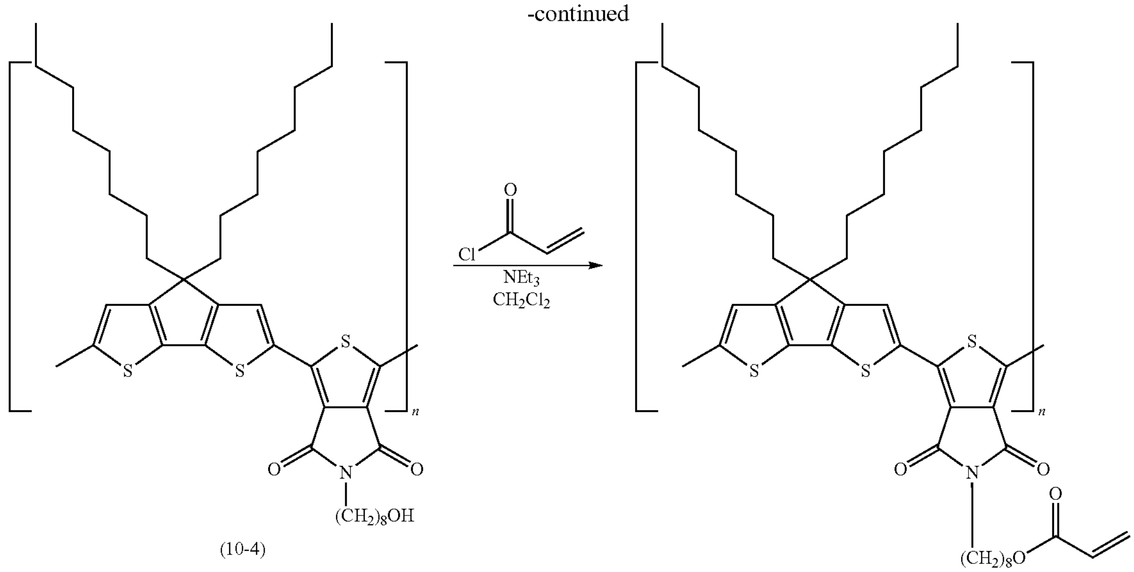

(10-4)

(10-5)

1) Synthesis of Polymer (10-5)

Polymer (10-5) was synthesized from compound (10-1) and compound (10-2) (mole ratio 1:1) in the same manner as polymers (1-4) to (1-6) in Example 1.

Polymer (10-5): Mw=$7.2\times10^4$, Mn=$2.8\times10^4$, $^1$H-NMR ($CDCl_3$); δ [ppm]=0.83-2.21 (46H), 3.62-4.64 (4H), 5.81-5.90 (1H), 6.02-6.29 (1H), 6.29-6.51 (1H), 7.25-7.85 (2H). λmax=700 nm, Tg>300° C. (decomposed).

2) Preparation of Element

A 2-mm square element having a photoelectric conversion layer of polymer (10-7) in which polymer (10-5) and compound (10-6) were cross-linked was obtained in the same manner as the preparation of the element in Example 1, except that polymer (1-6) was changed to polymer (10-5), fullerene (1-8) was changed to fullerene (10-6), and the solvent was changed from o-dichlorobenzene to chlorobenzene.

(10-6)

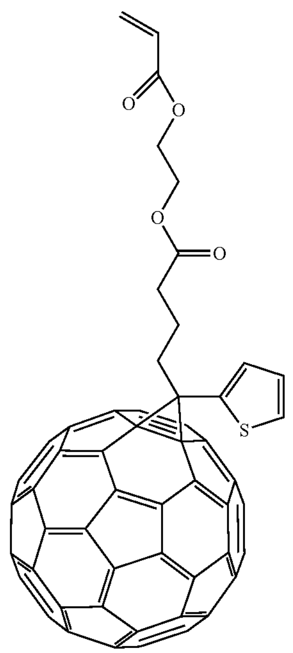

-continued
(10-7)
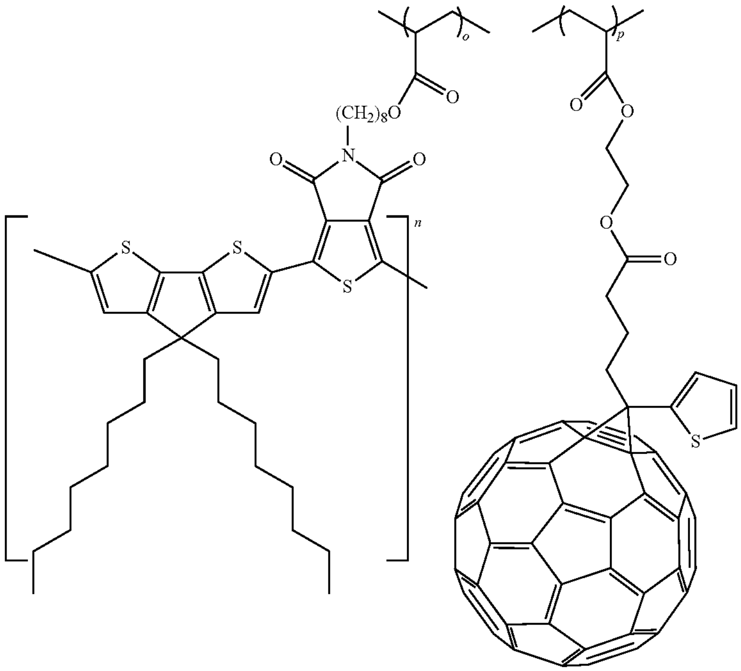
Example 11
Synthesis of p-Type-and-n-Type Linked Organic Semiconductor Polymer (11-6)
The polymer was synthesized according to the following reaction scheme.
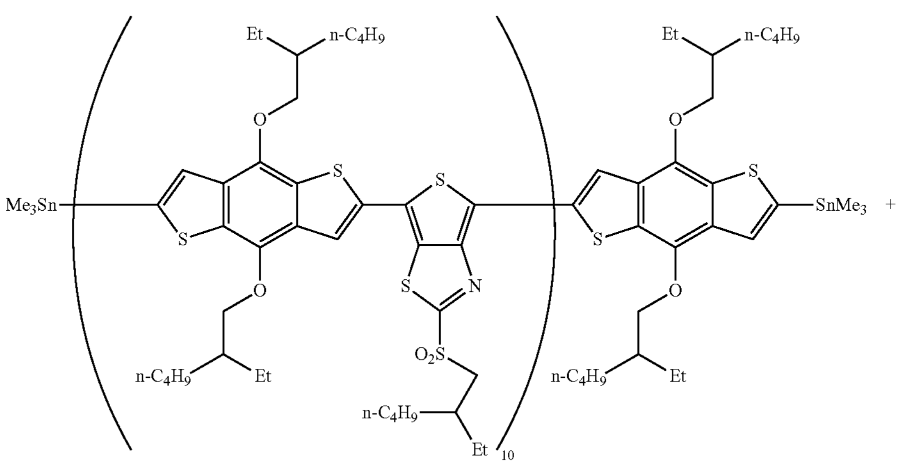
(11-1)
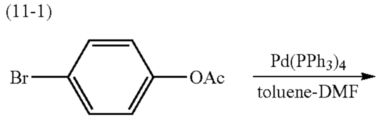
(11-2)

-continued
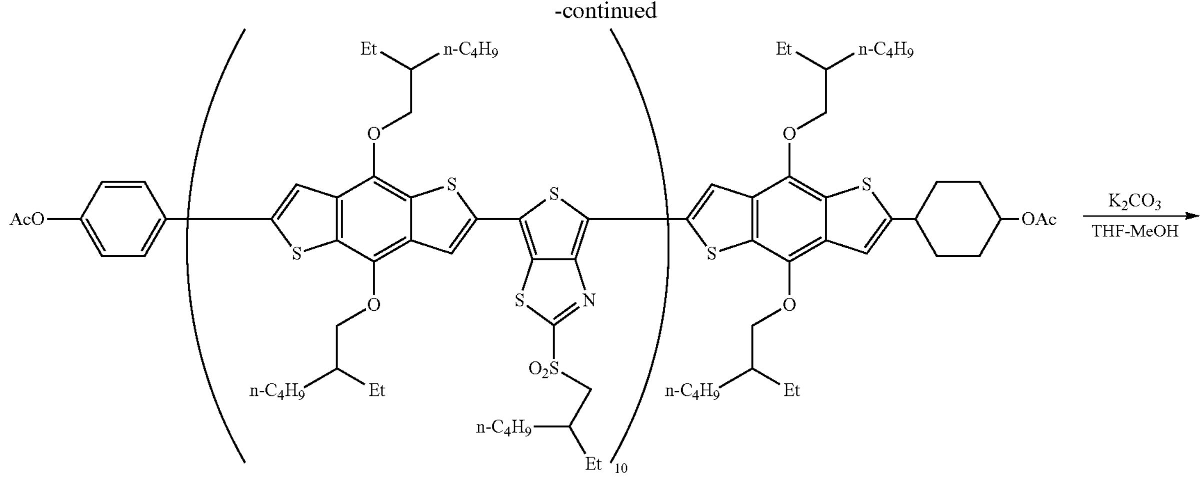
(11-3)
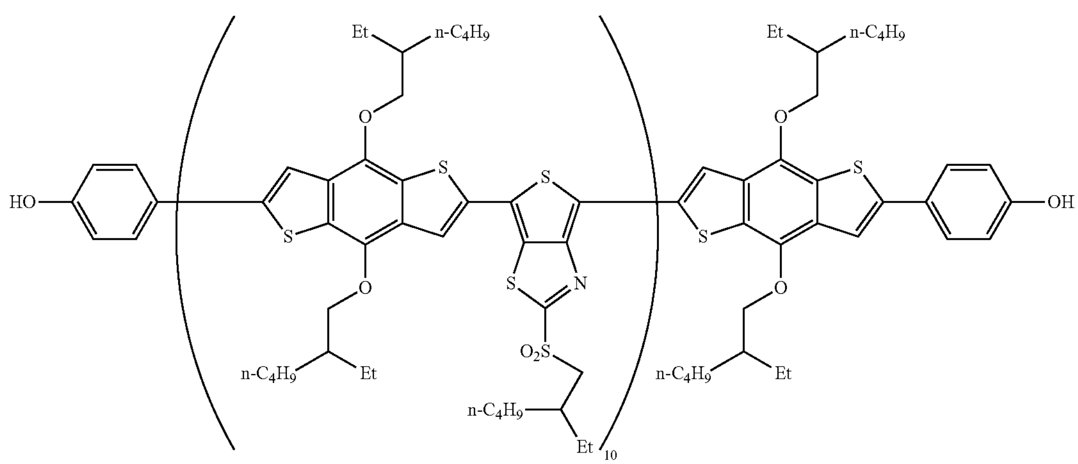
(11-4)
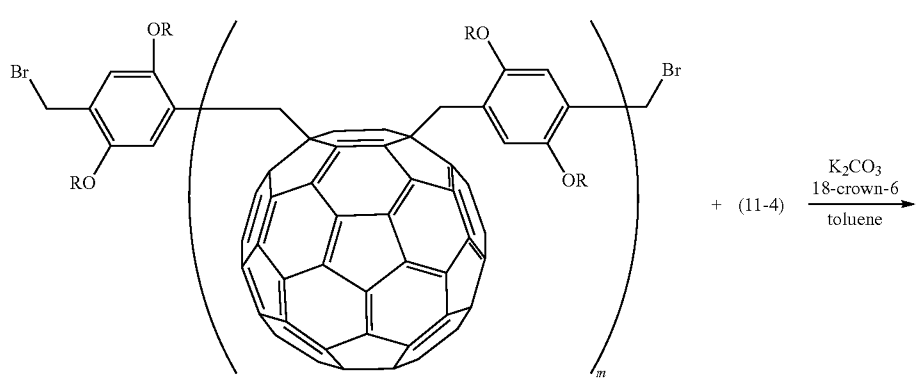
$R = n\text{-}C_8H_{17}$
(11-5)

-continued

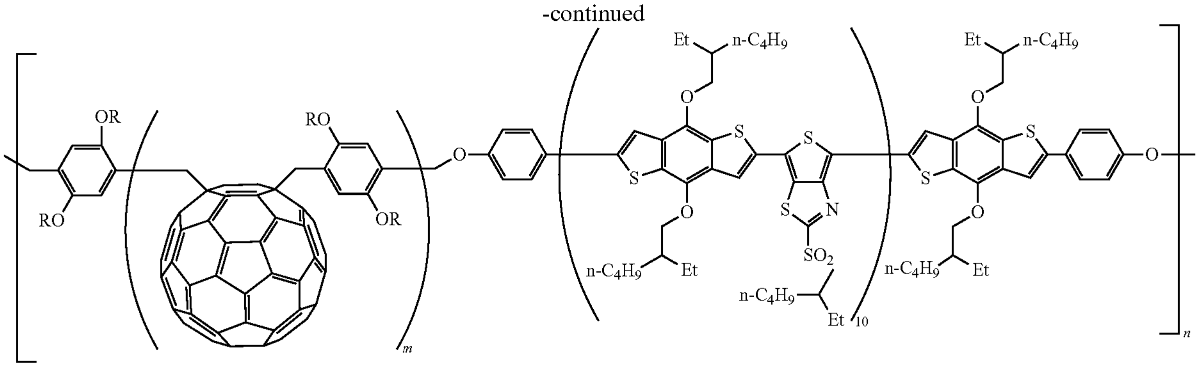

R = n-C$_6$H$_{13}$ (11-6)

1) Synthesis of Compound (11-4)

Compound (11-3) was synthesized in the same manner as the synthesis of compound (7-7) in Example 7, except that compound (7-6) was changed to 0.100 mmol of compound (11-1) synthesized in the same manner as the method in Example 7, and compound (7-4) was changed to 0.200 mmol of compound (11-2). A mixture of 150 mg of compound (11-3), 50 mg of potassium carbonate, 300 mL of toluene, and 100 mL of methanol was heated and refluxed for 6 hours. After ice-cooling, 200 mL of 1N hydrochloric acid was added thereto, and the mixture was subjected to liquid separation. The resultant organic layer was washed with 25 wt % brine, and the organic layer was dried over anhydrous sodium sulfate. After filtration, the solvent was distilled off under reduced pressure, and the resultant concentrate was purified by silica gel column chromatography, to obtain compound (11-4) (yield 69.8%).

2) Synthesis of Polymer (11-6)

50 mg of compound (11-5) synthesized according to a method described in Macromolecules, 43, 6033-6044 (2010) was allowed to react with 50 mg of compound (11-4) according to a method described in, ditto, Macromolecules, 43, 6033-6044 (2010), to obtain 47 mg of polymer (11-6).

Polymer (11-6): Mw=$9.1\times10^4$, Mn=$2.7\times10^4$, $^1$H-NMR (CDCl$_3$); δ [ppm]=0.80-2.81 (123H), 3.63-5.01 (22H), 7.20-7.90 (16H). λmax=654 nm, Tg>300° C. (decomposed).

3) Preparation of Element

A 2-mm square element was obtained in the same manner as Example 2, except that polymer (2-3) was changed to polymer (11-6).

Example 12

1) Preparation of Element

A 2-mm square element having a photoelectric conversion layer formed of polymer (1-9) and [60]PCBM was obtained in the same manner as the preparation of the element in Example 1, except that 10 mg of polymer (1-6), 10 mg of fullerene (1-8), and 5 mg of [60]PCBM (manufactured by Solenne BV) were used, and the solvent was changed from o-dichlorobenzene to 3 wt % 1,8-diiodooctane-containing o-dichlorobenzene, in preparing the element.

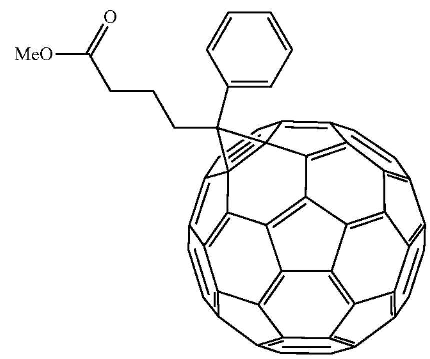

[60]PCBM

Example 13

1) Preparation of Element

A 2-mm square element having a photoelectric conversion layer formed of polymer (1-9) and polymer (12) was obtained in the same manner as the preparation of the element in Example 1, except that 5 mg of polymer (1-6), 15 mg of fullerene (1-8), and 5 mg of the following polymer (12) were used, and the solvent was changed from o-dichlorobenzene to 4 wt % 1,8-diiodooctane-containing o-chlorobenzene, in preparing the element.

(12)

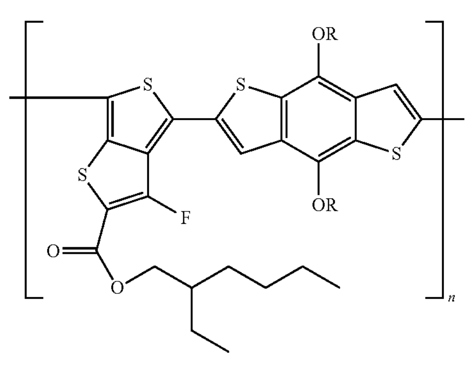

R = 2-ethylhexyl

Example 14

Synthesis of p-Type-and-n-Type Linked Organic Semiconductor Polymer (14-2)

1) Synthesis of Polymer (14-1)

139 mg of polymer (14-1) (yield 66.4%) was obtained from polymer (9-3), in the same manner as the synthesis of polymer (1-6) in Example 1.

Polymer (14-1): Mw=$4.0\times10^4$, Mn=$1.2\times10^4$, $^1$H-NMR ($CDCl_3$); δ [ppm]=0.83-2.18 (57H), 3.13-4.68 (10H), 5.71-5.93 (1H), 6.00-6.28 (1H), 6.32-6.45 (1H), 7.24-8.80 (12H), λmax=544 nm, Tg>300° C. (decomposed)

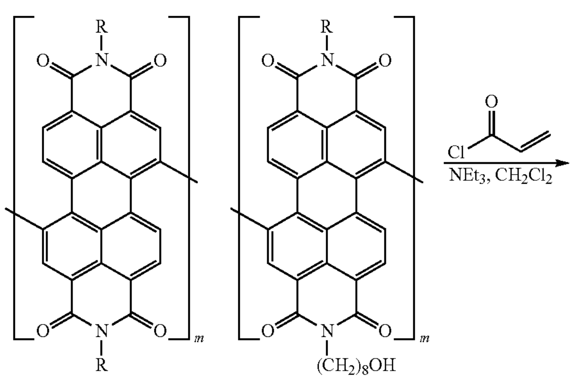

(9-3)

-continued

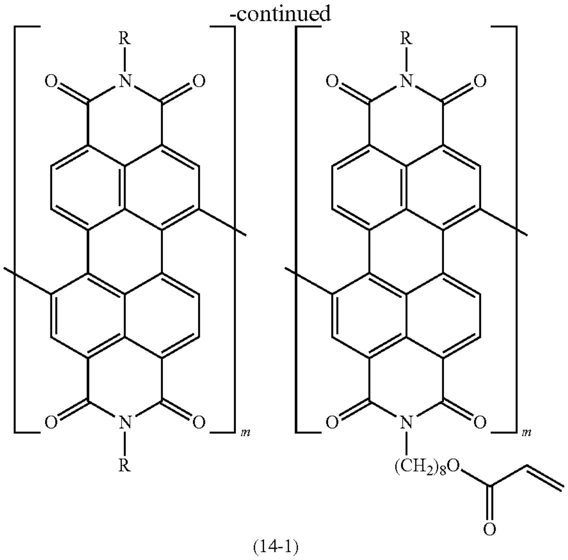

(14-1)

2) Preparation of Element

A 2-mm square element having a photoelectric conversion layer formed of polymer (14-2) in which polymer (14-1) and polymer (1-6) were cross-linked was obtained in the same manner as the preparation of the element in Example 1, except that polymer (14-1) and polymer (1-6) synthesized in Example 1 were used.

(14-2)

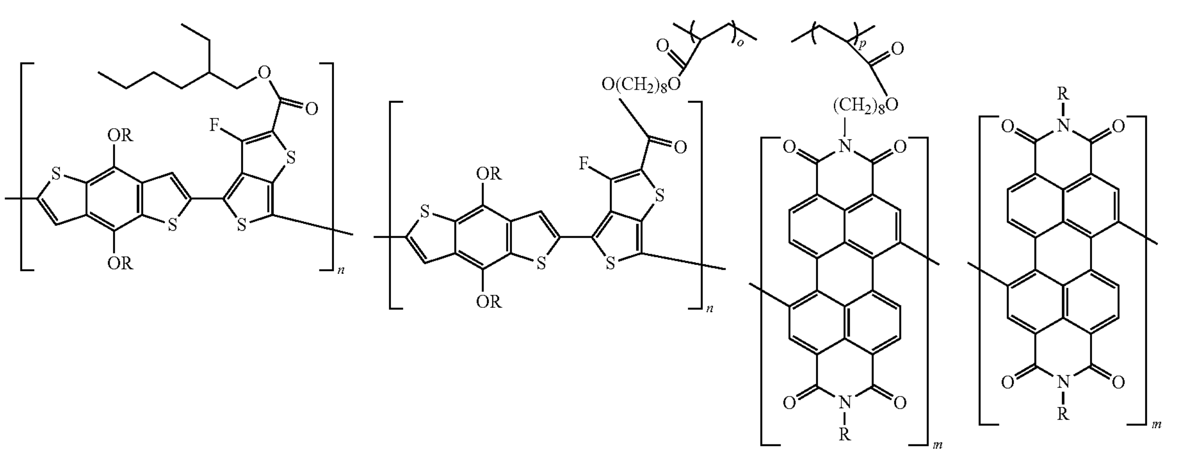

Comparative Example 1

1) Preparation of Element

On a washed and UV-ozone-treated glass-ITO substrate, PEDOT-PSS (Clevios P VP AI 4083, manufactured by H. C. Stark GmbH) to be used as a hole transporting layer was spin-coated (3,000 rpm), and dried at 140° C. for 30 minutes. Then, 10 mg of polymer (1'-1) synthesized according to WO03/075364A1 was dissolved into 1 mL of o-dichlorobenzene, and the resultant mixture was filtered using a 0.45-μm filter made of polytetrafluoroethylene. The resultant filtrate was applied onto the PEDOT-PSS layer by spin coating (1,500 rpm, 120 seconds), to obtain a photoelectric conversion layer. After drying, an upper electrode was formed on the photoelectric conversion layer by vapor deposition of aluminum, to obtain a 2-mm square element.

(1′-1)

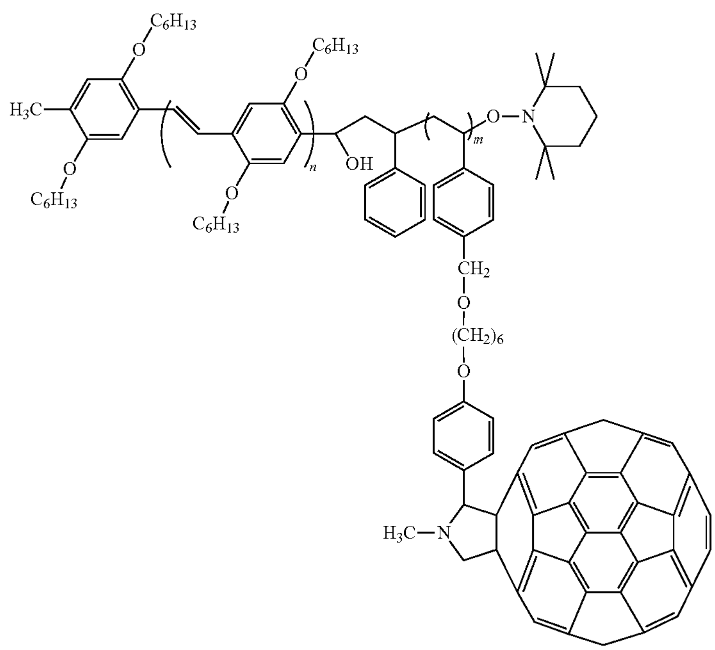

(Evaluation of Photovoltaic Cell)

1) Current Density-Voltage (J-V) Characteristics of Element

The 2-mm square elements prepared in Examples 1 to 14 and in Comparative example 1 were subjected to performance evaluation as follows:

For the elements thus obtained, the current density-voltage (J-V) characteristics of elements were evaluated using an SMU2400 type I-V measuring apparatus manufactured by Keithley Instruments, Inc., in a nitrogen atmosphere (oxygen concentration: 1 ppm or less, moisture concentration: 1 ppm or less). Filtered xenon lamp light from a solar simulator manufactured by Oriel Instruments Corp. was used, and an AM1.5G spectrum of 100 mW/cm$^2$ was approximated. The short circuit current density (Jsc), open circuit voltage (Voc), fill factor (FF), and power conversion efficiency (η) obtained in the apparatus are presented in the following Table 1.

2) Retention Ratio of Power Conversion Efficiency Under Heating Conditions

The 2-mm square elements obtained as described above were heated at 150° C. for 10 hours under a nitrogen atmosphere (oxygen concentration: 1 ppm or less, moisture concentration: 1 ppm or less), and then current density-voltage (J-V) characteristics of the elements were evaluated in the same manner as the above 1).

These results are collectively shown in Table 1 below with λmax of absorption characteristics of the semiconductor polymers.

TABLE 1

| | Polymer in Photoelectric conversion layer Kind | Initial performance (before heating) λmax [nm] | Jsc [mA/cm$^2$] | Voc [V] | FF [%] | η [%] | Performance after heating treatment η [%] | Retention rate [%] |
|---|---|---|---|---|---|---|---|---|
| Example 1 | Polymer (1-9) | 670 | 12.8 | 0.71 | 56 | 5.1 | 4.1 | 80 |
| Example 2 | Polymer (2-3) | 671 | 10.2 | 0.69 | 49 | 3.4 | 2.4 | 71 |
| Example 3 | Polymer (3-5) | 672 | 11.3 | 0.66 | 52 | 3.9 | 3.0 | 78 |
| Example 4 | Polymer (4-7) | 614 | 10.5 | 0.59 | 51 | 3.2 | 2.5 | 79 |
| Example 5 | Polymer (5-8) | 703 | 6.9 | 0.55 | 42 | 1.6 | 1.2 | 78 |
| Example 6 | Polymer (6-11) | 669 | 7.1 | 0.52 | 41 | 1.5 | 1.1 | 76 |
| Example 7 | Polymer (7-15) | 578 | 5.6 | 0.52 | 39 | 1.1 | 0.9 | 78 |
| Example 8 | Polymer (8-7) | 680 | 10.2 | 0.88 | 55 | 4.9 | 3.9 | 79 |
| Example 9 | Polymer (9-7) | 627 | 5.7 | 0.54 | 39 | 1.2 | 0.9 | 73 |
| Example 10 | Polymer (10-7) | 701 | 10.3 | 0.71 | 56 | 4.1 | 3.2 | 78 |
| Example 11 | Polymer (11-6) | 654 | 7.2 | 0.61 | 39 | 1.7 | 1.2 | 72 |
| Example 12 | Polymer (1-9) + [60] PCBM | 670 | 13.0 | 0.71 | 59 | 5.4 | 3.9 | 73 |
| Example 13 | Polymer (1-9) + Polymer (12) | 670 | 13.1 | 0.70 | 57 | 5.2 | 3.8 | 74 |
| Example 14 | Polymer (14-2) | 680 | 4.9 | 0.52 | 38 | 1.0 | 0.7 | 70 |
| Comparative example 1 | Polymer (1'-1) | 502 | 4.9 | 0.51 | 39 | 1.0 | 0.4 | 41 |

As is apparent from Table 1 above, the p-type-and-n-type semiconductor polymers according to the present invention had λmax of the absorption characteristics in a longer wavelength range and were excellent in cell characteristics, in particular, excellent in power conversion efficiency, and had significantly excellent thermal durability.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

7 Transparent substrate
10 Bulk hetero junction organic photovoltaic cell
11 Transparent electrode (first electrode)
12 Counter electrode (second electrode)
21 Hole transporting layer
22 Electron transporting layer
3 Photoelectric conversion layer
L Light
P Electric motor (electric fan)

The invention claimed is:

1. An organic photoelectric conversion element composition, comprising at least one p-type-and-n-type linked organic semiconductor polymer represented by formula (3):

(3)

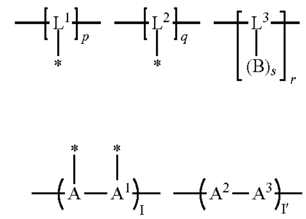

(a)

wherein, in formula (3), A, A$^1$, A$^2$ and A$^3$ each independently represents a group of a p-type organic semiconductor unit, B represents an n-type organic semiconductor unit selected from the group consisting of a group having a fullerene structure and a group having a 3,4,9,10-perylenetetracarboxylic diimide structure, in which A and A$^1$ in formula (3) each independently represents a group of a p-type organic semiconductor different in structure from the other;

L$^1$ to L$^3$ each independently represents a divalent or trivalent linking group containing neither p-type organic semiconductor unit nor n-type semiconductor unit;

at least one bonding hand represented by symbols -* in $L^1$ and $L^2$ bonds, in each formula, directly or through a divalent linking group, with at least one bonding hand represented by symbols -* in A or $A^1$ in (a), and the remaining non-bonded bonding hand -* bonds with a hydrogen atom or a monovalent substituent;

l and r each independently represents an integer of 1 to 1,000; s represents an integer of 1 to 10; and p, q and l' each independently represents an integer of 0 to 1,000; in which p and q do not simultaneously represent 0; and the bonding terminals represented by bonding hands—are each independently bonded with a hydrogen atom or a monovalent substituent.

2. The organic photoelectric conversion element composition according to claim 1, wherein the p-type-and-n-type linked organic semiconductor polymer represented by formula (3) is synthesized from a corresponding combination of compounds [C]:

[C]

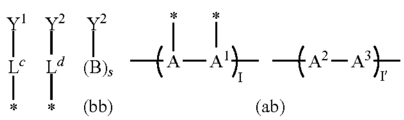

wherein [C] is a combination of a compound represented by formula (ab) and a compound represented by formula (bb);

in the compound represented by formula (ab) in [C], at least one bonding hand -* in A and $A^1$ bonds with a * part in *-$L^c$-$Y^1$ or a * part in *-$L^d$-$Y^2$, and when non-bonded therewith, bonds with a hydrogen atom or a monovalent substituent;

in formulas, A, $A^1$ to $A^3$, B, l, l' and s have the same meanings as A, $A^1$ to $A^3$, B, l, l' and s in formula (3); $L^c$ and $L^d$ each independently represents a single bond or a divalent linking group;

$Y^1$, $Y^2$ and $Y^3$ each independently represents a polymerizable group;

a partial structure of $Y^1$ forms $L^1$, a partial structure of $Y^2$ forms $L^2$, and a partial structure of $Y^3$ forms $L^3$;

in formula (ab), bonding terminals on each side are each independently bonded with a hydrogen atom or a monovalent substituent.

3. An organic photoelectric conversion element composition, comprising a polymer represented by combination [C]:

[C]

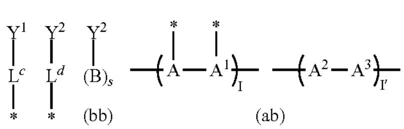

wherein [C] is a combination of a monomer represented by formula (ab) and a monomer represented by formula (bb);

in the monomer represented by formula (ab) in [C], at least one bonding hand -* in A and $A^1$ bonds with a * part in *-$L^c$-$Y^1$ or a * part in *-$L^d$-$Y^2$, and when non-bonded therewith, bonds with a hydrogen atom or a monovalent substituent;

A, $A^1$, $A^2$ and $A^3$ each independently represents a group of a p-type organic semiconductor unit, B represents an n-type organic semiconductor unit selected from the group consisting of a group having a fullerene structure and a group having a 3,4,9,10-perylenetetracarboxylic diimide structure, in which A and $A^1$ in formula (ab) each independently represents a group of a p-type organic semiconductor different in structure from the other;

l represents an integer of 1 to 1,000; s represents an integer of 1 to 10; and l' represents an integer of 0 to 1,000;

$L^c$ and $L^d$ each independently represents a single bond or a divalent linking group;

$Y^1$, $Y^2$ and $Y^3$ each independently represents a polymerizable group;

a partial structure of $Y^1$ forms $L^1$, a partial structure of $Y^2$ forms $L^2$, and a partial structure of $Y^3$ forms $L^3$;

in formula (ab), bonding terminals on each side are each independently bonded with a hydrogen atom or a monovalent substituent.

4. The organic photoelectric conversion element composition according to claim 1, wherein the group of the n-type organic semiconductor unit is a group having fullerene structure, a nitrogen-containing heterocyclic group, or an aromatic group having at least one electron-withdrawing group.

5. The organic photoelectric conversion element composition according to claim 1, wherein the group of the p-type organic semiconductor unit is a heterocyclic group having at least one atom among sulfur, nitrogen, oxygen, silicon, boron, selenium, tellurium, and phosphorus as a ring-constituting atom.

6. The organic photoelectric conversion element composition according to claim 1, wherein the group of the p-type organic semiconductor unit is selected from among the following heterocyclic groups:

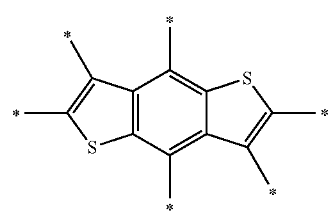

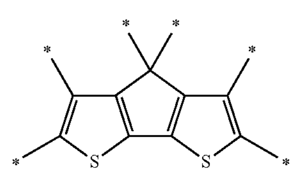

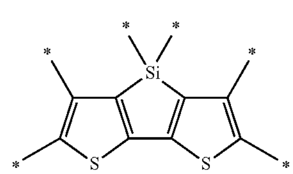

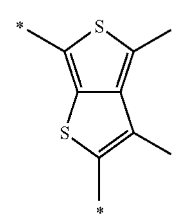

-continued
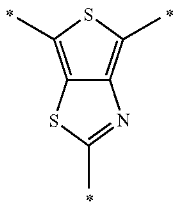
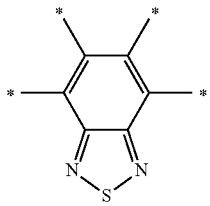
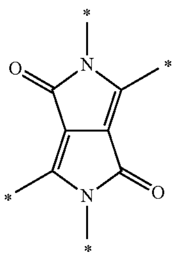
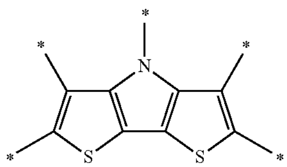
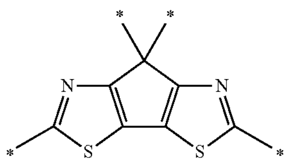
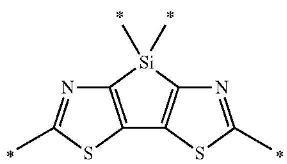
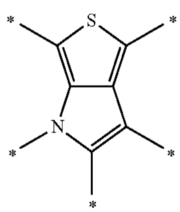
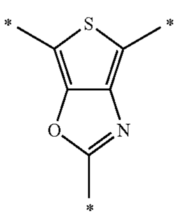
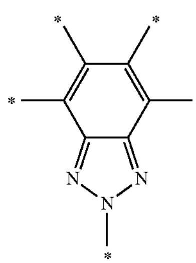
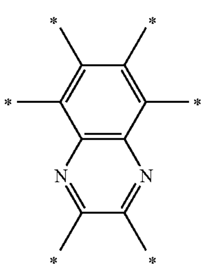
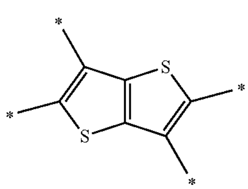
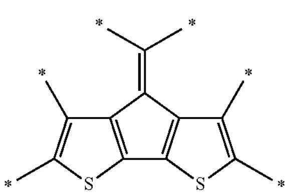
-continued
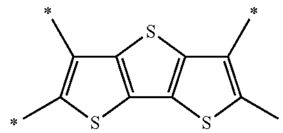
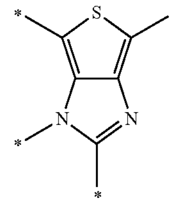
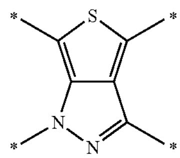
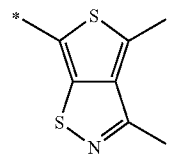
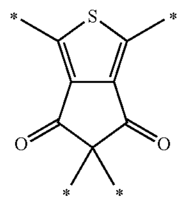
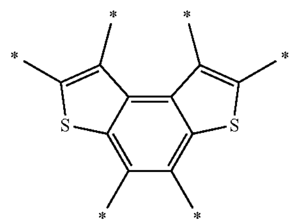
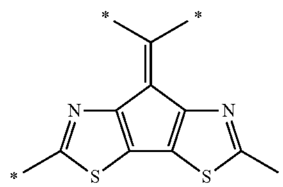
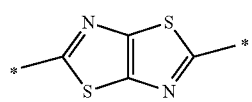
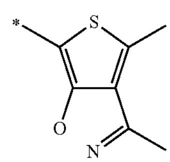
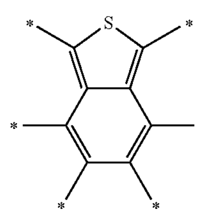
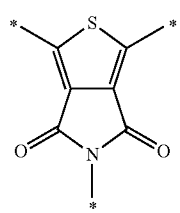
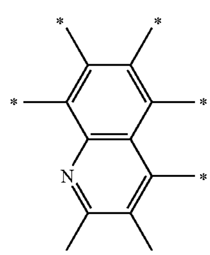
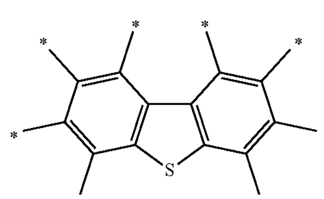

-continued
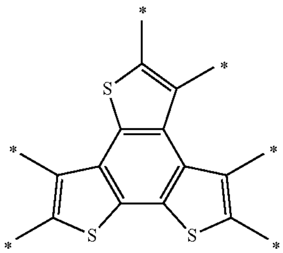
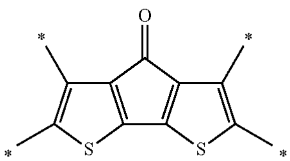
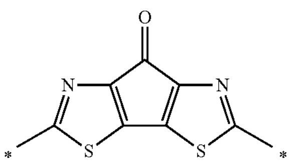
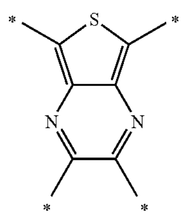
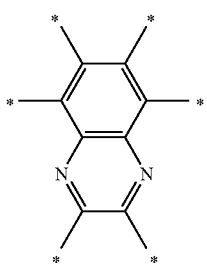
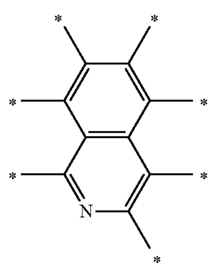
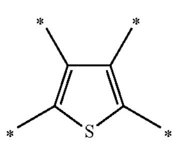
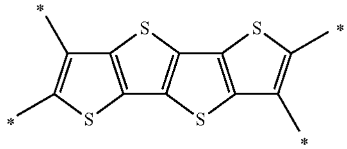
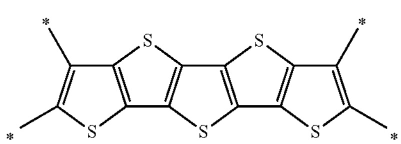
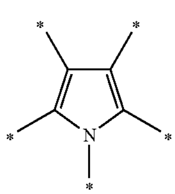
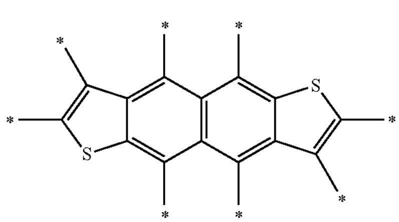
-continued
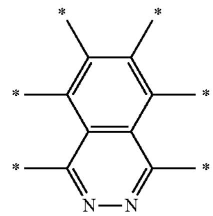
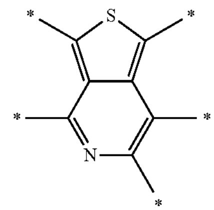
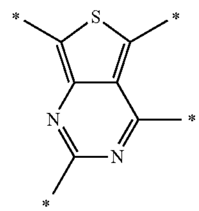
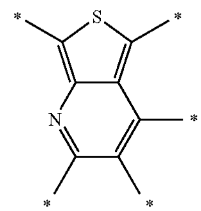
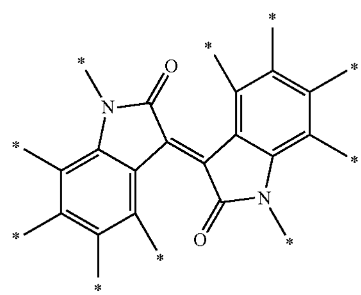
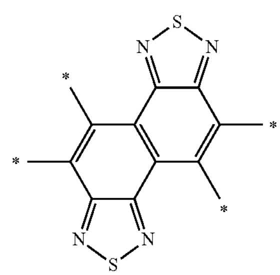
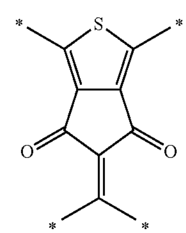
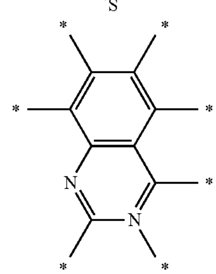
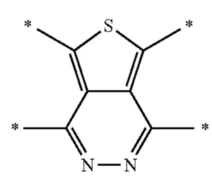
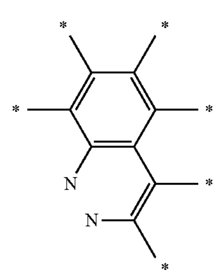
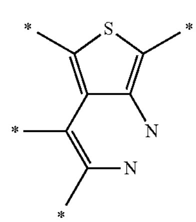
wherein, in the formulas, a bonding hand represented by a symbol * represents a linking site with a polymer main chain, a polymer side chain, a single bond or a divalent linking group; when the group forms the polymer main chain, at least two bonding hands thereof are used for forming the polymer main chain, and the remaining bonding hand(s) is bonded with a divalent linking group, a hydrogen atom, or a substituent; and when the bonding hands are used for forming the polymer main chain, each of the bonding hands is at a position where the polymer main chain conjugates.

7. A thin film, comprising the organic photoelectric conversion element composition according to claim 1.

8. A photovoltaic cell, comprising a layer composed of the organic photoelectric conversion element composition according to claim 1, between a first electrode and a second electrode.

9. A p-type-and-n-type linked organic semiconductor polymer, which is represented by formula (3):

(3)

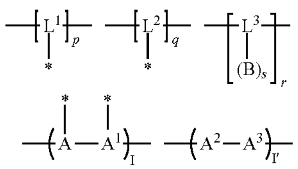

(a)

wherein, in formula (3), A, $A^1$, $A^2$ and $A^3$ each independently represents a group of a p-type organic semiconductor unit, B represents an n-type organic semiconductor unit selected from the group consisting of a group having a fullerene structure and a group having a 3,4,9,10-perylenetetracarboxylic diimide structure, in which A and $A^1$ each independently represents a group of a p-type organic semiconductor different in structure from the other;

$L^1$ to $L^3$ each independently represents a divalent or trivalent linking group containing neither p-type organic semiconductor unit nor n-type semiconductor unit;

at least one bonding hand represented by symbols -* in $L^1$ and $L^2$ in formula (3) bonds, in each formula, directly or through a divalent linking group, with at least one bonding hand represented by symbols -* in A or $A^1$ in (a), and the remaining non-bonded bonding hand -* bonds with a hydrogen atom or a monovalent substituent;

l and r each independently represents an integer of 1 to 1,000; s represents an integer of 1 to 10; and p, q and l' each independently represents an integer of 0 to 1,000; in which p and q do not simultaneously represent 0; and the bonding terminals represented by bonding hands—are each independently bonded with a hydrogen atom or a monovalent substituent.

10. The p-type-and-n-type linked organic semiconductor polymer according to claim 9, wherein the p-type-and-n-type linked organic semiconductor polymer represented by formula (3) is synthesized from a corresponding combination of compounds [C]:

[C]

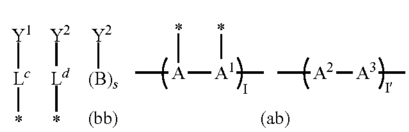

(bb) (ab)

wherein [C] is a combination of a compound represented by formula (ab) and a compound represented by formula (bb);

in the compound represented by formula (ab) in [C], at least one bonding hand -* in A and $A^1$ bonds with a * part in *-$L^c$-$Y^1$ or a * part in *-$L^d$-$Y^2$, and when non-bonded therewith, bonds with a hydrogen atom or a monovalent substituent;

A, $A^1$ to $A^3$, B, l, l' and s have the same meanings as A, $A^1$ to $A^3$, B, l, l' and s in formula (3); $L^c$ and $L^d$ each independently represents a single bond or a divalent linking group;

$Y^1$, $Y^2$ and $Y^3$ each independently represents a polymerizable group;

a partial structure of $Y^1$ forms $L^1$, a partial structure of $Y^2$ forms $L^2$, and a partial structure of $Y^3$ forms $L^3$;

in formula (ab), bonding terminals on each side are each independently bonded with a hydrogen atom or a monovalent substituent.

11. The p-type-and-n-type linked organic semiconductor polymer according to claim 9, wherein the group of the n-type organic semiconductor unit is a group having fullerene structure, a nitrogen-containing heterocyclic group, or an aromatic group having at least one electron-withdrawing group.

12. The p-type-and-n-type linked organic semiconductor polymer according to claim 9, wherein the group of the p-type organic semiconductor unit is a heterocyclic group having at least one atom among sulfur, nitrogen, oxygen, silicon, boron, selenium, tellurium, and phosphorus as a ring-constituting atom.

13. The p-type-and-n-type linked organic semiconductor polymer according to claim 9, wherein the group of the p-type organic semiconductor unit is selected from among the following heterocyclic groups:

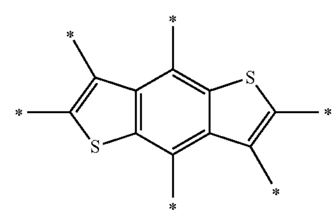

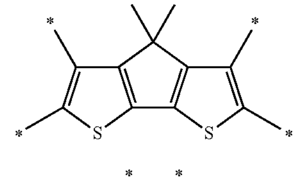

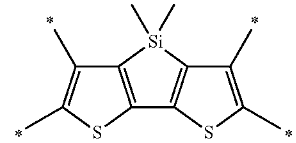

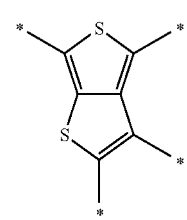

-continued
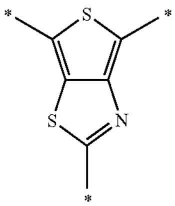
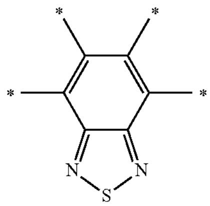
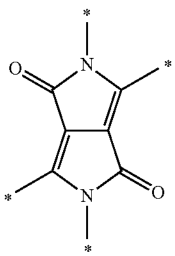
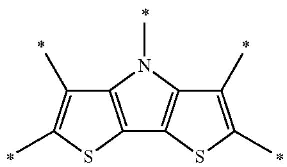
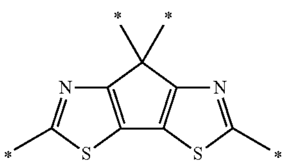
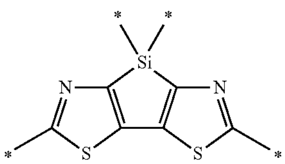
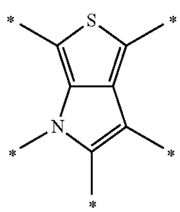
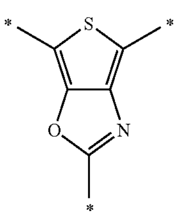
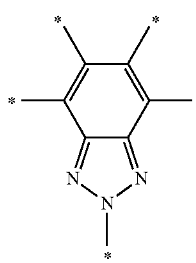
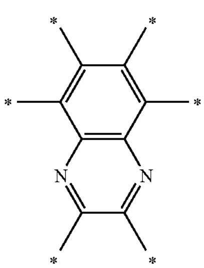
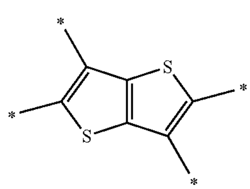
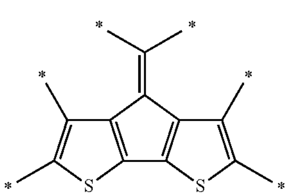
-continued
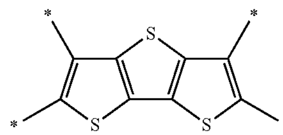
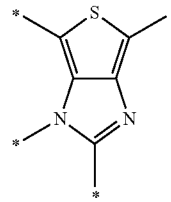
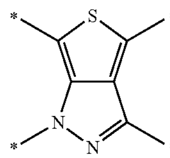
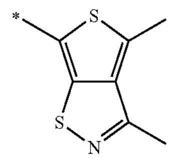
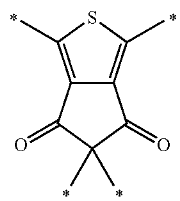
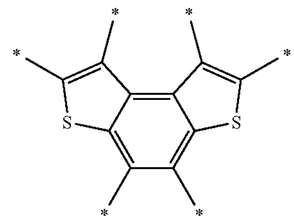
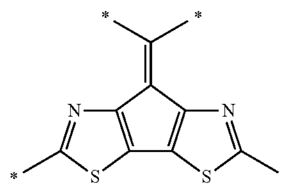
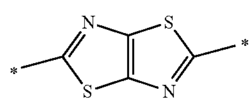
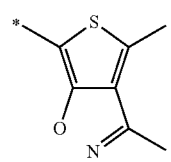
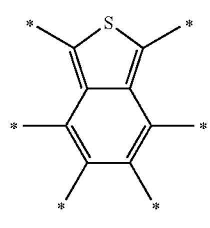
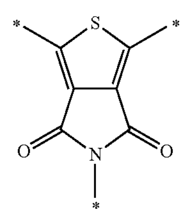
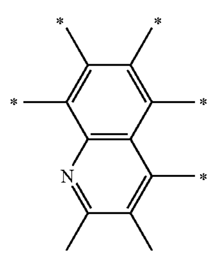
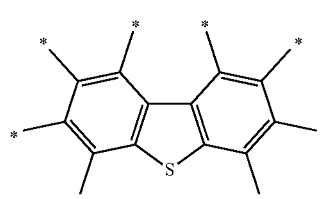

-continued
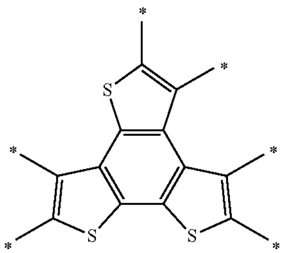
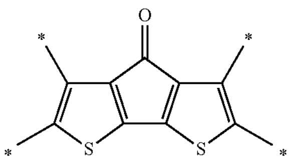
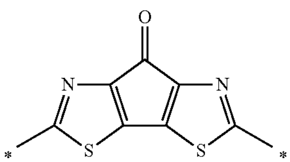
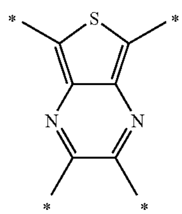
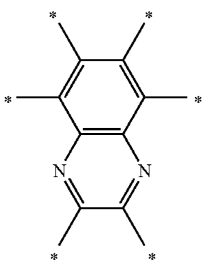
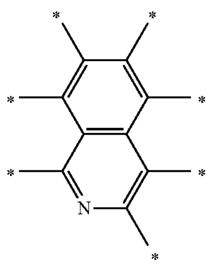
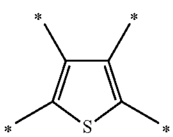
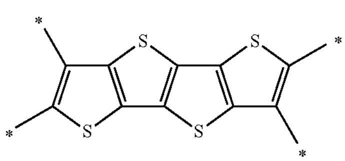
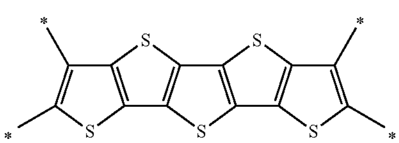
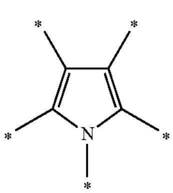
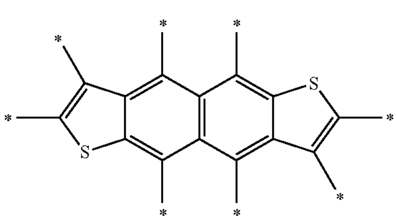
-continued
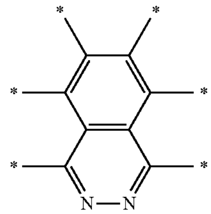
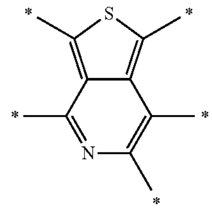
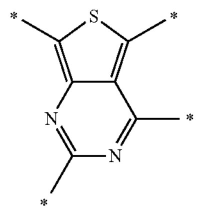
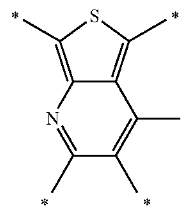
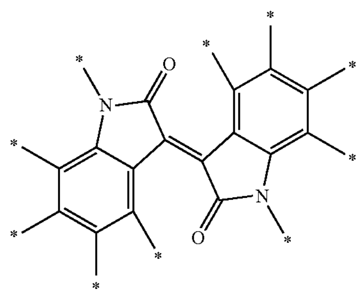
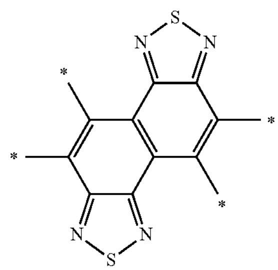
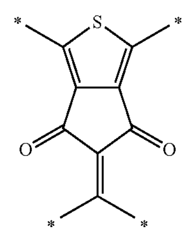
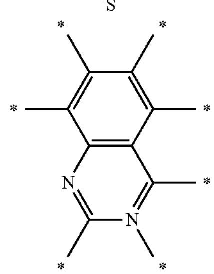
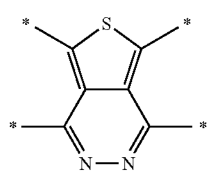
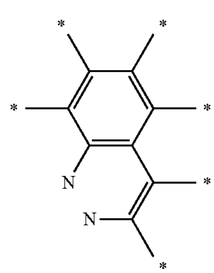
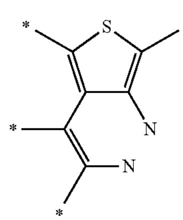
wherein, in the formulas, a bonding hand represented by a symbol * represents a linking site with a polymer main chain, a polymer side chain, a single bond or a divalent linking group; when the group forms the polymer main chain, at least two bonding hands thereof are used for forming the polymer main chain, and the remaining bonding hand(s) is bonded with a divalent linking group, a hydrogen atom, or a substituent; and when the bonding hands are used for forming the polymer main chain, each of the bonding hands is at a position where the polymer main chain conjugates.

14. A method of preparing a polymer, comprising the step of:

conducting a reaction between a combination of compounds or polymers represented by [C], to obtain a corresponding polymer represented by formula (3):

(3)

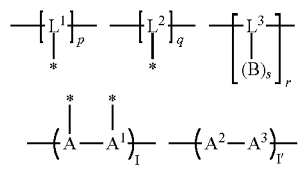

(a)

wherein, in formula (3), A, $A^1$, $A^2$ and $A^3$ each independently represents a group of a p-type organic semiconductor unit, B represents an n-type organic semiconductor unit selected from the group consisting of a group having a fullerene structure and a group having a 3,4,9,10-perylenetetracarboxylic diimide structure, in which A and $A^1$ in each independently represents a group of a p-type organic semiconductor different in structure from the other;

$L^1$ to $L^3$ each independently represents a divalent or trivalent linking group containing neither p-type organic semiconductor unit nor n-type semiconductor unit;

at least one bonding hand represented by symbols -* in $L^1$ and $L^2$ formula (3) bonds, in each formula, directly or through a divalent linking group, with at least one bonding hand represented by symbols -* in A or $A^1$ in (a), and the remaining non-bonded bonding hand -* bonds with a hydrogen atom or a monovalent substituent;

l and r each independently represents an integer of 1 to 1,000; s represents an integer of 1 to 10; and p, q and l' each independently represents an integer of 0 to 1,000; in which p and q do not simultaneously represent 0;

in formula (3), the bonding terminals represented by bonding hands—are each independently bonded with a hydrogen atom or a monovalent substituent;

[C]

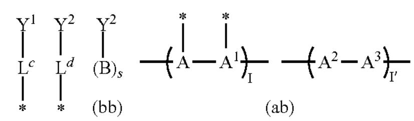

(bb) (ab)

wherein [C] is a combination of a compound represented by formula (ab) and a compound represented by formula (bb);

in the compound represented by formula (ab) in [C], at least one bonding hand -* in A and $A^1$ bonds with a * part in *-$L^c$-$Y^1$ or a * part in *-$L^d$-$Y^2$, and when non-bonded therewith, bonds with a hydrogen atom or a monovalent substituent;

in [C], A, $A^1$ to $A^3$, B, l, l' and s have the same meanings as A, $A^1$ to $A^3$, B, l, l' and s in formula (3); $L^c$ and $L^d$ each independently represents a single bond or a divalent linking group;

$Y^1$, $Y^2$ and $Y^3$ each independently represents a polymerizable group;

a partial structure of $Y^1$ forms $L^1$, a partial structure of $Y^2$ forms $L^2$, and a partial structure of $Y^3$ forms $L^3$;

in formula (ab), bonding terminals on each side are each independently bonded with a hydrogen atom or a monovalent substituent.

* * * * *